US012203965B2

(12) United States Patent
Huynh

(10) Patent No.: US 12,203,965 B2
(45) Date of Patent: Jan. 21, 2025

(54) WHEATSTONE BRIDGE HIGH ACCURACY IMPEDANCE SENSING CIRCUIT WITH INCREASED SIGNAL TO NOISE RATIO (SNR)

(71) Applicant: SIGMASENSE, LLC., Wilmington, DE (US)

(72) Inventor: Phuong Huynh, Fairfax, VA (US)

(73) Assignee: SIGMASENSE, LLC., Austin, TX (US)

( * ) Notice: Subject to any disclaimer, the term of this patent is extended or adjusted under 35 U.S.C. 154(b) by 40 days.

(21) Appl. No.: 18/207,216

(22) Filed: Jun. 8, 2023

(65) Prior Publication Data

US 2024/0044952 A1 Feb. 8, 2024

Related U.S. Application Data

(63) Continuation of application No. 17/412,579, filed on Aug. 26, 2021, now Pat. No. 11,709,189, which is a (Continued)

(51) Int. Cl.

| | |
|---|---|
| ***G01R 19/25*** | (2006.01) |
| ***G01R 19/257*** | (2006.01) |

(Continued)

(52) U.S. Cl.

CPC ....... *G01R 19/2509* (2013.01); *G01R 19/257* (2013.01); *G01R 27/02* (2013.01);

(Continued)

(58) Field of Classification Search

CPC .... H03M 1/0626; H03M 1/464; H03M 1/462; H03M 1/1245; H03M 3/462; H03M 3/32;

(Continued)

(56) References Cited

U.S. PATENT DOCUMENTS

| | | | |
|---|---|---|---|
| 5,437,178 | A | 8/1995 | Esin et al. |
| 6,218,972 | B1 | 4/2001 | Groshong |

(Continued)

FOREIGN PATENT DOCUMENTS

| | | | |
|---|---|---|---|
| CN | 104536627 | A | 4/2015 |
| CN | 107771273 | A | 3/2018 |

(Continued)

OTHER PUBLICATIONS

Baker; How delta-sigma ADCs work, Part 1; Analog Applications Journal; Oct. 1, 2011; 6 pgs.

(Continued)

*Primary Examiner* — Khai M Nguyen

(74) *Attorney, Agent, or Firm* — Garlick & Markison; Timothy W. Markison; Shayne X. Short

(57) ABSTRACT

An impedance sensing circuit includes first and second current sources and first and second bias current sources that are appropriately coupled to first and second resistors. The impedance sensing circuit also includes a comparator that compares a first voltage based on the first terminal of the first resistor to a second voltage based on the first terminal of the second resistor to generate a comparator output signal. Either the comparator output signal or a digital signal based on the comparator output signal operates to regulate the current signals output from the first and second current sources so that the first voltage is same as the second voltage. The comparator output signal and the digital signal is representative of a difference between the first voltage and the second voltage that is based on an impedance difference between the first resistor and the second resistor.

20 Claims, 96 Drawing Sheets

Related U.S. Application Data continuation-in-part of application No. 17/132,241, filed on Dec. 23, 2020, now Pat. No. 11,190,205, which is a continuation-in-part of application No. 17/078,187, filed on Oct. 23, 2020, now Pat. No. 11,133,811, which is a continuation-in-part of application No. 16/678,793, filed on Nov. 8, 2019, now Pat. No. 10,862,492.

(51) Int. Cl.

| | |
|---|---|
| ***G01R 27/02*** | (2006.01) |
| ***G01R 27/14*** | (2006.01) |
| ***H03M 3/00*** | (2006.01) |

(52) U.S. Cl.

CPC ............. *H03M 3/32* (2013.01); *H03M 3/462* (2013.01); *H03M 3/476* (2013.01); *G01R 27/14* (2013.01); *H03M 3/422* (2013.01)

(58) Field of Classification Search

CPC .......... H03M 3/476; H03M 3/43; H03M 1/84; H03M 3/422; G06F 3/044; G06F 2203/041; H01L 27/14609; G01R 19/2509; G01R 19/257; G01R 27/02; G01R 27/14

USPC .................................................. 341/143, 172

See application file for complete search history.

(56) References Cited

U.S. PATENT DOCUMENTS

| | | | | |
|---|---|---|---|---|
| 6,665,013 | B1 | 12/2003 | Fossum et al. | |
| 7,089,146 | B1 * | 8/2006 | D'Aquino | G01K 7/01 438/237 |
| 7,301,350 | B2 | 11/2007 | Hargreaves | |
| 7,476,233 | B1 | 1/2009 | Wiener et al. | |
| 7,528,755 | B2 | 5/2009 | Hammerschmidt | |
| 8,031,094 | B2 | 10/2011 | Hotelling | |
| 8,089,289 | B1 | 1/2012 | Kremin et al. | |
| 8,279,180 | B2 | 10/2012 | Hotelling et al. | |
| 8,547,114 | B2 | 10/2013 | Kremin | |
| 8,625,726 | B2 | 1/2014 | Kuan | |
| 9,201,547 | B2 | 12/2015 | Elias | |
| 9,910,073 | B2 * | 3/2018 | Joet | G01R 17/105 |
| 2003/0052657 | A1 | 3/2003 | Koernle et al. | |
| 2005/0235758 | A1 | 10/2005 | Kowal et al. | |
| 2011/0063154 | A1 | 3/2011 | Hotelling et al. | |
| 2011/0298745 | A1 | 12/2011 | Souchkov | |
| 2012/0319878 | A1 | 12/2012 | Bogner et al. | |
| 2013/0278447 | A1 | 10/2013 | Kremin | |
| 2014/0085985 | A1 | 3/2014 | Pan et al. | |
| 2016/0013804 | A1 | 1/2016 | Peluso | |
| 2016/0188049 | A1 | 6/2016 | Yang et al. | |
| 2018/0157354 | A1 | 6/2018 | Blondin et al. | |
| 2018/0275824 | A1 | 9/2018 | Li | |
| 2019/0296755 | A1 | 9/2019 | Mirhaj et al. | |

FOREIGN PATENT DOCUMENTS

| | | | |
|---|---|---|---|
| EP | 2284637 | A1 | 2/2011 |
| KR | 20180058204 | A | 5/2018 |

OTHER PUBLICATIONS

Brian Pisani, Digital Filter Types in Delta-Sigma ADCs, Application Report SBAA230, May 2017, pp. 1-8, Texas Instruments Incorporated, Dallas, Texas.

International Searching Authority; International Search Report; International Application No. PCT/US2020/058790; Feb. 22, 2021; 7 pgs.

European Patent Office; Extended European Search Report; Application No. 19853507.2; Jun. 13, 2023; 7 pgs.

* cited by examiner communication system 100 computing device 12

400

600

800

900

1000

1100

1200

1300

1401

1402

1500

1600

1700

1800

1900

2000

2100

2200

2300

2400

2500

2601

2602

2700

2801

2802

2803

2901

2902

3000

3100

3200

3300

3400

3501

3502

3503

3504

3505

3506

3507 current mirror

3508

3509

3521
MOSFET current splitter (PMOSs)

$I_1 = I_{1a} + I_{1b}$ if size of M1 and M2 same:
$I_{1a} = I_{1b}$ if size M1 < M2:
$I_{1a} < I_{1b}$ if size M1 > M2:
$I_{1a} > I_{1b}$

3522
bipolar current splitter (PNP BJTs)

$I_1 = I_{1a} + I_{1b}$ if size of Q1 and Q2 same:
$I_{1a} = I_{1b}$ if size Q1 < Q2:
$I_{1a} < I_{1b}$ if size Q1 > Q2:
$I_{1a} > I_{1b}$

3601

3603

3602

3604

3606

3605

3607

3701

3702

3703

3801

3802

3901

3902

4001

4002

4101 photo-diode equivalent circuit

4102

4103

4201

4202

4301

4302

4303

4304

4305

4401

4402

4403

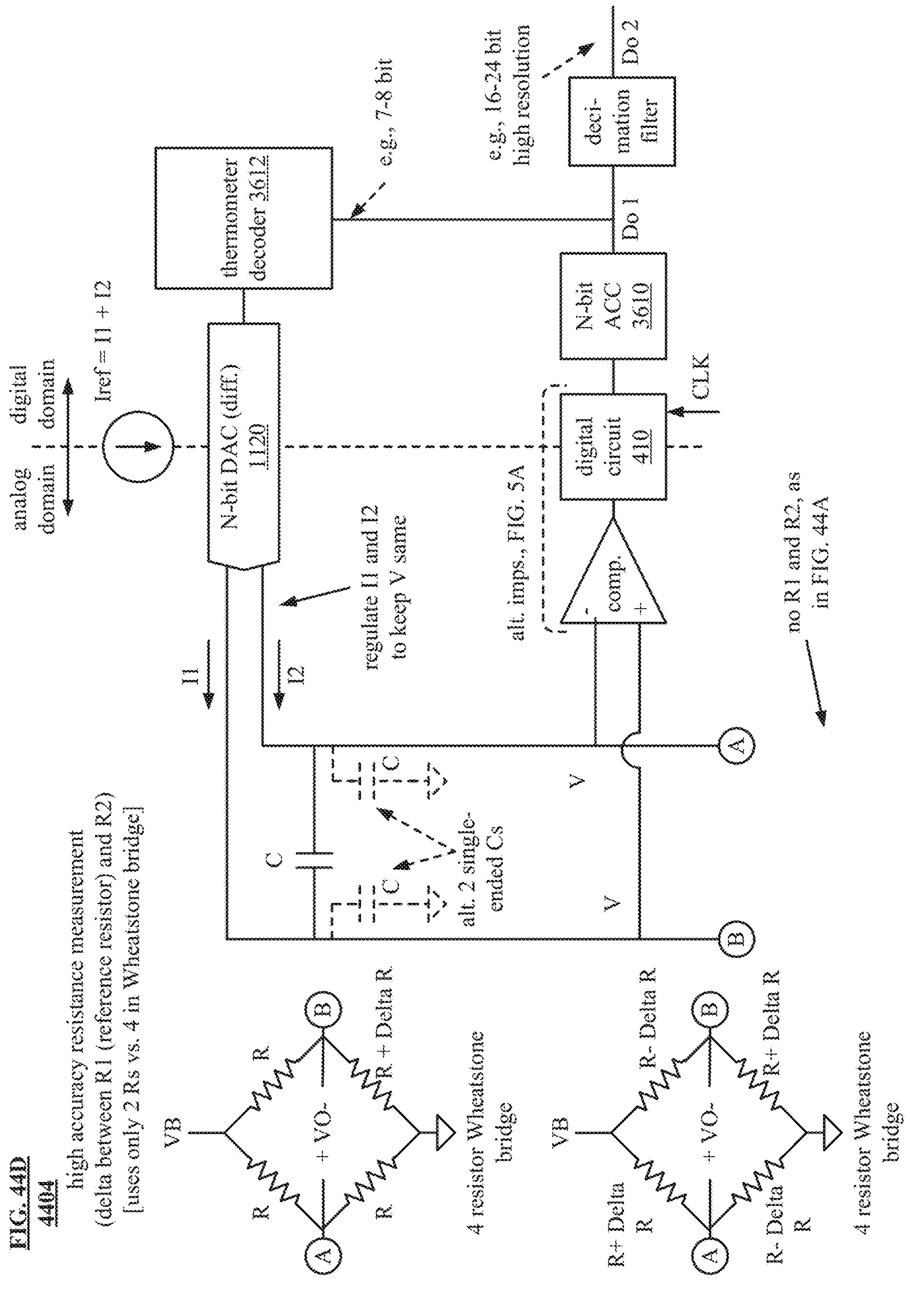
FIG. 44D
4404
high accuracy resistance measurement
(delta between R1 (reference resistor) and R2)
[uses only 2 Rs vs. 4 in Wheatstone bridge]
analog domain
digital domain
Iref = I1 + I2
N-bit DAC (diff.) 1120
thermometer decoder 3612
e.g., 7-8 bit
e.g., 16-24 bit high resolution
deci-mation filter
Do 2
Do 1
N-bit ACC 3610
CLK
digital circuit 410
alt. imps., FIG. 5A
comp.
-
+
regulate I1 and I2 to keep V same
I1
I2
C
C
C
alt. 2 single-ended Cs
V
V
A
B
no R1 and R2, as in FIG. 44A
VB
R
R
R
R + Delta R
+ VO-
A
B
4 resistor Wheatstone bridge
VB
R+ Delta R
R- Delta R
R- Delta R
R+ Delta R
+ VO-
A
B
4 resistor Wheatstone bridge

4405

4406

4407

4408

4409

4410

4411

4412

4501

4502

4504

4503

4505

3T pixel

4506

4T pixel

4507

4508 capacitive transimpedance amp pixel

4509 digital pixel

4510

4511

4602

4601

4700

4800

4901

4902

5001

5002

5101

5102

5103

5104

5203

5201

5202

5204

5301

5302

WHEATSTONE BRIDGE HIGH ACCURACY IMPEDANCE SENSING CIRCUIT WITH INCREASED SIGNAL TO NOISE RATIO (SNR)

CROSS REFERENCE TO RELATED PATENTS/PATENT APPLICATIONS

The present U.S. Utility patent application claims priority pursuant to 35 U.S.C. § 120 as a continuation of U.S. Utility application Ser. No. 17/412,579, entitled "Two-element High Accuracy Impedance Sensing Circuit with Increased Signal to Noise Ratio (SNR)," filed Aug. 26, 2021, pending, which claims priority pursuant to 35 U.S.C. § 120 as a continuation-in-part (CIP) of U.S. Utility application Ser. No. 17/132,241, entitled "Single-ended direct interface dual DAC feedback photo-diode sensor," filed Dec. 23, 2020, now issued as U.S. Pat. No. 11,190,205 on Nov. 30, 2021, which claims priority pursuant to 35 U.S.C. § 120 as a continuation-in-part (CIP) of U.S. Utility application Ser. No. 17/078,187, entitled "High Resolution Analog to Digital Converter (ADC) with Improved Bandwidth," filed Oct. 23, 2020, now issued as U.S. Pat. No. 11,133,811 on Sep. 28, 2021, which claims priority pursuant to 35 U.S.C. § 120 as a continuation-in-part (CIP) of U.S. Utility application Ser. No. 16/678,793, entitled "Current Operative Analog to Digital Converter (ADC)," filed Nov. 8, 2019, now issued as U.S. Pat. No. 10,862,492 on Dec. 8, 2020, all of which are hereby incorporated herein by reference in their entirety and made part of the present U.S. Utility patent application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to analog to digital conversion and more particularly to analog to digital converters (ADCs) and associated circuits, and architectures.

Description of Related Art

Within many electrical and electronic systems, conversion of signals between the analog domain and the digital domain, and vice versa, is performed. For example, sensors may be implemented to detect one or more conditions such as environmental conditions, operating conditions, device conditions, etc. Sensors are used in a wide variety of applications ranging from in-home automation, to industrial systems, to health care, to transportation, and so on. For example, sensors are placed in bodies, automobiles, airplanes, boats, ships, trucks, motorcycles, cell phones, televisions, touch-screens, industrial plants, appliances, motors, checkout counters, etc. for the variety of applications.

In general, a sensor converts a physical quantity into an electrical or optical signal. For example, a sensor converts a physical phenomenon, such as a biological condition, a chemical condition, an electric condition, an electromagnetic condition, a temperature, a magnetic condition, mechanical motion (position, velocity, acceleration, force, pressure), an optical condition, and/or a radioactivity condition, into an electrical signal.

A sensor includes a transducer, which functions to convert one form of energy (e.g., force) into another form of energy (e.g., electrical signal). There are a variety of transducers to support the various applications of sensors. For example, a transducer is capacitor, a piezoelectric transducer, a piezoresistive transducer, a thermal transducer, a thermal-couple, a photoconductive transducer such as a photoresistor, a photodiode, and/or phototransistor.

A sensor circuit is coupled to a sensor to provide the sensor with power and to receive the signal representing the physical phenomenon from the sensor. The sensor circuit includes at least three electrical connections to the sensor: one for a power supply; another for a common voltage reference (e.g., ground); and a third for receiving the signal representing the physical phenomenon. The signal representing the physical phenomenon will vary from the power supply voltage to ground as the physical phenomenon changes from one extreme to another (for the range of sensing the physical phenomenon).

The sensor circuits provide the received sensor signals to one or more computing devices for processing. A computing device is known to communicate data, process data, and/or store data. The computing device may be a cellular phone, a laptop, a tablet, a personal computer (PC), a work station, a video game device, a server, and/or a data center that support millions of web searches, stock trades, or on-line purchases every hour.

The computing device processes the sensor signals for a variety of applications. For example, the computing device processes sensor signals to determine temperatures of a variety of items in a refrigerated truck during transit. As another example, the computing device processes the sensor signals to determine a touch on a touchscreen. As yet another example, the computing device processes the sensor signals to determine various data points in a production line of a product.

In addition, within the operation of many devices and systems, conversion between the analog domain and the digital domain, and vice versa, is performed in accordance with the operation of such devices and systems. For example, many devices and systems operate using one or more digital signal processors (DSPs), microcontrollers, processors, etc. that operate within the digital domain. However, within certain devices and systems, one or more signals are received being in analog or continuous-time format. In order to utilize such one or more signals, they must be converted to being in digital or discrete-time format. Prior art analog to digital converters (ADCs) have many deficiencies including being highly consumptive of power, providing relatively low resolution, etc. There continues to be many applications that may not be appropriately service and provide high levels of performance using prior art ADCs. For example, certain applications do not have adequate power budget to facilitate effective operation of prior art ADCs. Also, certain applications cannot operate with high levels of performance based on the level of resolution and accuracy provided by prior art ADCs.

BRIEF DESCRIPTION OF THE SEVERAL VIEWS OF THE DRAWING(S)

Figure 34:
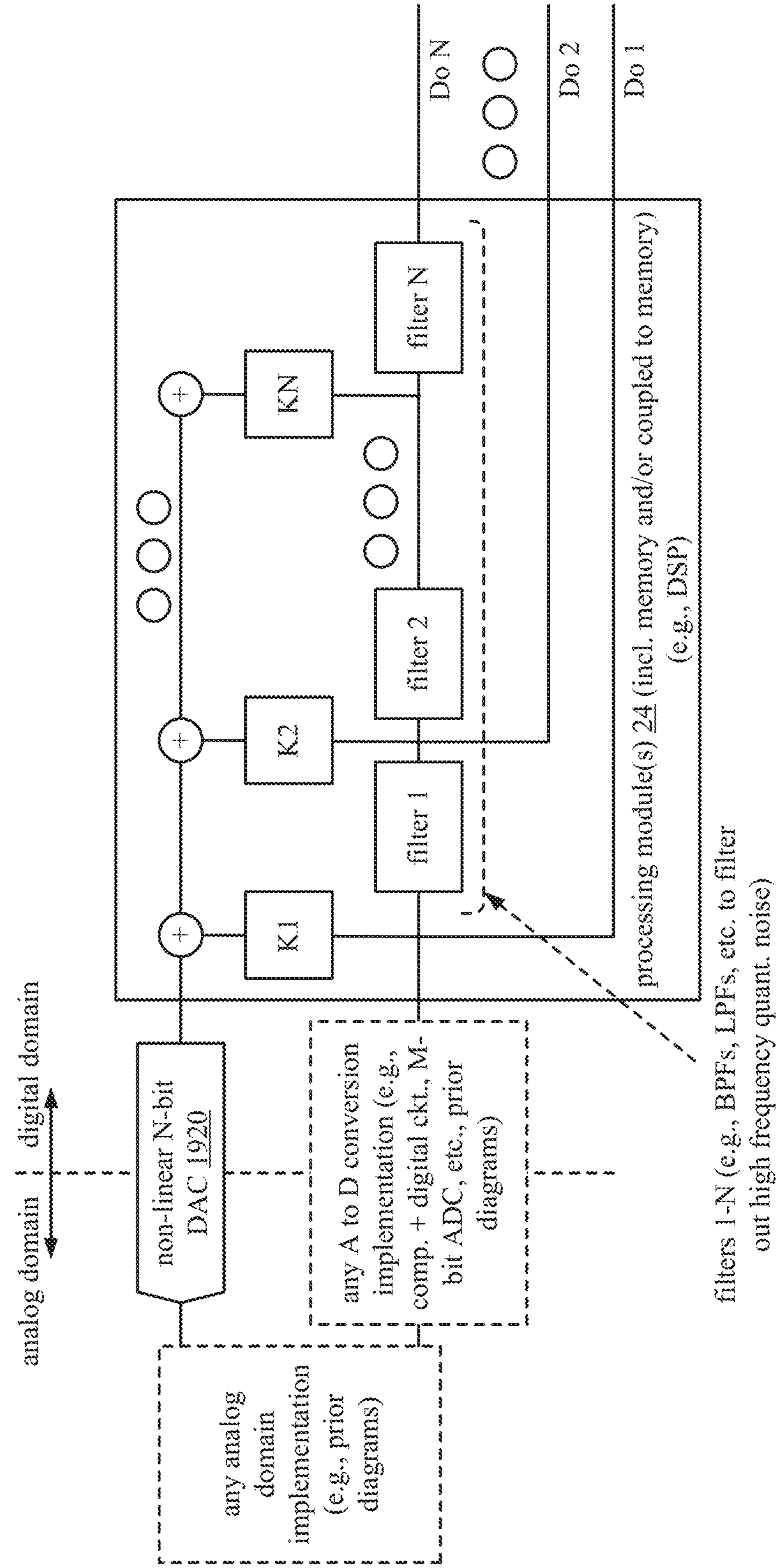
Figure 35A:
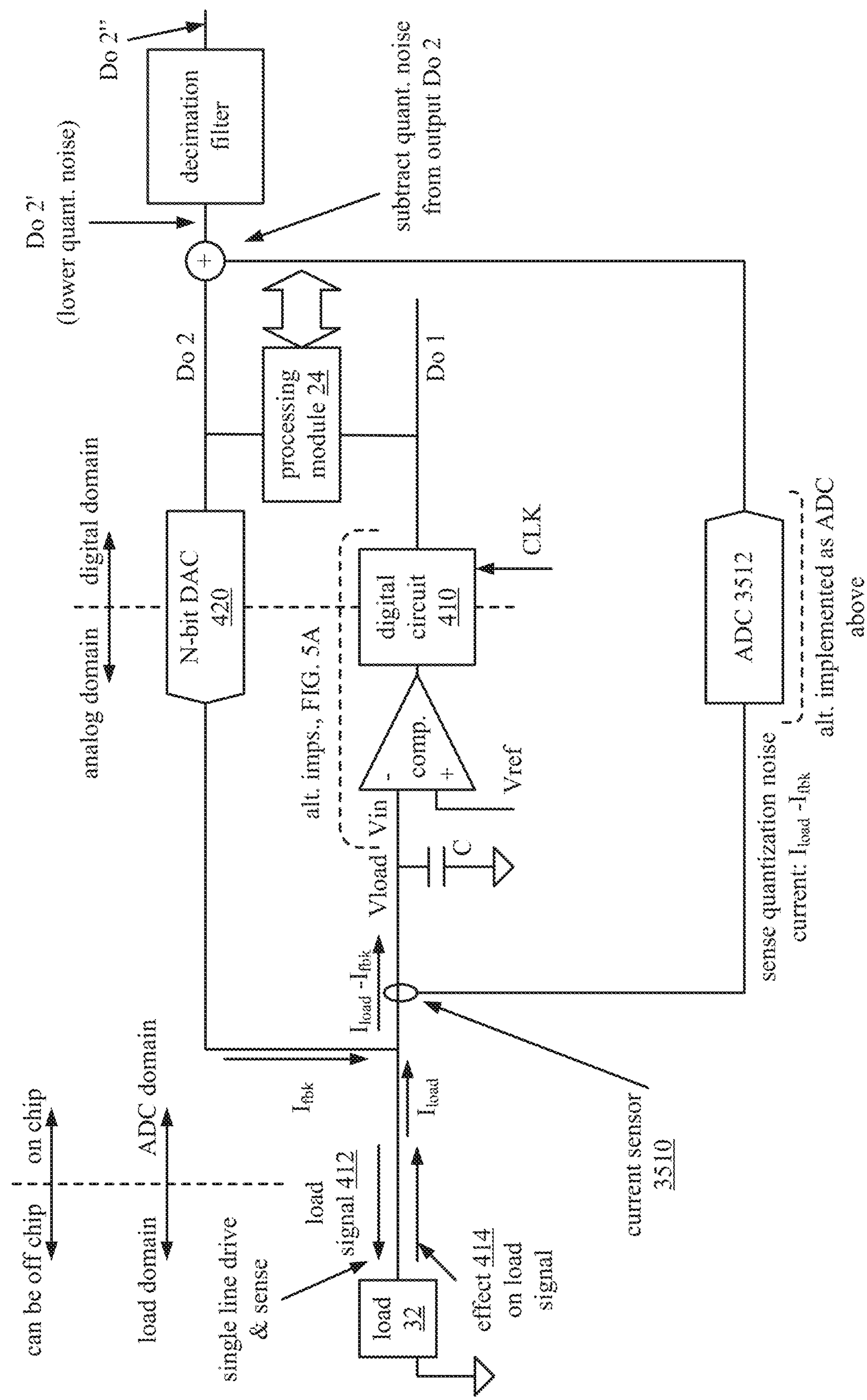
Figure 35B:
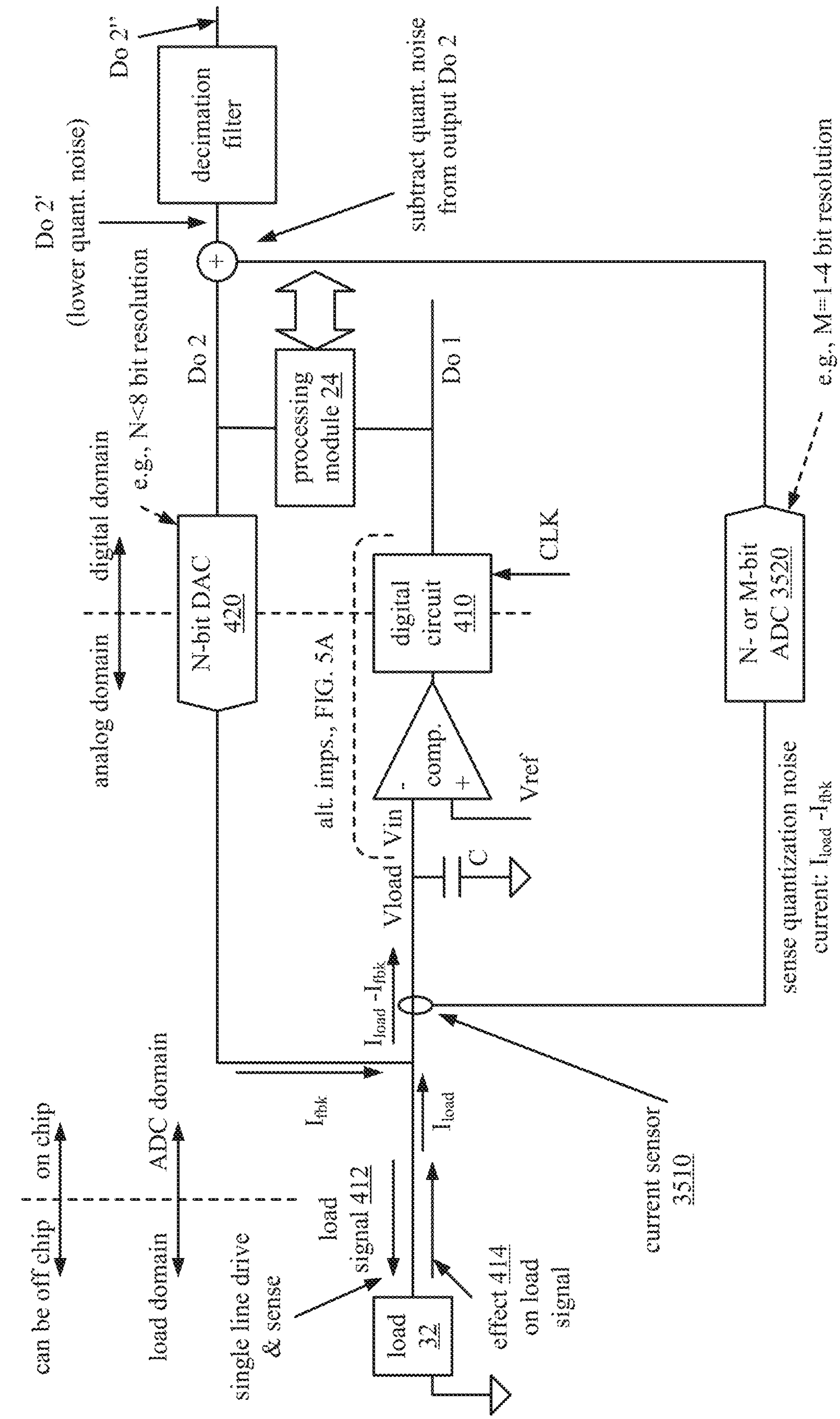
Figure 35C:
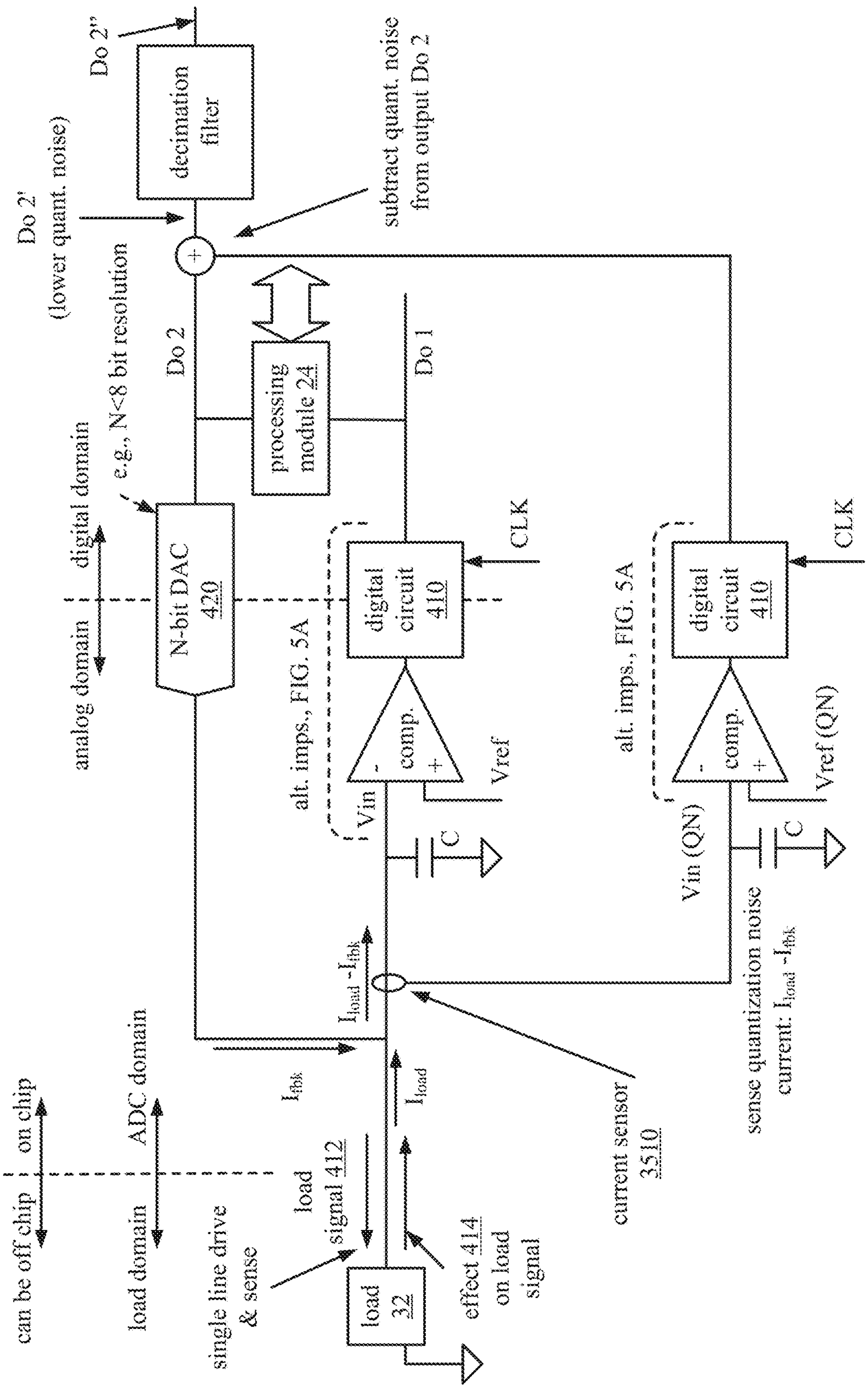
Figure 35D:
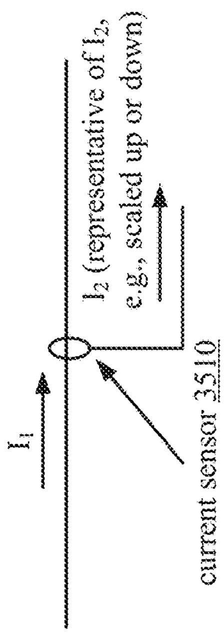
Figure 35E:
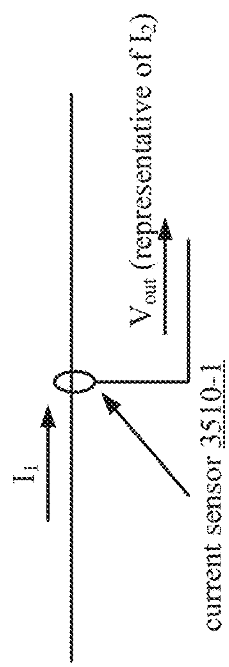
Figure 35F:
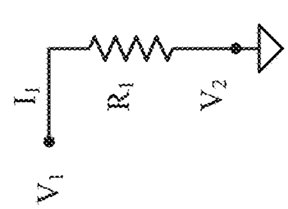
Figure 35G:
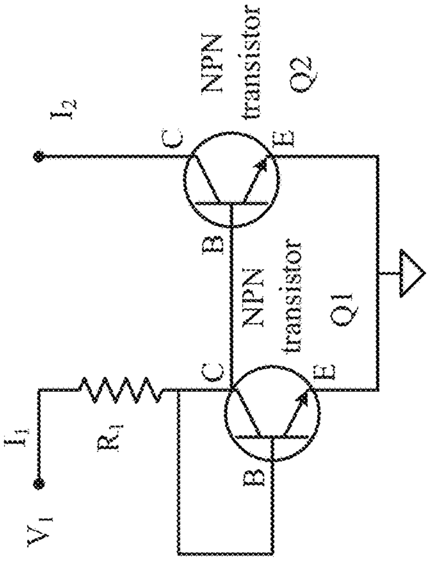
Figure 35H:
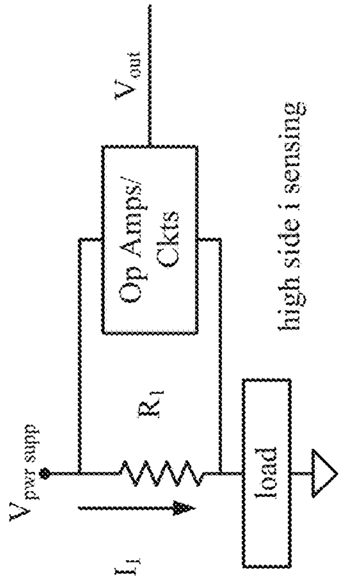
Figure 35I:
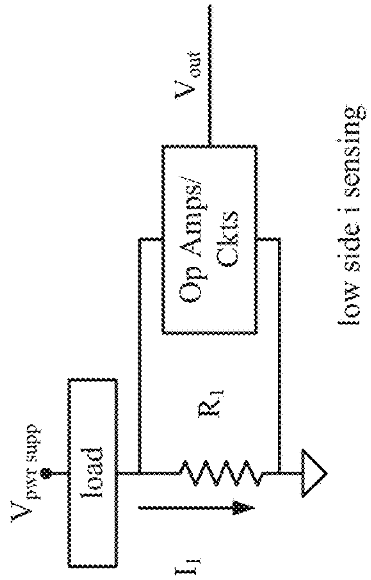
Figure 35J:
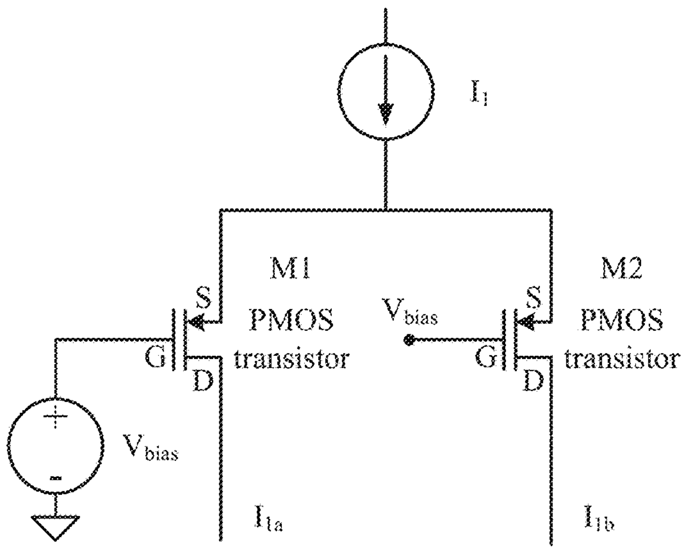
Figure 35K:
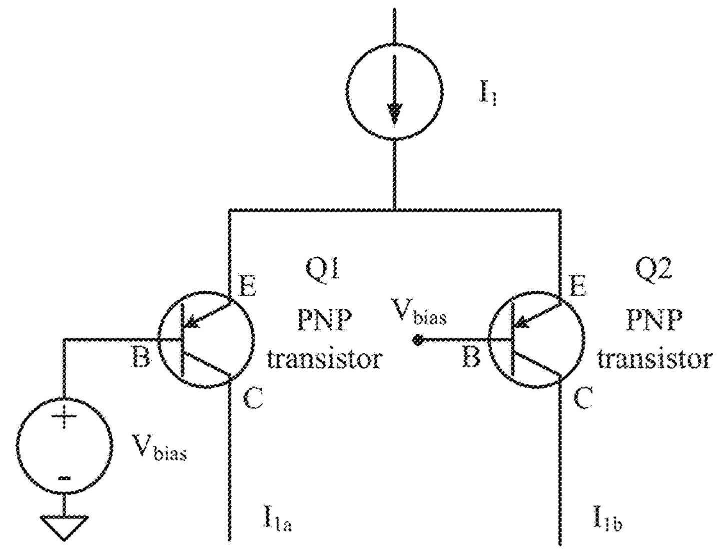
Figure 35L:
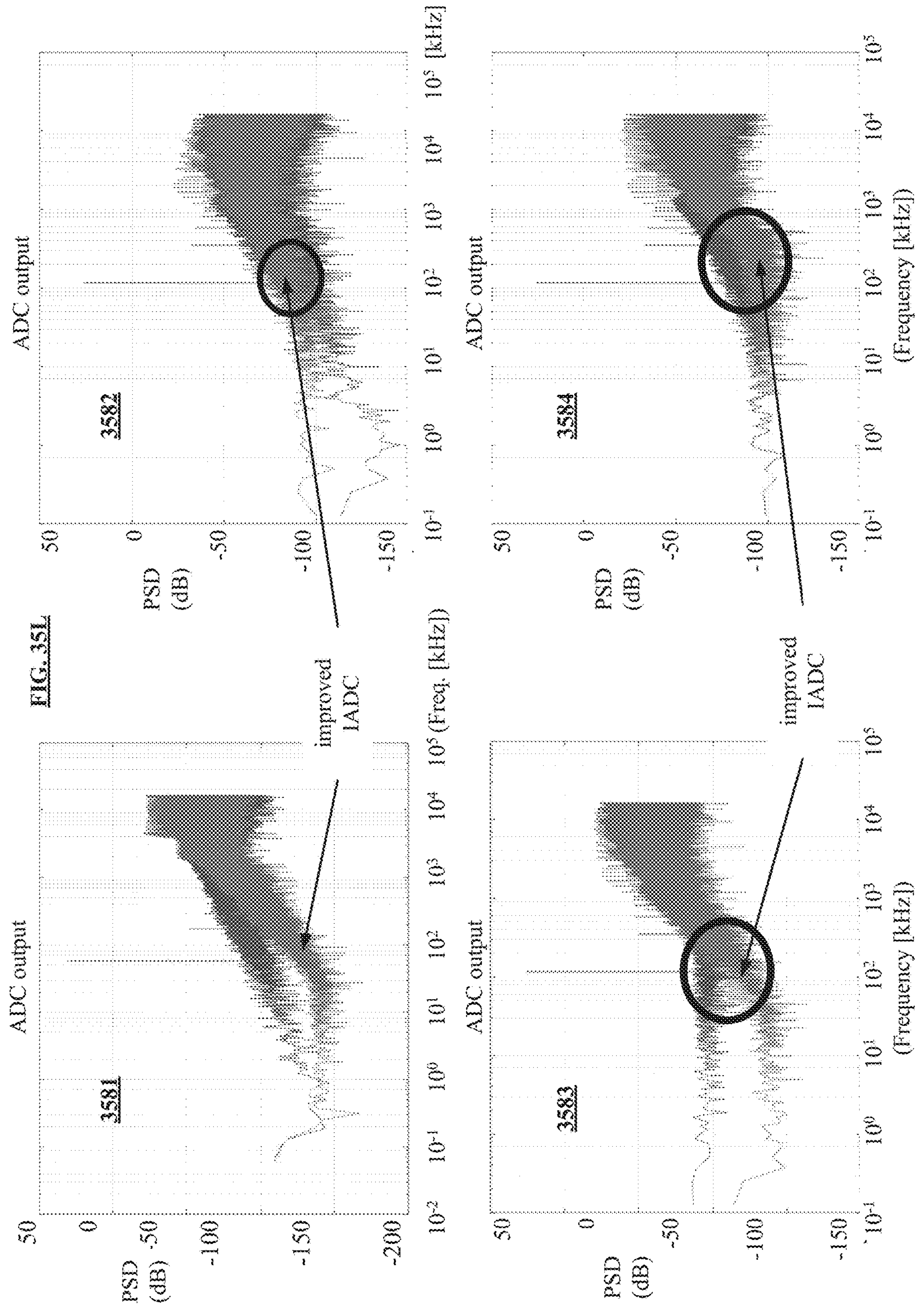
Figure 36A:
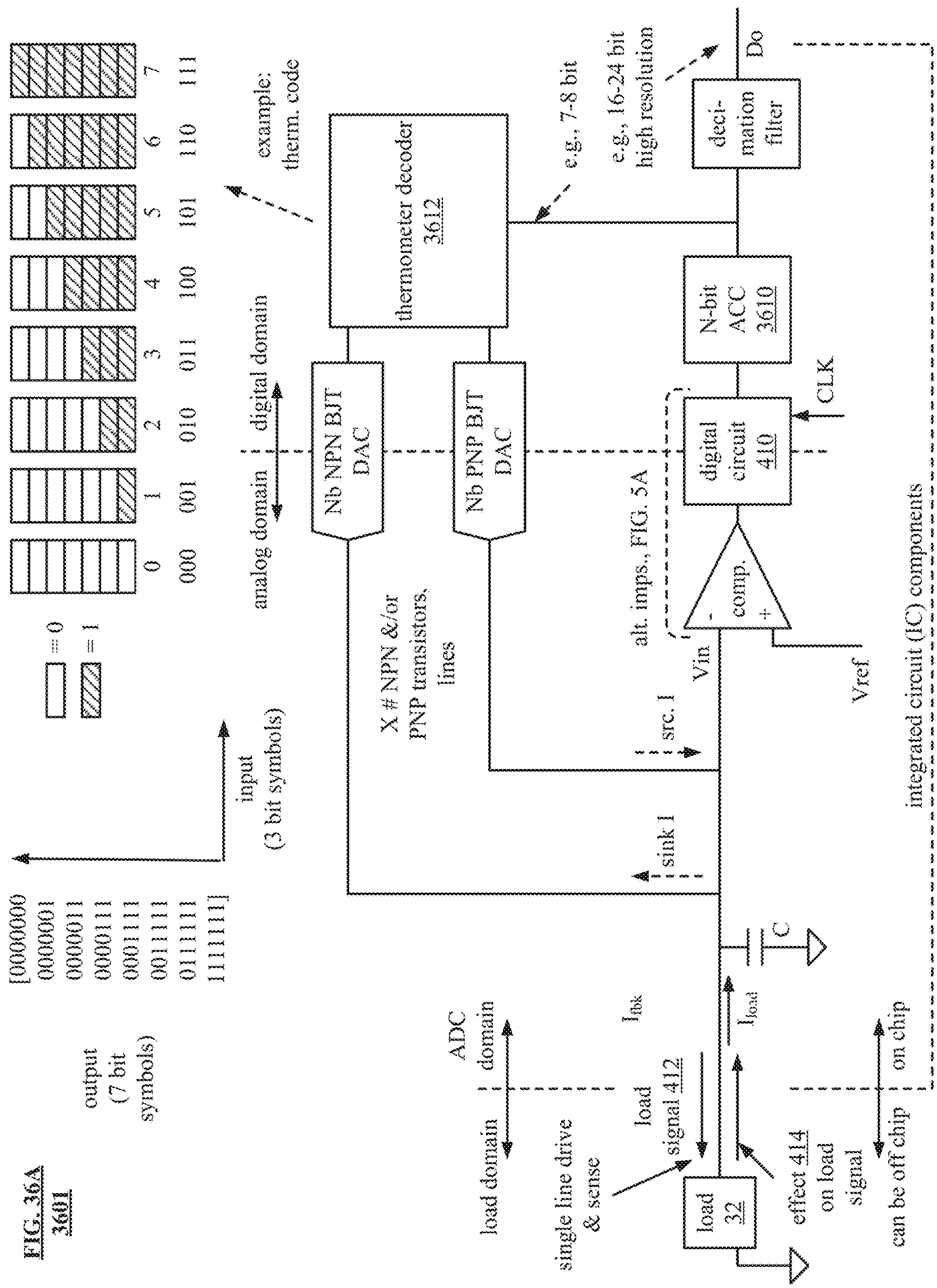
Figure 36C:
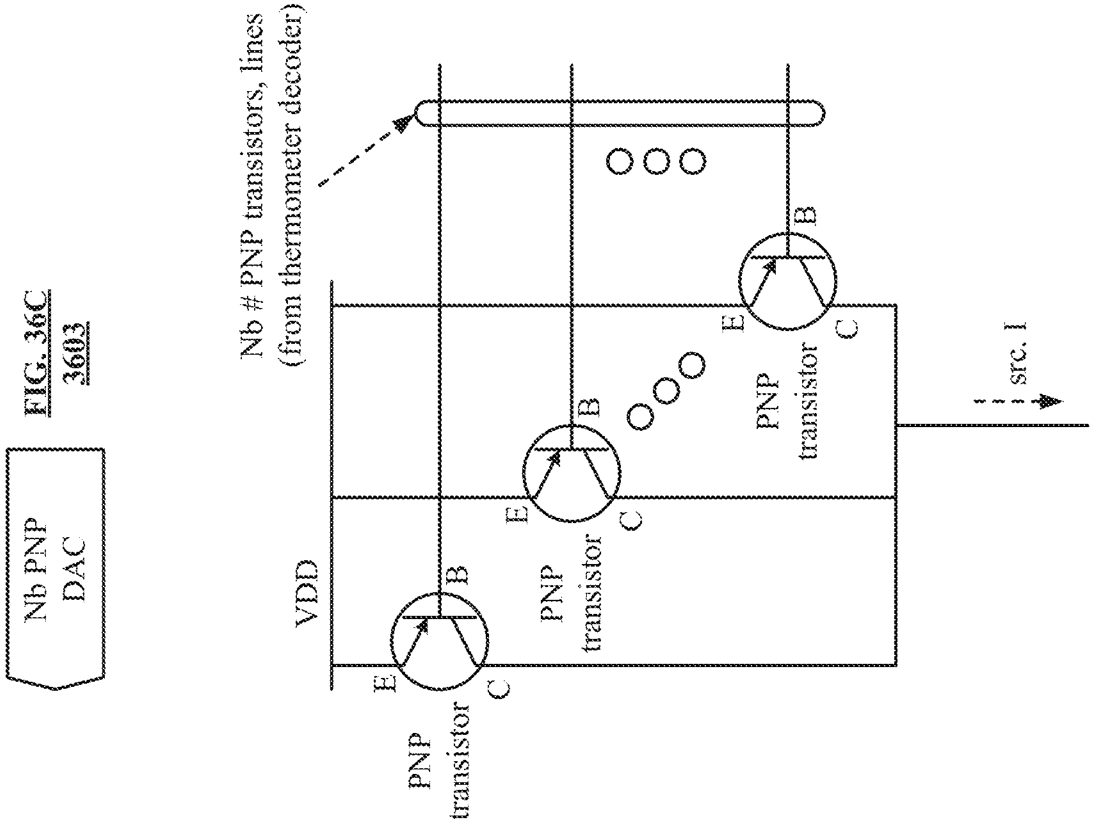
Figure 36B:
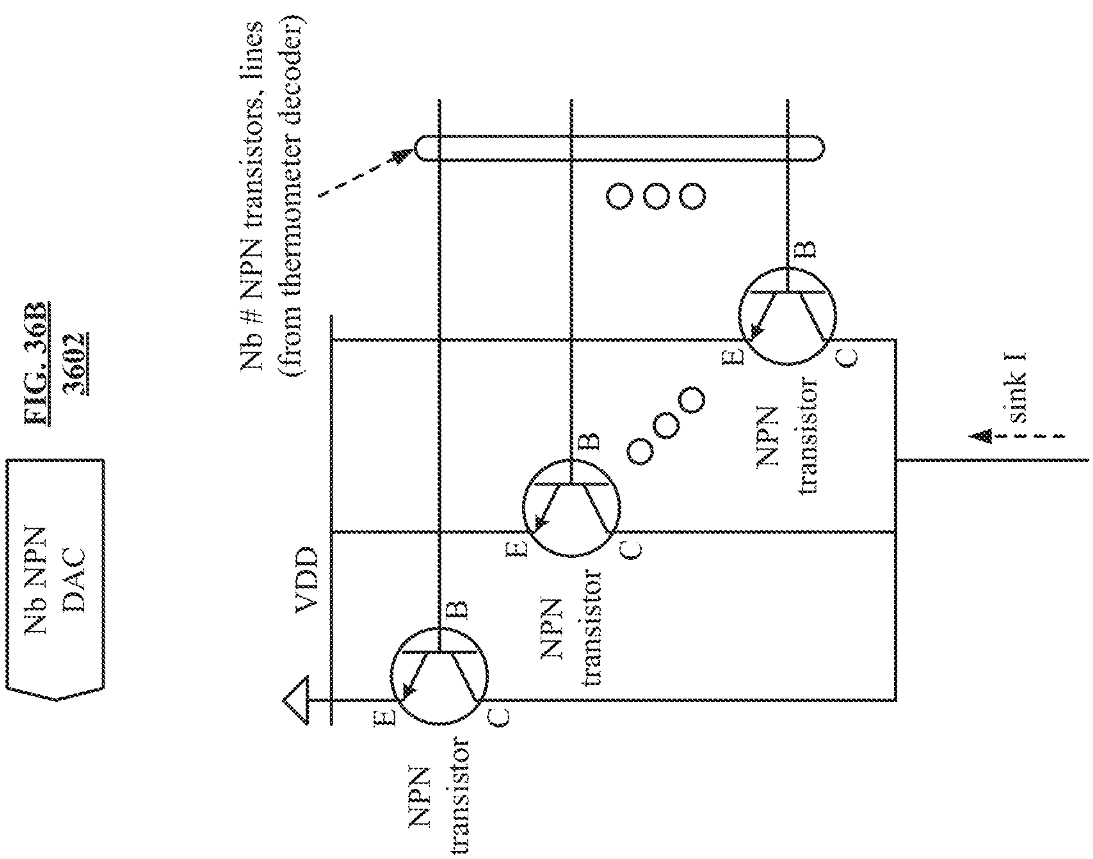
Figure 36D:
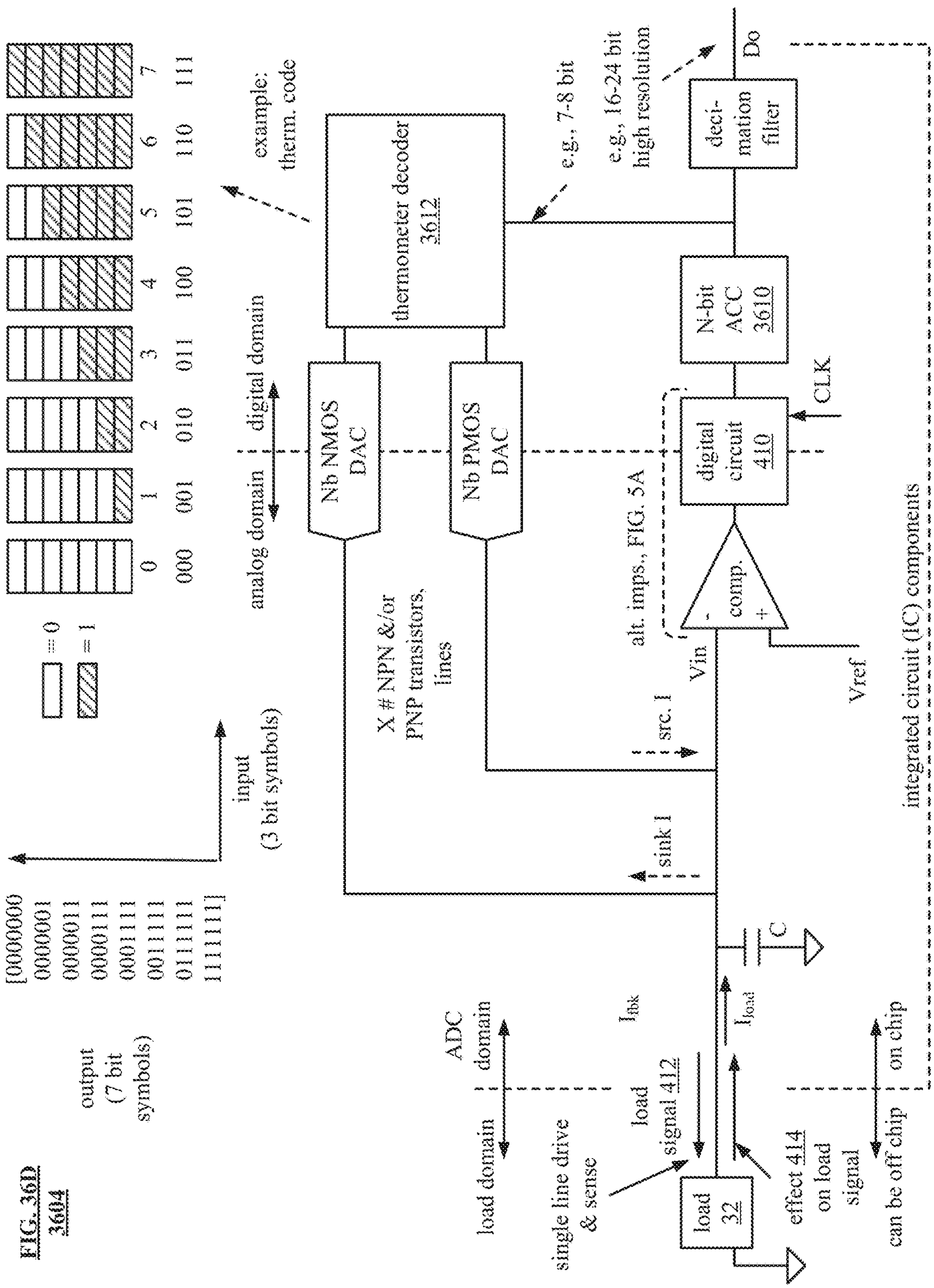
Figure 36F:
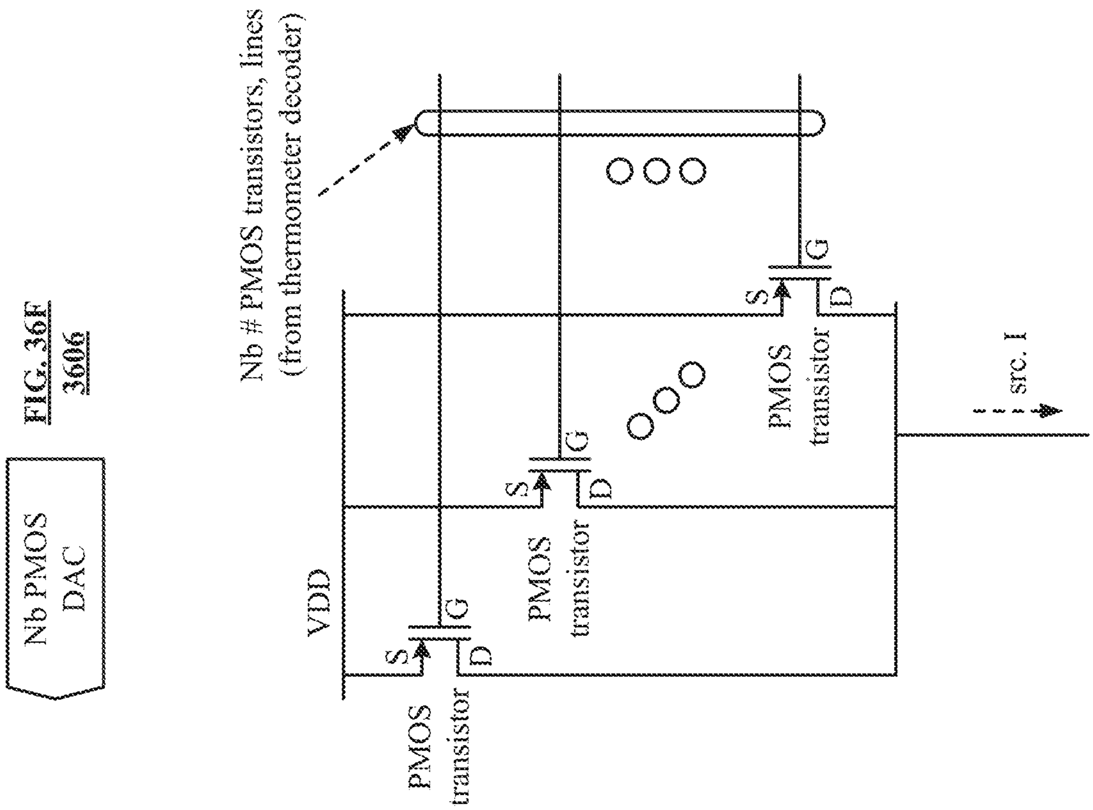
Figure 36E:
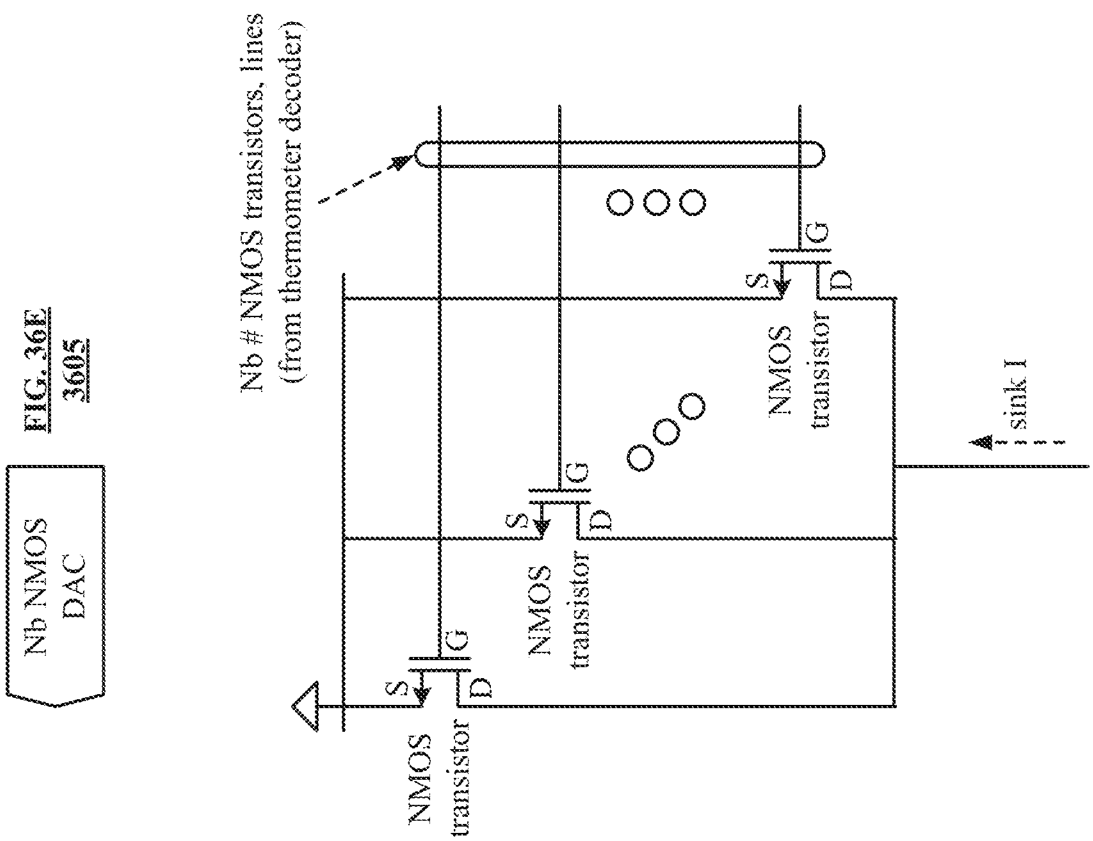
Figure 36G:
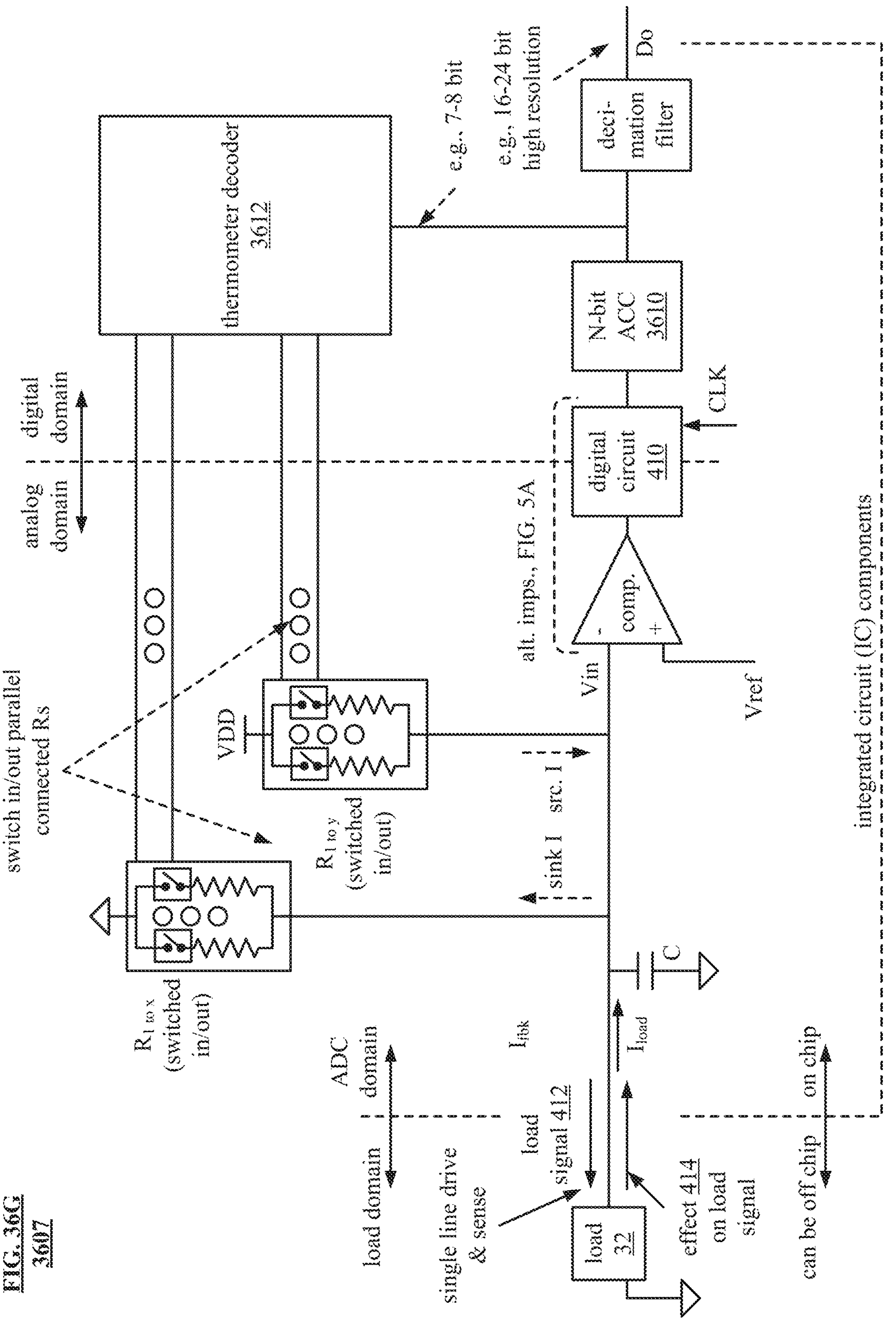
Figure 37A:
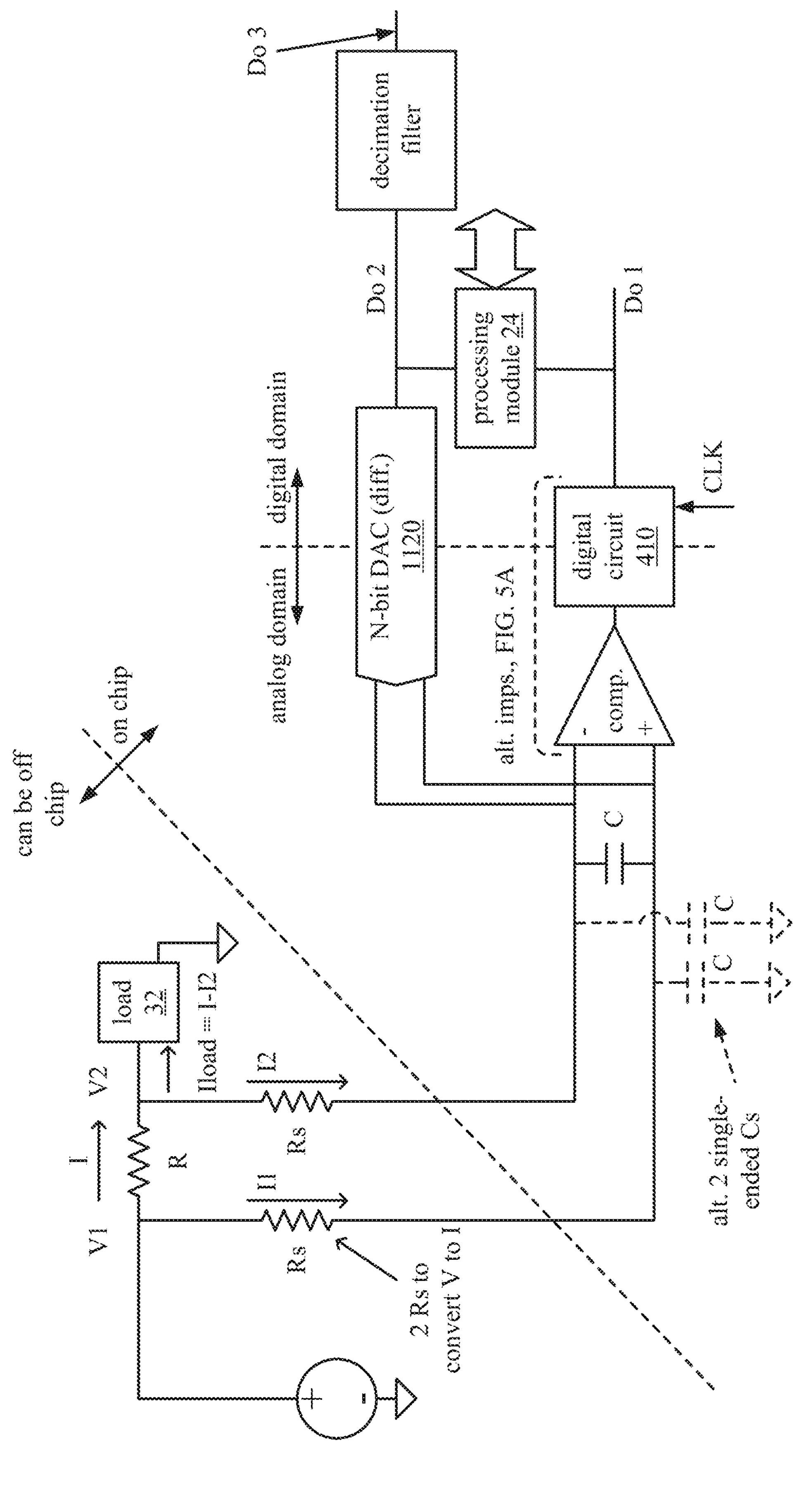
Figure 37B:
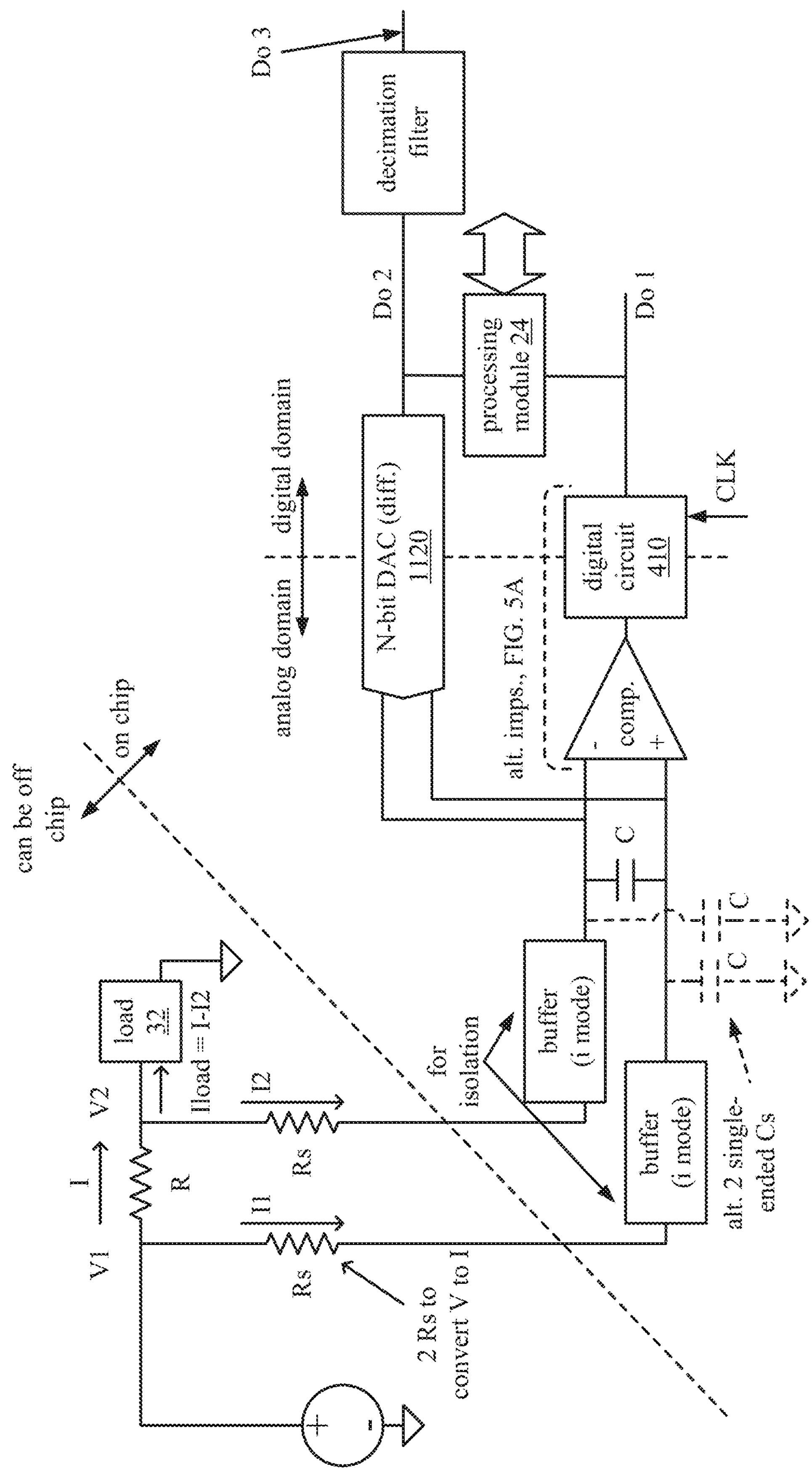
Figure 37C:
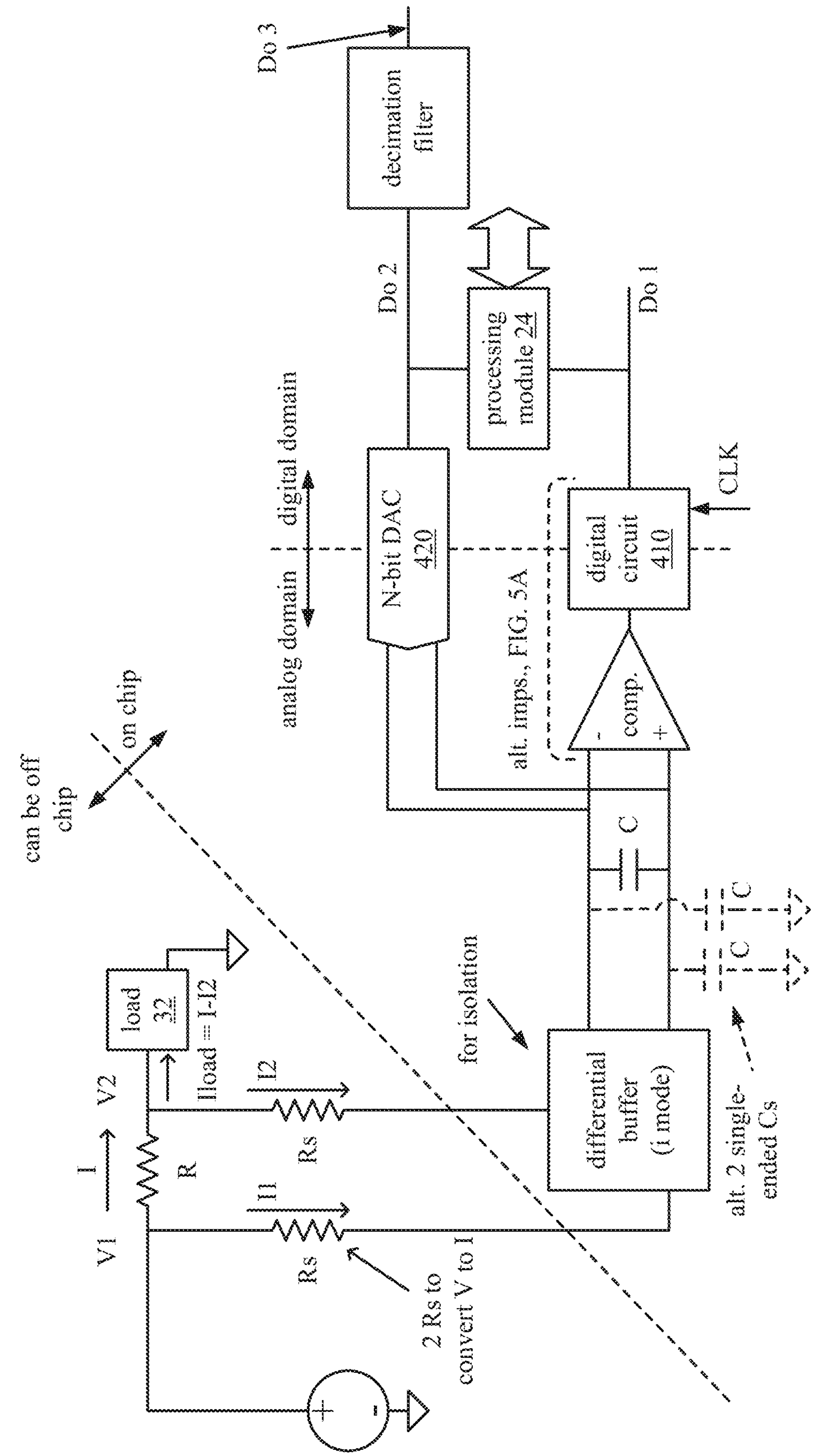
Figure 38A:
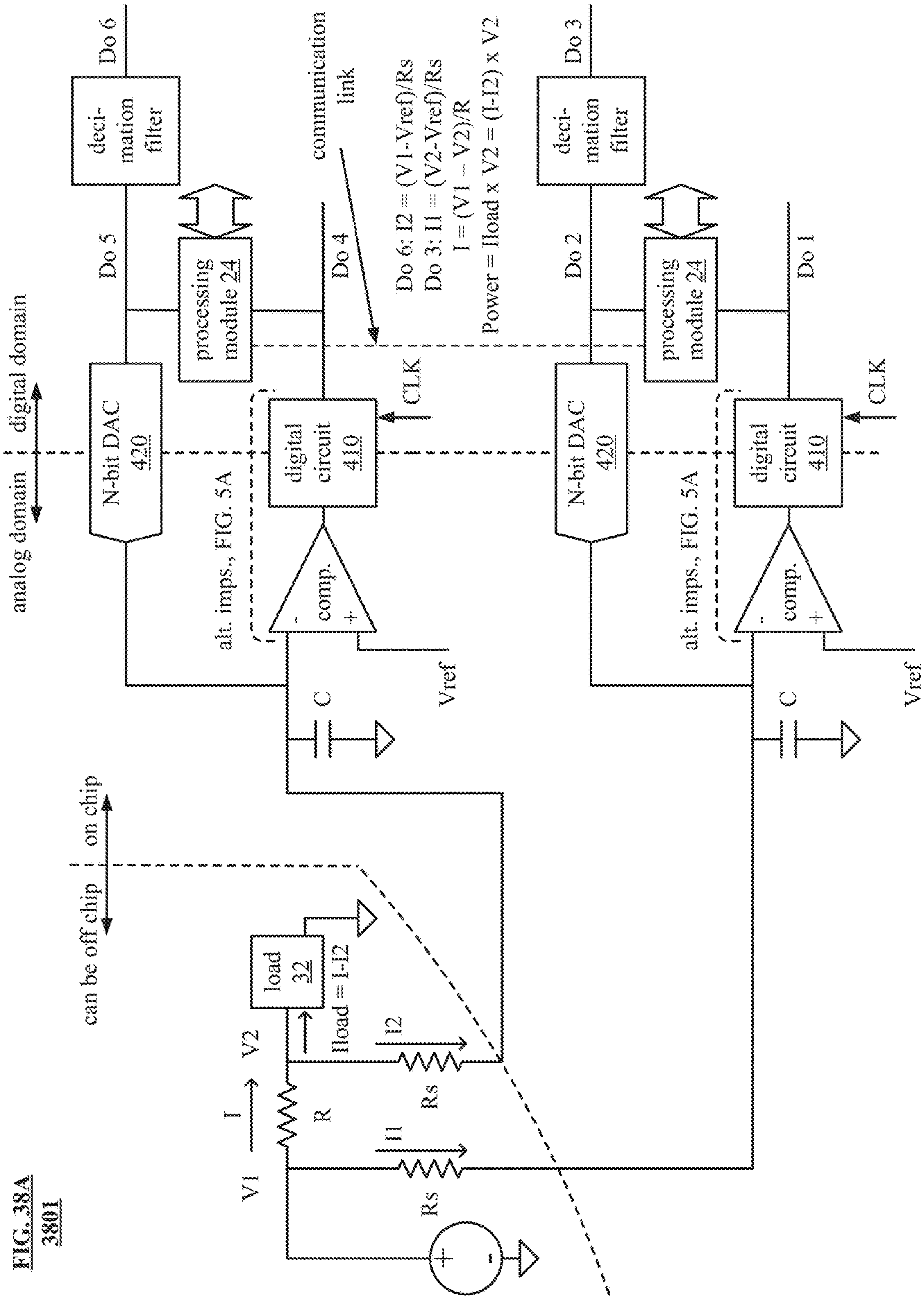
Figure 38B:
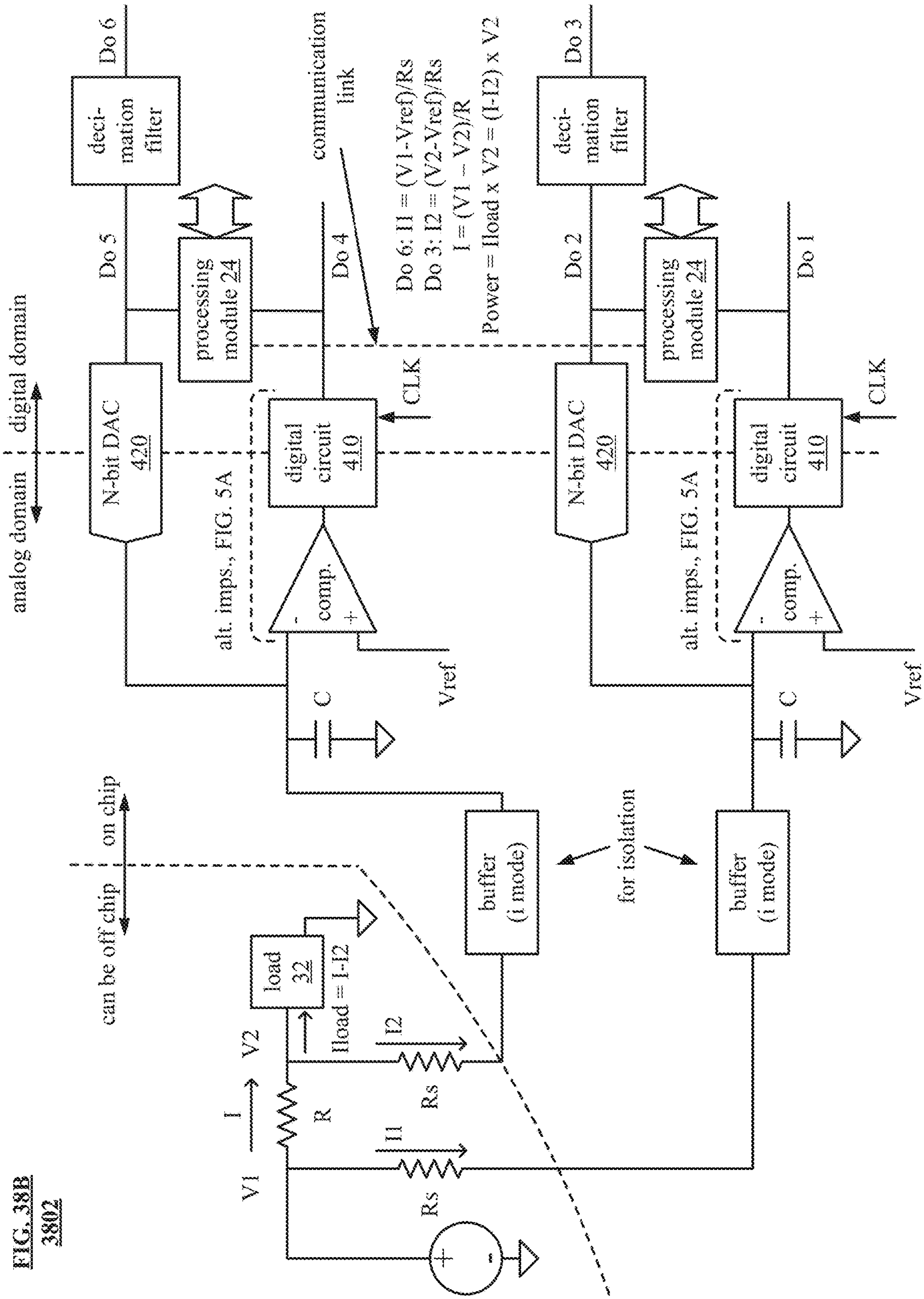
Figure 39A:
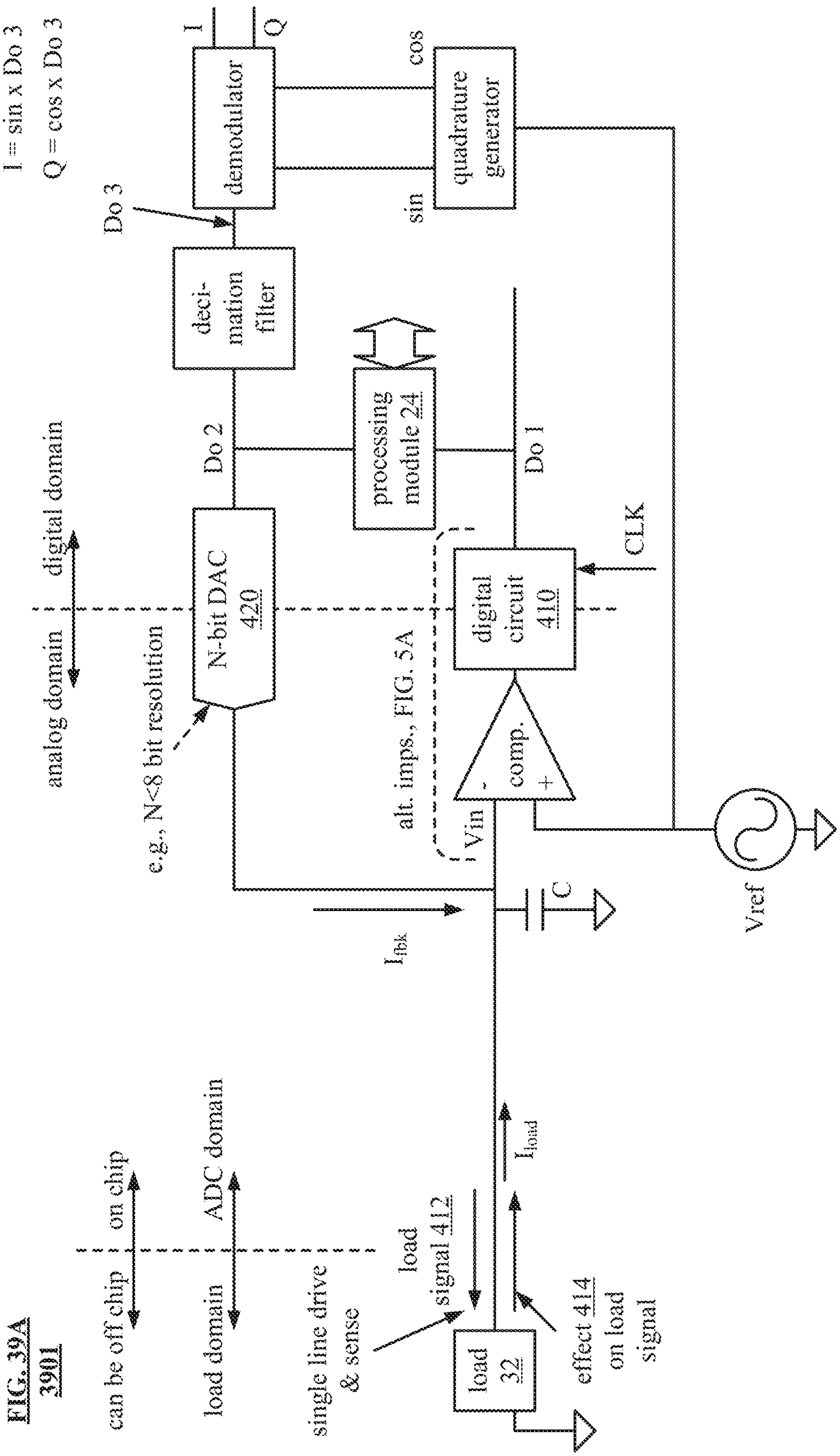
Figure 39B:
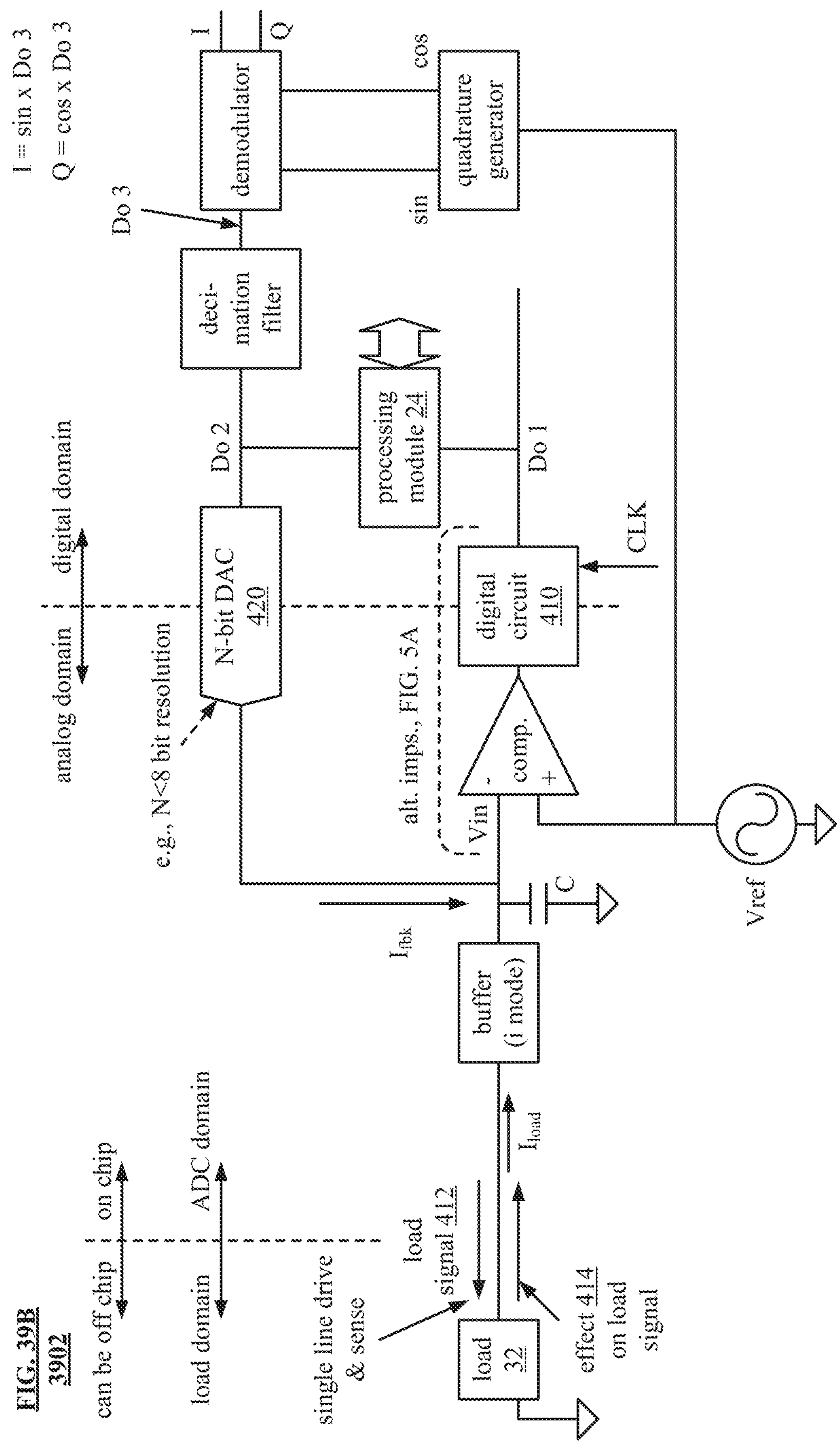
Figure 40A:
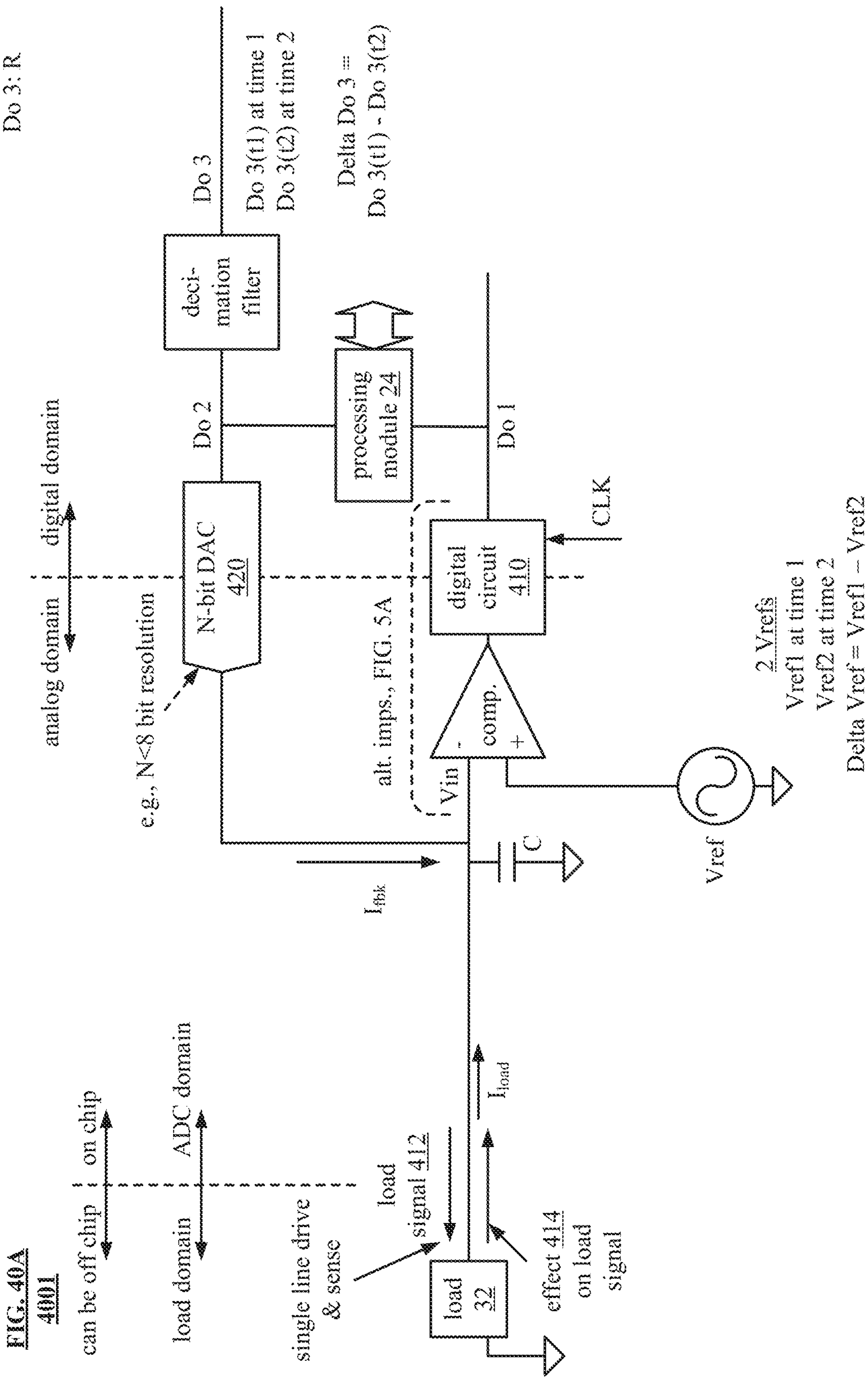
Figure 40B:
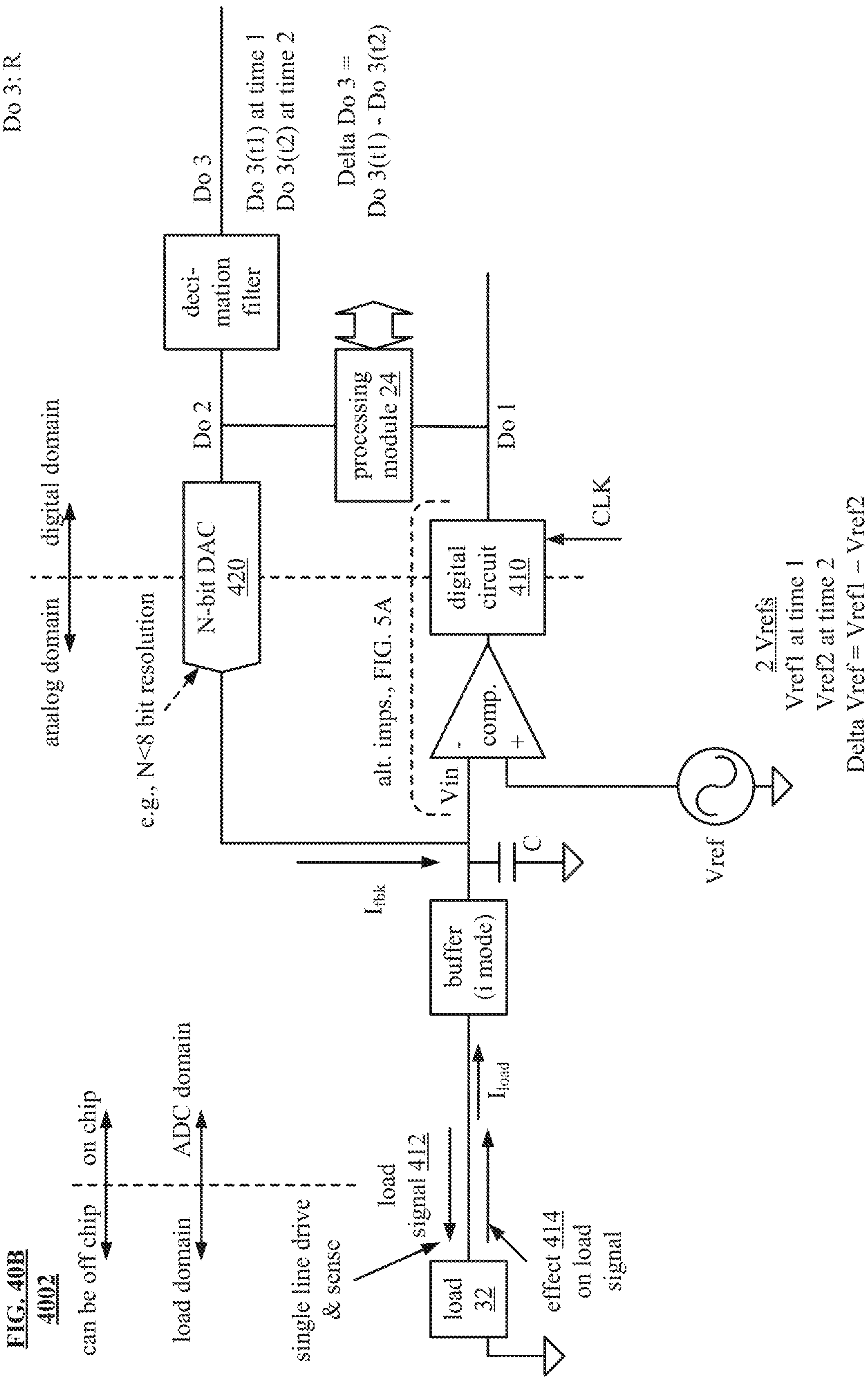
Figure 41A:
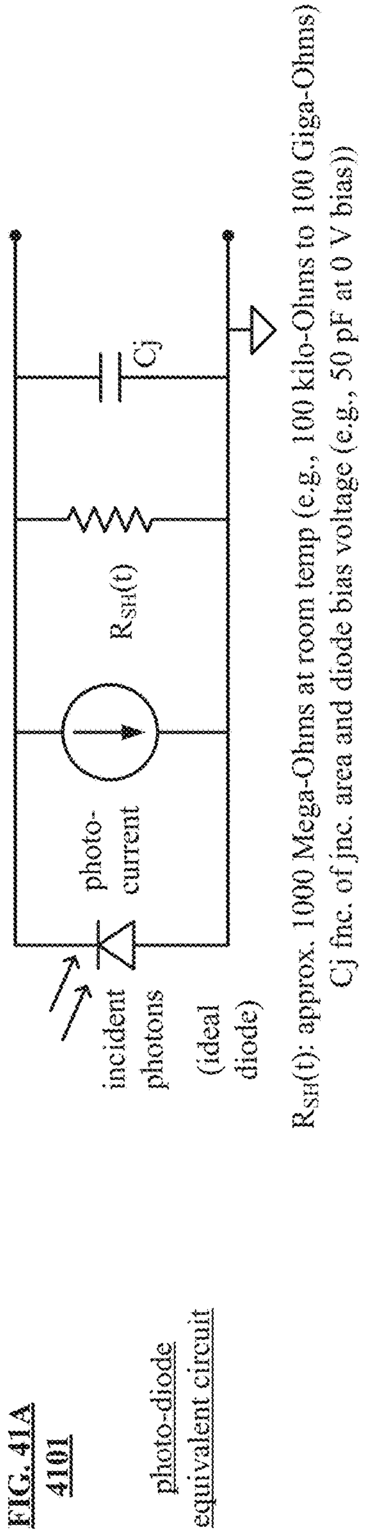
Figure 41B:
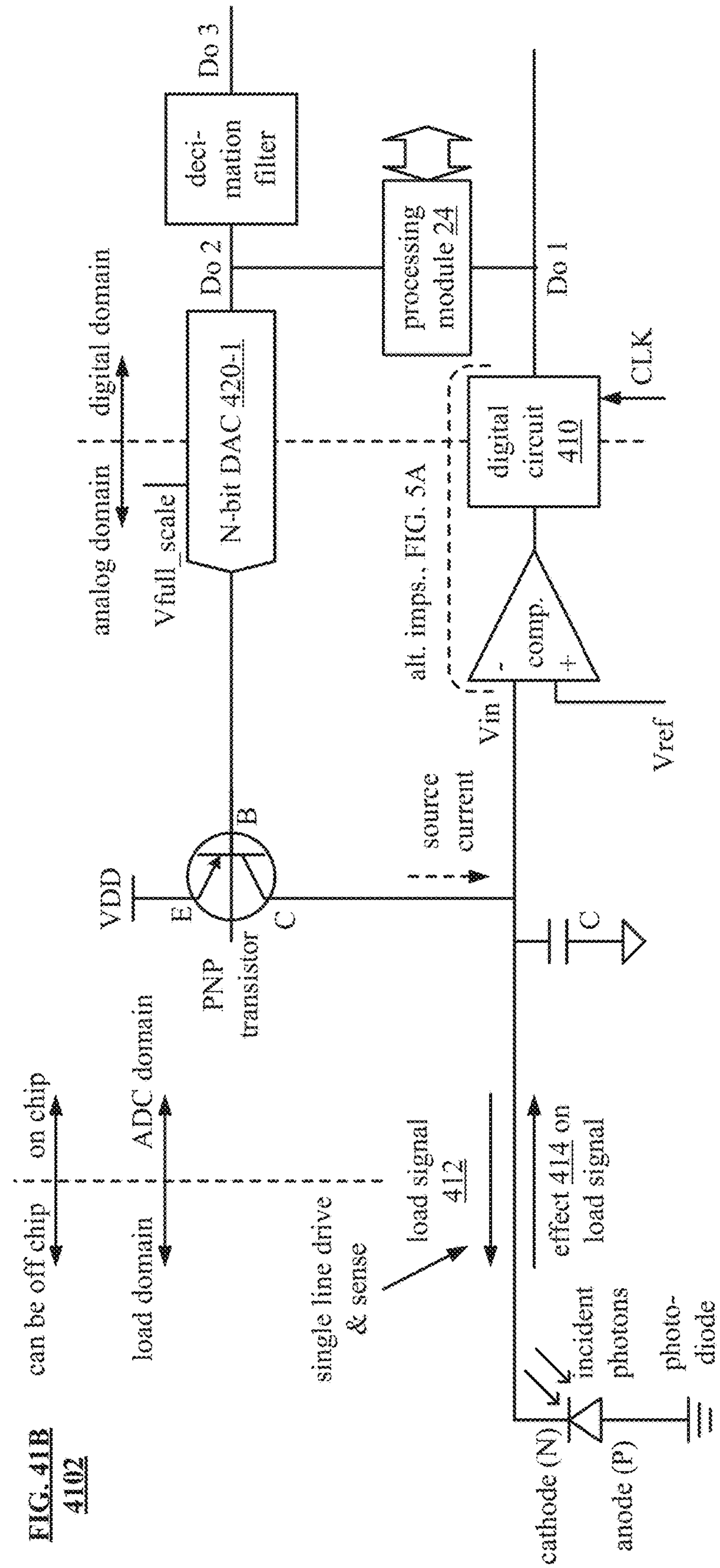
Figure 41C:
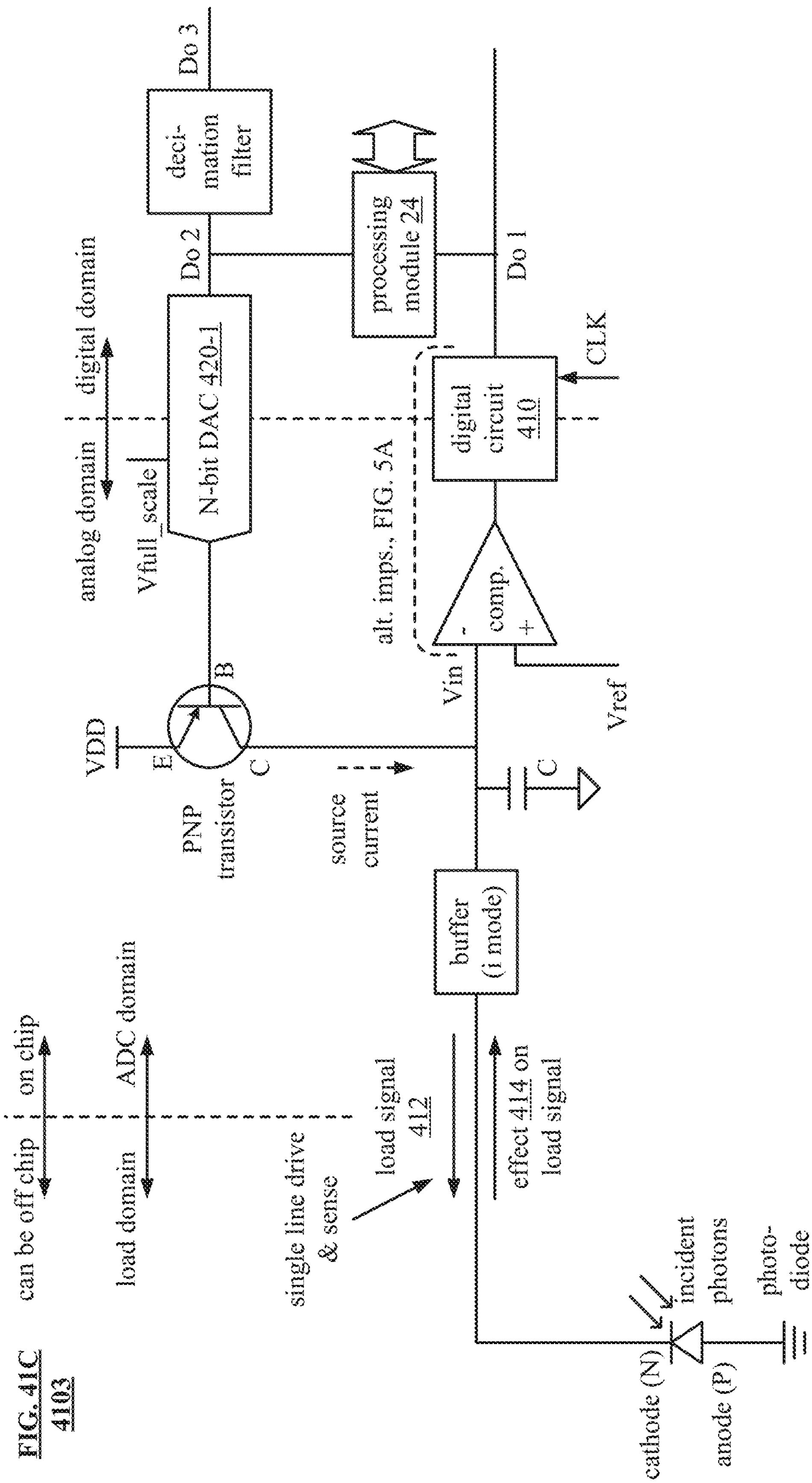
Figure 42A:
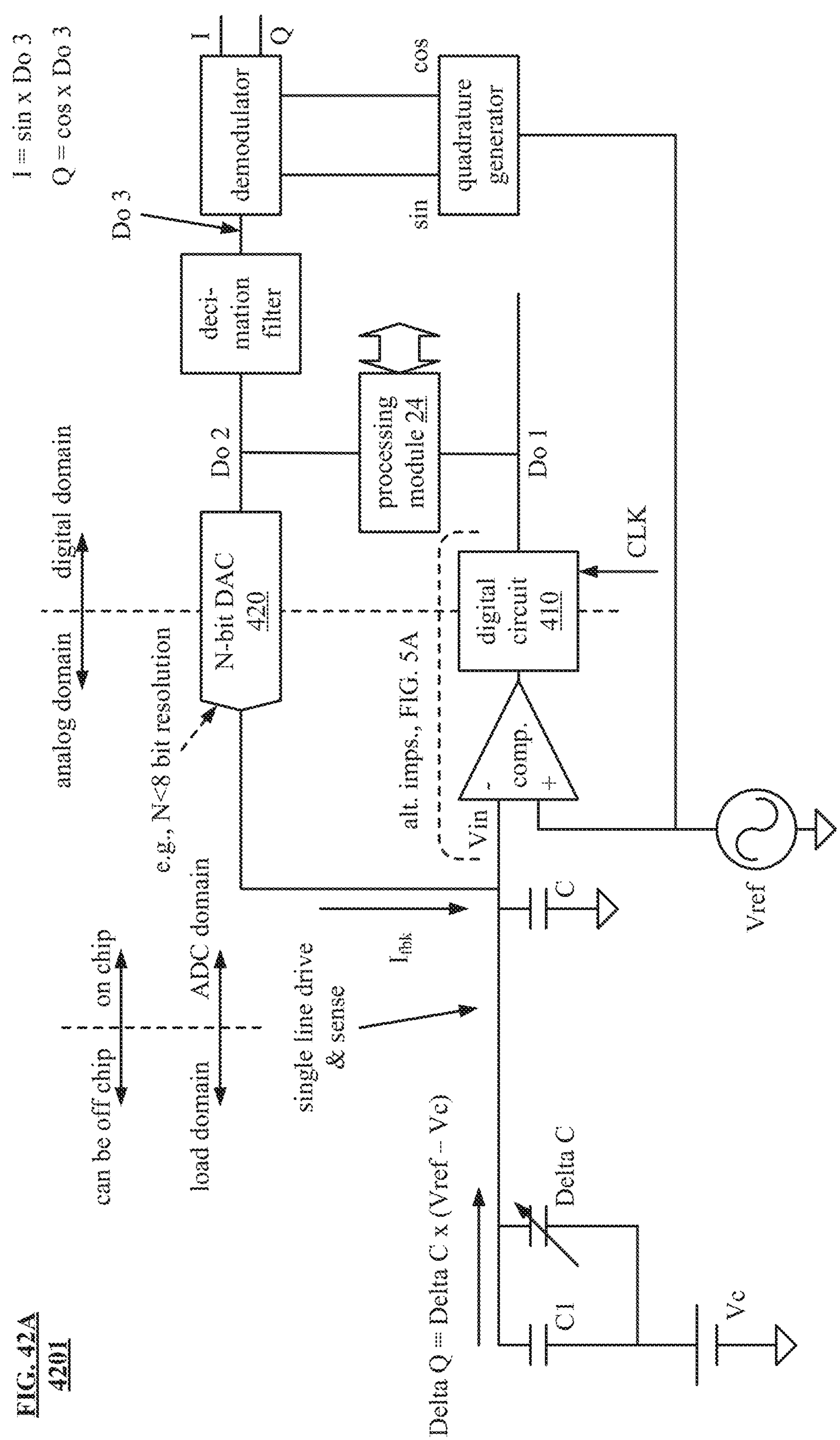
Figure 42B:
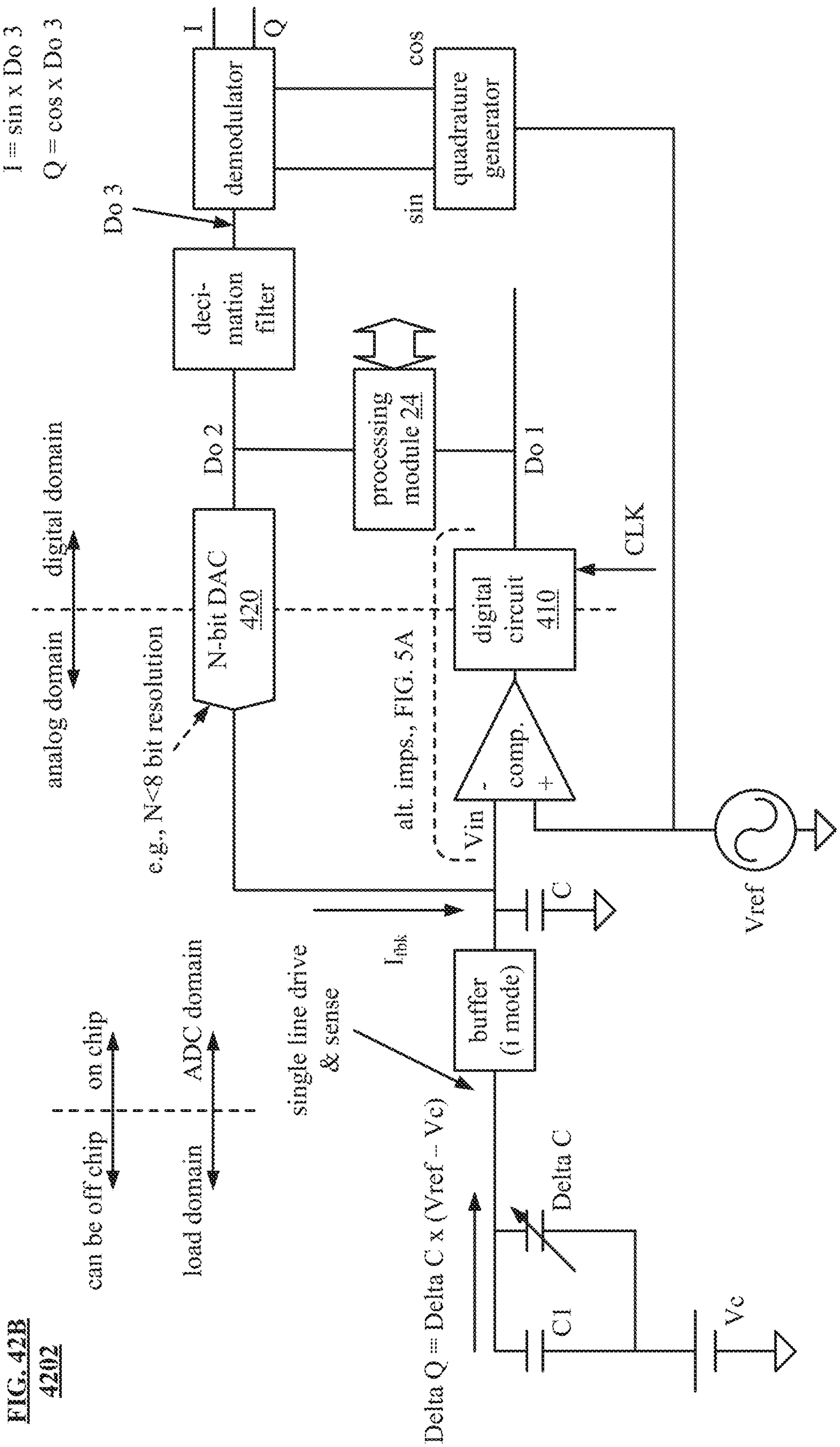
Figure 43A:
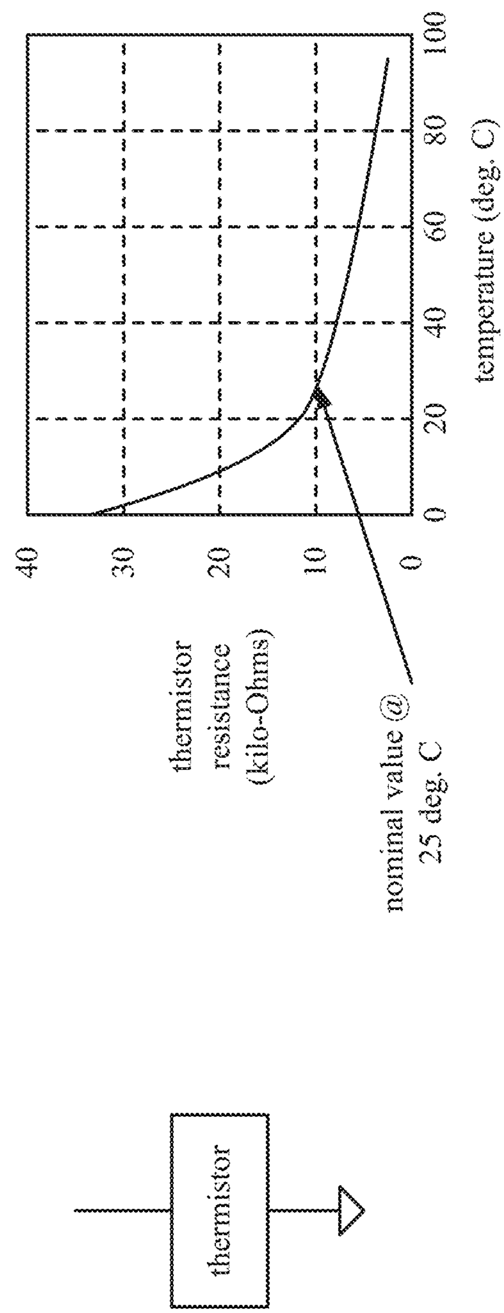
Figure 44A:
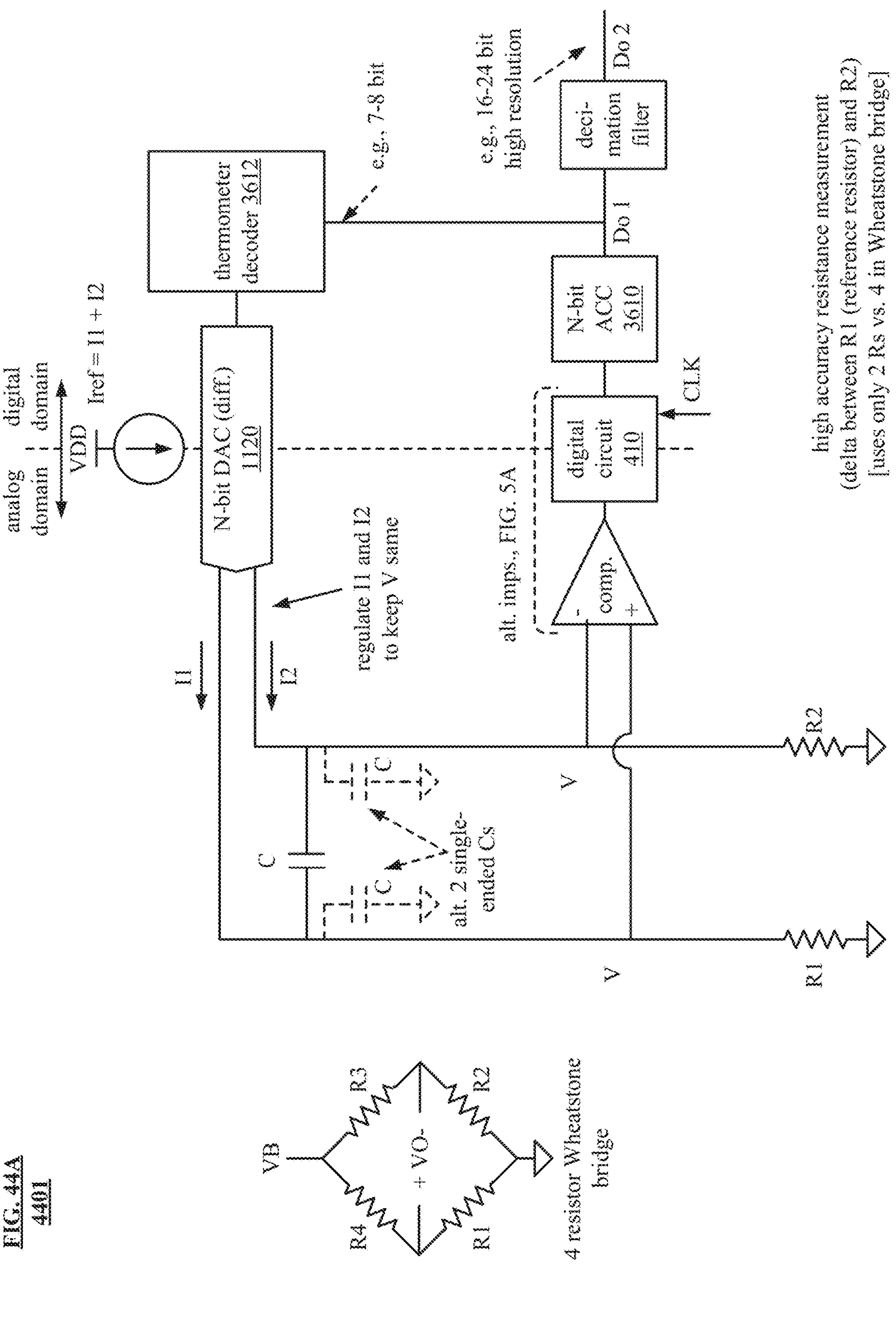
Figure 44B:
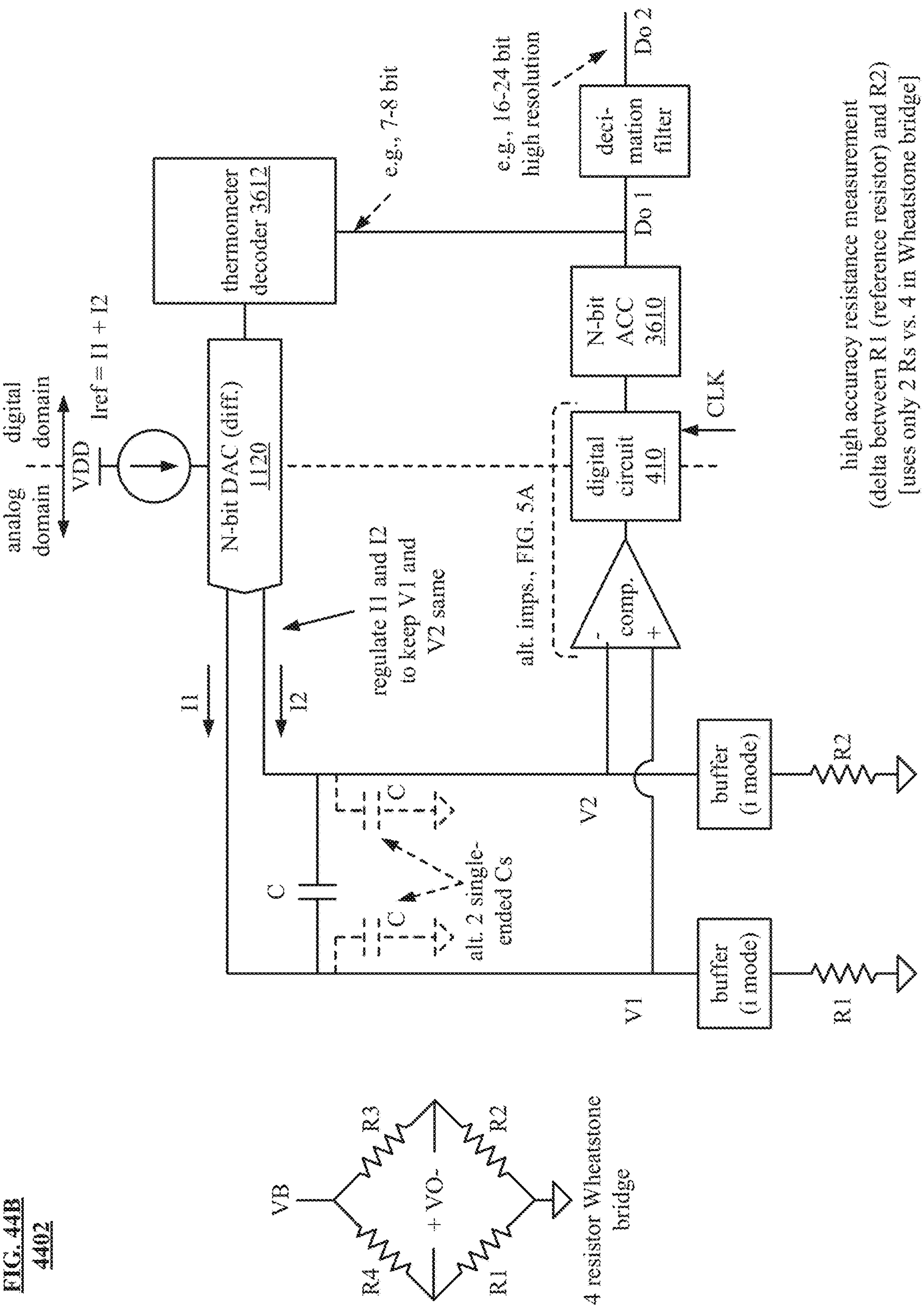
Figure 44C:
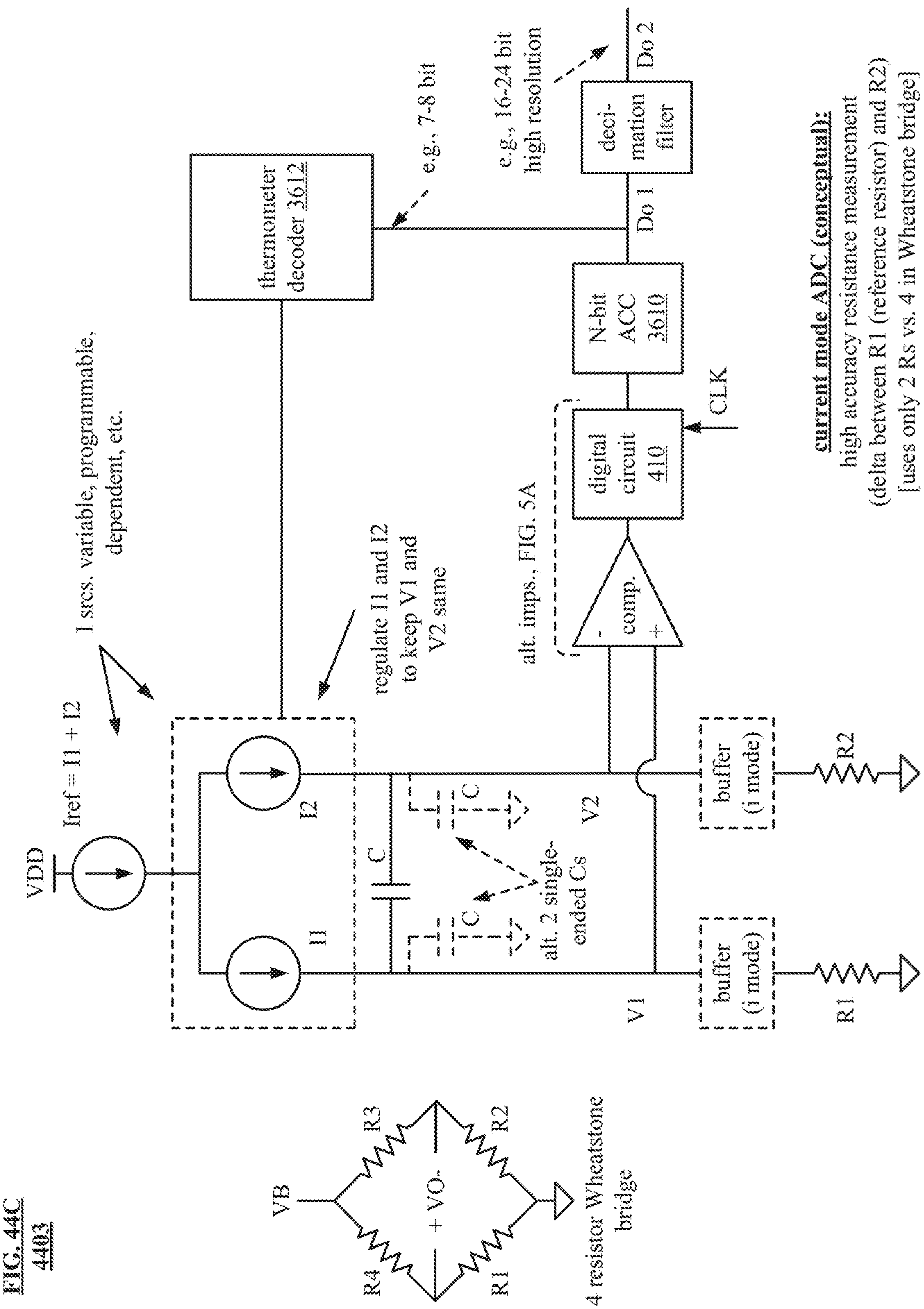
Figure 45A:
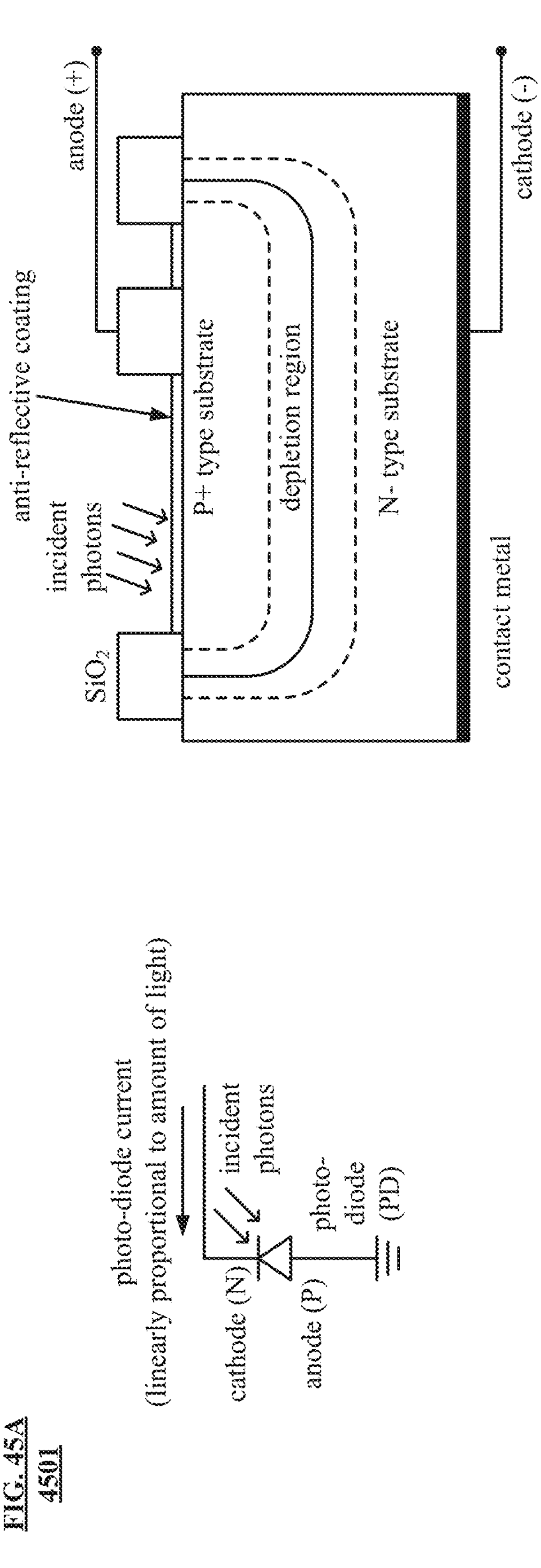
Figure 45B:
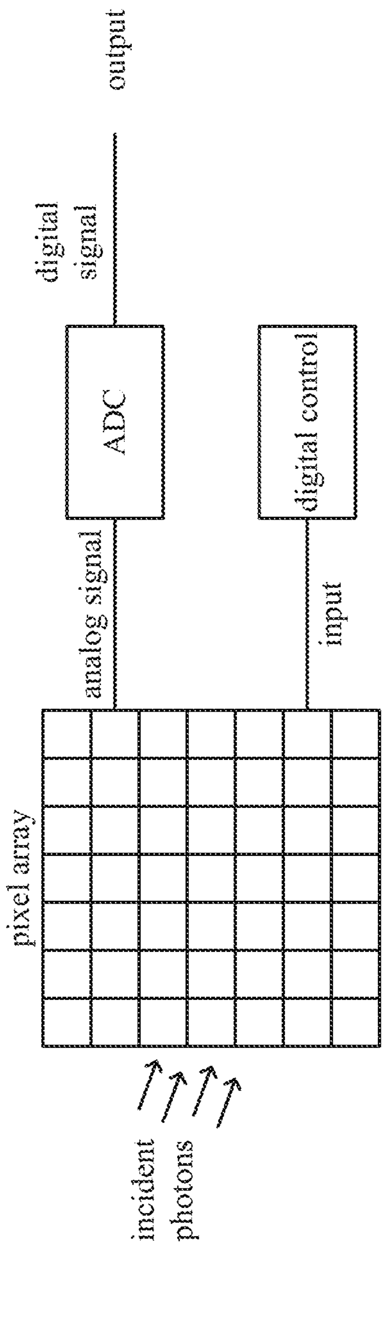
Figure 45D:
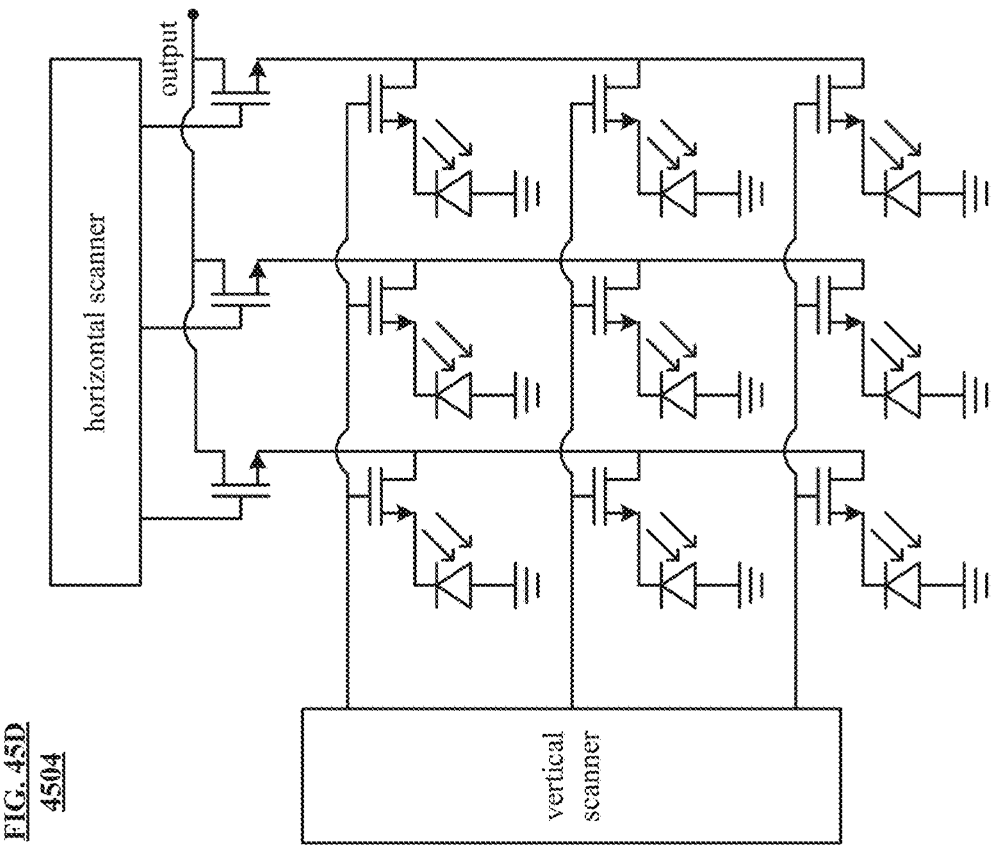
Figure 45C:
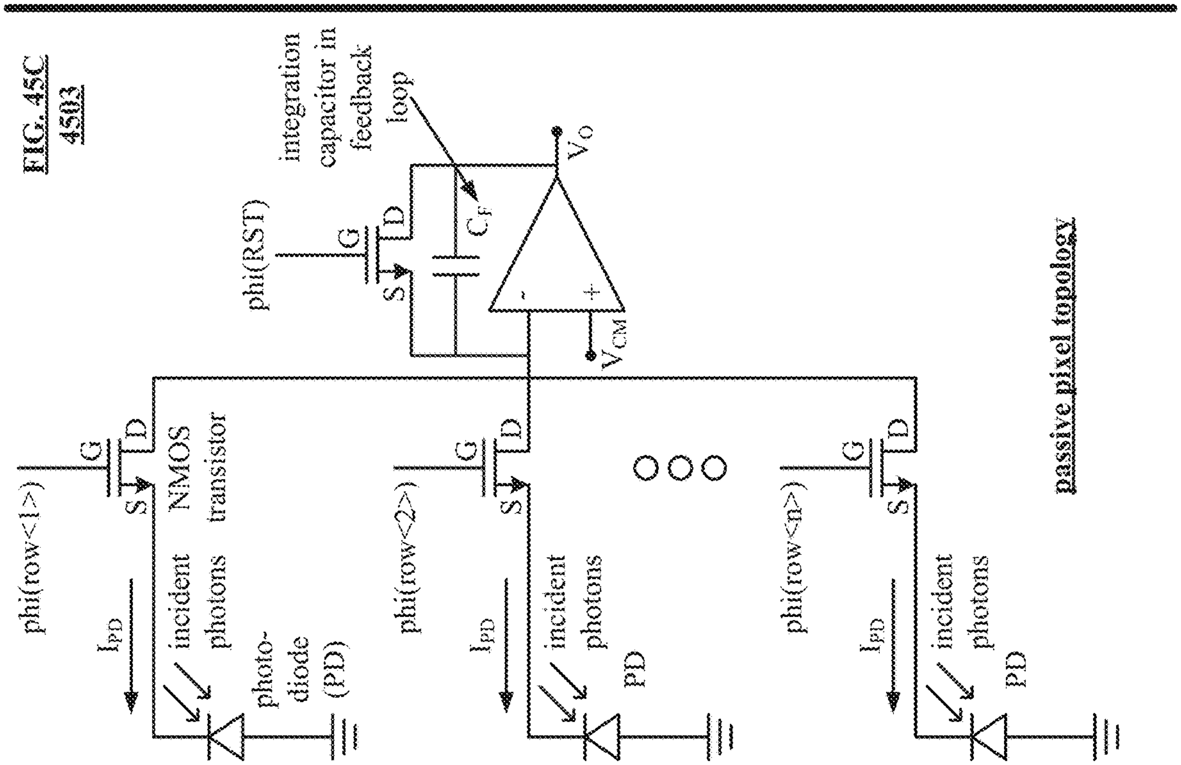
Figure 45E:
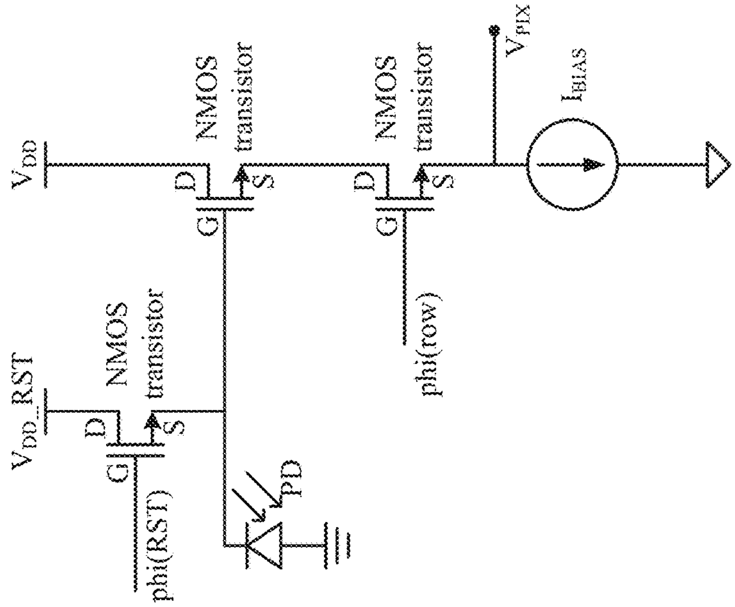
Figure 45F:
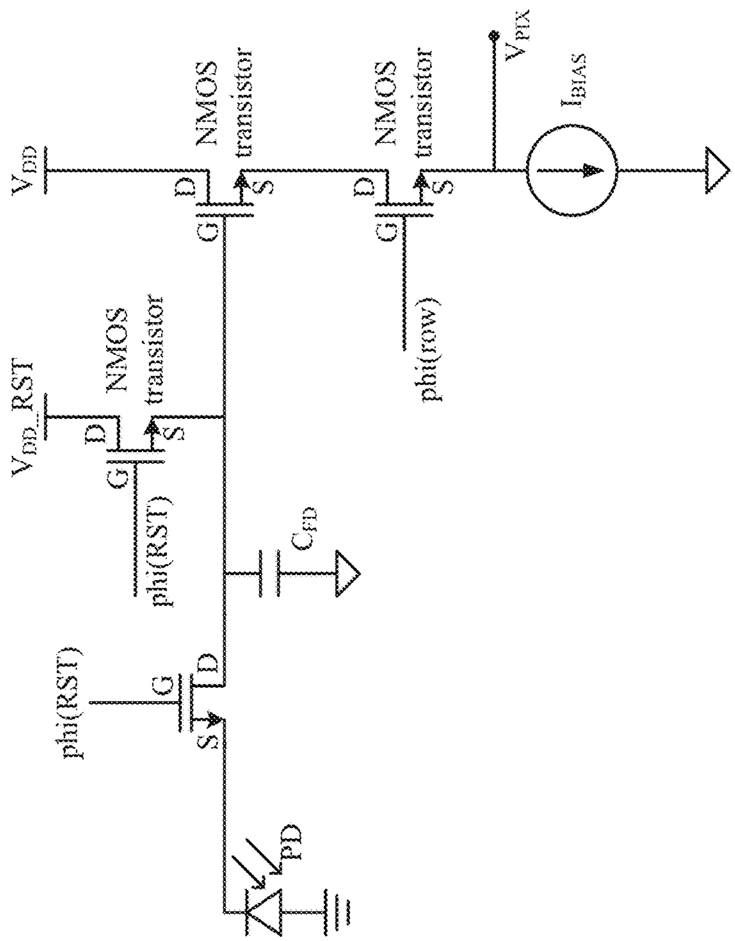
Figures 45G, 45H, 45I:
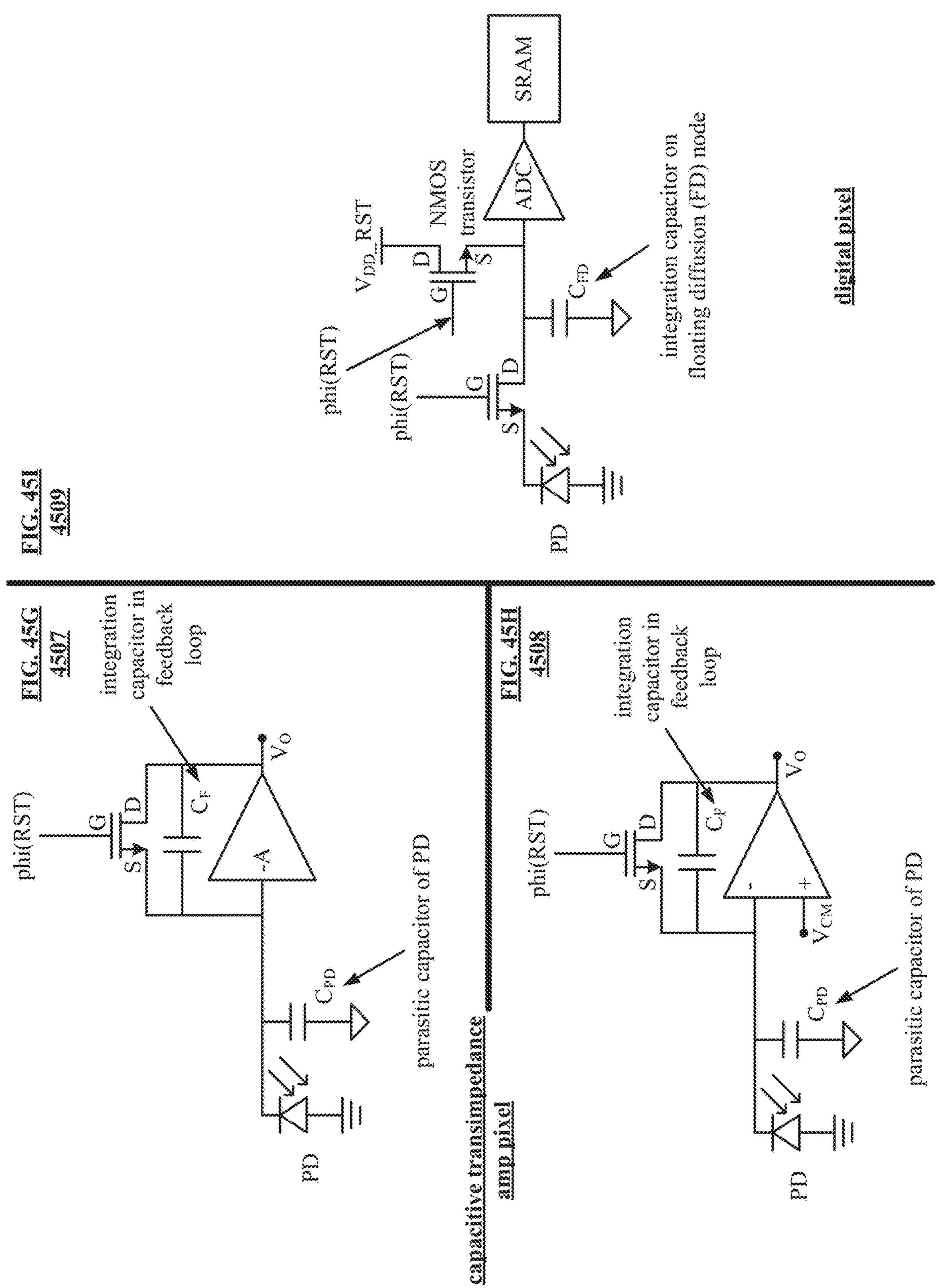
Figure 45J:
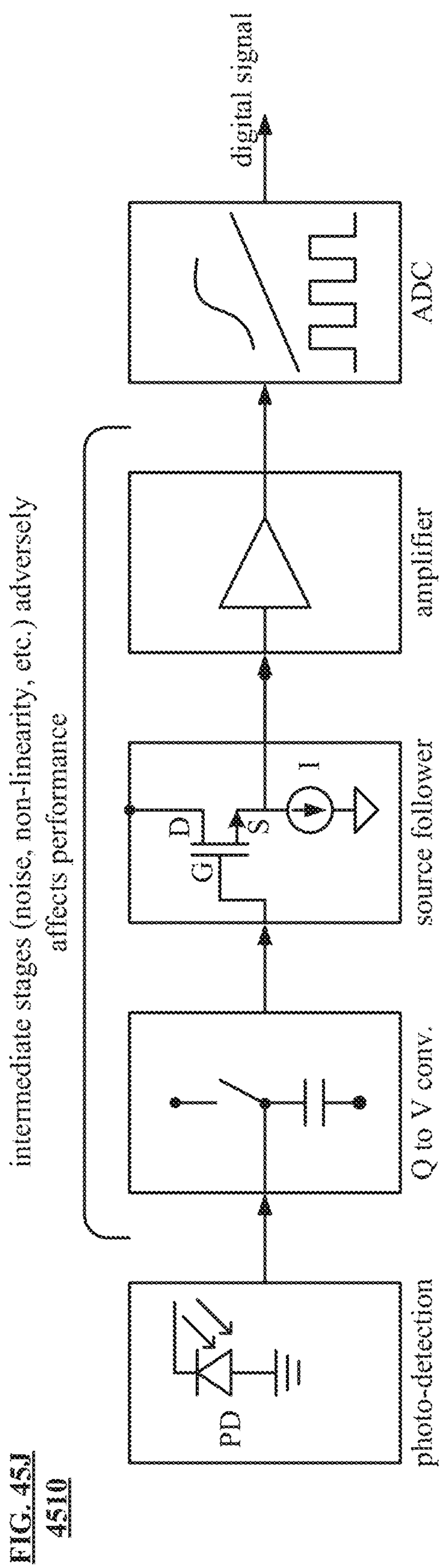
Figure 45K:
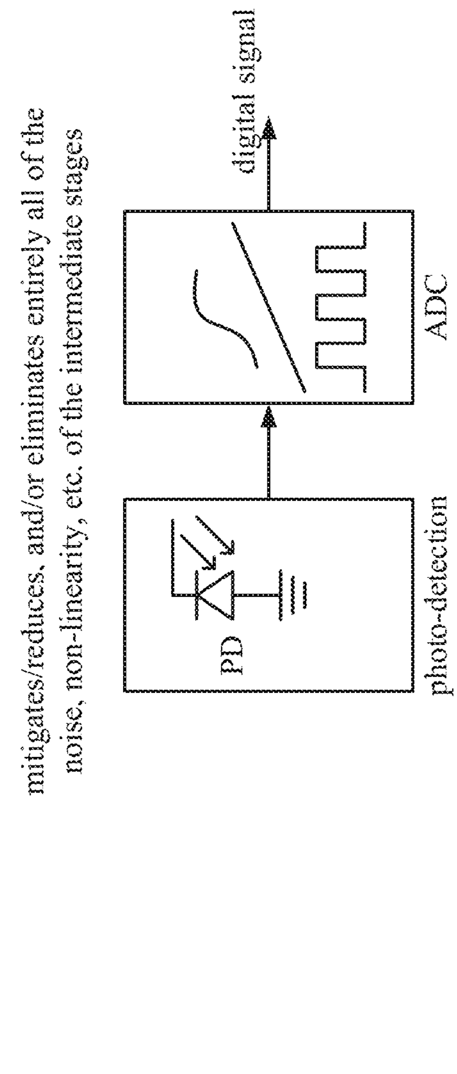
Figure 46B:
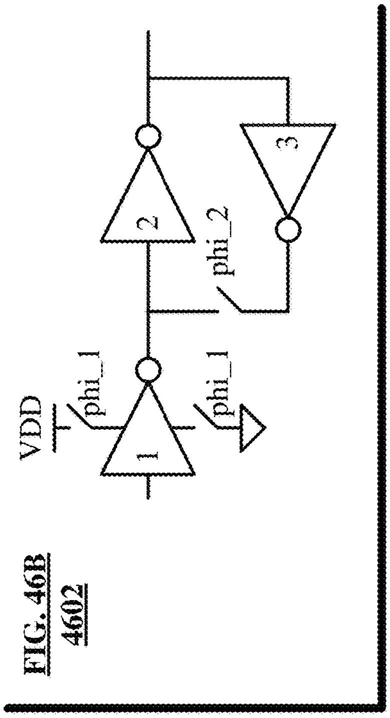
Figure 46A:
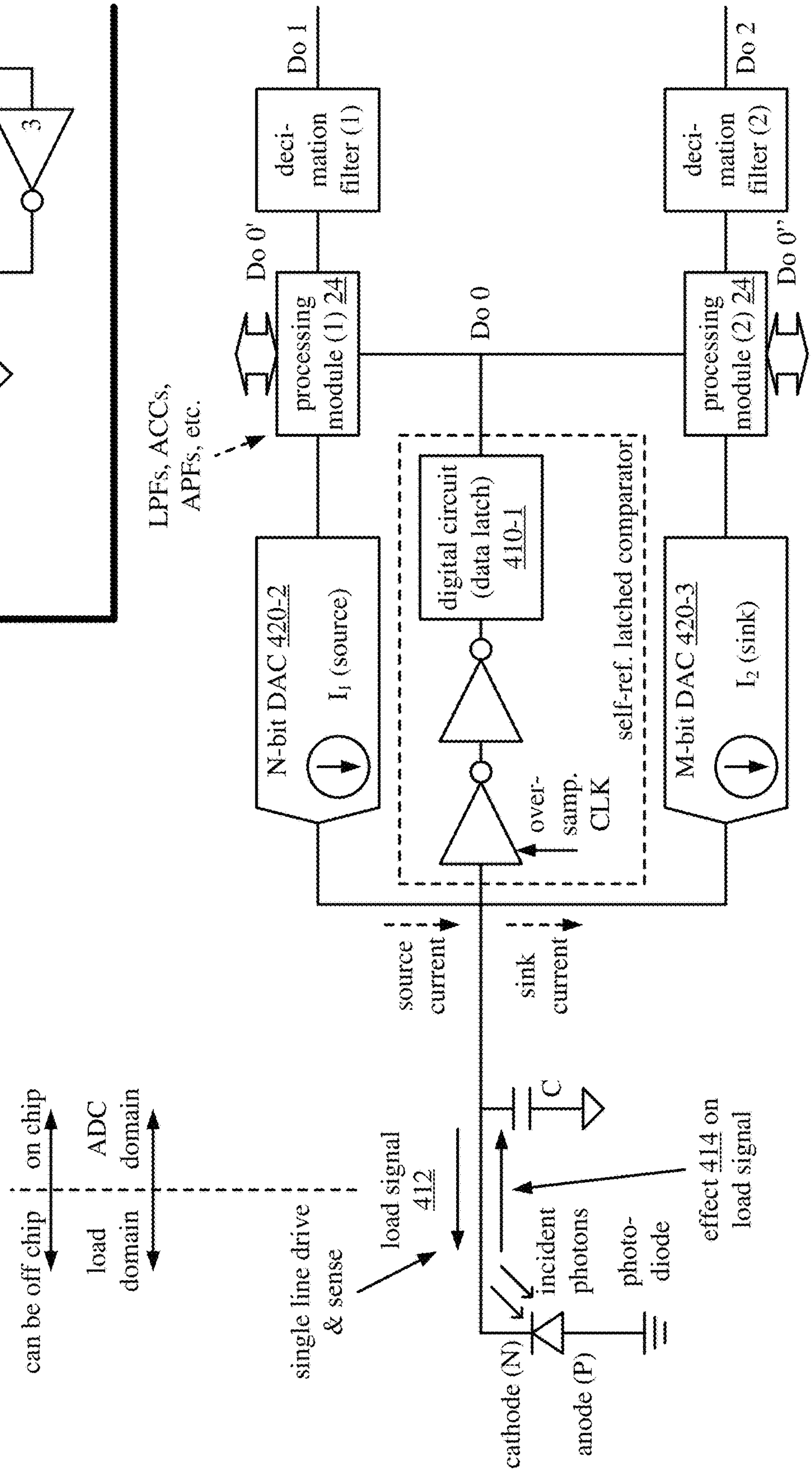
Figure 47:
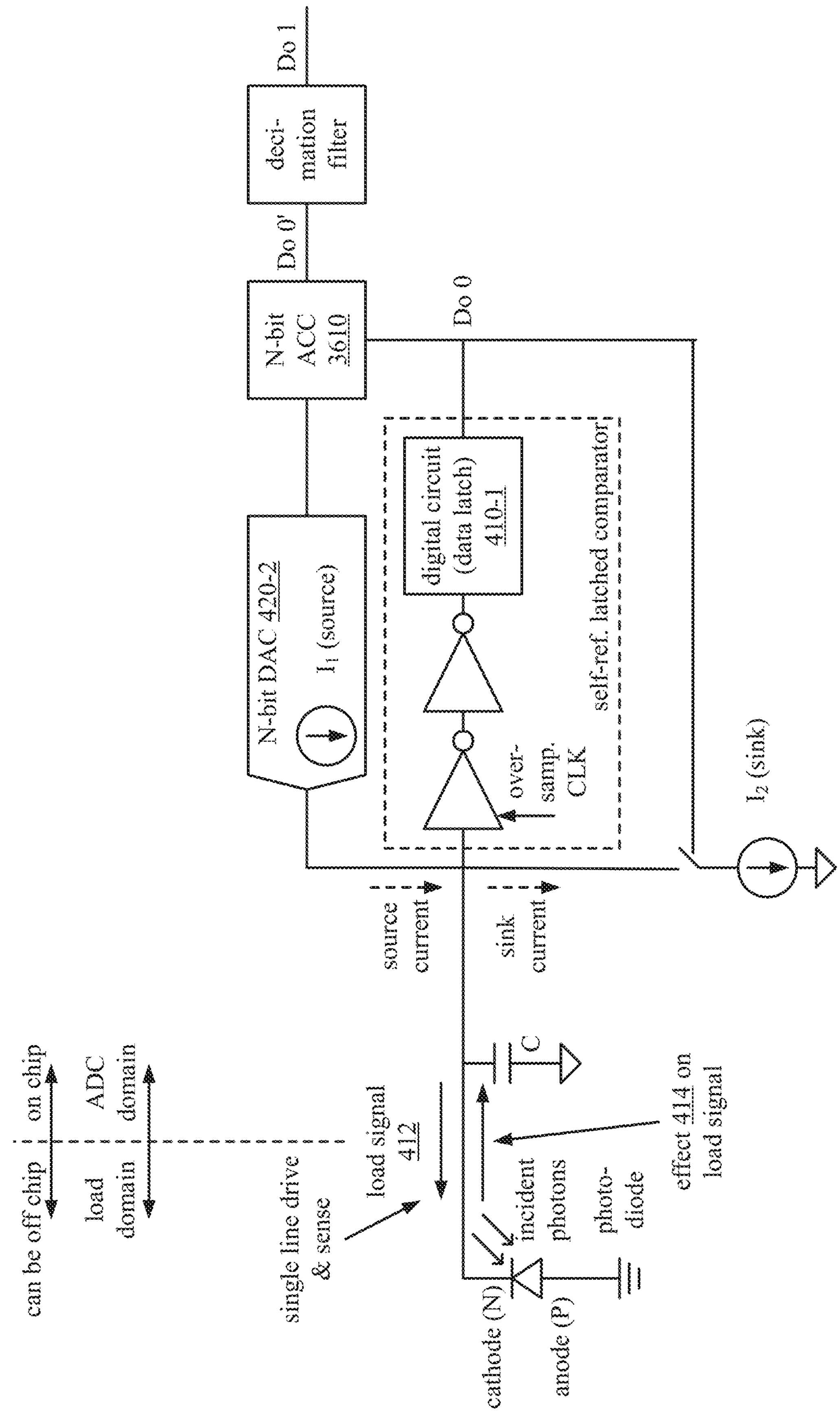
Figure 48:
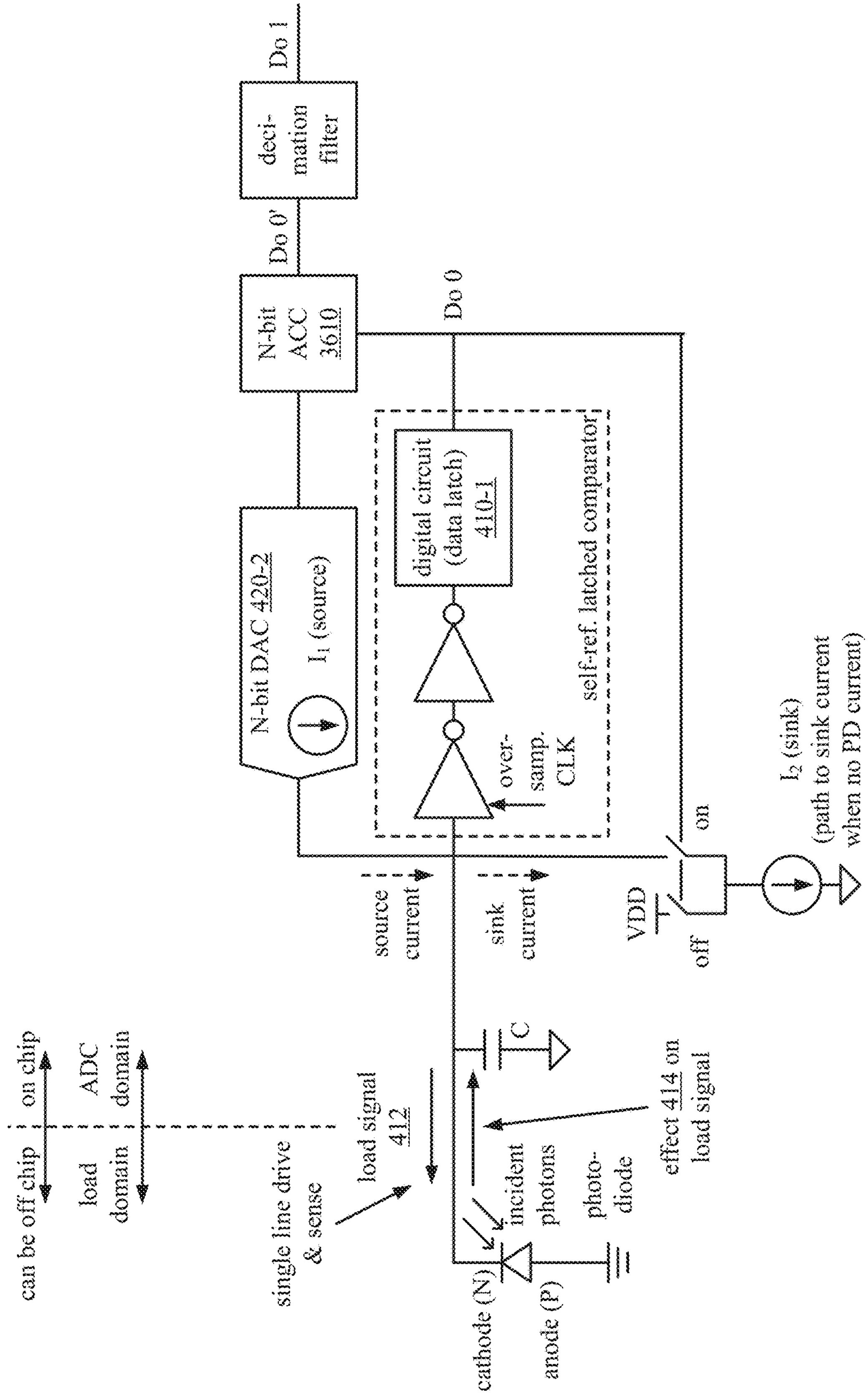
Figure 49A:
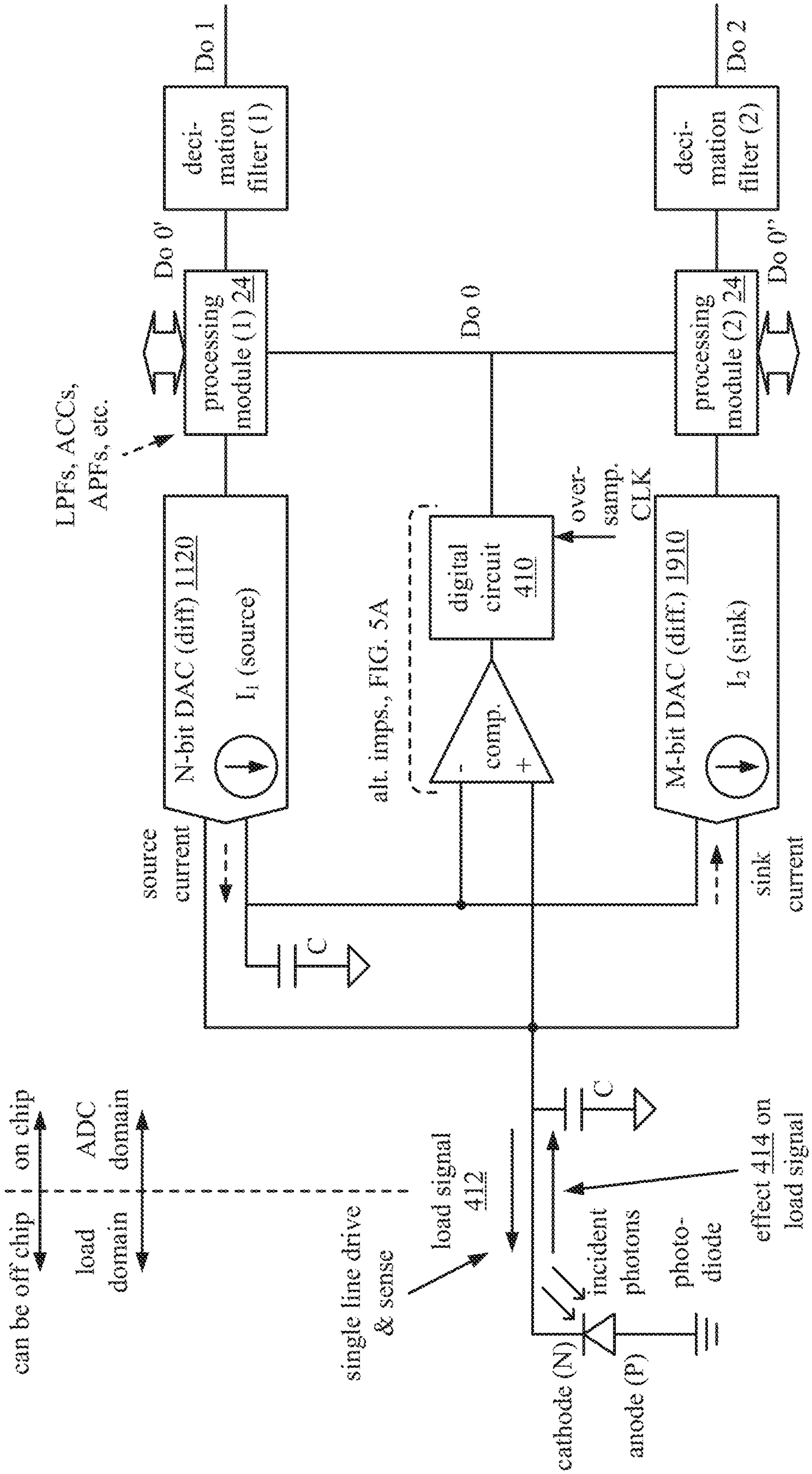
Figure 49B:
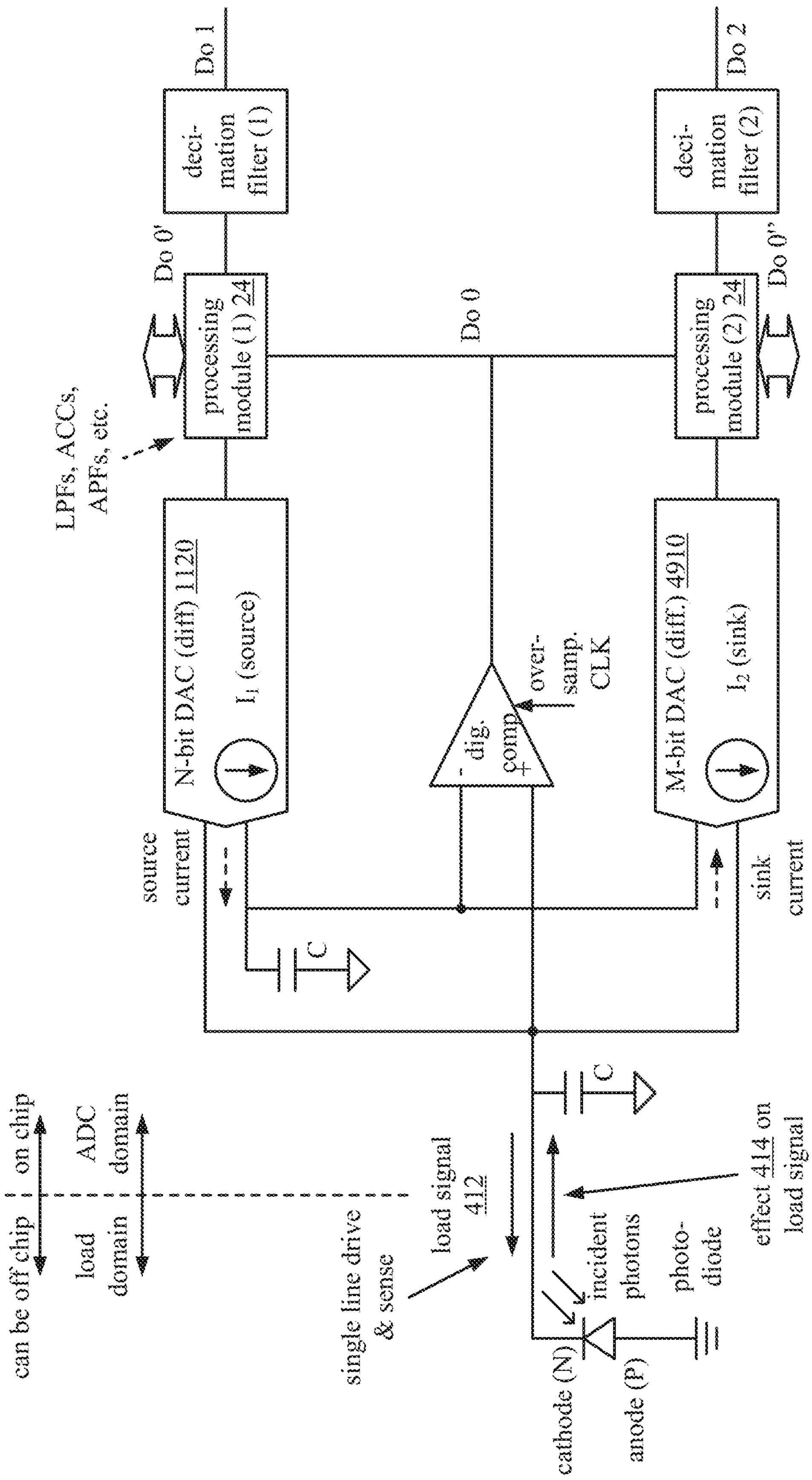
Figure 50A:
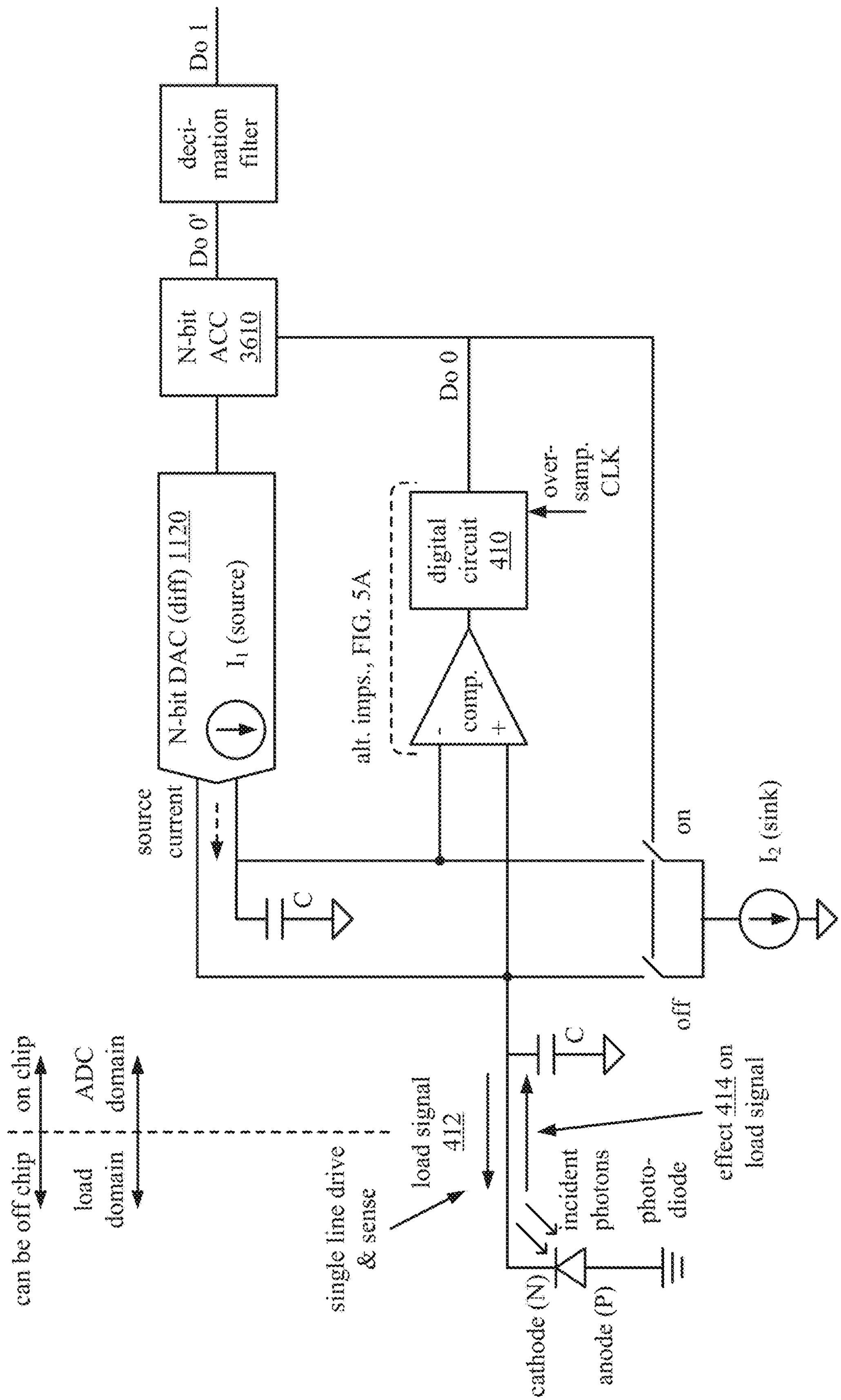
Figure 50B:
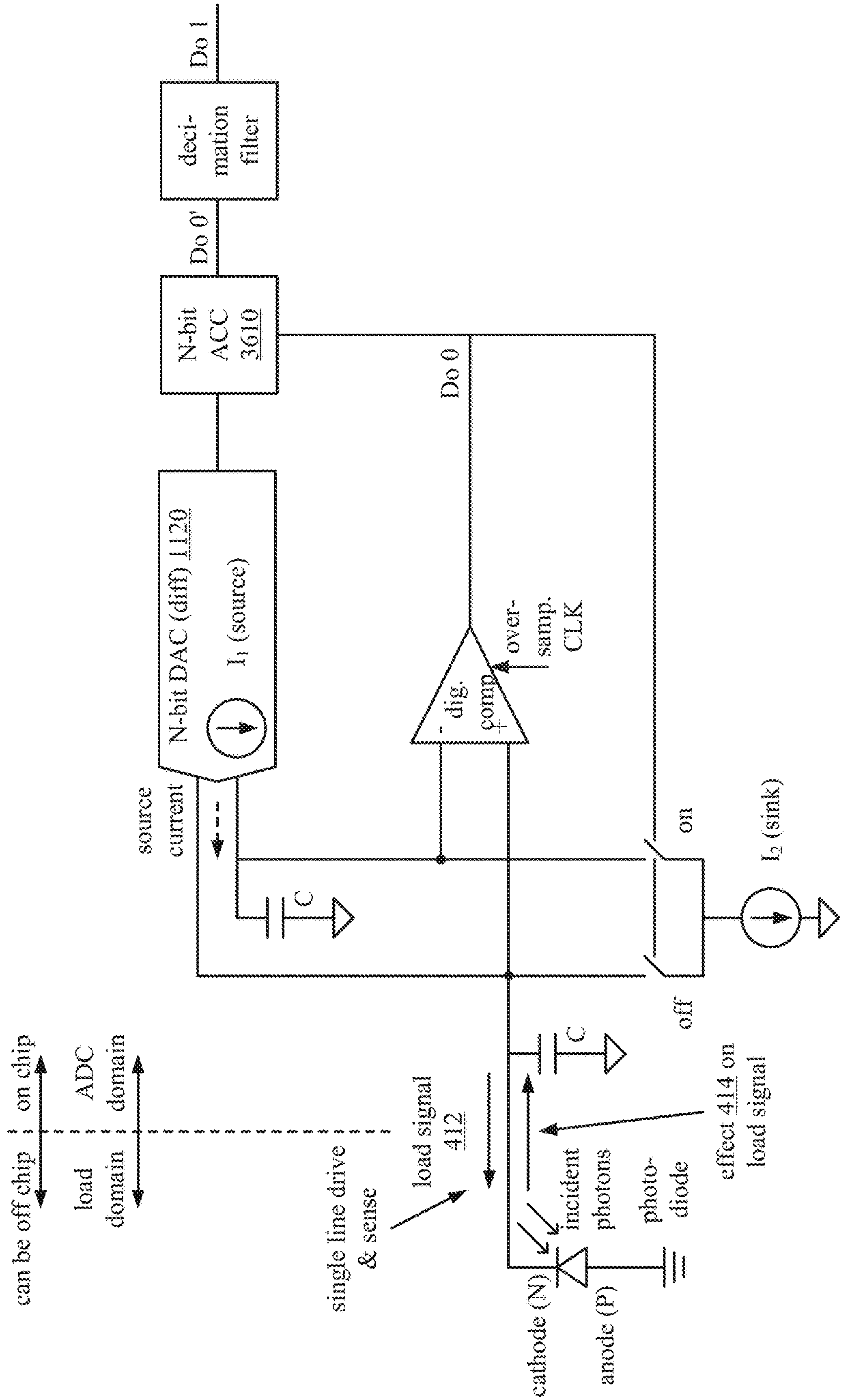
Figure 52C:
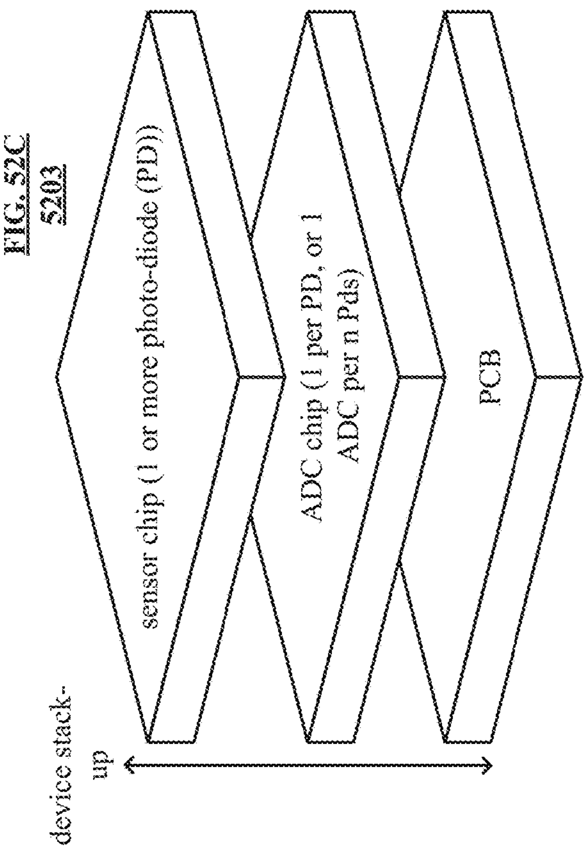
Figure 52A:
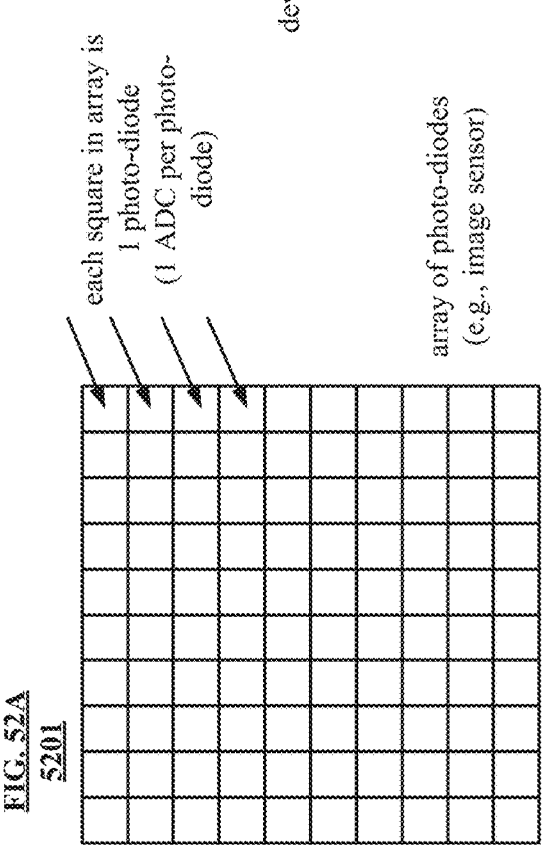
Figure 52B:
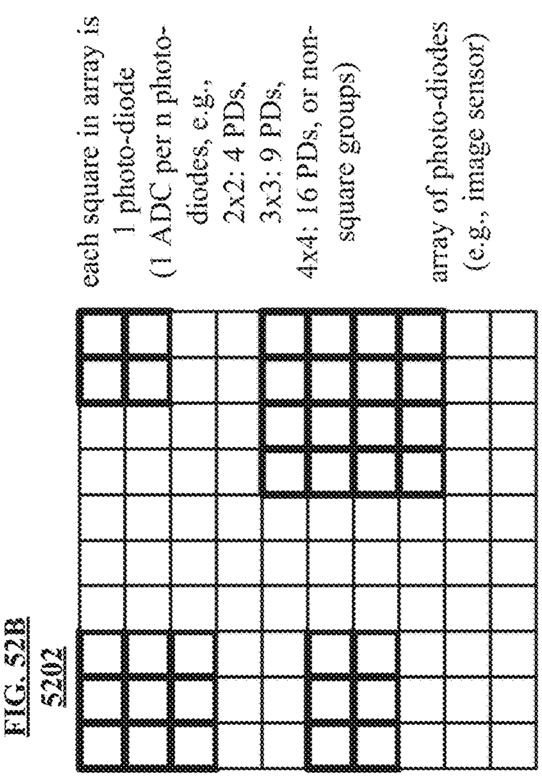
Figure 52D:
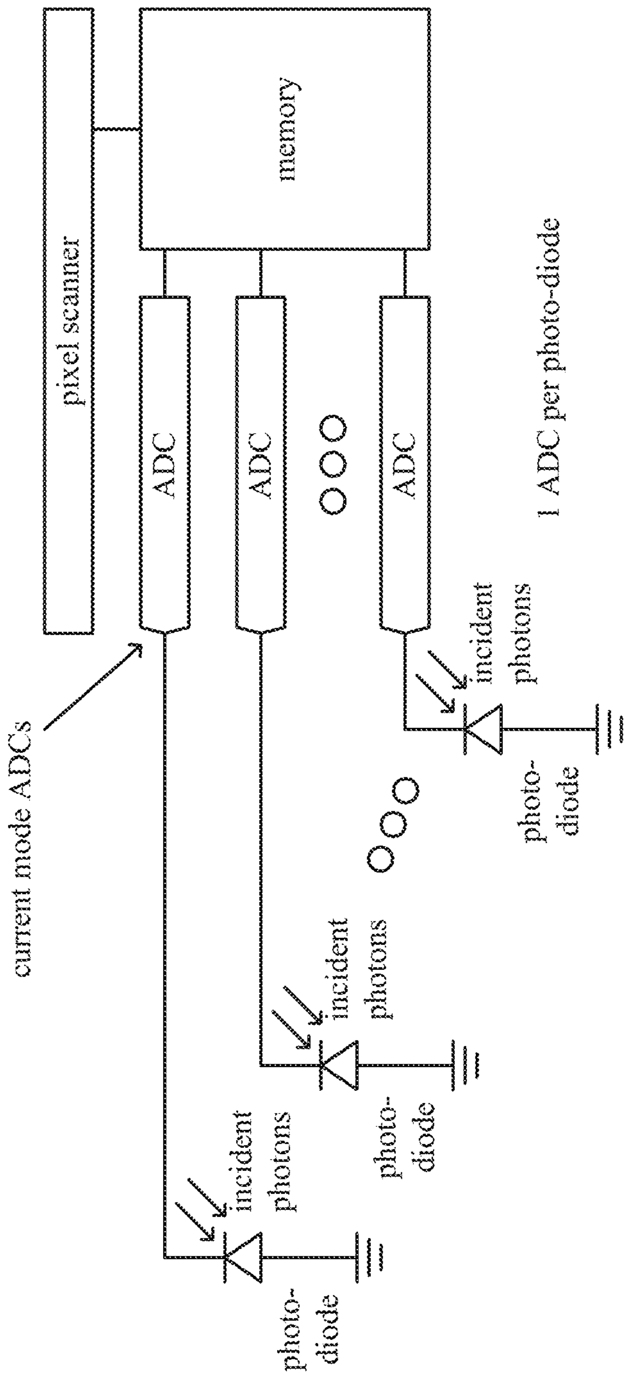
Figure 53A:
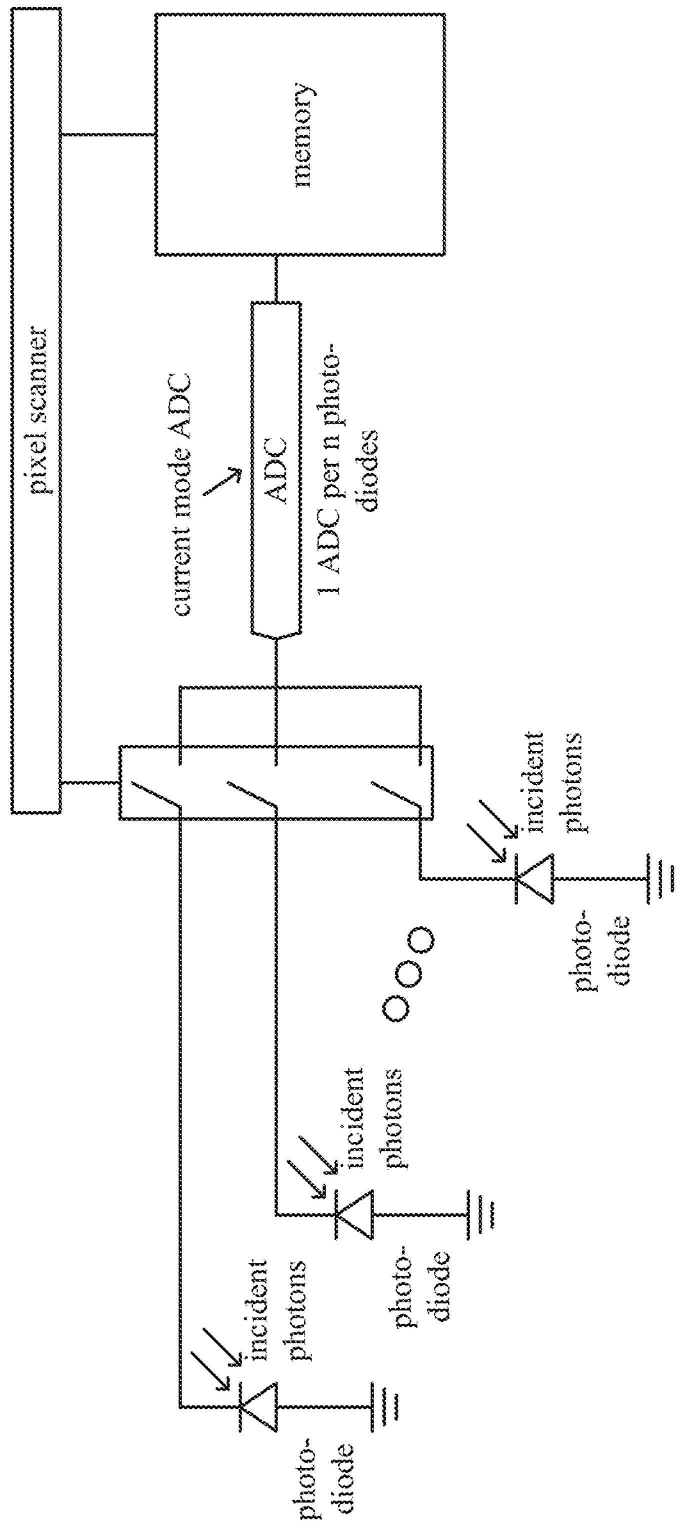
Figure 53B:
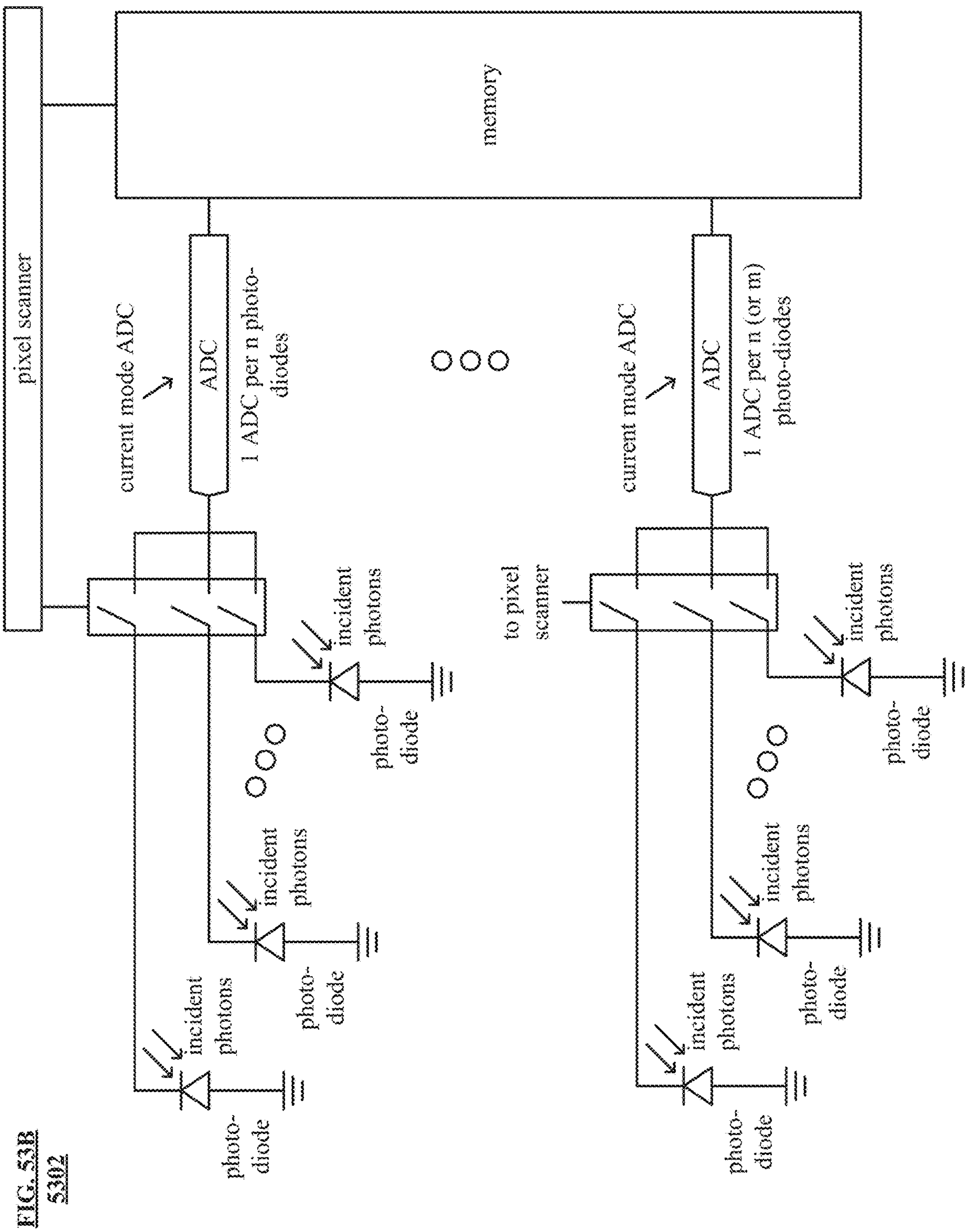

FIG. 34 is a schematic block diagram showing an embodiment of one or more processing modules implemented to perform digital domain filtering within an ADC that includes a non-linear N-bit DAC in accordance with the present invention;

FIGS. 35A, 35B, and 35C are schematic block diagrams showing various embodiments of analog to digital converters (ADCs) with improved bandwidth in accordance with the present invention;

FIGS. 35D, 35E, 35F, 35G, 35H, 35I, 35J, and 35K are schematic block diagrams showing various embodiments of current sensor circuitry that may be implemented in accordance with the present invention;

FIG. 35L shows multiple performance diagrams of ADC output expressed as power spectral density (PSD [dB]) as a function of frequency (kilo-Hertz [kHz]) in accordance with the present invention;

FIG. 36A is a schematic block diagram showing an embodiment of an ADC implemented with a thermometer decoder in accordance with the present invention;

FIGS. 36B and 36C are schematic block diagrams showing embodiments of one or more PNP BJTs (alternatively, Positive-Negative-Positive Bipolar Junction Transistors) and NPN BJTs (alternatively, Negative-Positive-Positive BJT) implemented to sink and source current within embodiments of ADCs implemented with a thermometer decoder in accordance with the present invention;

FIG. 36D is a schematic block diagram showing an alternative embodiment of an ADC implemented with a thermometer decoder in accordance with the present invention;

FIGS. 36E and 36F are schematic block diagrams showing embodiments of one or more metal-oxide-semiconductor field-effect transistors (MOSFETs) including one or more PMOS transistors and NMOS transistors implemented to sink and source current within embodiments of ADCs implemented with a thermometer decoder in accordance with the present invention;

FIG. 36G is a schematic block diagram showing an alternative embodiment of an ADC implemented with a thermometer decoder in accordance with the present invention;

FIGS. 37A, 37B, and 37C are schematic block diagrams showing various embodiments of differential current sensing circuits in accordance with the present invention;

FIGS. 38A and 38B are schematic block diagrams showing various embodiments of power sensing circuits in accordance with the present invention;

FIGS. 39A and 39B are schematic block diagrams showing various embodiments of impedance sensing circuits (including complex impedance sensing capability) in accordance with the present invention;

FIGS. 40A and 40B are schematic block diagrams showing various embodiments of resistance sensing circuits in accordance with the present invention;

FIG. 41A is a schematic block diagram showing an embodiment of photodiode equivalent circuit in accordance with the present invention;

FIGS. 41B and 41C are schematic block diagrams showing various embodiments of photodiode sensor circuits in accordance with the present invention;

FIGS. 42A and 42B are schematic block diagrams showing various embodiments of charge and/or capacitive change sensing circuits in accordance with the present invention;

FIG. 43A is a schematic block diagram showing an embodiment of response of a thermistor that may be implemented within a temperature sensing circuit in accordance with the present invention;

FIGS. 43B, 43C, 43D, and 43E are schematic block diagrams showing various embodiments of temperature sensing circuits operative with a thermistor in accordance with the present invention;

FIGS. 44A, 44B, and 44C are schematic block diagrams showing various embodiments of high accuracy resistance sensing circuits in accordance with the present invention;

FIG. 44D, 44E, 44F, 44G, 44H, 44I, 44J, 44K, and 44L are schematic block diagrams showing various other embodiments of high accuracy resistance sensing circuits in accordance with the present invention;

FIG. 45A is a schematic block diagram showing an embodiment of a photo-diode that is operative with an ADC in accordance with the present invention;

FIG. 45B is a schematic block diagram showing an embodiment of a pixel array of a photo-diode image sensor that is operative with an ADC in accordance with the present invention;

FIG. 45C is a schematic block diagram showing an embodiment of passive pixel topology that is operative with a pixel array of a photo-diode image sensor;

FIG. 45D is a schematic block diagram showing an embodiment of vertical and horizontal scanners operative with a pixel array of a photo-diode image sensor;

FIG. 45E is a schematic block diagram showing an embodiment of a three transistor pixel structure (3T) that is operative with a pixel of a pixel array of a photo-diode image sensor;

FIG. 45F is a schematic block diagram showing an embodiment of a four transistor pixel structure (4T) that is operative with a pixel of a pixel array of a photo-diode image sensor;

FIG. 45G is a schematic block diagram showing an embodiment of a capacitive transimpedance amplifier including an inverter structure that is operative with a pixel of pixel array of a photo-diode image sensor;

FIG. 45H is a schematic block diagram showing an embodiment of a capacitive transimpedance amplifier including a differential amplifier structure that is operative with a pixel of pixel array of a photo-diode image sensor;

FIG. 45I is a schematic block diagram showing an embodiment of a digital pixel structure that is operative with a pixel of pixel array of a photo-diode image sensor;

FIG. 45J is a schematic block diagram showing an embodiment of a chain block diagram of a photo-diode image sensor;

FIG. 45K is a schematic block diagram showing an embodiment of a chain block diagram of a photo-diode image sensor in accordance with the present invention;

FIG. 46A is a schematic block diagram showing an embodiment of an ADC implemented based on a single-ended direct interface dual DAC feedback photo-diode sensor in accordance with the present invention;

FIG. 46B is a schematic block diagram showing an embodiment of a self-referenced latched comparator that is operative with an ADC in accordance with the present invention;

FIG. 47 is a schematic block diagram showing an embodiment of an ADC implemented based on a single-ended direct interface DAC feedback and current sink photo-diode sensor in accordance with the present invention;

FIG. 48 is a schematic block diagram showing an embodiment of an ADC implemented based on a single-ended direct interface DAC feedback and current sink with improved settling time photo-diode sensor in accordance with the present invention;

FIGS. 49A and 49B are schematic block diagrams showing various embodiments of an ADC implemented based on a single-ended direct interface dual DAC feedback differential signaling photo-diode sensor in accordance with the present invention;

FIGS. 50A and 50B are schematic block diagrams showing various embodiments of an ADC implemented based on a single-ended direct interface DAC feedback and current sink differential signaling photo-diode sensor in accordance with the present invention;

FIGS. 51A, 51B, 51C, and 51D are schematic block diagrams showing various embodiments of an ADC implemented based on a single-ended direct interface DAC feedback and current sink with chopper differential signaling photo-diode sensor in accordance with the present invention;

FIG. 52A is a schematic block diagram showing an embodiment of a photo-diode image sensor in accordance with the present invention;

FIG. 52B is a schematic block diagram showing various embodiments of groupings of pixels within a photo-diode image sensor in accordance with the present invention;

FIG. 52C is a schematic block diagram showing an embodiment a device stack-up within a photo-diode image sensor in accordance with the present invention;

FIG. 52D is a schematic block diagram showing an embodiment of multiple ADCs respectively servicing photo-diodes within a photo-diode image sensor in accordance with the present invention;

FIG. 53A is a schematic block diagram showing an embodiment of a single ADC respectively servicing multiple photo-diodes within a photo-diode image sensor in accordance with the present invention; and FIG. 53B is a schematic block diagram showing an embodiment of a multiple instantiations of single ADCs each respectively servicing multiple photo-diodes within a photo-diode image sensor in accordance with the present invention.

DETAILED DESCRIPTION OF THE INVENTION

Figure 1:
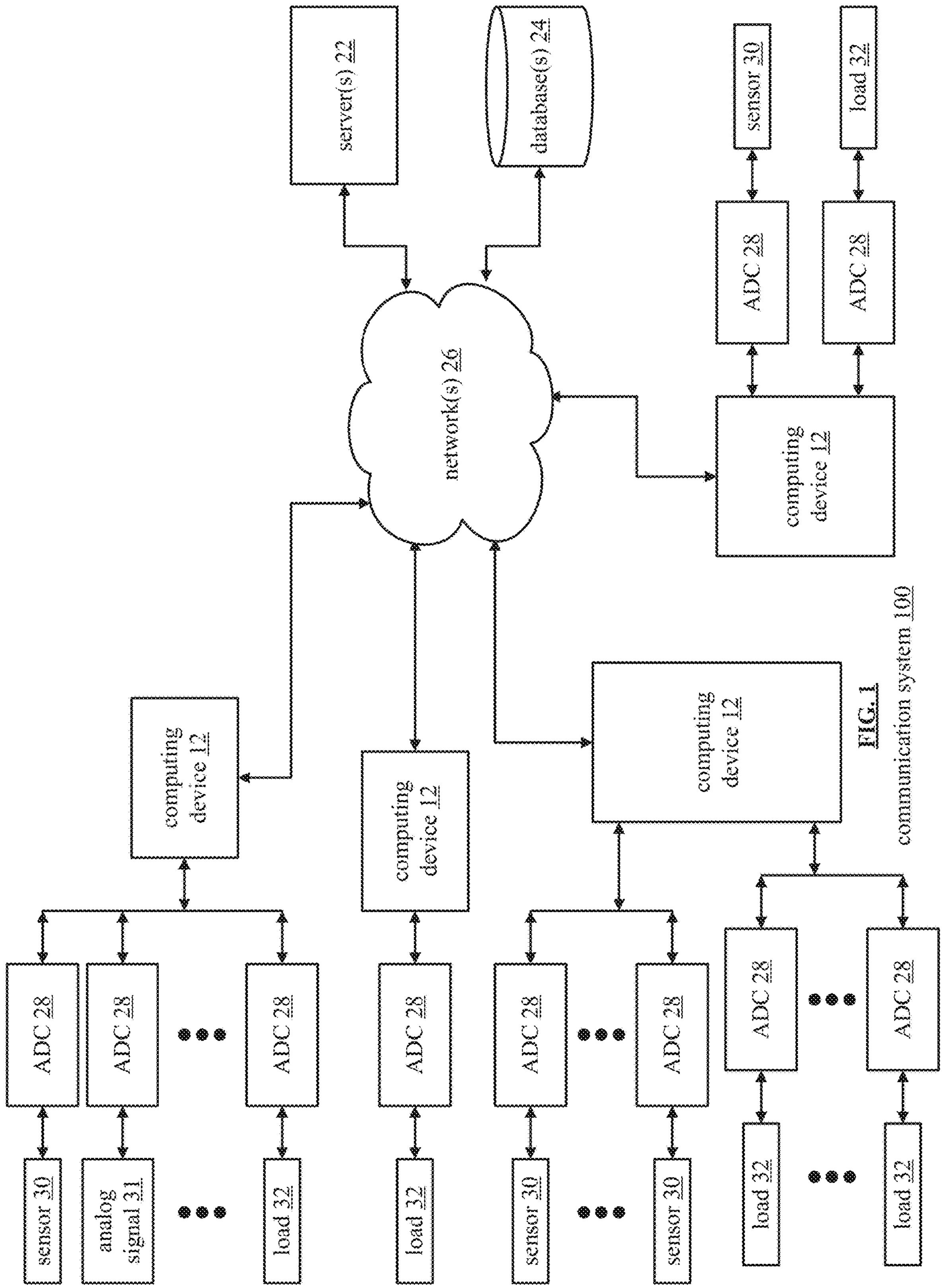
FIG. 1 is a schematic block diagram of an embodiment of a communication system in accordance with the present invention.

FIG. 1 is a schematic block diagram of an embodiment of a communication system 100 that includes a plurality of computing devices 12, one or more servers 22, one or more databases 24, one or more networks 26, a plurality of analog to digital converters (ADCs) 28, a plurality of sensors 30, and a plurality of loads 32. Generally speaking, an ADC 28 is configured to convert an analog signal 31 into a digital signal. In some examples, such an analog signal may be provided from and/or correspond a signal associated with a sensor 30, or generally speaking, a load 32 (e.g., such as which is consumptive of current, voltage, and/or power, and/or such as which produces a current, voltage, and/or power signal). Also, in some examples, note that any one of the computing devices 12 includes a touch screen with sensors 30, a touch & tactic screen that includes sensors 30, loads 32, and/or other components.

A sensor 30 functions to convert a physical input into an output signal (e.g., an electrical output, an optical output, etc.). The physical input of a sensor may be one of a variety of physical input conditions. For example, the physical condition includes one or more of, but is not limited to, acoustic waves (e.g., amplitude, phase, polarization, spectrum, and/or wave velocity); a biological and/or chemical condition (e.g., fluid concentration, level, composition, etc.); an electric condition (e.g., charge, voltage, current, conductivity, permittivity, eclectic field, which includes amplitude, phase, and/or polarization); a magnetic condition (e.g., flux, permeability, magnetic field, which amplitude, phase, and/or polarization); an optical condition (e.g., refractive index, reflectivity, absorption, etc.); a thermal condition (e.g., temperature, flux, specific heat, thermal conductivity, etc.); and a mechanical condition (e.g., position, velocity, acceleration, force, strain, stress, pressure, torque, etc.). For example, piezoelectric sensor converts force or pressure into an eclectic signal. As another example, a microphone converts audible acoustic waves into electrical signals.

There are a variety of types of sensors to sense the various types of physical conditions. Sensor types include, but are not limited to, capacitor sensors, inductive sensors, accelerometers, piezoelectric sensors, light sensors, magnetic field sensors, ultrasonic sensors, temperature sensors, infrared (IR) sensors, touch sensors, proximity sensors, pressure sensors, level sensors, smoke sensors, and gas sensors. In many ways, sensors function as the interface between the physical world and the digital world by converting real world conditions into digital signals that are then processed by computing devices for a vast number of applications including, but not limited to, medical applications, production automation applications, home environment control, public safety, and so on.

The various types of sensors have a variety of sensor characteristics that are factors in providing power to the sensors, receiving signals from the sensors, and/or interpreting the signals from the sensors. The sensor characteristics include resistance, reactance, power requirements, sensitivity, range, stability, repeatability, linearity, error, response time, and/or frequency response. For example, the resistance, reactance, and/or power requirements are factors in determining drive circuit requirements. As another example, sensitivity, stability, and/or linear are factors for interpreting the measure of the physical condition based on the received electrical and/or optical signal (e.g., measure of temperature, pressure, etc.).

Any of the computing devices 12 may be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. An example of the computing devices 12 is discussed in greater detail with reference to one or more of FIG. 2.

A server 22 is a special type of computing device that is optimized for processing large amounts of data requests in parallel. A server 22 includes similar components to that of the computing devices 12 with more robust processing modules, more main memory, and/or more hard drive memory (e.g., solid state, hard drives, etc.). Further, a server 22 is typically accessed remotely; as such it does not generally include user input devices and/or user output devices. In addition, a server may be a standalone separate computing device and/or may be a cloud computing device.

A database 24 is a special type of computing device that is optimized for large scale data storage and retrieval. A database 24 includes similar components to that of the computing devices 12 with more hard drive memory (e.g., solid state, hard drives, etc.) and potentially with more processing modules and/or main memory. Further, a database 24 is typically accessed remotely; as such it does not generally include user input devices and/or user output devices. In addition, a database 24 may be a standalone separate computing device and/or may be a cloud computing device.

The network 26 includes one more local area networks (LAN) and/or one or more wide area networks WAN), which may be a public network and/or a private network. A LAN may be a wireless-LAN (e.g., Wi-Fi access point, Bluetooth, ZigBee, etc.) and/or a wired network (e.g., Firewire, Ethernet, etc.). A WAN may be a wired and/or wireless WAN. For example, a LAN may be a personal home or business's wireless network and a WAN is the Internet, cellular telephone infrastructure, and/or satellite communication infrastructure.

In an example of operation, computing device 12 communicates with ADCs 28, that are in communication with a plurality of sensors 30. In some examples, the sensors 30 and/or ADCs 28 are within the computing device 12 and/or external to it. For example, the sensors 30 may be external to the computing device 12 and the ADCs 28 are within the computing device 12. As another example, both the sensors 30 and the ADCs 28 are external to the computing device 12. In some examples, when the ADCs 28 are external to the computing device, they are coupled to the computing device 12 via wired and/or wireless communication links.

The computing device 12 communicates with the ADCs 28 to; (a) turn them on, (b) obtain data from the sensors 30, loads 32, one or more analog signals 31, etc. individually and/or collectively), (c) instruct the ADC 28 on how to process the analog signals associated with the sensors 30, loads 32, one or more analog signals 31, etc. and to provide digital signals and/or information to the computing device 12, and/or (d) provide other commands and/or instructions.

In an example of operation and implementation, a computing device 12 is coupled to ADC 28 that is coupled to a senor 30. The sensor 30 and/or the ADC 28 may be internal and/or external to the computing device 12. In this example, the sensor 30 is sensing a condition that is particular to the computing device 12. For example, the sensor 30 may be a temperature sensor, an ambient light sensor, an ambient noise sensor, etc. As described above, when instructed by the computing device 12 (which may be a default setting for continuous sensing or at regular intervals), the ADC 28 is configured to generate a digital signal and/or information associated with the sensor 30 and to provide that digital signal and/or information to the computing device 12.

Figure 2:
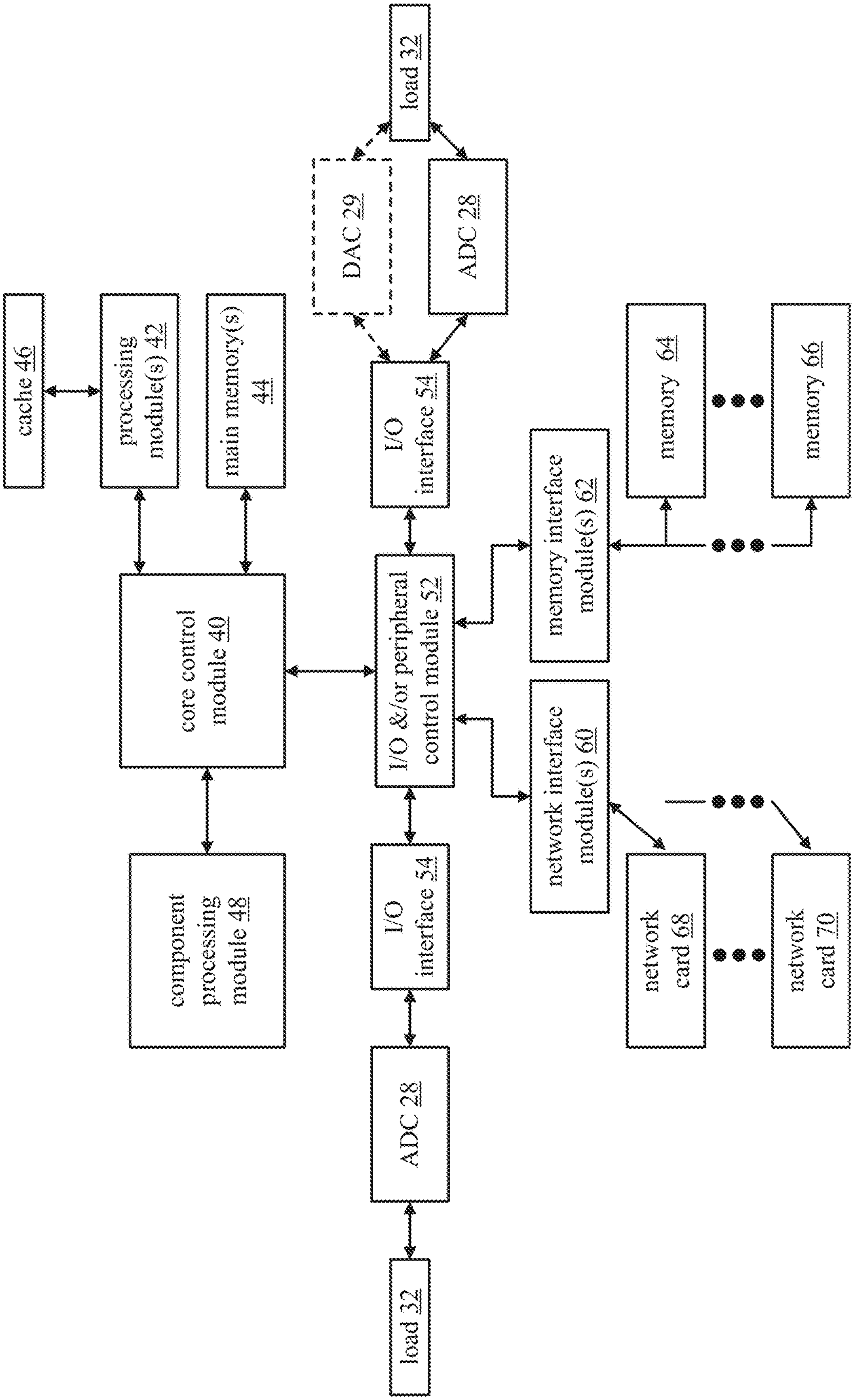
FIG. 2 is a schematic block diagram of an embodiment of a computing device in accordance with the present invention.

FIG. 2 is a schematic block diagram of an embodiment of a computing device 12 (e.g., any of the computing devices 12 in FIG. 1). The computing device 12 includes a core control module 40, one or more processing modules 42, one or more main memories 44, cache memory 46, an Input-Output (I/O) peripheral control module 52, one or more I/O interfaces 54, one or more ADCs 28 coupled to the one or more I/O interfaces 54 and one or more loads 32, optionally one or more digital to analog converters (DACs) 29 one or more I/O interfaces 54, one or more input interface modules 56, one or more output interface modules 58, one or more network interface modules 60, and one or more memory interface modules 62. In some examples, the computing device 12 also includes a component processing module 48. In an example of operation and implementation, such a component processing module 48 is implemented to facilitate operations associated with video graphics that may include any one or more of video graphics, display, a touch screen, a camera, audio output, audio input, and/or any other one or more computing device components, etc.

A processing module 42 is described in greater detail at the end of the detailed description of the invention section and, in an alternative embodiment, has a direction connection to the main memory 44. In an alternate embodiment, the core control module 40 and the I/O and/or peripheral control module 52 are one module, such as a chipset, a quick path interconnect (QPI), and/or an ultra-path interconnect (UPI).

Each of the main memories 44 includes one or more Random Access Memory (RAM) integrated circuits, or chips. For example, a main memory 44 includes four DDR4 ($4^{th}$ generation of double data rate) RAM chips, each running at a rate of 2,400 MHz. In general, the main memory 44 stores data and operational instructions most relevant for the processing module 42. For example, the core control module 40 coordinates the transfer of data and/or operational instructions from the main memory 44 and the memory 64-66. The data and/or operational instructions retrieve from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 includes one or more hard drives, one or more solid state memory chips, and/or one or more other large capacity storage devices that, in comparison to cache memory and main memory devices, is/are relatively inexpensive with respect to cost per amount of data stored. The memory 64-66 is coupled to the core control module 40 via the I/O and/or peripheral control module 52 and via one or more memory interface modules 62. In an embodiment, the I/O and/or peripheral control module 52 includes one or more Peripheral Component Interface (PCI) buses to which peripheral components connect to the core control module 40. A memory interface module 62 includes a software driver and a hardware connector for coupling a memory device to the I/O and/or peripheral control module 52. For example, a memory interface 62 is in accordance with a Serial Advanced Technology Attachment (SATA) port.

The core control module 40 coordinates data communications between the processing module(s) 42 and the network(s) 26 via the I/O and/or peripheral control module 52, the network interface module(s) 60, and a network card 68 or 70. A network card 68 or 70 includes a wireless communication unit or a wired communication unit. A wireless communication unit includes a wireless local area network (WLAN) communication device, a cellular communication device, a Bluetooth device, and/or a ZigBee communication device. A wired communication unit includes a Gigabit LAN connection, a Firewire connection, and/or a proprietary computer wired connection. A network interface module 60 includes a software driver and a hardware connector for coupling the network card to the I/O and/or peripheral control module 52. For example, the network interface module 60 is in accordance with one or more versions of IEEE 802.11, cellular telephone protocols, 10/100/1000 Gigabit LAN protocols, etc.

The core control module 40 coordinates data communications between the processing module(s) 42 and input device(s) 72 via the input interface module(s) 56 and the I/O and/or peripheral control module 52. An input device 72 includes a keypad, a keyboard, control switches, a touchpad, a microphone, a camera, etc. An input interface module 56 includes a software driver and a hardware connector for coupling an input device to the I/O and/or peripheral control module 52. In an embodiment, an input interface module 56 is in accordance with one or more Universal Serial Bus (USB) protocols.

The core control module 40 coordinates data communications between the processing module(s) 42 and output device(s) 74 via the output interface module(s) 58 and the I/O and/or peripheral control module 52. An output device 74 includes a speaker, etc. An output interface module 58 includes a software driver and a hardware connector for coupling an output device to the I/O and/or peripheral control module 52. In an embodiment, an output interface module 56 is in accordance with one or more audio codec protocols.

This disclosure presents novel analog to digital converter (ADC) designs, architectures, circuits, etc. that provide much improved performance in comparison to prior art ADCs. Various aspects, embodiments, and/or examples of the invention (and/or their equivalents) that may be used to perform analog to digital conversion of signals provide very high resolution digital format data. Certain examples of such analog-to-digital conversion is performed based on sensing an analog current signal associated with a sensor, a load, etc. or any source of an analog signal. In many examples provided herein, a load 32 is employed as the element having an associated analog signal that is sensed and converted to a digital signal. Generally speaking, such a load 32 may be any of a variety of types of sources, devices, systems, etc. that has an associated analog signal that may be sensed and converted to a digital signal including a sensor, a computing device, a circuit, etc. within any type of application context including industrial, medical, communication system, computing device, etc.

In addition, various aspects, embodiments, and/or examples of the invention (and/or their equivalents) that may be used to perform analog to digital conversion of signals may be implemented in accordance with providing both drive and sense capabilities such that a signal is driven from the ADC 28 to the load 32 to facilitate sensing of the analog signal associated with the load 32. In some examples, the signal is driven from the ADC 28 to energize the load 32 and to facilitate its effective operation. Consider an example in which the load 32 is a sensor 30. In such an example, the signal provided from the ADC 28 is operative to provide power to the sensor 30 and also simultaneously to sense the analog signal associated with the sensor 30 simultaneously via a single line. Alternatively, note that certain examples may operate such that the load 32 is provided power or energy from an alternative source. In such instances, the ADC 28 need not specifically be implemented to provide power or energy to the load 32 but merely to sense the analog signal associated with the sensor 30. In some examples, a sensing signal is provided from the ADC 28 to the load 32 such that detection of any change of the sensing signal is used and interpreted to determine one or more characteristics of the analog signal associated with the load 32. In certain examples, the providing of the sensing signal from the ADC 28 to the load 32 and the sensing of the analog signal associated with the load 32 are performed simultaneously via a single line that couples or connects the ADC 28 to the load 32.

Figure 3:
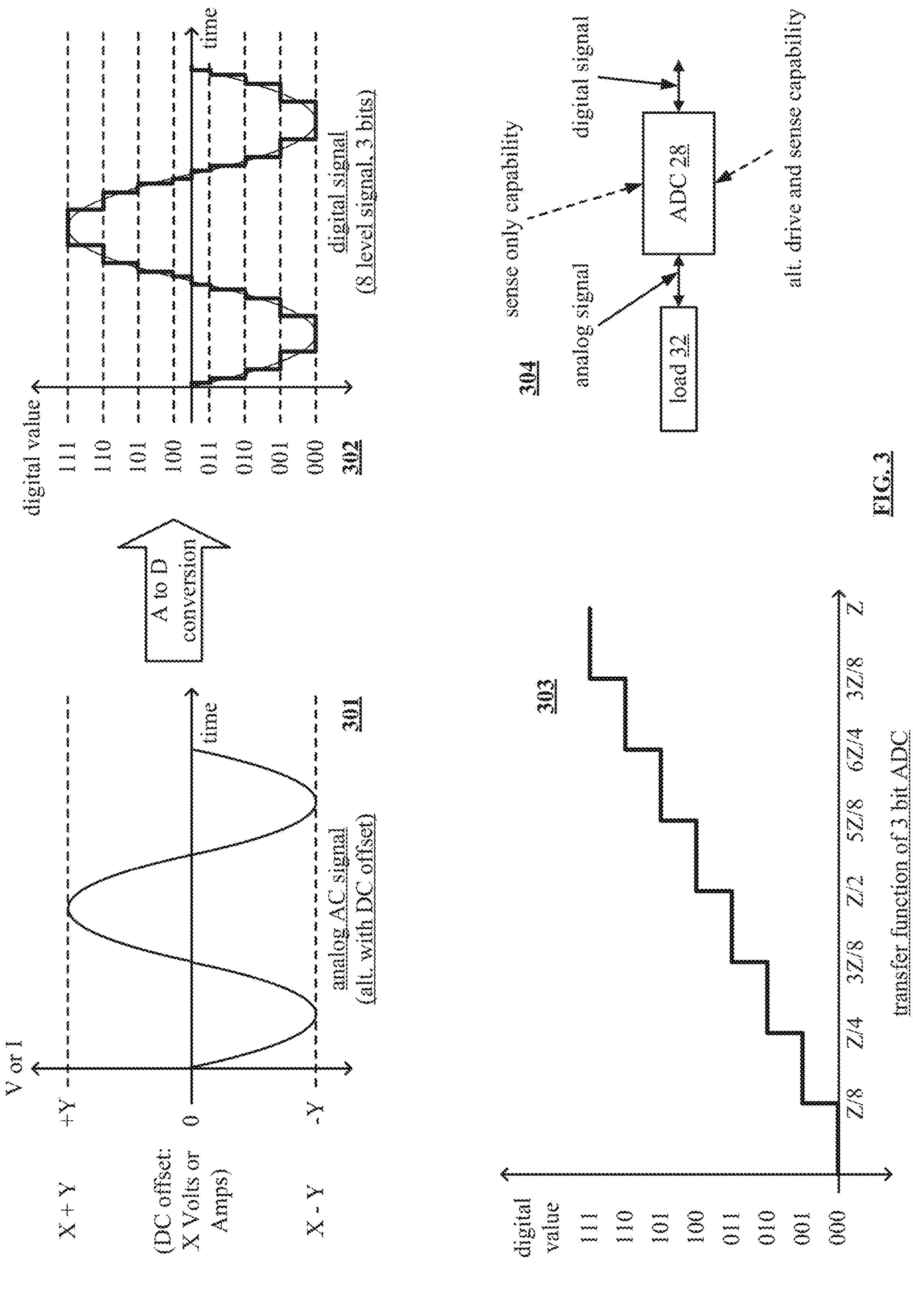
FIG. 3 is a schematic block diagram showing various embodiments of analog to digital conversion as may be performed in accordance with the present invention.

FIG. 3 is a schematic block diagram showing various embodiments 301, 302, 303, and 304 of analog to digital conversion as may be performed in accordance with the present invention. In the upper left portion of the diagram, with respect to reference numeral 301, and analog AC signal is shown. Note that the analog AC signal may or may not have a DC offset. Consider an example in which the DC offset is X volts, and consider a sinusoidal analog AC signal oscillates and varies between a maximum of +Y volts to a minimum of −Y volts as a function of time based on a particular frequency of the analog AC signal. Note that this example of an analog AC signal is not exhaustive, and generally speaking, such an analog AC signal may have any variety of shapes, frequencies, characteristics, etc. Examples of such analog signals may include any one or more of a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component).

Note also that such an analog signal may alternatively have only a DC component with no AC component. Note that any of the respective implementations of an ADC has described herein, or their equivalents, is also operative to detect an analog signal having only a DC component. Note that a totally non-varying analog signal having only a DC component, after undergoing analog-to-digital conversion, would produce a digital signal having a constant digital value as a function of time. That is to say, such a discrete-time signal generated based on a DC signal.

In the upper right hand portion of the diagram, with respect reference numeral 302, the analog AC signal shown with respect to reference numeral 301 is shown as undergoing analog-to-digital conversion in accordance with generating a digital signal. Generally speaking, the resolution and granularity of such a digital signal may be of any desired format including performing analog-to-digital conversion based on a range spanning any number of desired levels and generating a digital signal having any number of desired bits, N, where N is a positive integer. This particular example shows generation of additional signal in accordance with a range having 8 levels such that the digital signal includes 3 bits. For example, consider an analog AC signal having no DC offset and varying between a range spanning +Y/−Y volts, then that range is divided into 8 respective sub-range is, and when the value of the analog AC signal crosses from one sub-range into another sub-range as a function of time, then the value of the digital signal correspondingly changes as a function of time. With respect to reference numeral 302, a digital representation of the analog AC signal shown with respect to reference numeral 301 is shown as a function of time.

In the lower left-hand portion of the diagram, with respect to reference numeral 303, a transfer function of a three bit ADC is shown with respect to a Z volt reference. As the magnitude of the analog AC signal varies as a function of time, a corresponding digital value is generated based on where the magnitude of the analog AC signal is within the range from zero to a Z volt reference. Note that this particular example shown with respect to reference numeral 303 is shown as varying between zero and a Z volt reference.

In another example, such a transfer function may be implemented based on using −Y volts as a baseline such that, along the horizontal axis, 0 corresponds to −Y volts, and Z is twice the magnitude of Y (e.g., Z=2×MAG[Y]). For example, consider the analog AC signal shown with respect to reference 301 as being an analog AC signal having no DC offset and varying between a range spanning +Y/−Y volts, then the Z volt reference could correspond to Y (or alternatively some value greater than Y to facilitate detection of the analog AC signal bearing outside of a particular or expected range), then such an 8 level, 3 bit digital signal may be generated such as shown with respect to reference numeral 302.

In the lower right hand portion of the diagram, with respect to reference numeral 304, an ADC 28 is shown as being coupled or connected to a load 32. The ADC 28 is configured to sense an analog signal associated with the load 32 and to generate a digital signal based thereon. Note that the ADC 28 may be implemented to facilitate both drive and sense capabilities such that the ADC 28 is configured to drive an analog current and/or voltage signal to the load 32 while concurrently or simultaneously sensing the analog signal associated with the load 32. In alternative examples, the ADC 28 is also operative to perform simultaneous driving and sensing of the analog signal associated with the load 32 when the load 32 is energized from another source such as from a battery, an external power source, etc.

Note that the ADC 28 includes capability and functionality to perform sensing only or alternatively, to perform both drive and sense. In some examples, the ADC 28 is configured to perform sensing only of an analog signal (e.g., having AC and/or DC components) associated with the load 32. In other example, the ADC 28 is configured to drive an analog current and/or voltage signal to the load 32 while concurrently and/or simultaneously sensing an analog signal (e.g., having AC and/or DC components) associated with the load 32. For example, the ADC 28 is configured to provide power to or energize the load 32 while also concurrently and/or simultaneously sensing an analog signal (e.g., having AC and/or DC components) associated with the load 32. Also, in certain alternative examples, the ADC 28 is also operative to perform simultaneous driving and sensing of the analog signal associated with the load 32 when the load 32 is energized from another source such as from a battery, an external power source, etc.

Various aspects, embodiments, and/or examples of the invention (and/or their equivalents) include an ADC that is operative to sense an analog current signal. The ADC is implemented to convert the sensed analog current signal into a very high resolution digital format of a desired resolution (e.g., of a certain sampling rate, resolution, or number of bits, etc.).

Figure 4:
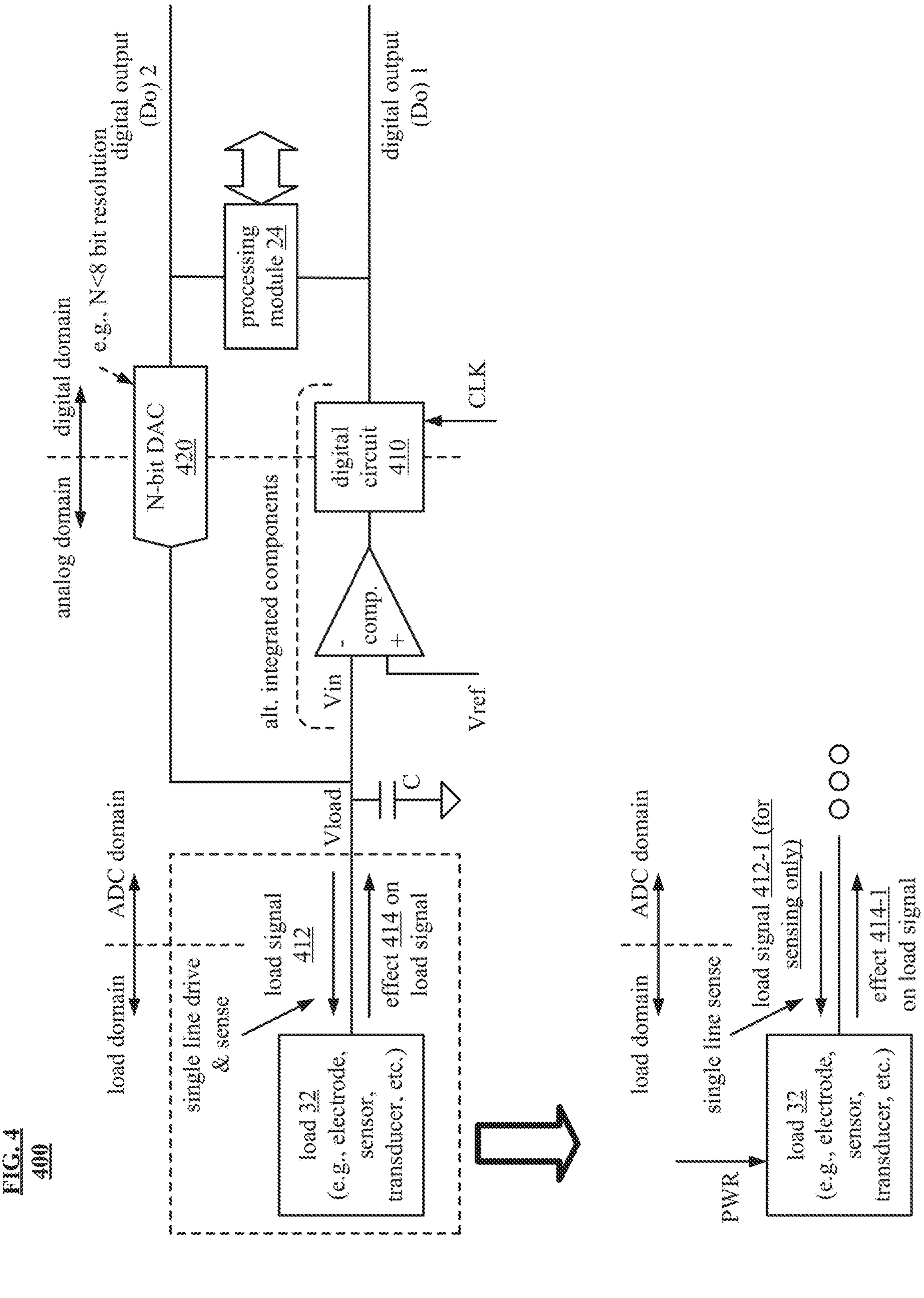
FIG. 4 is a schematic block diagram of an embodiment of an analog to digital converter (ADC) in accordance with the present invention.

FIG. 4 is a schematic block diagram of an embodiment 400 of an analog to digital converter (ADC) in accordance with the present invention. In this diagram, an ADC is connected to or coupled to a load 32 via single line such that the ADC is configured to provide a load signal 412 via that single line and simultaneously to detect any effect 414 on that load signal via a single line. In certain examples, the ADC is configured to perform single line drive and sense of that load signal 412, including any effect 414 thereon via that single line.

Note that certain of the following diagrams show one or more processing modules 24. In certain instances, the one or more processing modules 24 is configured to communicate with and interact with one or more other devices including one or more of ADCs, one or more components implemented within an ADC (e.g., filters of various types including low pass filters, bandpass filters, decimation filters, etc., gain or amplification elements, digital circuits, digital to analog converters (DACs) of varying types include N-bit DACs, analog to digital converters (ADCs) of varying types include M-bit ADCs, etc. Note that any such implementation of one or more processing modules 24 may include integrated memory and/or be coupled to other memory. At least some of the memory stores operational instructions to be executed by the one or more processing modules 24. In addition, note that the one or more processing modules 24 may interface with one or more other devices, components, elements, etc. via one or more communication links, networks, communication pathways, channels, etc. (e.g., such as via one or more communication interfaces of the device, such as may be integrated into the one or more processing modules 24 or be implemented as a separate component, circuitry, etc.).

Also, within certain of the following diagrams, there is a demarcation shown between the analog domain and the digital domain (e.g., showing the portion of the diagram that operates in the analog domain based on continuous-time signaling, and the portion of the diagram that operates in the digital domain that operates in the digital domain based on discrete-time signaling). Moreover, within certain of the following diagrams, there is a demarcation shown between the load domain and the ADC domain (e.g., Showing the connection or coupling between a load and/or an analog signal that is being sensed and the ADC that is sensing the analog signal, which may be associated with the load). In certain examples, an ADC is connected to or coupled to a load via a single line.

Also, such an ADC may be implemented to perform simultaneous driving and sensing of a signal via that single line that connects or couples to the load. For example, such an ADC is operative to drive an analog signal (e.g., current and/or voltage) of the load 32. With respect to implementations that operate in accordance with sensing analog current signals, such an ADC is operative to sense current signals within an extremely broad range including very low currents (e.g., currents below the 1 pico-amp range, within the 10 s of pico-amps range, below the 1 nano-amp range, within the 10 s of nano-amps range, below the 1 micro-amp range, within the 10 s of micro-amps range, etc.) and also up to relatively much larger currents (e.g., currents in the 10 s milli-amps range, 100 s milli-amps range, or even higher values of amps range, etc.). In some examples, such as with respect to detecting currents that are provided from a photodetection or photodiode component, such an ADC is operative to sense current signals below the 1 pico-amp range, currents within the 100 s of micro-amps range, etc.

Also, in some examples, when using appropriately provisioned components (e.g., higher current, higher power, etc.), much higher currents can also be sensed using architectures and topologies in accordance with an ADC as described herein. For example, such an ADC implemented based on architectures and topologies, as described herein, using appropriately provisioned components are operative to sense even higher currents (e.g., is of amps, 10 s of amps, or even higher values of amps range, etc.).

In addition, such an ADC may be implemented to provide for extremely low power consumption (e.g., less than 2 μW). Such an ADC may be particularly well-suited for low-power applications such as remote sensors, battery operated applications, etc. The architecture and design of such an ADC requires very few analog components. This provides a number of advantages and improve performance over prior art ADCs including very little continuous static current being consumed. In certain examples, such an ADC is described herein provides for a 10× lower power consumption in comparison to prior art ADC technologies. Such extremely low power consumption implementations may be particularly well-suited for certain applications such as bio-medical applications including sensing of vital signs on the patient, low current sensors, remote sensors, etc.

In addition, note that while such an ADC as described herein provides for significant improvement in a reduction in power consumption in comparison to prior art ADCs (e.g., including prior art ADCs such as successive approximation resolution (SAR) ADCs, D-sigma modulator ADCs, pipeline ADCs, etc.), such an ADC is described herein may be implemented as a general-purpose ADC in any of a variety of applications. Moreover, the bandwidth of analog signals that may be sensed using such an ADC is described herein is extremely broad, ranging from DC up to and over 10 MHz. In certain particular examples, such an ADC has described herein is implemented for very low frequency measurements, such as from DC up to 1 kHz.

Note also that an ADC as described herein may be designed and tailored particularly for a desired digital signal resolution to be generated based on a particular bandwidth to be sampled. In general, there may be a trade-off between bandwidth and power consumption within a particularly designed ADC. Consider an example in which a very high resolution digital signal is desired for a relatively low sampling bandwidth versus another example in which a relatively low resolution digital signal is desired for a relatively high sampling bandwidth. For example, consider a particularly designed ADC to provide a digital signal having 16-bit resolution for a sampling bandwidth below 100 kHz, then such an ADC may be implemented to consume less than 1 μW of energy.

Such an ADC may be appropriately designed to meet criteria for a particular application. Consider an example in which a 24-bit digital signal is desired for a relatively low sampling bandwidth from DC up to 100 kHz. Consider another example in which a 12 bit digital signal desired for a relatively higher sampling bandwidth from DC up to 1 MHz. In comparing these two examples, as the sampling bandwidth is extended higher and higher, the ADC will consume more current and thereby be more power consumptive. Depending on the particular application at hand, a relatively low sampling bandwidth may be acceptable for the particular application at hand, and very significant power consumption savings may be achieved. Generally speaking, a trade-off in design implementation may be viewed as higher resolution/lower sampling bandwidth/lower power consumption versus higher resolution/higher sampling bandwidth/higher power consumption.

In addition, note that many of the examples of an ADC included herein operate based on sensing a current signal as opposed to a voltage signal. In addition, when the ADC is implemented in an application to sense a voltage signal, an appropriately implemented voltage to current transforming element, such as the trans-impedance amplifier that is operative to transform voltage to current, or vice versa, may be implemented to generate a current signal from a voltage signal in any particular desired application.

In any of the various diagrams, note that such a load 32 may be of any of a variety of types including electrode, a sensor, a transducer, etc. Generally speaking, such a load 32 may be any of a variety of types of components. Examples of such components may include any one or more of sources, devices, systems, etc. that has an associated analog signal that may be sensed and converted to a digital signal including a sensor, a computing device, a circuit, etc. within any type of application context including industrial, medical, communication system, computing device, etc.

Also, note that such a load 32 as depicted within any diagram herein may be energized or powered based on the signal provided from the ADC or alternatively powered by another source such as a battery, external power source, etc. For example, consider the lower left-hand portion of the diagram and need demarcation between the load domain and the ADC domain, such that the load 32 is connected to the ADC via a single line. In certain examples, the ADC is implemented to facilitate single-line sense functionality such that a load signal 412-1 is provided to the load 32 for sensing only, and any effect 414-1 on that load signal is sensed and detected by the ADC. In such an example is this, power is provided to the load 32 from an external source.

Referring again to the top portion of the diagram, the ADC is connected to or coupled to a load 32 via single line such that the ADC is configured to provide a load signal 412 via that single line and simultaneously to detect any effect 414 on that load signal via a single line. For example, the load signal 412 is an analog current signal. An analog capacitor, C, is implemented to be charged in accordance with the load signal 412. Note that such an analog capacitor may alternatively be a load capacitance from the load 32 itself, such that a separate analog capacitor, C, is not needed when the load 32 itself provides a sufficient load capacitance.

In an example of operation and implementation, a load voltage, Vload, is generated based on any effect 414 on that load signal charging the capacitor. This load voltage, Vload, serves as an input voltage, Vin, to one of the inputs of a comparator that also receives a reference signal, Vref (e.g., a voltage reference signal). Note that the reference signal, Vref, may be internally generated, provided from an external source, provided from a processing module 24, etc. The comparator compares the input voltage, Vin, to the reference signal, Vref, and outputs a signal that is based on any difference between the input voltage, Vin, to the reference signal, Vref, that gets processed by a digital circuit 410 to generate a digital output (Do) 1 signal that may be viewed as being a digital stream of 0s and/or is at a clock rate (CLK) at which the digital circuit 410 is clocked.

For example, consider that the input voltage, Vin, is greater than the reference signal, Vref, then the comparator output signal would be positive (e.g., such as a positive rail or power supply voltage of the ADC). Alternatively, consider that the input voltage, Vin, is less than or equal to the reference signal, Vref, then the comparator output signal would be negative (e.g., such as a negative rail or power supply voltage of the ADC).

In another example, consider that the input voltage, Vin, is greater than the reference signal, Vref, then the comparator output signal would be positive or negative (e.g., such as a positive or negative rail or power supply voltage of the ADC). Alternatively, consider that the input voltage, Vin, is less than or equal to the reference signal, Vref, then the comparator output signal would be zero (e.g., such as a ground voltage potential).

Generally speaking, the combined operation of the comparator and the digital circuit 410 may be viewed as performing the analog to digital conversion of a signal that is the difference (e.g., and error voltage, Ve) between the input voltage, Vin, and the reference signal, Vref (e.g., Ve=Vref−Vin) to generate a digital signal of a particularly desired resolution, which may be viewed as M bits, where M is a positive integer greater than or equal to 1.

A processing module 24 is operative to process the Do 1 to generate a digital output (Do) 2. Note that the processing module 24 may be implemented in any of a variety of examples to perform any desired digital signal processing on the Do 1 to generate the Do 2. Examples of such digital signal processing may be increasing the output resolution (e.g., consider Do 1 having a resolution of M bits and Do 2 having a resolution of N bits, where N and M are both positive integers, where M is a positive integer greater than or equal to 1, and N is greater than M), performing filtering on the Do 1 to generate the Do 2 (e.g., such as low pass filtering or bandpass filtering based on certain parameters such as a particular frequency cut off for low pass filtering or a particular frequency range for bandpass filtering).

The processing module 24 provides the Do 2 to an N-bit digital to analog converter (DAC) 420. In some examples, the N-bit DAC 420 has a resolution of N<8 bits. This N-bit DAC 420, based on the Do 2 provided from the processing module 24, forces and output current to the load 32 that follows or tracks the load signal 412 due to the operation of the comparator that compares the input voltage, Vin, to the reference signal, Vref, and, in conjunction with the digital circuit 410, generates Do 1.

From certain perspectives, considering the Do 1 and the Do 2, the Do 1 may be viewed as a digital signal corresponding to the unfiltered load current signal including quantization noise, and the Do 2 may be viewed as another digital signal corresponding to a filtered load current signal.

In this diagram, the positive input of the comparator is driven by the reference signal, Vref. The load voltage, Vload, will follow the reference signal, Vref, based on the comparator output signal that corresponds to the difference or error between the input voltage, Vin, and the reference signal, Vref. In many examples, the difference between the input voltage, Vin, and the reference signal, Vref, is very small (e.g., approaching 0, very close to 0, or actually 0) based on the Delta-sigma modulation operation of the comparator and the digital circuit 410. For example, when there is any difference between the input voltage, Vin, and the reference signal, Vref, the ADC adapts/modifies the output current from the N-bit DAC 420 to match the current of the load so that difference or error between the input voltage, Vin, and the reference signal, Vref, will be forced to 0.

Note that the comparator and the digital circuit 410 may be implemented using one or more other components and other examples while still providing the same overall functionality of the ADC. The following diagram shows some alternative possible examples of how the comparator and the digital circuit 410 may be implemented.

Note that this implementation of an ADC includes very few number of analog components. For example, there may be instances in which no capacitors required whatsoever given that the load 32 inherently includes sufficient load capacitance to generate the load voltage, Vload. In certain implementations, the comparator is implemented by a component that performs analog to digital conversion of the load voltage, Vload, directly thereby further reducing the number of analog components within the ADC.

Given the small number of analog components, such an ADC consumes little or no continuous static power thereby facilitating very low power consumption. The only static current being consumed is by the N-bit DAC 420. This N-bit DAC 420 drives and output current that is same as the sensed load current thereby tracking or following the load current. Therefore, within implementations in which the load current is small, so will the corresponding output current from the N-bit DAC 420 be small. The smaller the current provided from the N-bit DAC 420, which is based on the sensed load current, the lower the power consumption of the ADC. Note that there are certainly alternative implementations of an ADC that will consume some static current, such as when an M-bit analog to digital converter (ADC) is used or some other component that is implemented to perform the analog-to-digital conversion of the signal Vin to Do 1.

Also, note that the amount of power consumed by the DAC, particularly the digital power consumed by the DAC, scales with the clock rate, CLK. Note also that applications that are implemented to perform sensing of ADC signal, such as sensing ADC current signal, the clock frequency can be extremely low (e.g., within the range of 1 kHz to 100 kHz) thereby providing for a very small digital power consumption.

Figure 5A:
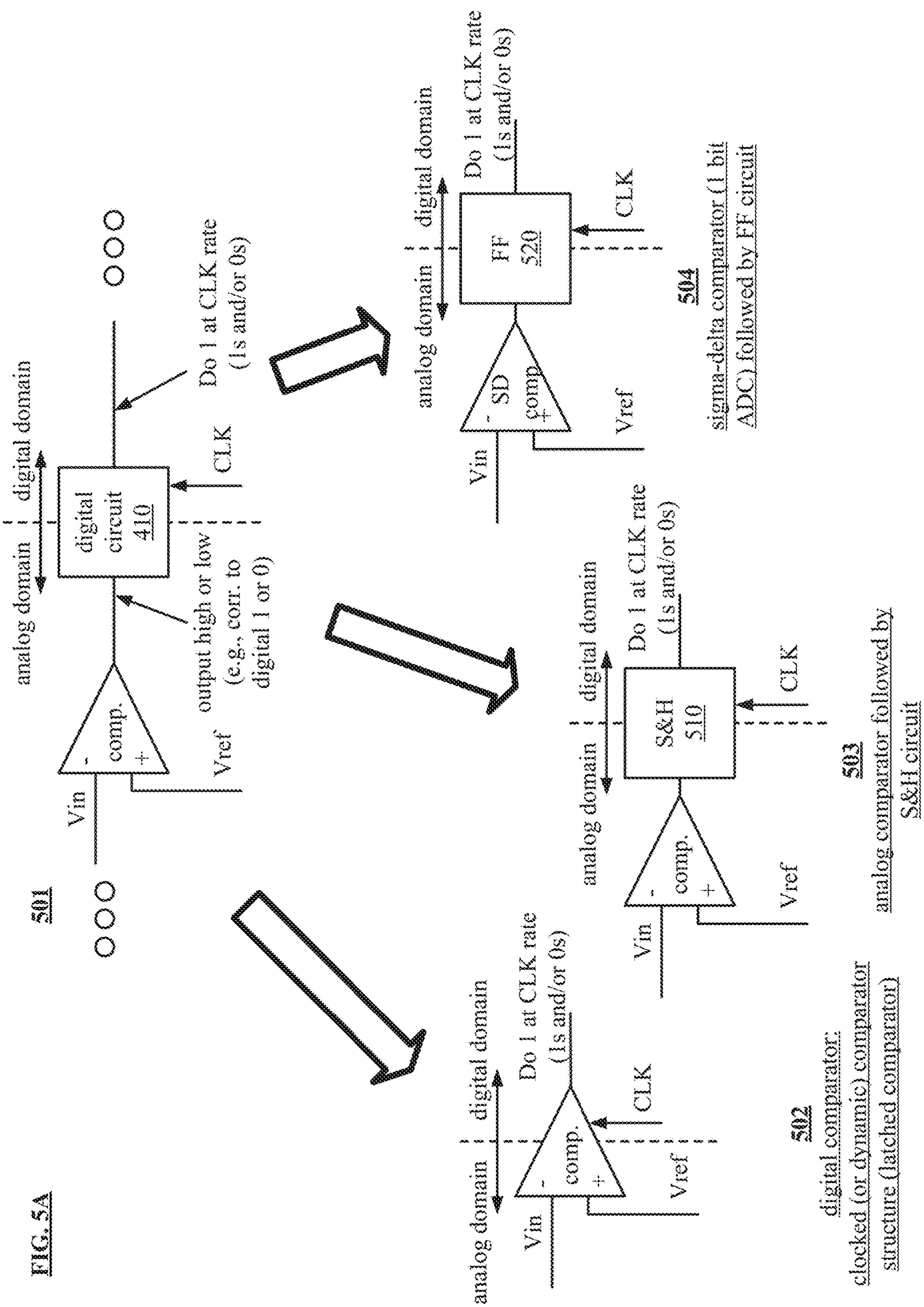
FIG. 5A is a schematic block diagram showing alternative embodiments of various components may be implemented within an ADC in accordance with the present invention.

FIG. 5 is a schematic block diagram showing alternative embodiments 501, 502, 503, and 504 of various components may be implemented within an ADC in accordance with the present invention. Considering reference numeral 501, a comparator operates in cooperation with the digital circuit 410 as described above such that the combined operation of the comparator and the digital circuit 410 may be viewed as performing the analog to digital conversion of a signal that is the difference (e.g., Ve) between the input voltage, Vin, and the reference signal, Vref (e.g., Ve=Vref−Vin) to generate a digital signal of a particularly desired resolution, which may be viewed as M bits, where M is a positive integer greater than or equal to 1.

However, note that comparator and the digital circuit 410 may be implemented using any of a variety of other means while still facilitating proper operation of an ADC. With respect to reference numeral 502, a digital comparator, which may alternatively be described as a clock (or dynamic) comparator structure (latched comparator) is shown. This singular device performs the operation of both a comparator and the digital circuit 410 within a single device. For example, the digital comparator is clocked at a particular clocking frequency (CLK) and outputs a stream of 1s and/or 0s based on the comparison of Vref and Vin. In comparison to a comparator that operates continuously and that will output one of two values, such as either a high signal or low signal, continually as a function of time, a digital comparator outputs a 1 or 0 at each clock cycle based on the comparison of Vref and Vin in accordance with generating the Do 1 (e.g., 1 when Vref>Vin and 0 when Vref<=Vin, or vice versa). Also note that by only clocking such a digital comparator at certain intervals, a higher accuracy and lower power consumption can be achieved in comparison to a comparator that operates continuously.

With respect to reference numeral 503, the output of the comparator is provided to a sample and hold circuit (S&H) 510. Generally speaking, a S&H 510 holds, locks, or freezes its value at a constant level for a specified minimum period of time. This signal may be viewed as interpreted as a digital stream of 1s and/or 0s at the clocking frequency (CLK) in accordance with generating the Do 1. Note that such a S&H 510 may be implemented in a variety of ways including a circuit that stores electric charge and a capacitor and also employs one or more switching elements such that the circuit stores electric charge is built up over each of certain intervals, and the switching element connects the output of the circuit that stores electric charge to the output at certain in the boroughs such as the clocking frequency (CLK) in accordance with generating the Do 1.

With respect to reference numeral 504, the comparator and the digital circuit for 10 are replaced with a sigma-delta comparator, such as a one bit ADC, followed by a flip-flop circuit (FF) 520. The sigma-delta comparator provides a high or low signal to the FF 520 based on comparison of Vref and Vin, and the FF 520 outputs a 1 or 0 at each clock cycle such as the clocking frequency (CLK) based on the comparison of Vref and Vin in accordance with generating the Do 1.

Generally speaking, note that the implementation of a comparator and the digital circuit 410 as shown within any of the diagrams herein may be alternatively implemented in a variety of different ways including those shown within this diagram and/or their equivalents.

Figure 5B:
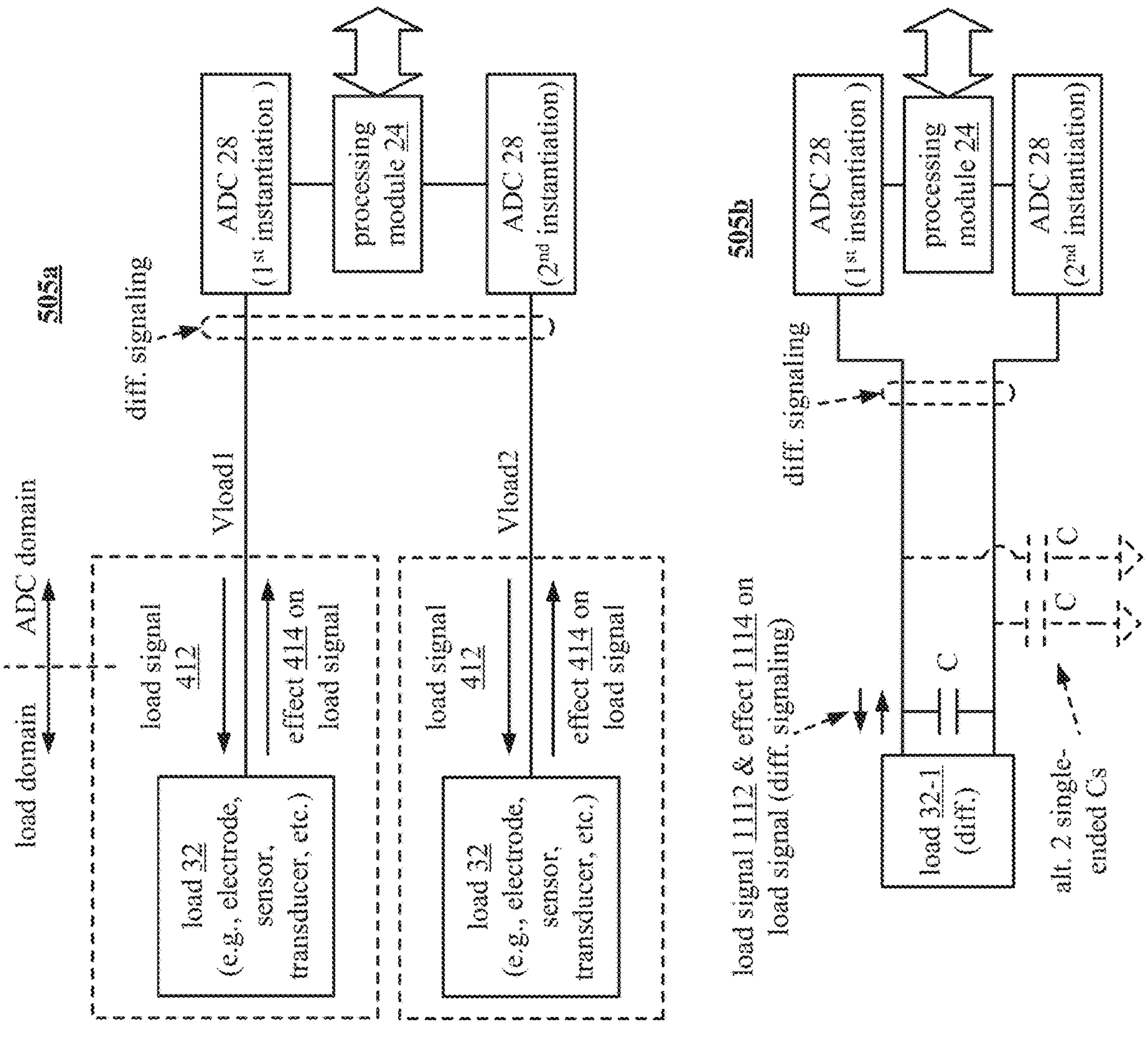
FIG. 5B is a schematic block diagram showing alternative embodiments of servicing differential signaling using ADCs in accordance with the present invention.

FIG. 5B is a schematic block diagram showing alternative embodiments 505*a* and 505*b* of servicing differential signaling using ADCs in accordance with the present invention. In addition to servicing and sensing single-ended lines and generating digital signals based thereon using ADCs as described herein, note that servicing and sensing of signals may also be performed. For example, with respect to reference numeral 505*a*, a first instantiation of an ADC 28 and the second instantiation of an ADC 28 are each respectively coupled via a respective single line to a different perspective load 32. Two respective load voltages, Vload1 and Vload2, are respectively received by the first and second instantiations of an ADC 28. Note that the first and second instantiation of an ADC 28 may be the same or may be different. Each respective instantiation of an ADC 28 in this example is operative to service and sense a respective single-ended line. Together, the first and second instantiations of an ADC 28 are operative to sense a differential signal that is based on the two load voltages, Vload1 and Vload2, and to generate a corresponding digital signal based thereon. In certain examples a processing module 24 is implemented to combine a first digital signal that is based on Vload1 and that is generated by the first instantiation of an ADC 28 and a second digital signal that is based on Vload2 and that is generated by the second instantiation of an ADC 28 to generate a resultant digital signal that corresponds to the differential voltage between the two load voltages, Vload1 and Vload2 (e.g., Vdiff=Vload1−Vload2, or Vdiff=Vload2−Vload1).

As another example, with respect to reference numeral 505*b*, a differential load 32-1 is serviced such that the two signal lines corresponding to the differential signaling provided by the differential load 32-1 are respectively provided to a first instantiation of an ADC 28 and a second instantiation of an ADC 28. Similarly, a processing module 24 may be implemented to generate a resulting digital signal that corresponds to the differential voltage associated with the differential load 32-1. The first instantiation of an ADC 28 in the second instantiation of an ADC 28 operate cooperatively to provide a load signal 1112 and to detect any effect 1114 on the load signal that is based on the differential load 32-1. A capacitor, C, is also implemented across the differential signal lines of the differential load 32-1. In alternative implementations, two respective single-ended capacitors, C, are respectively connected to the differential signal lines and to ground instead of the capacitor, C, connected to the differential lead lines (e.g., a first single ended capacitor, C, connected to one of the differential signal lines and to ground, and a second single ended capacitor, C, also connected to the other of the differential signal lines and to ground).

Note that any example, embodiment, etc. of any ADC described herein that is operative to sense an analog signal via a single line may be implemented within the first instantiation and the second instantiation of an ADC 28 in either of these examples corresponding to reference numerals 505*a* and 505*b* and/or their equivalents.

In an example of operation and implementation, an ADC (e.g., consider the ADC of FIG. 4) includes a capacitor that is operably coupled to a load and configured to produce a load voltage based on charging by a load current and a digital to analog converter (DAC) output current. In some examples, the ADC is coupled to the load via a single line. The ADC also includes a comparator. When enabled, the comparator operably coupled and configured to receive the load voltage via a first input of the comparator, receive a reference voltage via a second input of the comparator, and compare the load voltage to the reference voltage to generate a comparator output signal.

The ADC also includes a digital circuit that is operably coupled to the comparator. When enabled, the digital circuit operably coupled and configured to process the comparator output signal to generate a first digital output signal that is representative of a difference between the load voltage and the reference voltage.

The ADC also includes one or more processing modules operably coupled to the digital circuit and to memory, which may be included within the ADC or external to the ADC. When enabled, the one or more processing modules is configured to execute the operational instructions to process the first digital output signal to generate a second digital output signal that is representative of the difference between the load voltage and the reference voltage, wherein the second digital output signal includes a higher resolution than the first digital output signal.

The ADC also includes an N-bit digital to analog converter (DAC) that is operably coupled to the one or more processing modules. When enabled, the N-bit DAC operably coupled and configured to generate the DAC output current based on the second digital output signal. Note that N is a positive integer. The DAC output current tracks the load current, and the load voltage tracks the reference voltage.

Also, in some examples, the one or more processing modules, when enabled, is further configured to process the first digital output signal in accordance with performing band pass filtering or low pass filtering to generate the second digital output signal that is representative of the difference between the load voltage and the reference voltage.

In alternative examples, the comparator includes a sigma-delta comparator, and the digital circuit includes a clocked flip flop. In even other examples, a digital comparator includes both the comparator and the digital circuit (e.g., the digital comparator is operative to perform the functionality of both the comparator and the digital circuit). When enabled, the digital comparator operably coupled and configured to receive the load voltage via a first input of the comparator, receive a reference voltage via a second input of the comparator, and compare the load voltage to the reference voltage to generate the first digital output signal that is representative of the difference between the load voltage and the reference voltage.

In addition, in certain examples, the ADC includes a decimation filter coupled to the one or more processing modules. When enabled, the decimation filter is operably coupled and configured to process the second digital output signal to generate another digital output signal having a lower sampling rate and a higher resolution than the second digital output signal. Alternative to or in addition to, another decimation filter is coupled to the digital circuit. When enabled, the other decimation filter the operably coupled and configured to process the first digital output signal to generate another digital output signal having a lower sampling rate and a higher resolution than the first digital output signal.

Figure 6:
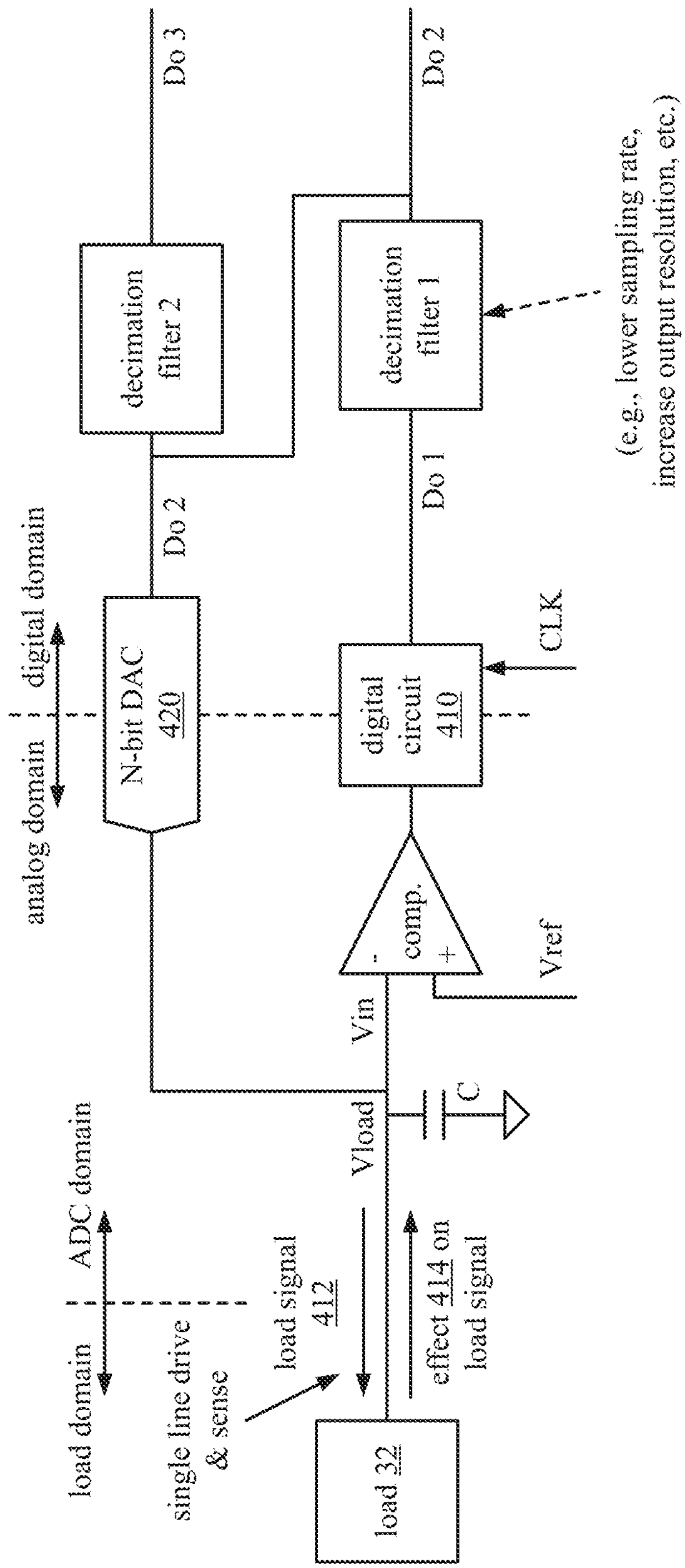
FIG. 6 is a schematic block diagram of another embodiment of an ADC that includes one or more decimation filters in accordance with the present invention.

FIG. 6 is a schematic block diagram of another embodiment 600 of an ADC that includes one or more decimation filters in accordance with the present invention. This diagram has similarities with respect to FIG. 4 with at least one difference being that a decimation filter 1 and/or a decimation filter 2 are implemented to process the Do 1 and the Do 2. For example, a decimation filter may be implemented to process a digital signal thereby lowering the sample rate thereof and increasing the output resolution. Consider a digital signal having a 12 bit resolution and a 100 kHz sampling rate. In one example, a decimation filter may operate to increase the resolution of that digital signal to be 24-bit resolution with a lower sampling rate of 50 kHz. In another example, decimation filter may operate to increase the resolution of that digital signal to be 18-bit resolution with a lower sampling rate of 75 kHz. generally speaking, any desired transformation of sampling rate and output resolution may be made performed using one or more decimation filters in accordance with any of the various examples of ADCs as described herein. In certain examples, only a decimation filter 1 is included thereby processing the Do 1 to generate the Do 2. In other examples, both a decimation filter 1 is included thereby processing the Do 1 to generate the Do 2 and a decimation filter 2 is included thereby processing the Do 2 to generate a Do 3 (e.g., Do 3 having a lower sampling rate and increased output resolution in comparison to the Do 2).

Figure 7:
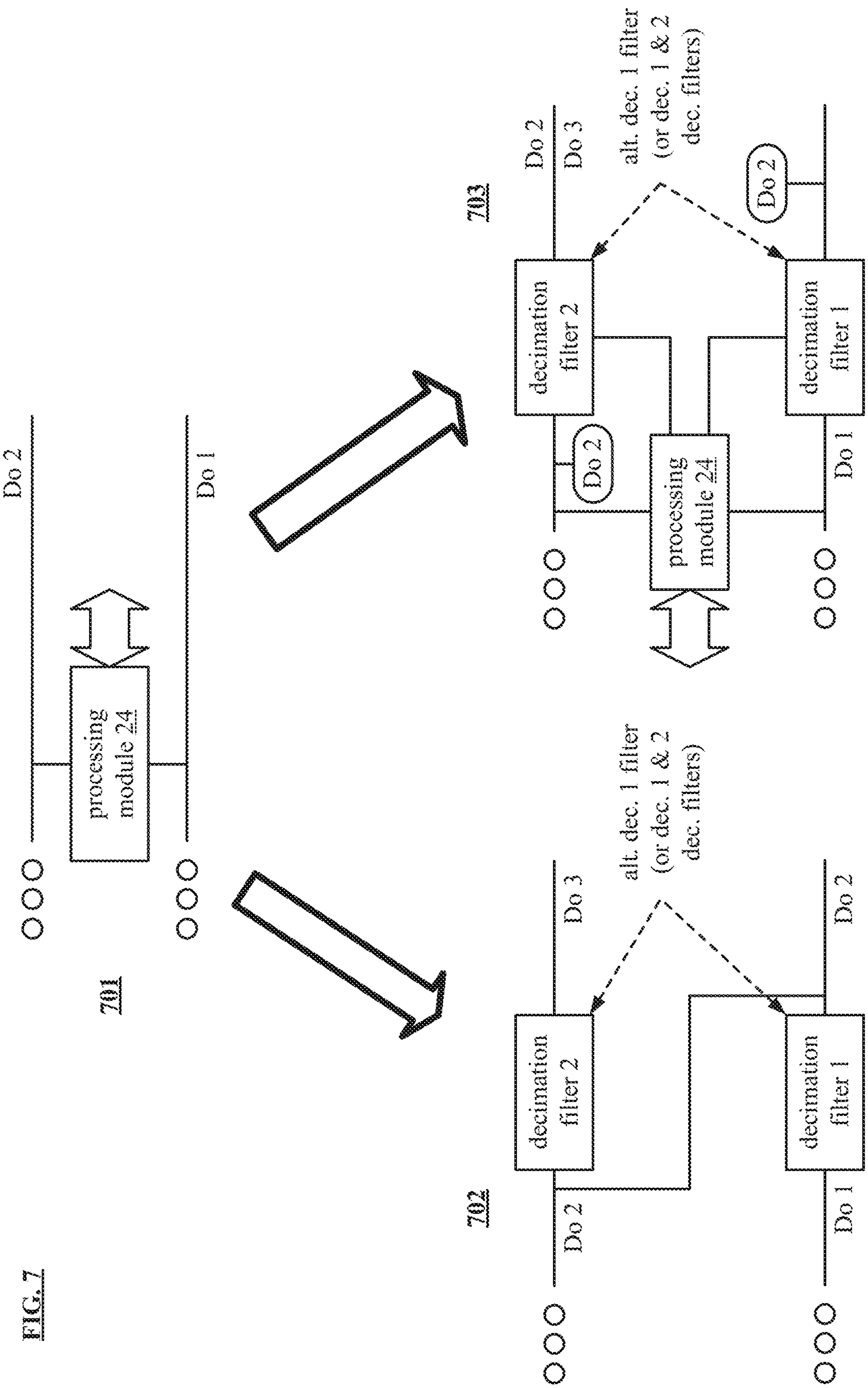
FIG. 7 is a schematic block diagram showing alternative embodiments of one or more decimation filters and/or processing modules that may be implemented to perform digital domain processing within an ADC in accordance with the present invention.

FIG. 7 is a schematic block diagram showing alternative embodiments 701, 702, and 703 of one or more decimation filters and/or processing modules that may be implemented to perform digital domain processing within an ADC in accordance with the present invention. With respect to reference numeral 701, a processing module 24 may be implemented to perform any of a variety of different digital signal processing operations on the Do 1 to generate the Do 2 such as decimation filtering, low pass filtering, bandpass filtering, etc. However, note that such an implementation of the output signals, such as Do 1 and the Do 2 may be implemented in different configurations as desired in particular applications.

For example, with respect to reference numeral 702, a decimation filter 1 and a decimation filter 2 may be implemented. As described above, only a decimation filter 1 may s included thereby processing the Do 1 to generate the Do 2. In other examples, both a decimation filter 1 is included thereby processing the Do 1 to generate the Do 2 and a decimation filter 2 is included thereby processing the Do 2 to generate a Do 3 (e.g., Do 3 having a lower sampling rate and increased output resolution in comparison to the Do 2).

With respect to reference numeral 703, the processing module 24 is configured to control the operation of the decimation filter 1 and decimation filter 2. For example, the processing module 24 is configured to the manner in which decimation filtering may be performed by the decimation filter 1 and/or decimation filter 2 (e.g., including the manner of conversion of digital signal resolution, the modification of sampling rate, etc.).

Note that any of the respective implementations shown within this diagram may be implemented within any other of the appropriate diagrams of an ADC as described herein.

Figure 8:
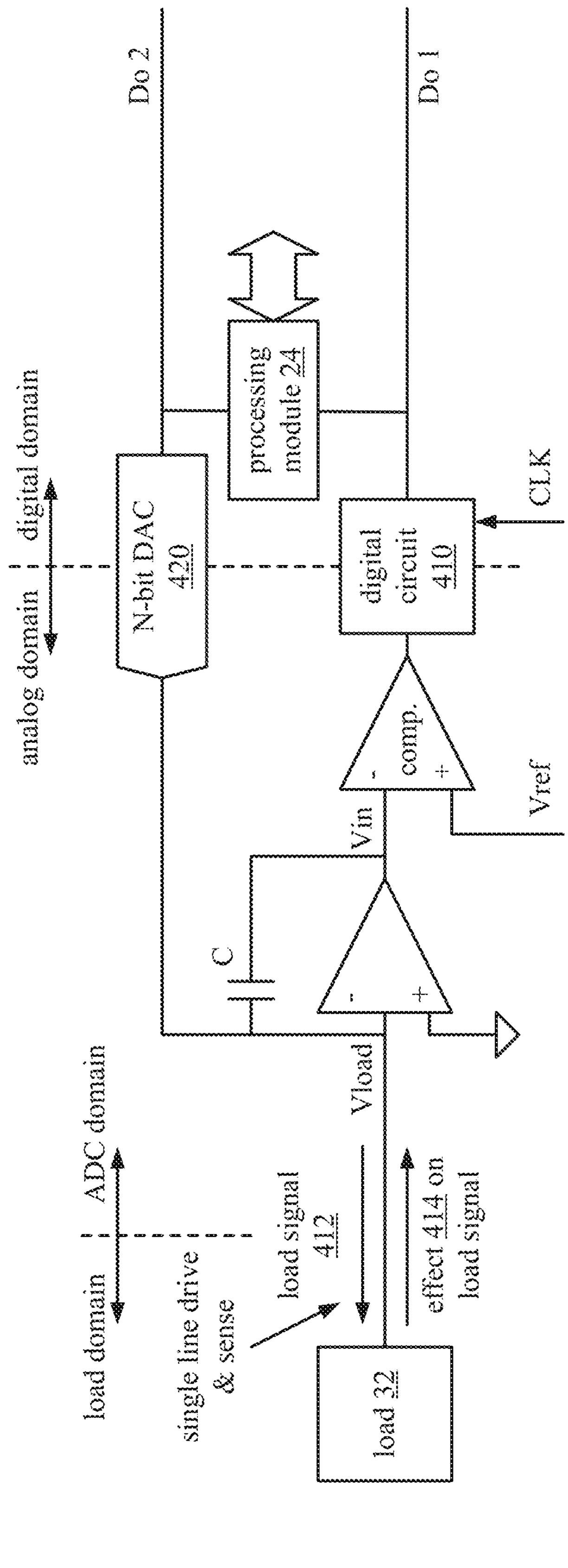
FIG. 8 is a schematic block diagram of another embodiment of an ADC in accordance with the present invention.

FIG. 8 is a schematic block diagram of another embodiment 800 of an ADC in accordance with the present invention. This diagram is similar to that of FIG. 4 with at least one difference being that the capacitor, C, is replaced by an integrator. The integrator is implemented as an operational amplifier with a feedback capacitor, C. The use of the operational amplifier in place of only the capacitor, C, may be used for applications that are tailored to serve greater power than that of FIG. 4. Generally speaking, the feedback capacitor, C, implemented in cooperation with the operational amplifier serves a similar purpose of the capacitor, C, in FIG. 4 of being charged based on the load current and the output current from the N-bit DAC 420 thereby generating the Vin to be provided to the comparator and compared with Vref.

In an example of operation and implementation, an ADC (e.g., consider the ADC of FIG. 800) includes an operational amplifier (op amp) that is operably coupled to a load via a first op amp input. Also, a capacitor is operably coupled to the first op amp input and an op amp output. When enabled, the op amp is operably coupled and configured to generate an output voltage at the op amp output that corresponds to a load voltage that is based on charging of the capacitor by a load current and a digital to analog converter (DAC) output current. In some examples, the ADC is coupled to the load via a single line.

The ADC also includes a comparator that is operably coupled to the op amp. When enabled, the comparator operably coupled and configured to receive the output voltage via a first input of the comparator, receive a reference voltage via a second input of the comparator, and compare the load voltage to the reference voltage to generate a comparator output signal.

The ADC also includes a comparator a digital circuit that is operably coupled to the comparator. When enabled, the digital circuit is operably coupled and configured to process the comparator output signal to generate a first digital output signal that is representative of a difference between the load voltage and the reference voltage.

The ADC also includes a comparator one or more processing modules operably coupled to the digital circuit and to memory, which may be included within the ADC or external to the ADC. When enabled, the one or more processing modules is configured to execute the operational instructions to process the first digital output signal to generate a second digital output signal that is representative of the difference between the load voltage and the reference voltage. Note that the second digital output signal includes a higher resolution than the first digital output signal.

The ADC also includes an N-bit digital to analog converter (DAC) that is operably coupled to the one or more processing modules. When enabled, the N-bit DAC operably coupled and configured to generate the DAC output current based on the second digital output signal. Note that N is a positive integer. Also, the DAC output current tracks the load current, and the load voltage tracks the reference voltage.

In some examples, the one or more processing modules, when enabled, is further configured to process the first digital output signal in accordance with performing band pass filtering or low pass filtering to generate the second digital output signal that is representative of the difference between the load voltage and the reference voltage.

In some examples, the comparator includes a sigma-delta comparator, and the digital circuit includes a clocked flip flop. Also, in some other examples, a digital comparator includes both the comparator and the digital circuit (e.g., the digital comparator is operative to perform the functionality of both the comparator and the digital circuit). When enabled, the digital comparator operably coupled and configured to receive the load voltage via a first input of the comparator, receive a reference voltage via a second input of the comparator, and compare the load voltage to the reference voltage to generate the first digital output signal that is representative of the difference between the load voltage and the reference voltage.

In addition, in certain examples, the ADC includes a decimation filter coupled to the one or more processing modules. When enabled, the decimation filter is operably coupled and configured to process the second digital output signal to generate another digital output signal having a lower sampling rate and a higher resolution than the second digital output signal. Alternative to or in addition to, another decimation filter is coupled to the digital circuit. When enabled, the other decimation filter the operably coupled and configured to process the first digital output signal to generate another digital output signal having a lower sampling rate and a higher resolution than the first digital output signal.

Figure 9:
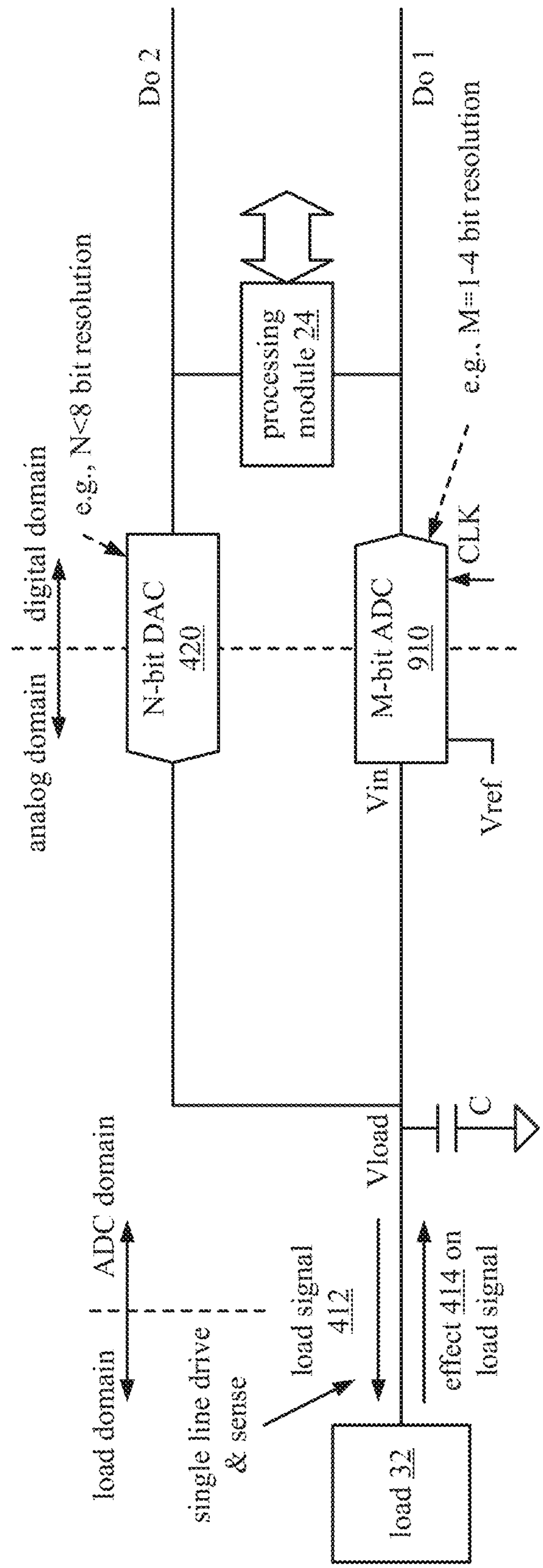
FIG. 9 is a schematic block diagram of another embodiment of an ADC in accordance with the present invention.

FIG. 9 is a schematic block diagram of another embodiment 900 of an ADC in accordance with the present invention. This diagram has certain similarities with one or more of the previous diagrams with at least one difference being that a comparator and the digital circuit 410, or a functionally equivalent component to the comparator and the digital circuit 410, is replaced by a low resolution analog to digital converter (ADC), specifically, an M-bit ADC 910, where M is a positive integer greater than or equal to 1. In certain particular examples, M is a positive integer within the range of 1-4 (e.g., 1, 2, 3, or 4). Also, in certain particular examples, N of the N-bit DAC 420 is less than or equal to M. In certain specific examples, N<8 bit resolution. For example, if N=4, then M=3, 2, or 1. The Do 2 may be viewed as a high-resolution digital signal (N bit resolution) compared to the Do 1 (M bit resolution), such that M<N. In addition, in some examples, the Do 2 is a modified version of the Do 1 after having undergone any desired digital signal processing within the processing module 24.

Note that the M-bit ADC 910 is operative to generate the Do 1 as being an error signal that corresponds to a difference between Vin and Vref and having a resolution of M bits and that is output based on the clocking rate, CLK. For example, the Do 1 is a digital signal that corresponds to corresponds to an error signal, Ve, such that Ve=Vref−Vin or Vin−Vref.

The use of such an M-bit ADC 910 provides many performance improvements for certain applications including a reduction of quantization noise and an increase of the output resolution of the ADC, particularly with respect to the Do 1. For example, instead of Do 1 being a single bit resolution digital signal (e.g., a digital stream of 1s and/or 0s), the Do 1 in this diagram is a digital signal having a higher resolution (e.g., of 2, 3, or 4 bits). In some examples, the Do 1 is then provided to the processing module 24, and the processing module 24 is configured to perform any desired digital signal processing operation on the Do 1 to generate the Do 2 (e.g., increase the output resolution and lower the sampling rate, perform low pass filtering, perform bandpass filtering, etc.).

In this diagram, note that the Do 1 may be passed directly to the N-bit DAC 420 such that the Do 1 is used to drive the N-bit DAC 420. However, in certain examples, the Do 2 is used to drive the N-bit DAC 420 such as when it is a filtered and/or digital signal processed version of the Do 1.

In an example of operation and implementation, an ADC (e.g., the ADC of FIG. 900) includes a capacitor that is operably coupled to a load and configured to produce a load voltage based on charging by a load current and a digital to analog converter (DAC) output current. In some examples, the ADC is coupled to the load via a single line.

The ADC also includes an M-bit analog to digital converter (ADC). When enabled, the M-bit ADC operably coupled and configured to receive the load voltage, receive a reference voltage, and compare the load voltage to the reference voltage and generate a first digital output signal that is representative of a difference between the load voltage and the reference voltage.

The ADC also includes a processing module operably coupled to the digital circuit and to memory, which may be included within the ADC or external to the ADC. When enabled, the processing module is configured to execute the operational instructions to process the first digital output signal to generate a second digital output signal that is representative of the difference between the load voltage and the reference voltage. Note that the second digital output signal includes a higher resolution than the first digital output signal.

The ADC also includes an N-bit digital to analog converter (DAC) that is operably coupled to the processing module. When enabled, the N-bit DAC is operably coupled and configured to generate the DAC output current based on the second digital output signal. Note that the DAC output current tracks the load current, and the load voltage tracks the reference voltage. N is a first positive integer, and M is a second positive integer greater than or equal to 1. In some examples, N is greater than M. In other examples, N is the first positive integer that is less than or equal to 8, and M is the second positive integer that is greater than or equal to 1 and less than or equal to 4.

In even other examples, the one or more processing modules, when enabled, is further configured to process the first digital output signal in accordance with performing band pass filtering or low pass filtering to generate the second digital output signal that is representative of the load voltage.

In addition, in certain examples, the ADC includes a decimation filter coupled to the one or more processing modules. When enabled, the decimation filter is operably coupled and configured to process the second digital output signal to generate another digital output signal having a lower sampling rate and a higher resolution than the second digital output signal. Alternative to or in addition to, another decimation filter is coupled to the digital circuit. When enabled, the other decimation filter the operably coupled and configured to process the first digital output signal to generate another digital output signal having a lower sampling rate and a higher resolution than the first digital output signal.

Figure 10:
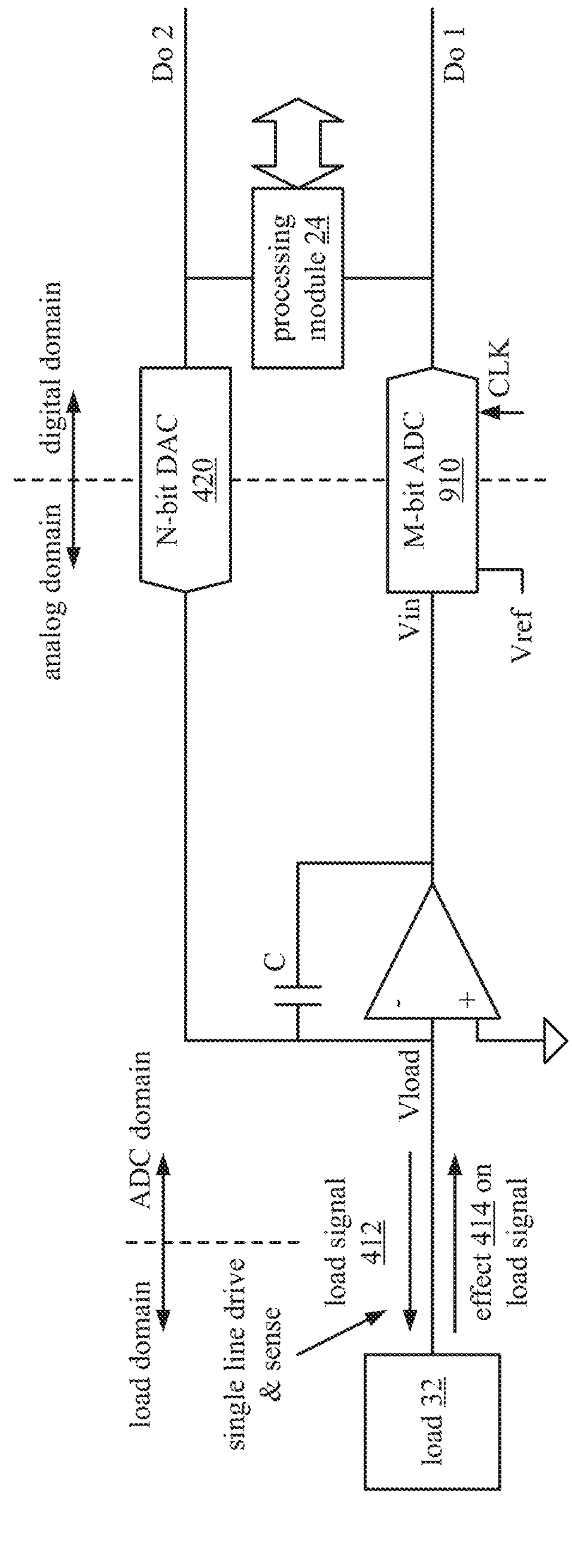
FIG. 10 is a schematic block diagram of another embodiment of an ADC in accordance with the present invention.

FIG. 10 is a schematic block diagram of another embodiment 1000 of an ADC in accordance with the present invention. This diagram is similar to the previous diagram with at least one difference being that the capacitor, C, is replaced by an integrator. The integrator is implemented as an operational amplifier with a feedback capacitor, C. The use of the operational amplifier in place of only the capacitor, C, may be used for applications that are tailored to serve greater power than that of the previous diagram. Generally speaking, the feedback capacitor, C, implemented in cooperation with the operational amplifier serves a similar purpose of the capacitor, C, in the previous diagram of being charged based on the load current and the output current from the N-bit DAC 420 thereby generating the Vin to be provided to the comparator and compared with Vref.

In addition, with respect to all of these examples of an ADC, the ADC operates by providing an output current to the load 32 to cancel out the load current. This may be viewed as providing an output current that is equal to and opposite polarity to the load current. Again, note that such an ADC may be implemented not only to sense an analog signal associated with the load 32 but also to provide power and/or energy to the load 32 within implementations where the load 32 is not energized via another source. In some examples, this providing of power and/or energy from the ADC to the load 32 is performed simultaneously via a single line via which the ADC senses and analog signal associated with the load 32. Also, such an ADC may be implemented to perform sensing only of an analog signal associated with the load 32 without providing power and/or energy to the load 32.

Figure 11:
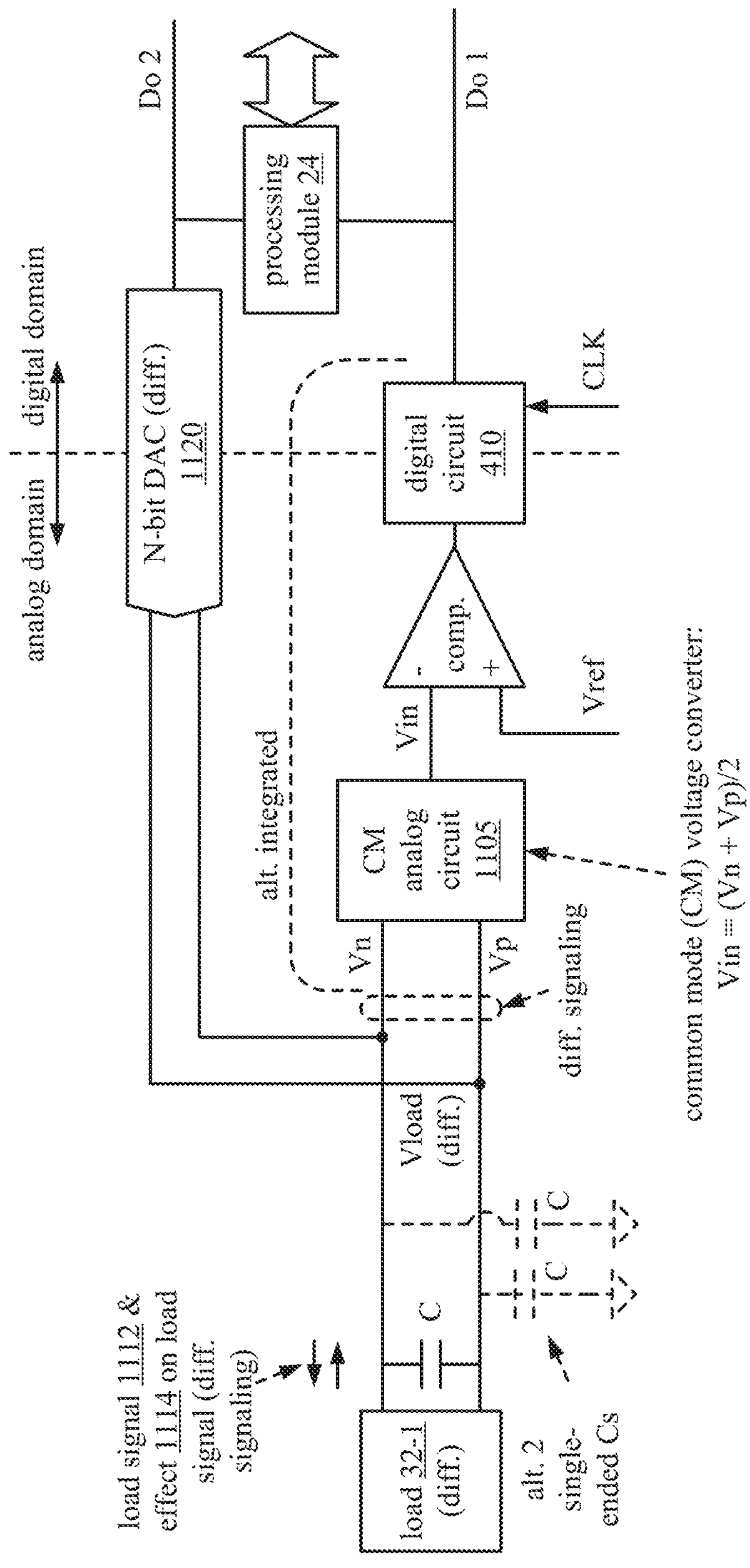
FIG. 11 is a schematic block diagram of an embodiment of an ADC that is operative to process an analog differential signal in accordance with the present invention.

FIG. 11 is a schematic block diagram of an embodiment 1100 of an ADC that is operative to process an analog differential signal in accordance with the present invention. This diagram shows an implementation of an ADC operating on a differential load 32-1 such that the ADC provides a load signal 1112 to the differential load 32-1 and also detects any effect 1114 on that load signal. In this diagram, a capacitor, C, is connected to the differential lead lines of the differential load 32-1. In alternative implementations, two respective single-ended capacitors, C, are respectively connected to the differential signal lines and to ground instead of the capacitor, C, connected to the differential lead lines (e.g., a first single ended capacitor, C, connected to one of the differential signal lines and to ground, and a second single ended capacitor, C, also connected to the other of the differential signal lines and to ground).

Also, the N-bit DAC 420 is replaced with a differential N-bit DAC 1120, wherein N is a positive integer. The N-bit DAC 420 is operative to generate a differential output current signal that is provided to the differential load 32-1 based on the Do 2.

A differential signal may be viewed as being composed of two respective voltages corresponding to the two differential signal lines, Vp and Vn (e.g., sometimes referred to as a positive voltage, Vp, is a negative voltage, Vn). In this diagram, a common mode (CM) analog circuit 1105 is implemented to convert the differential signal to a single-ended signal. For example, the CM analog circuit 1105 is operative to generate an input voltage, Vin, such that Vin=(Vn+Vp)/2. In some examples, note that the CM analog circuit 1105, the comparator, and the digital circuit 410 are all be implemented within a singular component or device that is operative to process a differential signal and to generate the Do 1 based thereon.

Figure 12:
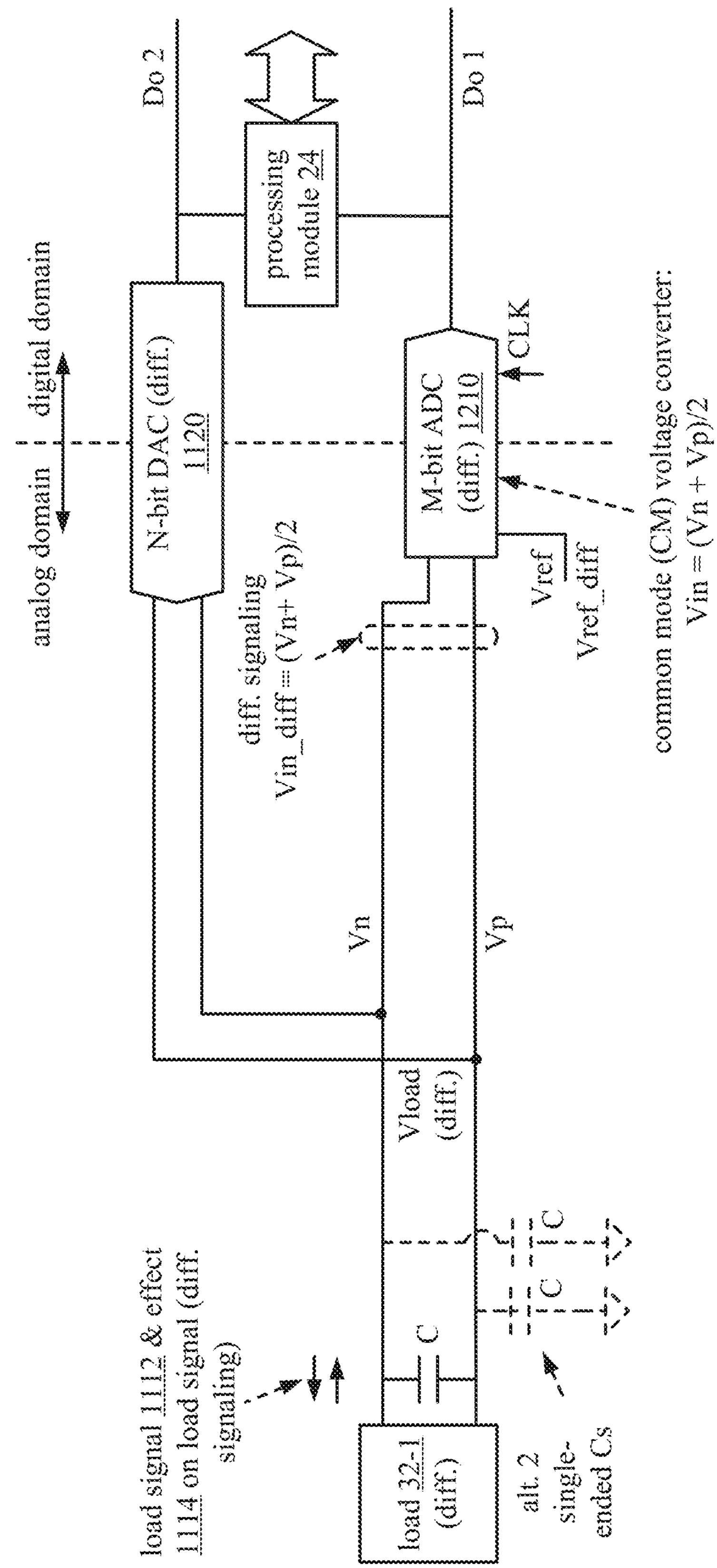
FIG. 12 is a schematic block diagram of another embodiment of an ADC that is operative to process an analog differential signal in accordance with the present invention.

FIG. 12 is a schematic block diagram of another embodiment 1200 of an ADC that is operative to process an analog differential signal in accordance with the present invention. This diagram has certain similarities with the previous diagram with at least one difference being that the CM analog circuit 1105, the comparator, and the digital circuit 410, or a functionally equivalent component to CM analog circuit 1105, the comparator, and the digital circuit 410, is replaced by a low resolution analog to digital converter (ADC), specifically, a differential M-bit ADC 1210, where M is a positive integer greater than or equal to 1. In certain particular examples, M is a positive integer within the range of 1-4 (e.g., 1, 2, 3, or 4).

Also, in certain particular examples, N of the differential N-bit DAC 1120 is less than or equal to M. In certain specific examples, N<8 bit resolution. For example, if N=4, then M=3, 2, or 1. The Do 2 may be viewed as a high-resolution digital signal (N bit resolution) compared to the Do 1 (M bit resolution), such that M<N. In addition, in some examples, the Do 2 is a modified version of the Do 1 after having undergone any desired digital signal processing within the processing module 24.

In certain examples, note that the differential M-bit ADC 1210 is operative to generate the Do 1 as being an error signal that corresponds to a difference between Vin (such that Vin=(Nv+Vp)/2) and Vref and having a resolution of M bits and that is output based on the clocking rate, CLK. For example, the Do 1 is a digital signal that corresponds to corresponds to an error signal, Ve, such that Ve=Vref−Vin or Vin−Vref.

In other examples, note that the differential M-bit ADC 1210 is operative to generate the Do 1 as being an error signal that corresponds to a difference between the differential input voltage signal, Vin_diff, that is composed of Vn and Vp and a differential reference signal, Vref_diff (e.g., Vref_diff being a differential signal that is composed two different reference voltages, such as Vref1 and Vref2, and having a resolution of M bits and that is output based on the clocking rate, CLK. For example, the Do 1 is a digital signal that corresponds to corresponds to an error signal, Ve_diff, that corresponds to the difference between the two differential signals, Ve_diff=Vref_diff−Vin_diff or Vin_diff−Vref_diff.

The use of such a differential M-bit ADC 1210 provides many performance improvements for certain applications including a reduction of quantization noise and an increase of the output resolution of the ADC, particularly with respect to the Do 1. For example, instead of Do 1 being a single bit resolution digital signal (e.g., a digital stream of 1s and/or 0s), the Do 1 in this diagram is a digital signal having a higher resolution (e.g., of 2, 3, or 4 bits). In some examples, the Do 1 is then provided to the processing module 24, and the processing module 24 is configured to perform any desired digital signal processing operation on the Do 1 to generate the Do 2 (e.g., increase the output resolution and lower the sampling rate, perform low pass filtering, perform bandpass filtering, etc.).

In this diagram, note that the Do 1 may be passed directly to the differential N-bit DAC 1120 such that the Do 1 is used to drive the differential N-bit DAC 1120. However, in certain examples, the Do 2 is used to drive the differential N-bit DAC 1120 such as when it is a filtered and/or digital signal processed version of the Do 1.

Figure 13:
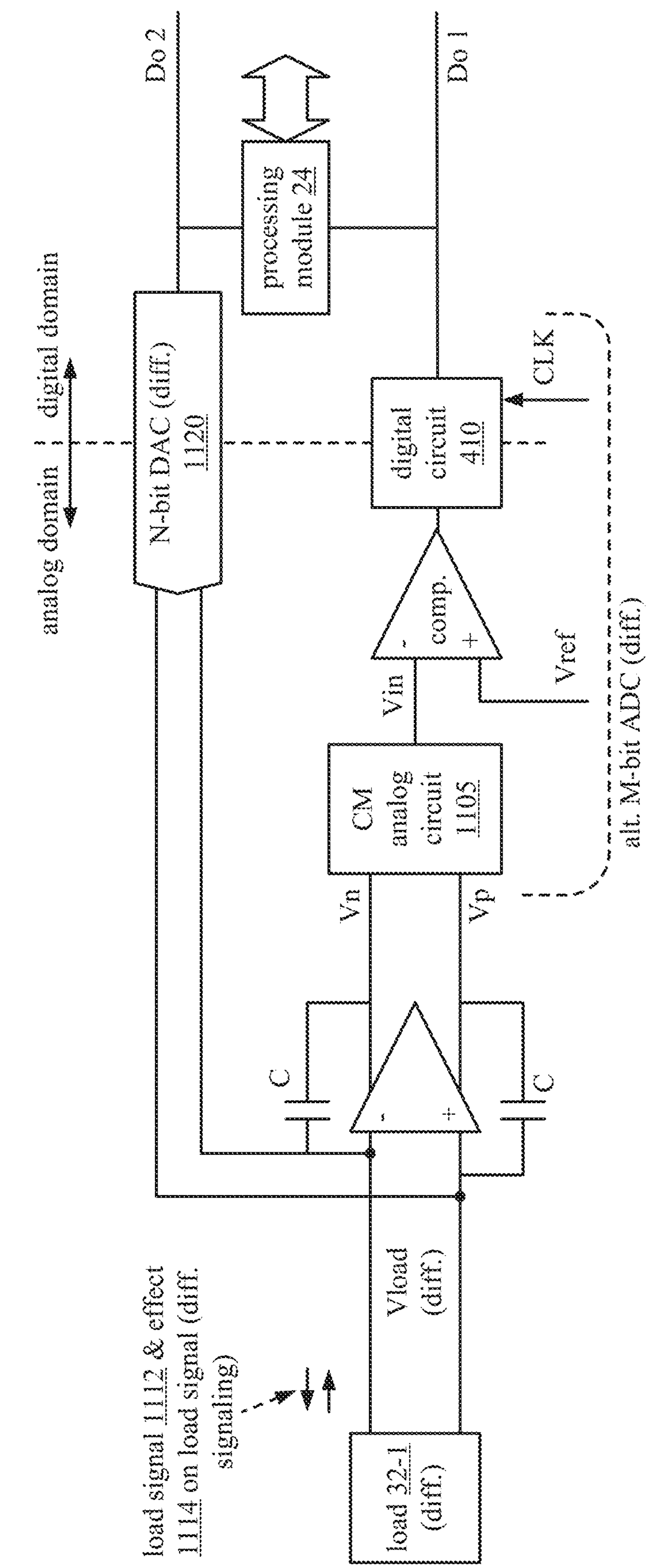
FIG. 13 is a schematic block diagram of another embodiment of an ADC that is operative to process an analog differential signal in accordance with the present invention.

FIG. 13 is a schematic block diagram of another embodiment 1300 of an ADC that is operative to process an analog differential signal in accordance with the present invention. This diagram has certain similarities to certain of the previous diagrams that operate based on differential signaling with at least one difference being that the capacitor, C, that was connected between the differential signal lines of the load 32-1 is replaced by a differential integrator with two respective feedback capacitors, C. The differential integrator is implemented as an operational amplifier with two respective feedback capacitors, C, and is operative to generate a differential input signal is based on Vn and Vp. The use of the operational amplifier in place of only the capacitor, C, two respective feedback capacitors, C may be used for applications that are tailored to serve greater power than that of the previous diagram. Generally speaking, the two respective feedback capacitors, C, implemented in cooperation with the differential operational amplifier serve a similar purpose of the capacitor, C, that was connected between the differential signal lines of the load 32-1 in the previous diagram of being charged based on the differential load current and the differential output current from the differential N-bit DAC 1120 thereby generating the Vin to be provided to the comparator and compared with Vref.

Note that the CM analog circuit 1105, the comparator, and the digital circuit 410 may alternatively be replaced with a differential M-bit ADC 1210 such as in accordance with the previous diagram.

Figure 14A:
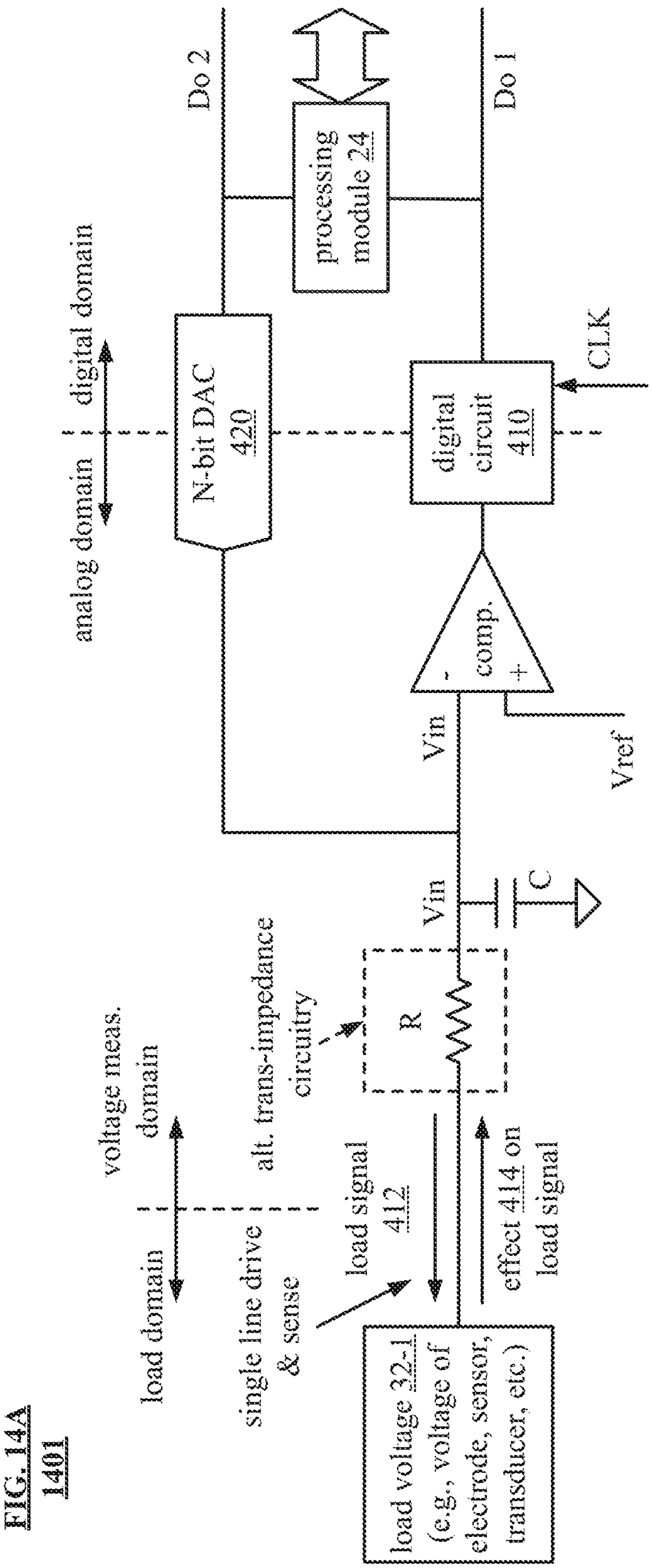
FIG. 14A is a schematic block diagram of an embodiment an ADC that is operative to perform voltage measurement in accordance with the present invention.

FIG. 14A is a schematic block diagram of an embodiment 1401 an ADC that is operative to perform voltage measurement in accordance with the present invention. This diagram has some similarities with the previous diagrams with at least one difference being that the load 32 is replaced by the load voltage 32-1, which may be a voltage of any of a number of devices including the load 32. Examples of such a load voltage 32-1 include any of the voltage of an electrode, sensor, transducer, etc. Another difference within this diagram is that a resistor, R, is placed in line with the single line that connects her couples the ADC that is operative to perform voltage measurement and the load voltage 32-1. For example, the load voltage 32-1, when dropping across the resistor, R, to generate the input voltage, Vin, will provide a current signal that will charge the capacitor, C, that is provided to one of the inputs of the comparator. Generally speaking, a load voltage 32-1 can be measured by inserting a resistor, R, between the load voltage 32-1 and the ADC so as to facilitate conversion of the load voltage 32-1 to a current, Iin, that is equal to the difference between the load voltage 32-1, Vload, and Vin, such that Iin=(Vload−Vin)/R. note also that a prince impedance circuitry may alternatively be implemented that is operative to convert a voltage to a current signal such that the current signal may be sensed by an ADC as described herein.

Figure 14B:
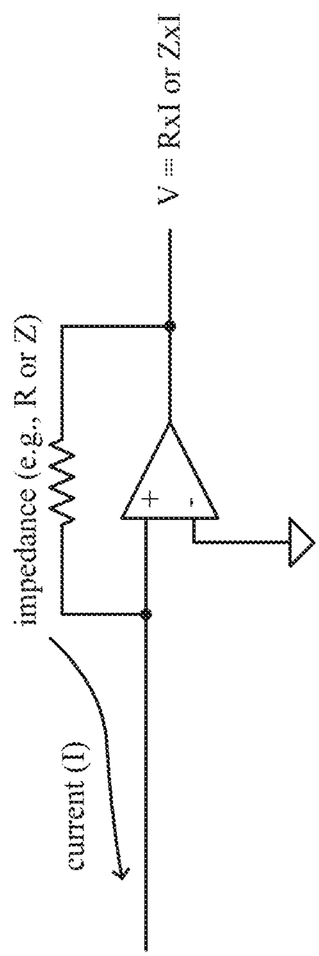
FIG. 14B is a schematic block diagram of an embodiment an transimpedance amplifier that may be implemented within an ADC that is operative to perform voltage measurement in accordance with the present invention.

FIG. 14B is a schematic block diagram of an embodiment 1402 an transimpedance amplifier that may be implemented within an ADC that is operative to perform voltage measurement in accordance with the present invention. The trans-impedance circuitry includes a buffer, operational amplifier, etc. having a first input coupled to the ground potential, and a second input coupled to a node that is sourcing or sinking current, such as the node connected to the N-bit DAC 420. An impedance (shown as an R or generically a Z, which may have inductive and/or capacitive reactants components) is also coupled from the second input to the output of the buffer, operational amplifier, etc. A current, I, that flows through the impedance generates an output voltage, V, that is based on the impedance times the current, I (e.g., V=R×I or Z×I). Such a trend impedance amplifier, or any appropriate circuit or component that is operative to perform voltage to current signal conversion, or vice versa, may be used in place of the resistor shown within the previous diagram.

Figure 15:
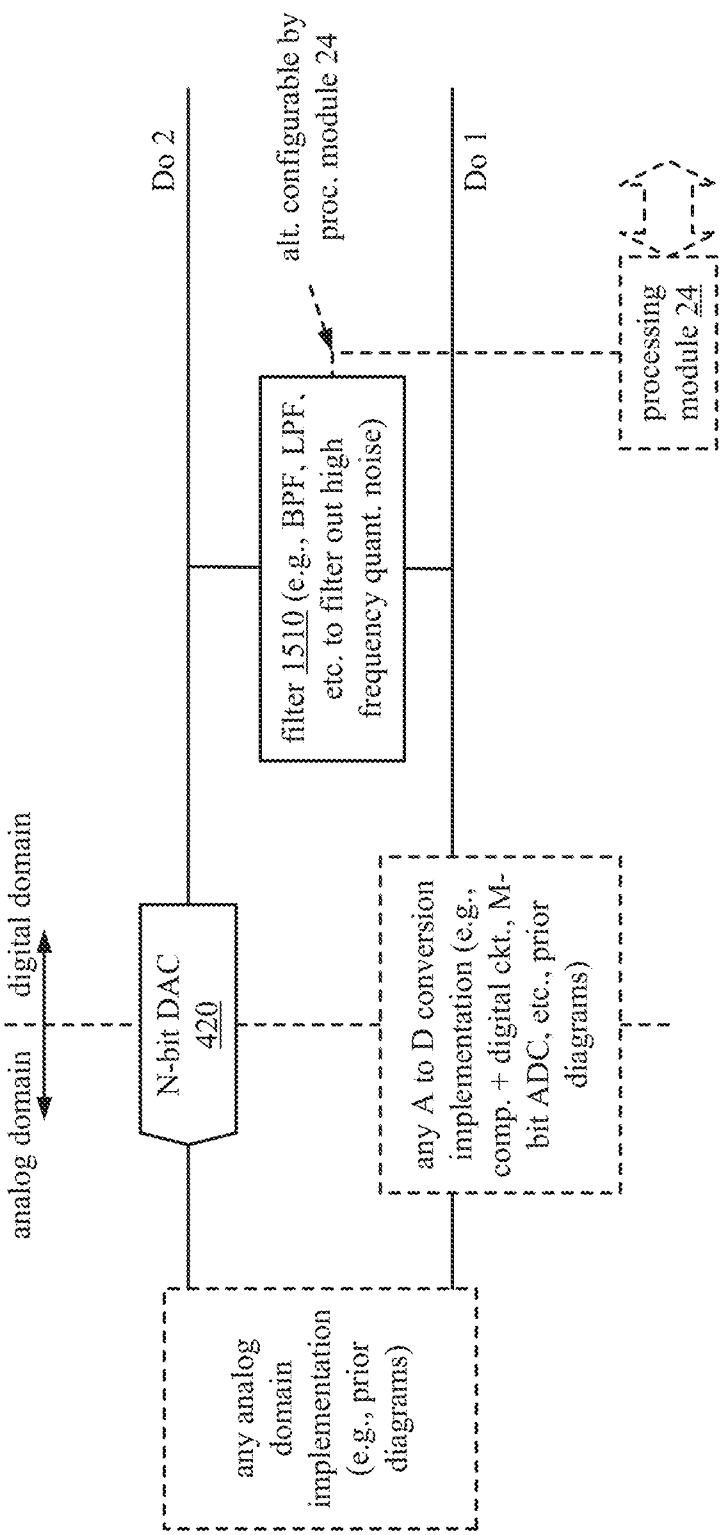
FIG. 15 is a schematic block diagram showing an embodiment of digital domain filtering within an ADC in accordance with the present invention.

FIG. 15 is a schematic block diagram showing an embodiment 1500 of digital domain filtering within an ADC in accordance with the present invention. This diagram shows an alternative implementation to having a processing module 24 implemented to receive him perform any desired digital signal processing on the Do 1 and to generate the Do 2. Specifically, a filter 1510 is implemented to process the Do 1 to generate the Do 2. Note that the filter 1510 may be of any desired type of digital filter. In certain examples, bandpass filtering or low pass filtering is performed by the filter 1510 to filter out high-frequency quantization noise within the Do 1 in accordance with generating the Do 2. Possible examples of a low pass filter or low pass filter operation may be implemented based on an accumulator or in integrator. For example, consider an application tailored for detecting a DC analog signal, or for detecting an analog signal having a frequency within the voice frequency bands such as 20 kHz to 100 kHz, then appropriate low pass filtering or bandpass filtering is performed by the filter 1510 to filter out high-frequency quantization noise within the Do 1 in accordance with generating the Do 2.

In certain examples, note that a processing module 24 may be in communication with the filter 1510 such that the particular filtering to be performed by the filter 1510 is configurable based on control signaling from the processing module 24. For example, consider the filter 1510 to be a configurable or selectable filter that includes one or more options of bandpass filtering or low pass filtering. The processing module 24 is configured to select a first type of filtering to be performed at or during a first time and a second type of filtering to be performed at or during a second time, and so on.

Figure 16:
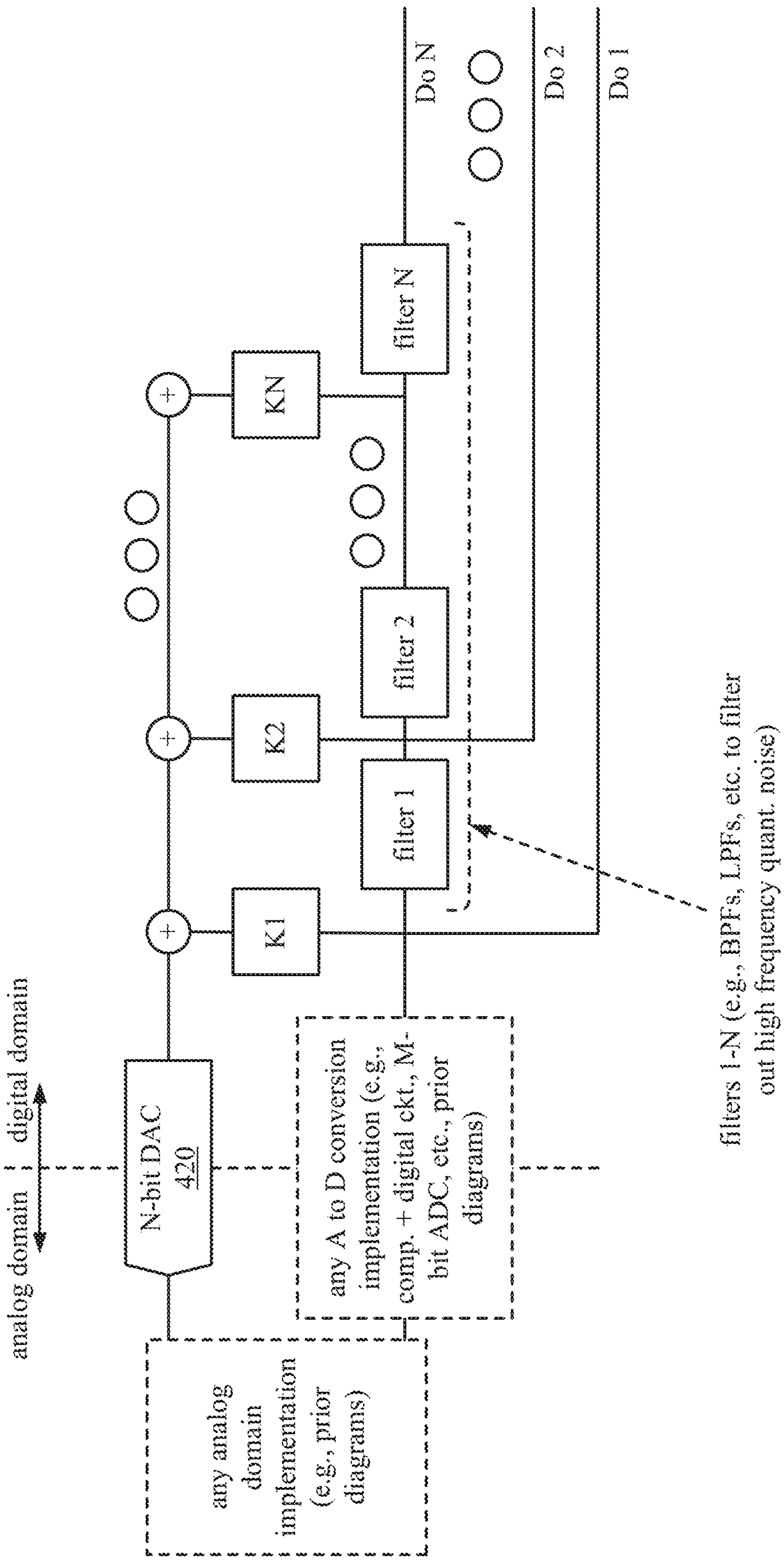
FIG. 16 is a schematic block diagram showing an embodiment of digital domain filtering using cascaded filters within an ADC in accordance with the present invention.

FIG. 16 is a schematic block diagram showing an embodiment 1600 of digital domain filtering using cascaded filters within an ADC in accordance with the present invention. This diagram shows digital signal processing based on a cascade of N and pass filters or N low pass filters. In a particular example, N=10. The gain elements, K1 through KN, are amplification constants that are used to stabilize the feedback loop from any digital output signal that is generated by the respective cascade of N filter (e.g., filter 1 through filter N) that provide the digital input control signal to the N-bit DAC 420. The different respective game factors operate to stabilize the feedback that is provided to the N-bit DAC 420. Note that this implementation is operative to provide a number of different respective digital output signals, shown as Do 1, Do 2 through Do N as corresponding to the respective outputs from the respective cascade of N filter (e.g., filter 1 through filter N). Note that any one or more decimation filters may also be implemented to perform decimation filtering of the digital output signals, shown as Do 1, Do 2 through Do N as corresponding to the respective outputs from the respective cascade of N filter (e.g., filter 1 through filter N).

Figure 17:
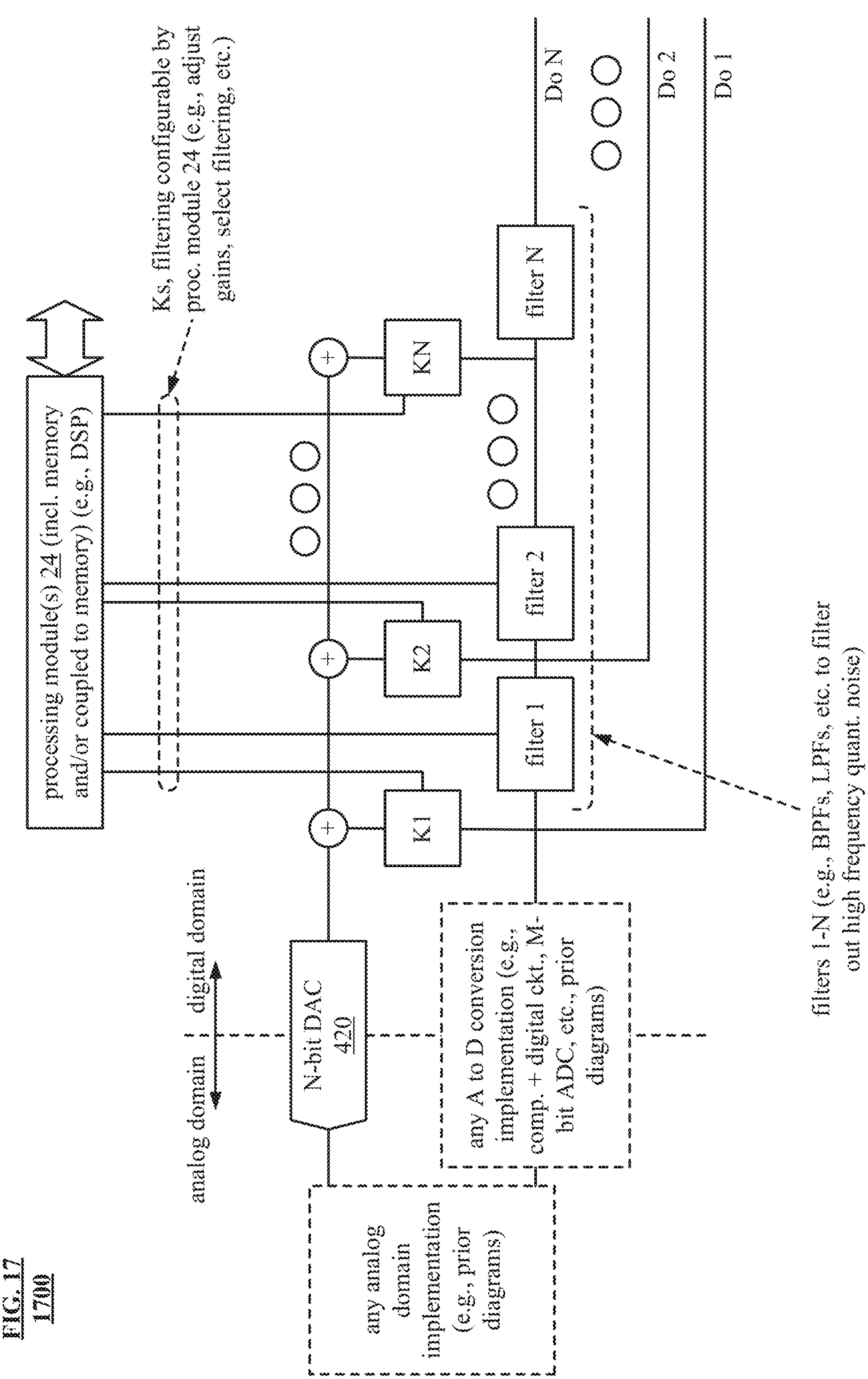
FIG. 17 is a schematic block diagram showing another embodiment of digital domain filtering using configurable/adjustable cascaded filters within an ADC in accordance with the present invention.

FIG. 17 is a schematic block diagram showing another embodiment 1700 of digital domain filtering using configurable/adjustable cascaded filters within an ADC in accordance with the present invention. This diagram is similar to the previous diagram with at least one difference being that one or more processing modules 24 is coupled or connected to each of the respective gain elements (K1 through KN) and the respective cascade of N filter (e.g., filter 1 through filter N). The one or more processing modules 24 is configured to adjust a gains of the respective gain elements (K1 through KN) and mean particular characteristics by which filtering is performed by the respective cascade of N filter (e.g., filter 1 through filter N).

For example, the one or more processing modules 24 is configured to select a first set of gains for the respective gain elements (K1 through KN) and a first type of filtering to be performed by the respective cascade of N filter (e.g., filter 1 through filter N) at or during a first time and a second set of gains for the respective gain elements (K1 through KN) and a second type of filtering to be performed by the respective cascade of N filter (e.g., filter 1 through filter N) at or during a second time.

Figure 18:
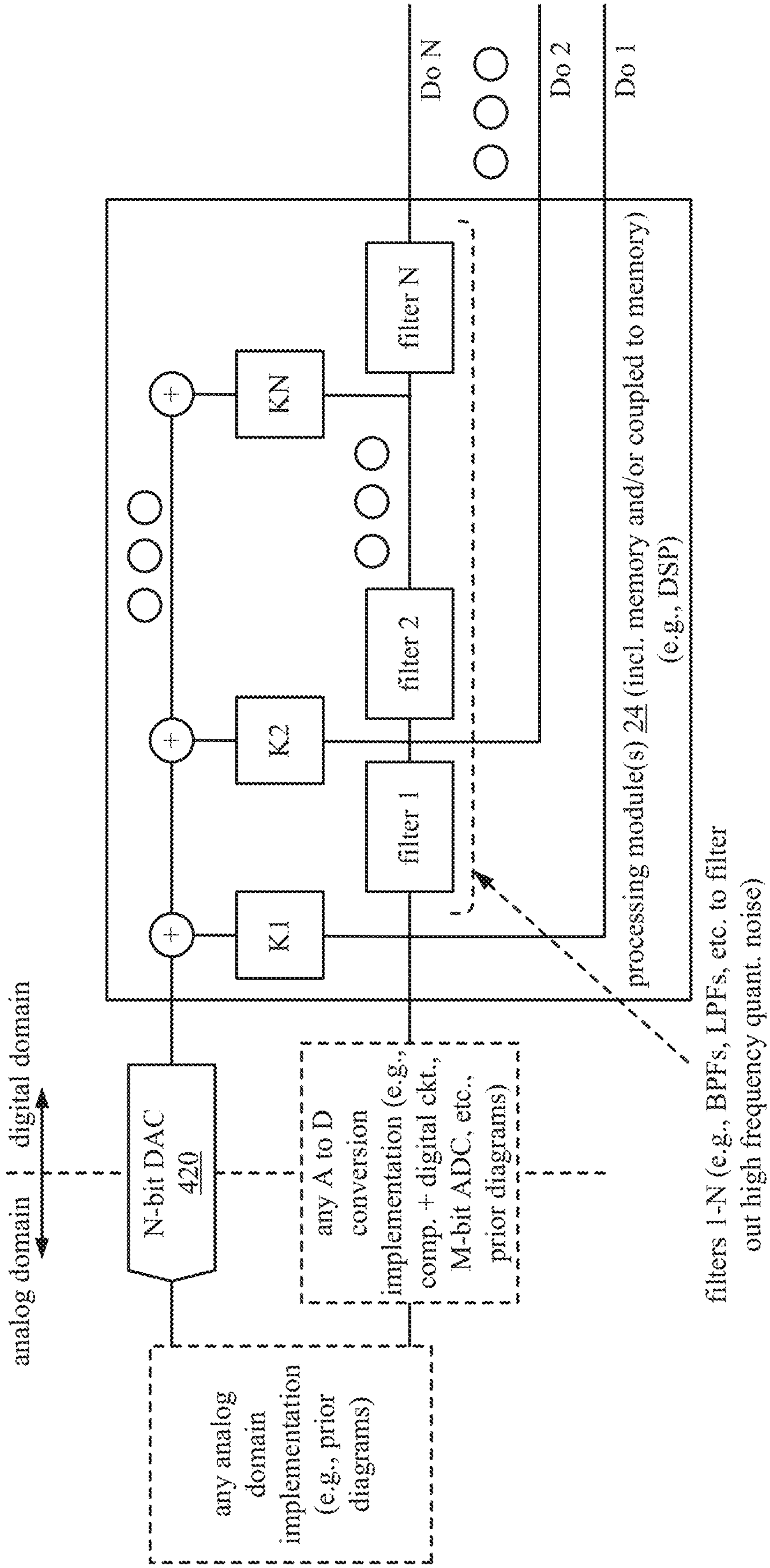
FIG. 18 is a schematic block diagram showing an embodiment of one or more processing modules implemented to perform digital domain filtering within an ADC in accordance with the present invention.

FIG. 18 is a schematic block diagram showing an embodiment 1800 of one or more processing modules implemented to perform digital domain filtering within an ADC in accordance with the present invention. This diagram includes one or more processing modules 24 that is operative to perform the filtering pictorially illustrated within the previous diagram. For example, one or more processing modules 24 may be implemented perform any desired digital signal processing of any of the respective digital output signals, shown as Do 1, Do 2 through Do N including the digital signal processing pictorially described with respect to the previous diagram. In this diagram, the one or more processing modules 24 itself for themselves performs the digital signal processing. In the previous diagram, separate and distinct digital signal processing components are implemented, ending one or more processing modules 24 of that diagram are operative to control and configure the manner in which those digital signal processing components operate.

In addition, alternative examples of an ADC may be implemented using a non-linear N-bit DAC that operates based on a non-linear function. For example, a non-linear N-bit DAC is operative to provide an output current based on the non-linear function of the digital input signal provided to it. Such a non-linear function may be described also as a non-linear companding function such that companding corresponds to a non-linear response of the ADC based on the signal it receives and/or senses. In such a non-linear N-bit DAC, the output current is a non-linear function of the input.

Considering one possible example of an ADC that includes a non-linear N-bit DAC, the digital output signal (e.g., the Do 1 and/or the Do 2 signal) that is generated by such an ADC is a non-linear function of the analog signal that it is sensing. Consider an ADC that includes a non-linear N-bit DAC and operates based on a logarithmic function when sensing a current signal, then the digital output signal (e.g., the Do 1 and/or the Do 2 signal) is a logarithmic function of the input current. Such an ADC that includes a non-linear N-bit DAC may be referred to as a companding ADC. Generally speaking, such an ADC that provides for a non-linear response when generating a digital output signal based on the analog signal that it is sensing may be referred to as a companding ADC.

Note that such a companding ADC may also be implemented to perform simultaneous driving and sensing of a signal via that single line that connects or couples to the load. For example, such an ADC is operative to drive an analog signal (e.g., current and/or voltage) of a load 32. With respect to implementations that operate in accordance with sensing analog current signals, such a companding ADC is also operative to sense current signals within an extremely broad range including very low currents (e.g., currents below the 1 pico-amp range, within the 10 s of pico-amps range, below the 1 nano-amp range, within the 10 s of nano-amps range, below the 1 micro-amp range, within the 10 s of micro-amps range, etc.) and also up to relatively much larger currents (e.g., currents in the 10 s milli-amps range, 100 s milli-amps range, or even higher values of amps range, etc.). In some examples, such as with respect to detecting currents that are provided from a photodetection or photodiode component, such a companding ADC is also operative to sense current signals below the 1 pico-amp range, currents within the 100 s of micro-amps range, etc.

Also, in some examples, when using appropriately provisioned components (e.g., higher current, higher power, etc.), much higher currents can also be sensed using architectures and topologies in accordance with a companding ADC as described herein. For example, such a companding ADC implemented based on architectures and topologies, as described herein, using appropriately provisioned components are operative to sense even higher currents (e.g., is of amps, 10 s of amps, or even higher values of amps range, etc.).

In addition, note that various implementations of such a companding ADC may be implemented to cover a number of decades orders of magnitude. For example, consider a companding ADC that is implemented to detect current signals radiating from the 10 s of pico-amps to ones of milli-amps. Such a companding ADC would cover a dynamic range of 7-8 decades or 7-8 orders of magnitude. Within such an example, such a very broad dynamic range may be divided using a log scale into the 7-8 decades, such that there are a few data points within each particular decade. Note also that there is a trade-off regarding the resolution of the digital output signal (e.g., the Do 1 and/or the Do 2 signal) that is generated by such a companding ADC and range of current signals that may be sensed. For example, when the dynamic range of signals to be sensed by such a companding ADC is relatively large, then there can be limitations on sensing very low currents with a high degree of accuracy.

Generally speaking, the broader the dynamic range of signals to be sensed, then a higher resolution of the digital output signal (e.g., the Do 1 and/or the Do 2 signal) provides for a higher degree of accuracy, particularly when sensing very low currents. Consider an example in which currents within a dynamic range of 10 s of pico-amps to 100 s of micro-amps is to be sensed (e.g., within a photodetection or photodiode component), then generating a digital output signal using a certain number of bits (e.g., a resolution of 12 bits) may be insufficient to cover the entire range. Within such a particular example, increasingly resolution of the digital output signal (e.g., to a resolution of 16 bits) can help facilitate sensing of signals with higher resolution and also assist sensing very low currents with a high degree of accuracy.

Several the following diagrams have similarities to the prior diagrams with at least one difference being that a non-linear N-bit DAC 1920 is implemented to generate the current that is output to a load that matches or tracks the current of the load. Similarly, as described with respect to other examples of an ADC, the companding ADCs of these subsequent diagrams also operate by providing an output current to the load 32 to cancel out the load current. This may be viewed as providing an output current that is equal to and opposite polarity to the load current. Note also that such a companding ADC may be implemented not only to sense an analog signal associated with the load 32 but also to provide power and/or energy to the load 32 within implementations where the load 32 is not energized via another source. In some examples, this providing of power and/or energy from the companding ADC to the load 32 is performed simultaneously via a single line via which the companding ADC senses and analog signal associated with the load 32. Also, such a companding ADC may be implemented to perform sensing only of an analog signal associated with the load 32 without providing power and/or energy to the load 32.

Generally speaking, with respect to such non-linear N-bit DACs, such as the non-linear N-bit DAC 1920, the output current provided there from is a non-linear function of the Do 2. Therefore, the Do 2 itself is also an inverse function of the load current, given that the output current from the non-linear N-bit DAC 1920 is operative to match or track the current of the load (e.g., being equal and opposite of the current of the load thereby minimizing the error signal that is based on the difference between Vref and Vin).

Figure 19:
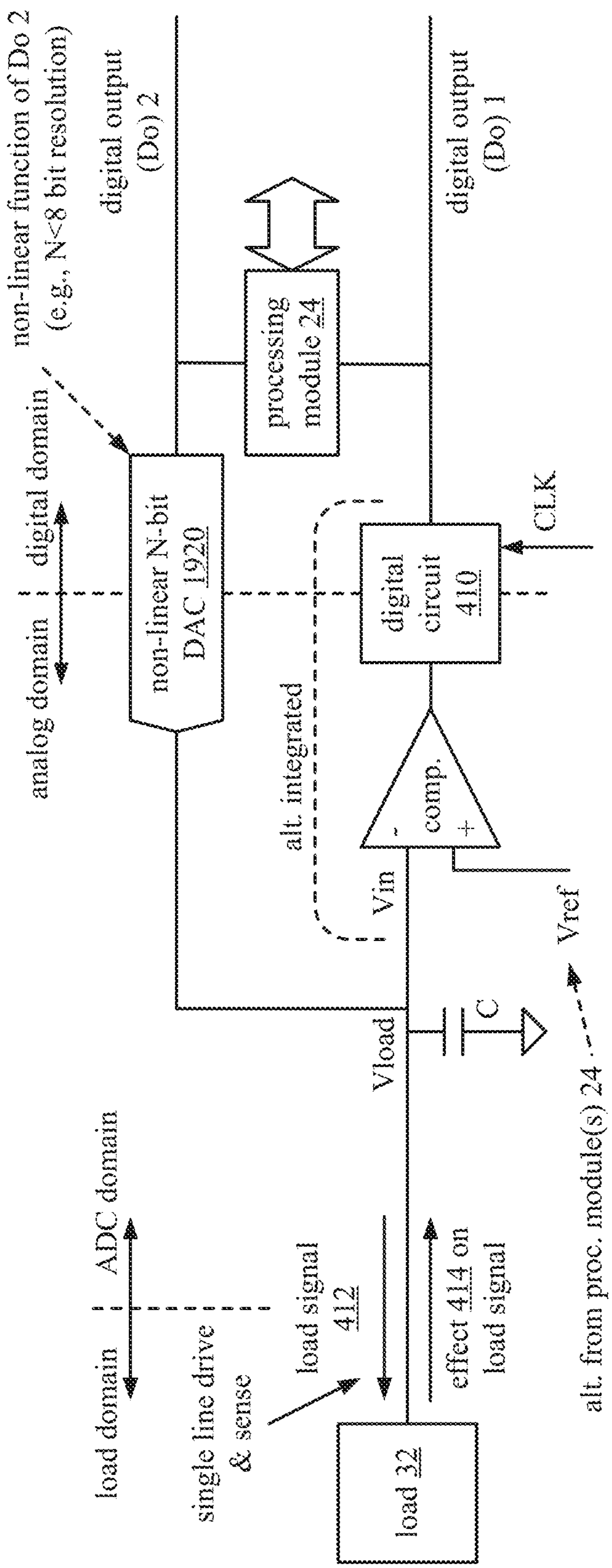
FIG. 19 is a schematic block diagram of an embodiment of an ADC that includes a non-linear N-bit digital to analog converter (DAC) in accordance with the present invention.

FIG. 19 is a schematic block diagram of an embodiment 1900 of an ADC that includes a non-linear N-bit digital to analog converter (DAC) in accordance with the present invention. This diagram is similar to certain of the previous diagrams (e.g., FIG. 4) that include a comparator and a digital circuit 410 that generates the Do 1 that is provided to the processing module 24. The processing module 24 processes the Do 1 to generate the Do 2. Also, an analog capacitor, C, is connected to a node that couples the load 32 to the companding ADC (e.g., an ADC that includes a non-linear N-bit digital to DAC, an ADC that provides for a non-linear response when generating a digital output signal based on the analog signal that it is sensing).

However, in this diagram, a non-linear N-bit DAC 1920 is implemented to generate the current signal that is provided to the node that connects or couples the companding ADC to the load 32 to match and track the current signal of the load.

Many of the subsequent diagrams include similar components and operate similarly with at least one difference being that they operate as companding ADCs such that they provide for a non-linear response when generating a digital output signal based on the analog signal that it is sensing. Many of the diagrams include a non-linear N-bit DAC 1920 is implemented in place of the N-bit DAC 420.

Figure 20:
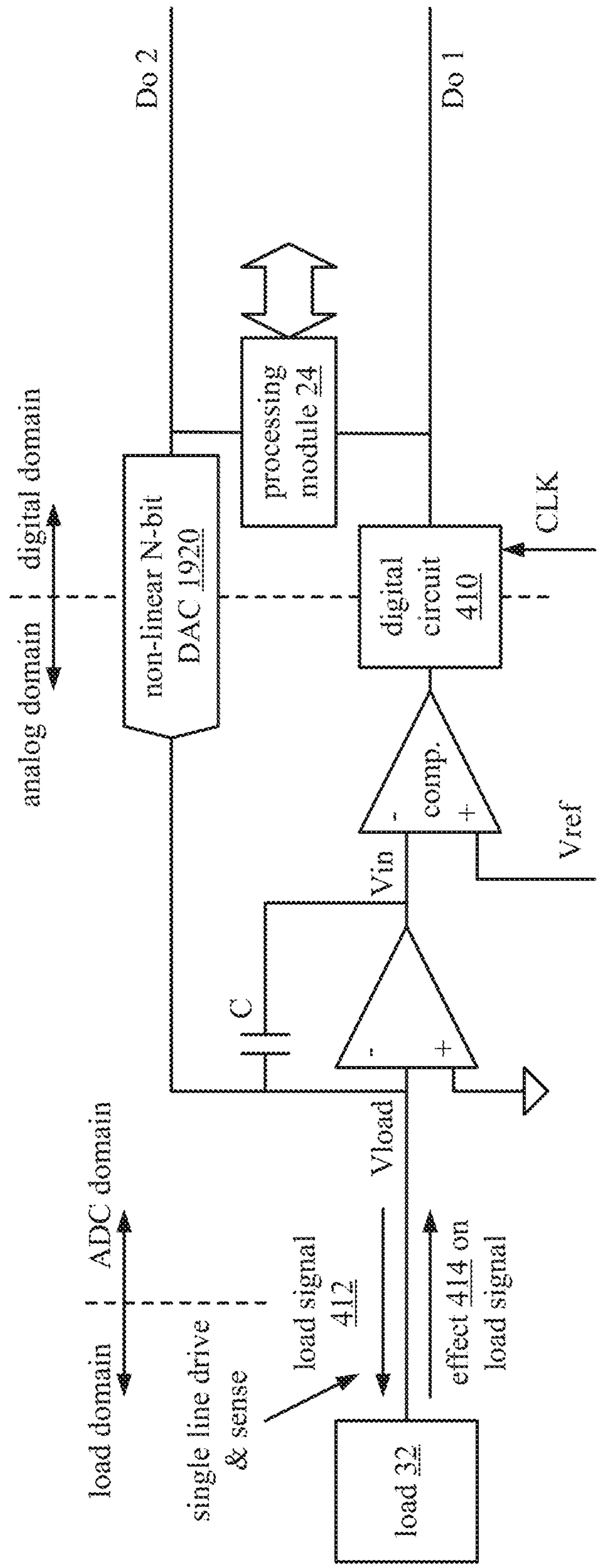
FIG. 20 is a schematic block diagram of another embodiment of an ADC that includes a non-linear N-bit DAC in accordance with the present invention.

FIG. 20 is a schematic block diagram of another embodiment 2000 of an ADC that includes a non-linear N-bit DAC in accordance with the present invention. This diagram is similar to FIG. 8 with a difference being that a non-linear N-bit DAC 1920 is implemented in place of the N-bit DAC 420.

Figure 21:
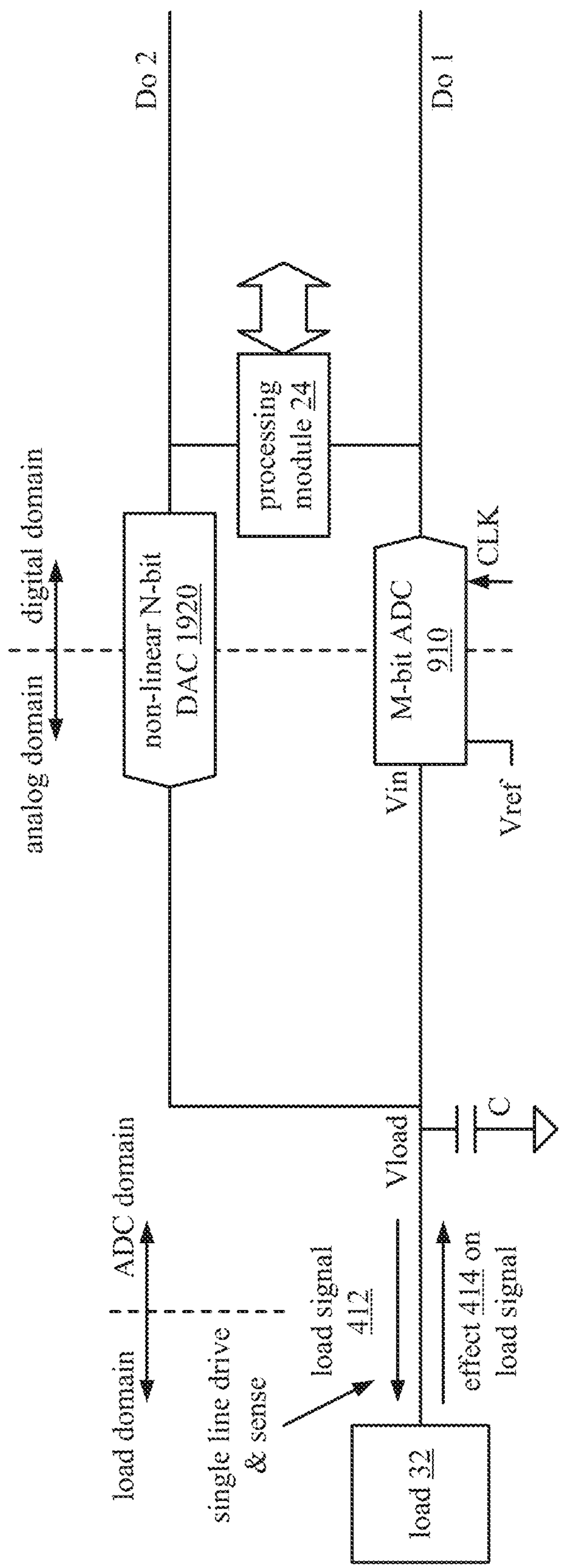
FIG. 21 is a schematic block diagram of another embodiment of an ADC that includes a non-linear N-bit DAC in accordance with the present invention.

FIG. 21 is a schematic block diagram of another embodiment 2100 of an ADC that includes a non-linear N-bit DAC in accordance with the present invention. This diagram is similar to FIG. 9 with a difference being that a non-linear N-bit DAC 1920 is implemented in place of the N-bit DAC 420.

Figure 22:
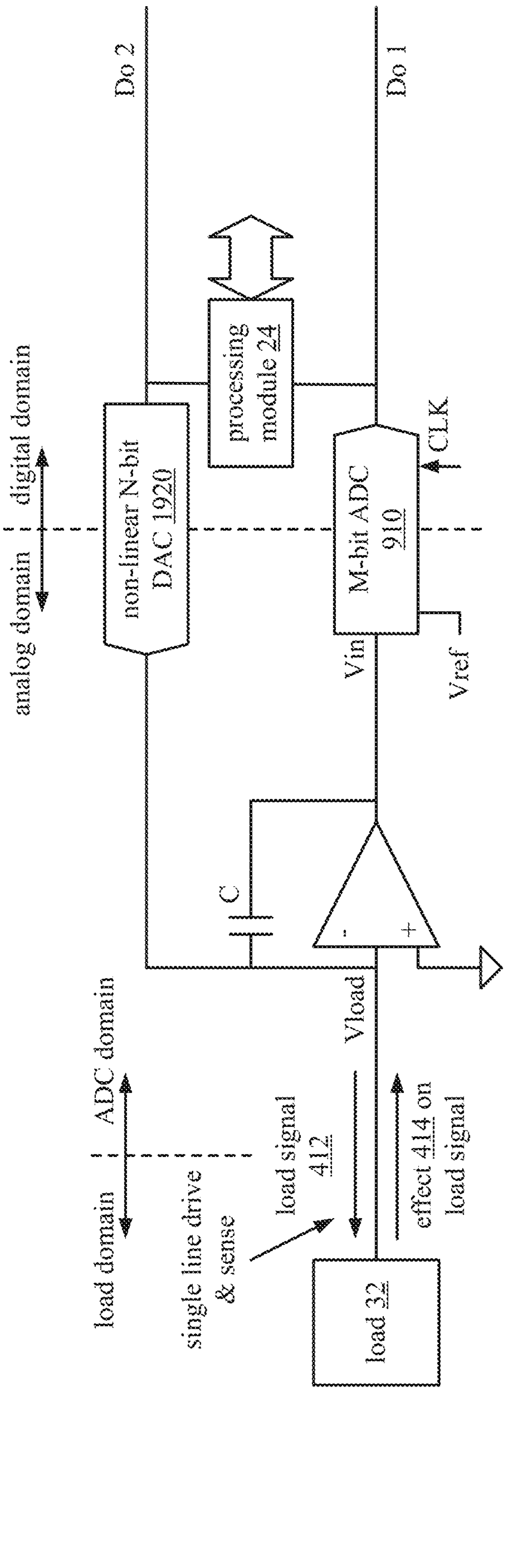
FIG. 22 is a schematic block diagram of another embodiment of an ADC that includes a non-linear N-bit DAC in accordance with the present invention.

FIG. 22 is a schematic block diagram of another embodiment 2200 of an ADC that includes a non-linear N-bit DAC in accordance with the present invention. This diagram is similar to FIG. 10 with a difference being that a non-linear N-bit DAC 1920 is implemented in place of the N-bit DAC 420.

Figure 23:
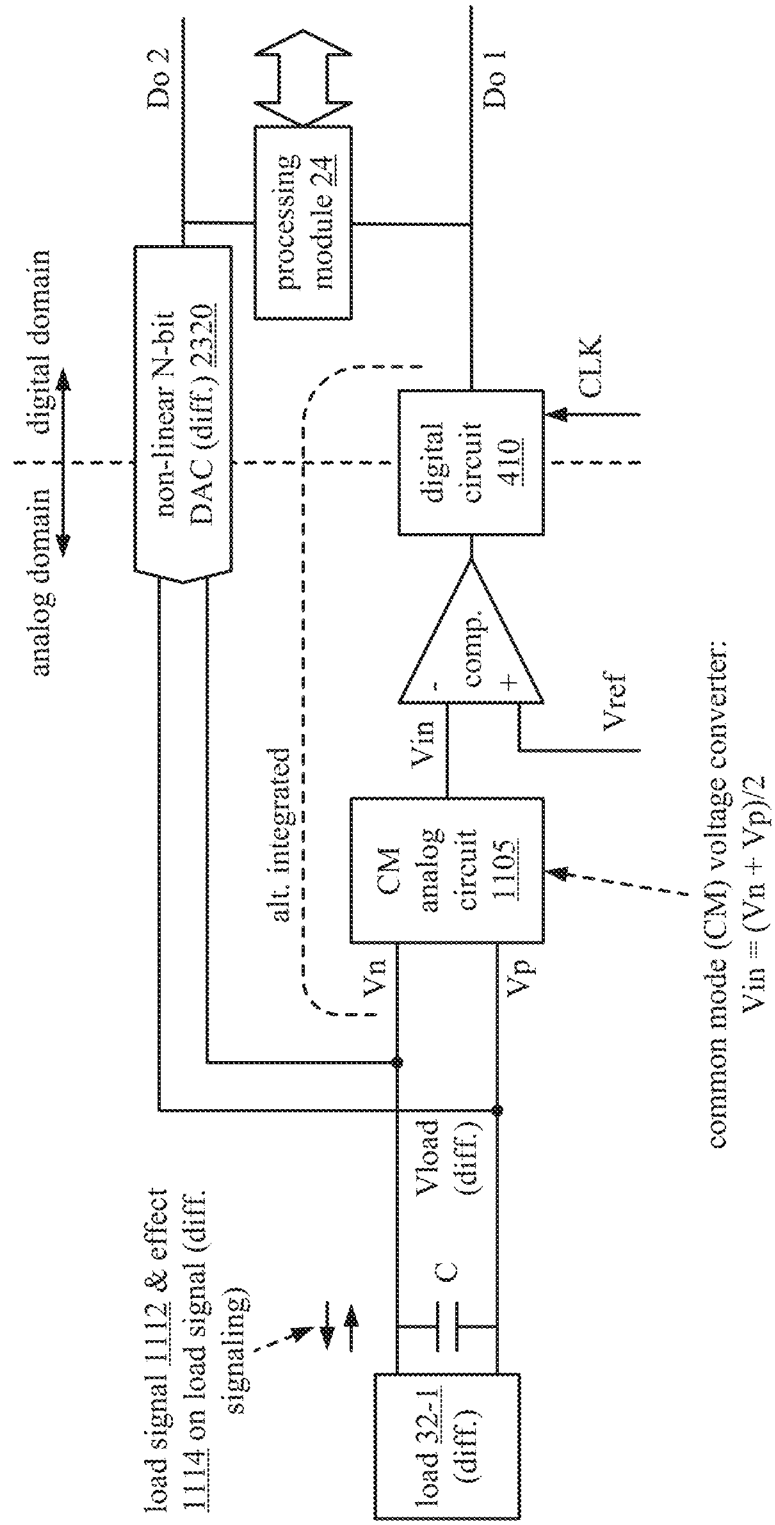
FIG. 23 is a schematic block diagram of an embodiment of an ADC that includes a non-linear N-bit DAC that is operative to process an analog differential signal in accordance with the present invention.

FIG. 23 is a schematic block diagram of an embodiment 2300 of an ADC that includes a non-linear N-bit DAC that is operative to process an analog differential signal in accordance with the present invention. This diagram is similar to FIG. 11 with a difference being that a differential non-linear N-bit DAC 2320 is implemented in place of the differential N-bit DAC 1120.

Figure 24:
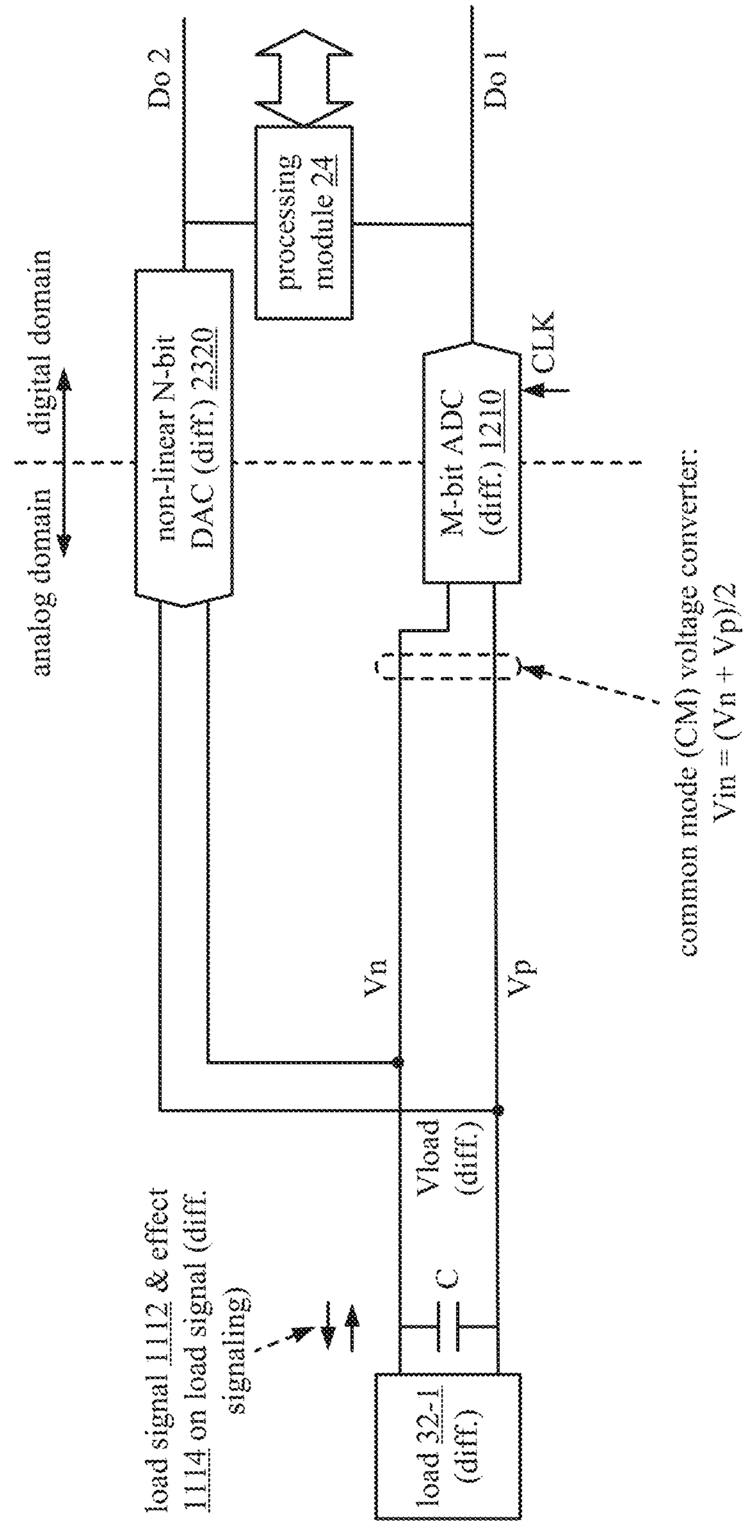
FIG. 24 is a schematic block diagram of another embodiment of an ADC that includes a non-linear N-bit DAC that is operative to process an analog differential signal in accordance with the present invention.

FIG. 24 is a schematic block diagram of another embodiment 2400 of an ADC that includes a non-linear N-bit DAC that is operative to process an analog differential signal in accordance with the present invention. This diagram is similar to FIG. 12 with a difference being that a differential non-linear N-bit DAC 2320 is implemented in place of the differential N-bit DAC 1120.

Figure 25:
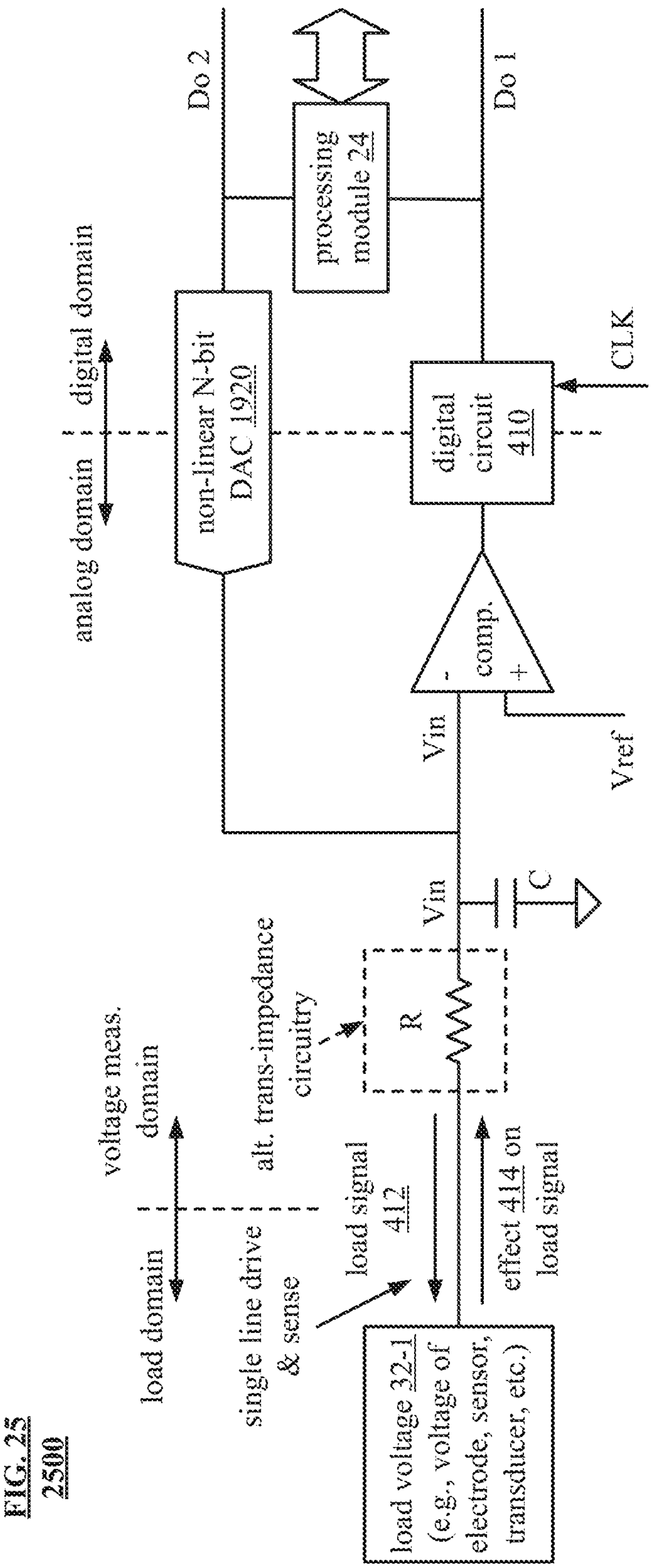
FIG. 25 is a schematic block diagram of an embodiment an ADC that includes a non-linear N-bit DAC and that is operative to perform voltage measurement in accordance with the present invention.

FIG. 25 is a schematic block diagram of an embodiment 2500 an ADC that includes a non-linear N-bit DAC and that is operative to perform voltage measurement in accordance with the present invention. This diagram is similar to FIG. 14A with a difference being that a non-linear N-bit DAC 1920 is implemented in place of the N-bit DAC 420. For example, implementing an appropriate element in-line between the companding ADC and a load voltage 32-1 (e.g., a resistor, R, a trans-impedance circuitry, and/or any appropriate complement to convert voltage to current, etc.) facilitates the conversion of the load voltage 32-1 to a load current that may be detected using such a companding ADC. In such an example, the non-linear N-bit DAC 1920 within the companding ADC operates based on a function of Do 2. In an example that includes a resistor, R, implemented non-linear N-bit DAC 1920, the Do 2 itself is an inverse function of the load voltage 32-1 divided by R (e.g., function of Vload/R).

Certain of the following diagrams show the use of one or both of a PNP transistor (alternatively, Positive-Negative-Positive Bipolar Junction Transistor (BJT)) or an NPN transistor (alternatively, Negative-Positive-Positive BJT) to implement the non-linear conversion function. For example, the use of one or both of a PNP transistor or NPN transistor may be used to implement a logarithmic conversion function.

In addition, certain of the following diagrams operate using a N-bit DAC 420-1 that provides an output voltage signal to be received by the base of an NPN transistor or a PNP transistor. In such examples, one or more of an NPN transistor or a PNP transistor is implemented to provide the current that matches or tracks the load current. Certain examples operate by sourcing current, and others operate by sinking current. Even other examples operate by providing both functionality of sourcing current and sinking current as may be required to match or track the load current.

Figure 26A:
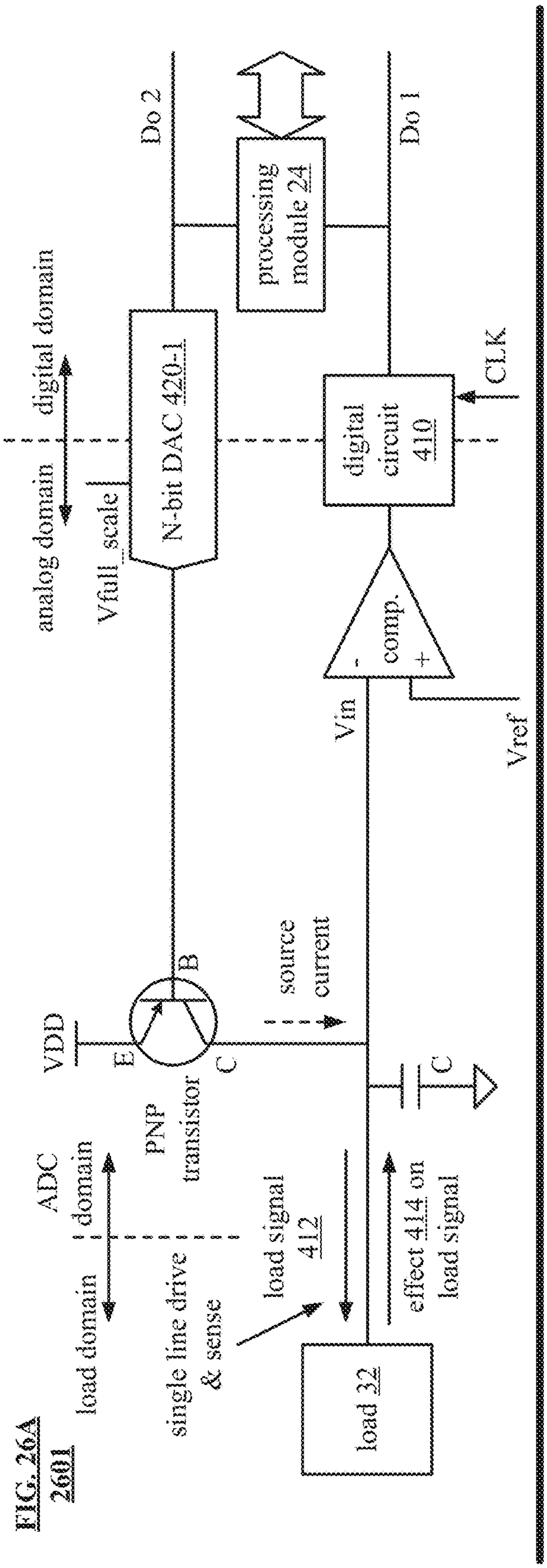
FIG. 26A is a schematic block diagram of an embodiment an ADC that includes a PNP transistor (alternatively, Positive-Negative-Positive Bipolar Junction Transistor (BJT)) implemented to source current in accordance with the present invention.

FIG. 26A is a schematic block diagram of an embodiment 2601 an ADC that includes a PNP transistor (alternatively, Positive-Negative-Positive Bipolar Junction Transistor (BJT)) implemented to source current in accordance with the present invention.

Generally speaking, a BJT is a type of transistor including three terminals, a base (B), a collector (C), and an emitter (E). Such a BJT includes two semiconductor junctions that share a thin doped region in between them. Considering an NPN transistor, a thin p-doped region is implemented in between two n-type semiconductor regions thereby forming the two semiconductor junctions. Considering an PNP transistor, a thin n-doped region is implemented in between two p-type semiconductor regions thereby forming the two semiconductor junctions.

With respect to such a transistor, the collector current, $I_c$, as a function of the voltage between the base (B) and emitter (E) is as follows:

$$I_C = I_S\left(e^{\frac{qV_{BE}}{kT}} - 1\right),$$

where, based on the Shockley diode equation or the diode law, $I_s$ the reverse bias saturation current (alternatively referred to as scale current);

$V_{BE}$ is the voltage across the semiconductor junction;

$V_T$ is the thermal voltage, kT/q, which is the Boltzmann constant, k, times temperature, T, divided by electron charge, q.

As such, the value of $V_{BE}$ is the output voltage of the N-bit DAC 420-1, which operates based on a full-scale voltage shown as Vfull_scale, such that the N-bit DAC 420-1 is operative to provide an output voltage up to and including the full-scale voltage shown as Vfull_scale.

Given that $V_{BE}$ is the output voltage of the N-bit DAC 420-1, then it is also the conversion of the Do 2 to an analog signal.

Therefore, the Do 2 is a an inverse function of the above equation showing the collector current, $I_s$, as follows:

$$Do2 = V_{BE} \approx \frac{kT}{q}\ln\left(\frac{I_C}{I_S}\right)$$

Figures 28A, 28B, 28C:
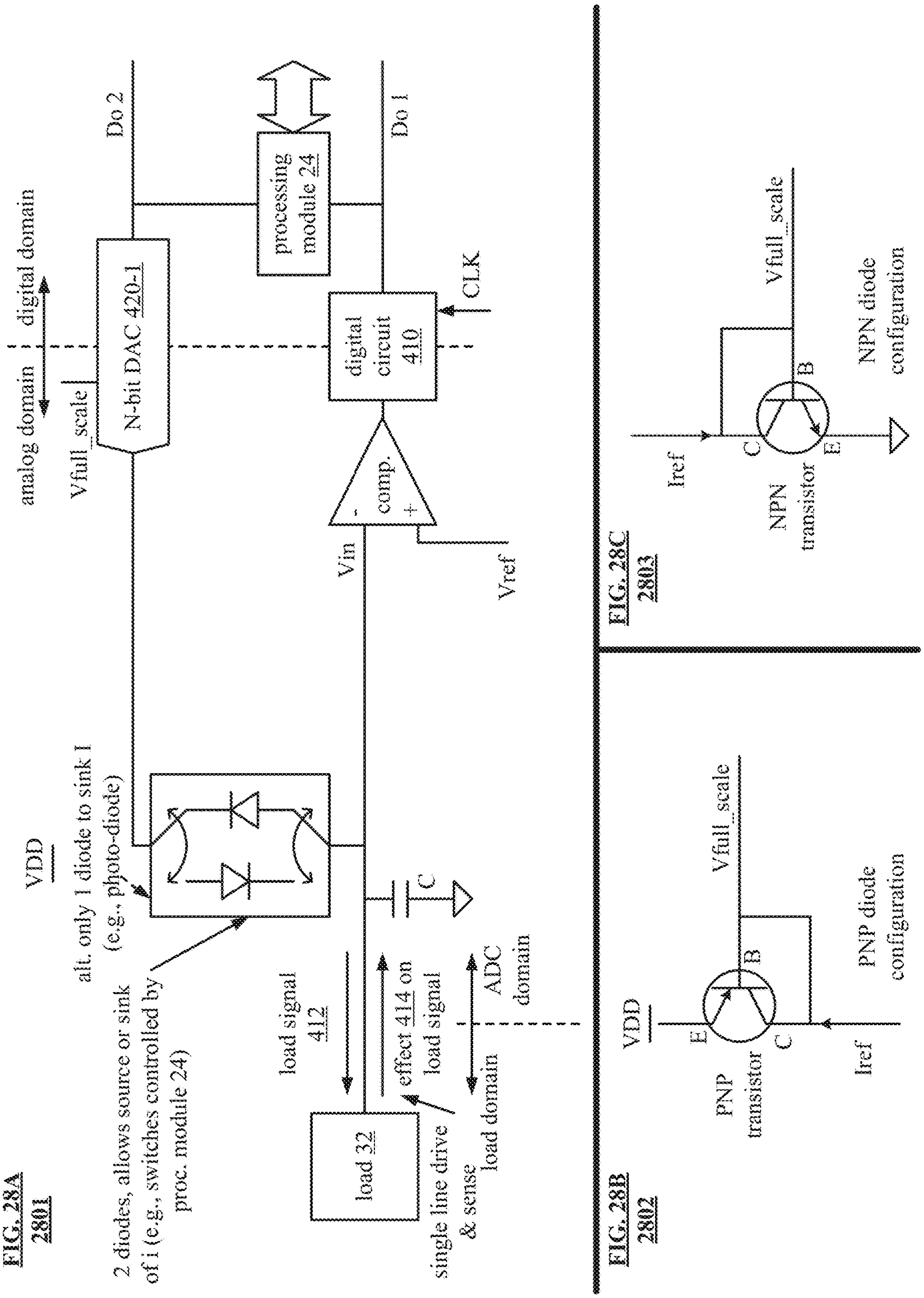
FIG. 28A is a schematic block diagram of an embodiment an ADC that includes diodes implemented to source and/or sink current in accordance with the present invention.
FIG. 28B is a schematic block diagram of an embodiment a PNP transistor diode configuration operative to generate a full scale voltage signal in accordance with the present invention.
FIG. 28C is a schematic block diagram of an embodiment an NPN transistor diode configuration operative to generate a full scale voltage signal in accordance with the present invention.

The full-scale voltage shown as Vfull_scale is a reference voltage for the N-bit DAC 420-1, which also operates to control the full-scale output current. FIG. 28B and FIG. 28C show examples by which a temperature independent full-scale reference circuit may be implemented.

Referring again to FIG. 26A, this diagram shows a PNP transistor implemented to source current to a node that connects to the load 32 to match and track the load current.

Figure 26B:
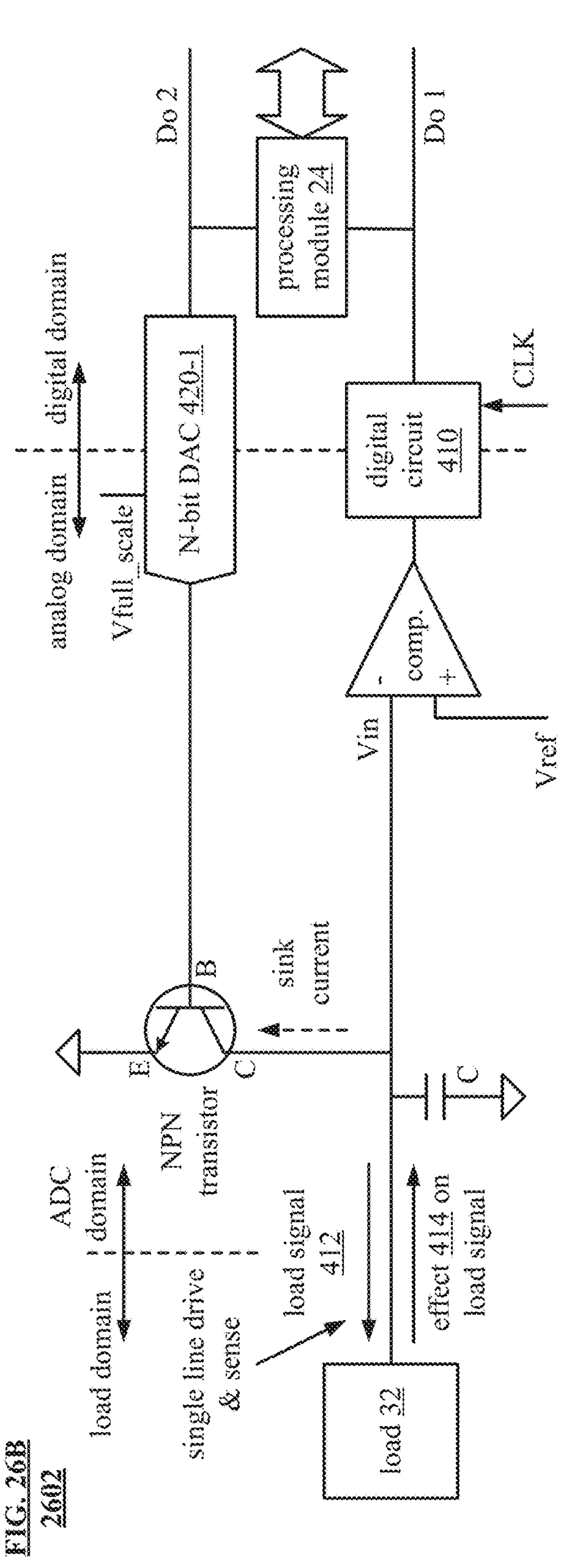
FIG. 26B is a schematic block diagram of an embodiment an ADC that includes an NPN transistor (alternatively, Negative-Positive-Positive BJT) implemented to sink current in accordance with the present invention.

FIG. 26B is a schematic block diagram of an embodiment 2602 an ADC that includes an NPN transistor (alternatively, Negative-Positive-Positive BJT) implemented to sink current in accordance with the present invention. This diagram shows an NPN transistor implemented to sink current from a node that connects to the load 32 to match and track the load current.

Figure 27:
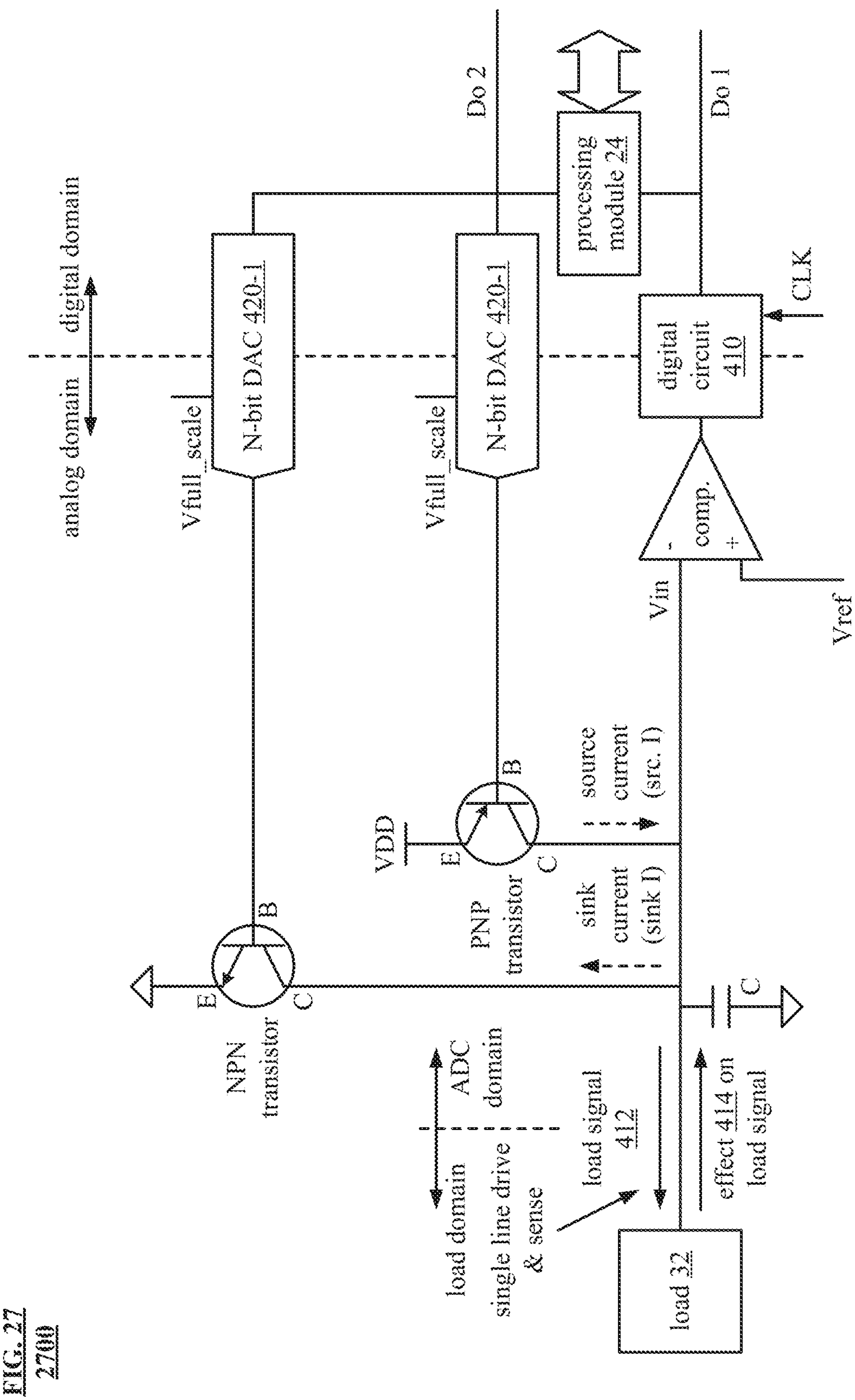
FIG. 27 is a schematic block diagram of an embodiment an ADC that includes both a PNP transistor implemented to source current and an NPN transistor implemented to sink current in accordance with the present invention.

FIG. 27 is a schematic block diagram of an embodiment 2700 an ADC that includes both a PNP transistor implemented to source current and an NPN transistor implemented to sink current in accordance with the present invention. This diagram shows both a PNP transistor implemented to source current to a node that connects to the load 32 to match and track the load current and also an NPN transistor implemented to sink current from a node that connects to the load 32 to match and track the load current. In cooperation with one another, both the PNP transistor and the NPN transistor can operate either to sink or source current as may be needed to match and track the load current.

FIG. 28A is a schematic block diagram of an embodiment 2801 an ADC that includes diodes implemented to source and/or sink current in accordance with the present invention. This diagram shows the two diodes implemented and controlled using switches, such as being controlled by the processing module 24, to provide for sinking or sourcing current to or from the node that connects to the load 32 to match and track the load current.

FIG. 28B is a schematic block diagram of an embodiment 2802 a PNP transistor diode configuration operative to generate a full scale voltage signal in accordance with the present invention. In addition, note that one way to have a temperature independent full-scale reference current is to use a PNP or NPN diode configuration to generate the full-scale voltage (Vfull_scale) based on an applied reference current Iref. This is to form a current mirror. The output bipolar transistor current to the load is a mirror copy of the reference current, Iref, which is scaled by the voltage value provided by the N-bit DAC 420-1. The reference current is applied to the collector of the PNP (or NPN) and the base is connected to the collector to form a diode configuration. The base voltage of the PNP is the full-scale voltage (Vfull_scale) that is applied to the N-bit DAC. Such a configuration for a PNP transistor is shown with respect to FIG. 28B. Such a configuration for an NPN transistor is shown with respect to FIG. 28B.

FIG. 28C is a schematic block diagram of an embodiment 2803 an NPN transistor diode configuration operative to generate a full scale voltage signal in accordance with the present invention.

Such implementations of a companding ADC using one or more NPN transistors, PNP transistors, and/or diodes provide a number of advantages over prior art ADCs. For example, they may be operated using extremely low power. Also, they operate to provide direct conversion of a digital output (e.g., Do 2) that is logarithmically proportional to the input current. Moreover, using an appropriate implementation, such as that described to provide a temperature independent full-scale reference current, such a companding ADC is temperature independent as opposed to the prior art ADCs, which are temperature dependent. Also, the accuracy and operation of such a companding ADC is independent of the Is current of the bipolar transistor [reverse bias saturation current (alternatively referred to as scale current)], which can have very wide tolerance across components.

Certain of the following diagrams show the use of one or both of a P-channel or P-type metal-oxide-semiconductor field-effect transistor (MOSFET) (alternatively, PMOS transistor) or an N-channel or N-type metal-oxide-semiconductor field-effect transistor (MOSFET) (alternatively, NMOS transistor) to implement the non-linear conversion function. For example, the use of one or both of a PMOS transistor or an NMOS transistor may be used to implement a logarithmic conversion function.

In addition, certain of the following diagrams operate using a N-bit DAC 420-1 that provides an output voltage signal to be received by the gate of an NMOS transistor or a PMOS transistor. In such examples, one or more of an NMOS transistor or a PMOS transistor is implemented to provide the current that matches or tracks the load current. Certain examples operate by sourcing current, and others operate by sinking current. Even other examples operate by providing both functionality of sourcing current and sinking current as may be required to match or track the load current.

Figure 29A:
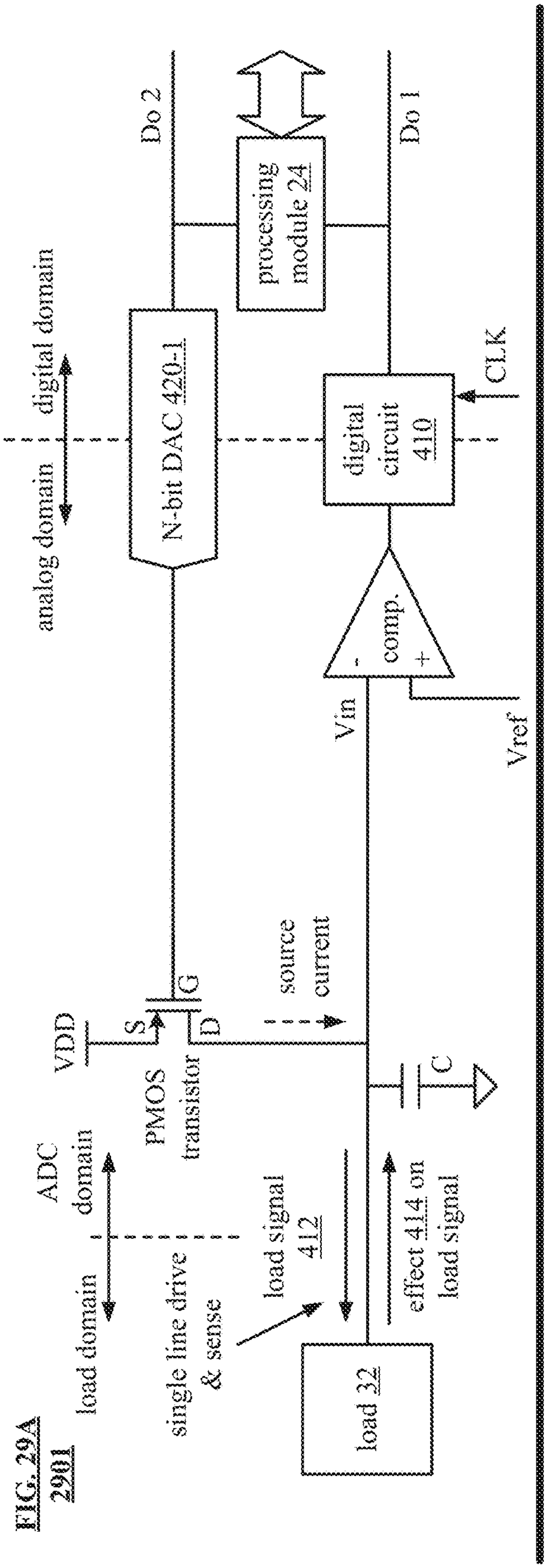
FIG. 29A is a schematic block diagram of an embodiment an ADC that includes a P-channel or P-type metal-oxide-semiconductor field-effect transistor (MOSFET) (alternatively, PMOS transistor) implemented to source current in accordance with the present invention.

FIG. 29A is a schematic block diagram of an embodiment 2901 an ADC that includes a P-channel or P-type metal-oxide-semiconductor field-effect transistor (MOSFET) (alternatively, PMOS transistor) implemented to source current in accordance with the present invention.

For example, the use of one or both of an NMOS transistor or a PMOS transistor operates as a square root conversion function. For example, the drain current, ID, of a MOSFET is as follows:

$$I_D = \frac{\mu C_{OX}}{2}\frac{W}{L}(V_{GS} - V_T)^2,$$

where $V_{GS}$ is the voltage across the gate (G) to source (S) junction of the MOSFET;

$V_T$ is the thermal voltage, kT/q, which is the Boltzmann constant, k, times temperature, T, divided by electron charge, q;

W is gate width;

L is gate length;

$\mu C_{ox}$ is a process transconductance parameter; and $\mu C_{ox}(W/L)$ is a MOSFET transconductance parameter.

As such, the voltage across the gate (G) to source (S) junction of the MOSFET, $V_{GS}$, is the output voltage of the N-bit DAC 420-1. As such, the value of $V_{GS}$ is the output voltage of the N-bit DAC 420-1.

Given that $V_{GS}$ is the output voltage of the N-bit DAC 420-1, then it is also the conversion of the Do 2 to an analog signal.

Therefore, the Do 2 (shown as Do in the equation below) is a an inverse function of the above equation showing the drain current, $I_D$, as follows:

$$Do = V_{GS} = \sqrt{\frac{2L}{\mu C_{OX} W} I_D} - V_T$$

As can be seen, this shows the Do 2 (shown as Do in the equation above) as being a square root function of the input current, which is the drain current, $I_D$.

Also, note that parallel measurement similar to the log ratio-metric measurement may be used to remove the dependence on $V_T$, which is the thermal voltage, kT/q, and which varies as a function of temperature. For example, a similar diode configuration and Iref current mirror as in the bipolar transistor variant can be applied here with respect to MOSFET devices.

For example, consider generating a first digital output signal, shown as Do 1 below, and also a first digital output signal, shown as Do2 below:

$$Do_1 = V_{GS} = \sqrt{\frac{2L}{\mu C_{OX} W} I_{D1}} - V_T, \text{ and}$$

$$Do_2 = V_{GS} = \sqrt{\frac{2L}{\mu C_{OX} W} I_{D2}} - V_T,$$

then the difference between them is as follows:

$$Do_1 - Do_2 = \sqrt{\frac{2L}{\mu C_{OX} W} I_{D1}} - \sqrt{\frac{2L}{\mu C_{OX} W} I_{D2}},$$

which is temperature independent and has no dependence on $V_T$, which is the thermal voltage, kT/q.

Referring again to FIG. 29A, this diagram shows a PMOS transistor implemented to source current to a node that connects to the load 32 to match and track the load current.

Figure 29B:
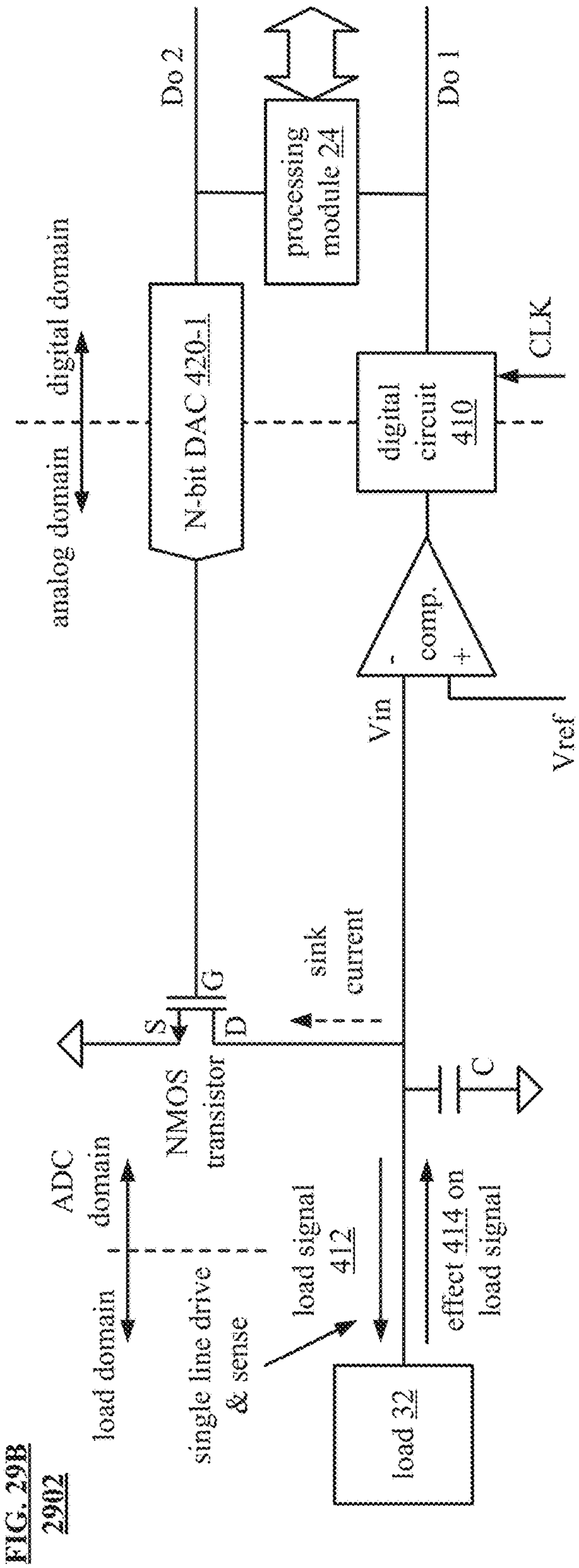
FIG. 29B is a schematic block diagram of an embodiment an ADC that includes an N-channel or N-type metal-oxide-semiconductor field-effect transistor (MOSFET) (alternatively, NMOS transistor) implemented to sink current in accordance with the present invention.

FIG. 29B is a schematic block diagram of an embodiment 2902 an ADC that includes an N-channel or N-type metal-oxide-semiconductor field-effect transistor (MOSFET) (alternatively, NMOS transistor) implemented to sink current in accordance with the present invention. This diagram shows an NMOS transistor implemented to sink current from a node that connects to the load 32 to match and track the load current.

Figure 30:
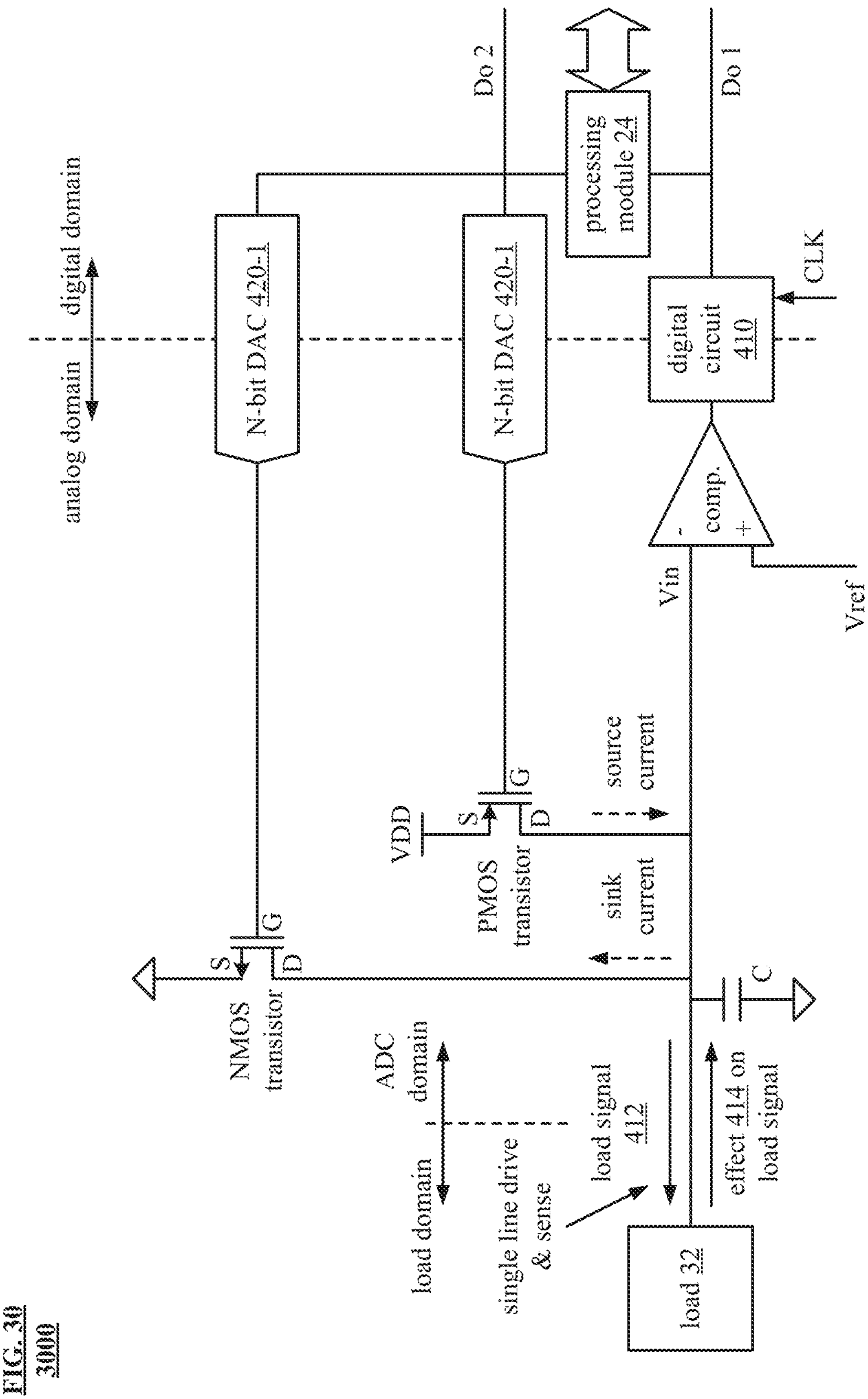
FIG. 30 is a schematic block diagram of an embodiment an ADC that includes both a PMOS transistor implemented to source current and an NMOS transistor implemented to sink current in accordance with the present invention.

FIG. 30 is a schematic block diagram of an embodiment 3000 an ADC that includes both a PMOS transistor implemented to source current and an NMOS transistor implemented to sink current in accordance with the present invention. This diagram shows both a PMOS transistor implemented to source current to a node that connects to the load 32 to match and track the load current and also an NMOS transistor implemented to sink current from a node that connects to the load 32 to match and track the load current. In cooperation with one another, both the PMOS transistor and the NMOS transistor can operate either to sink or source current as may be needed to match and track the load current.

Figure 31:
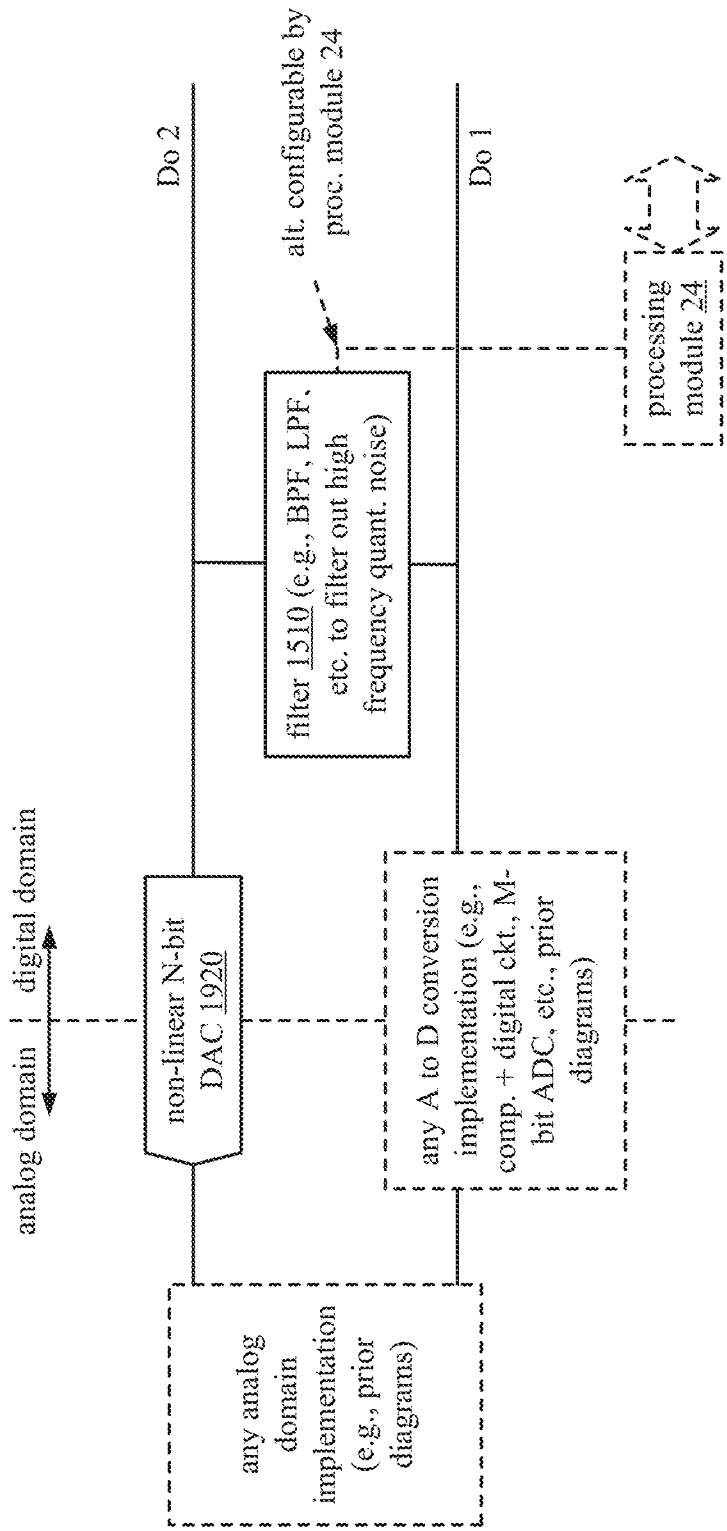
FIG. 31 is a schematic block diagram showing an embodiment of digital domain filtering within an ADC that includes a non-linear N-bit DAC in accordance with the present invention.

FIG. 31 is a schematic block diagram showing an embodiment 3100 of digital domain filtering within an ADC that includes a non-linear N-bit DAC in accordance with the present invention. This diagram is similar to FIG. 15 with a difference being that a non-linear N-bit DAC 1920 is implemented in place of the N-bit DAC 420.

Figure 32:
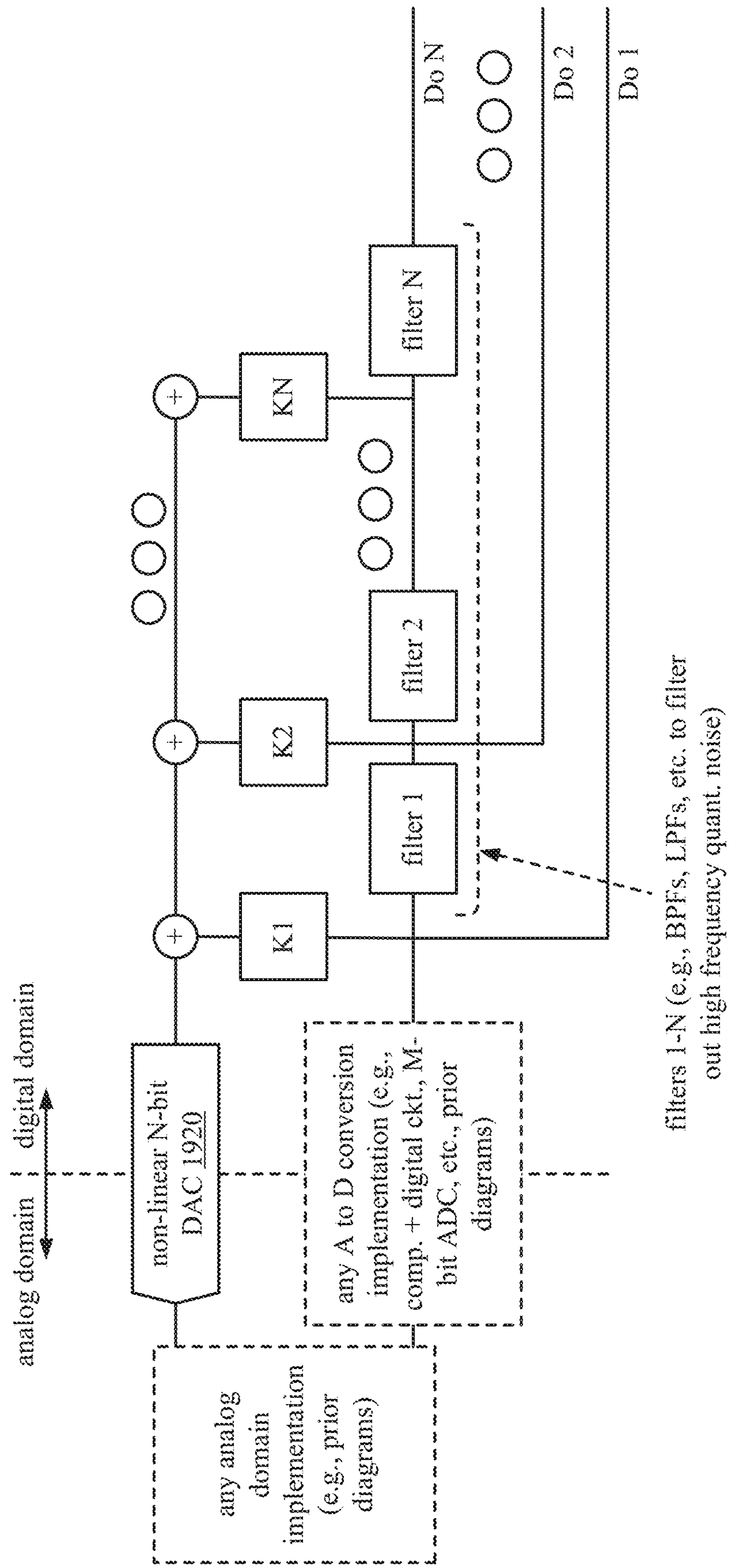
FIG. 32 is a schematic block diagram showing an embodiment of digital domain filtering using cascaded filters within an ADC that includes a non-linear N-bit DAC in accordance with the present invention.

FIG. 32 is a schematic block diagram showing an embodiment 3200 of digital domain filtering using cascaded filters within an ADC that includes a non-linear N-bit DAC in accordance with the present invention. This diagram is similar to FIG. 16 with a difference being that a non-linear N-bit DAC 1920 is implemented in place of the N-bit DAC 420.

Figure 33:
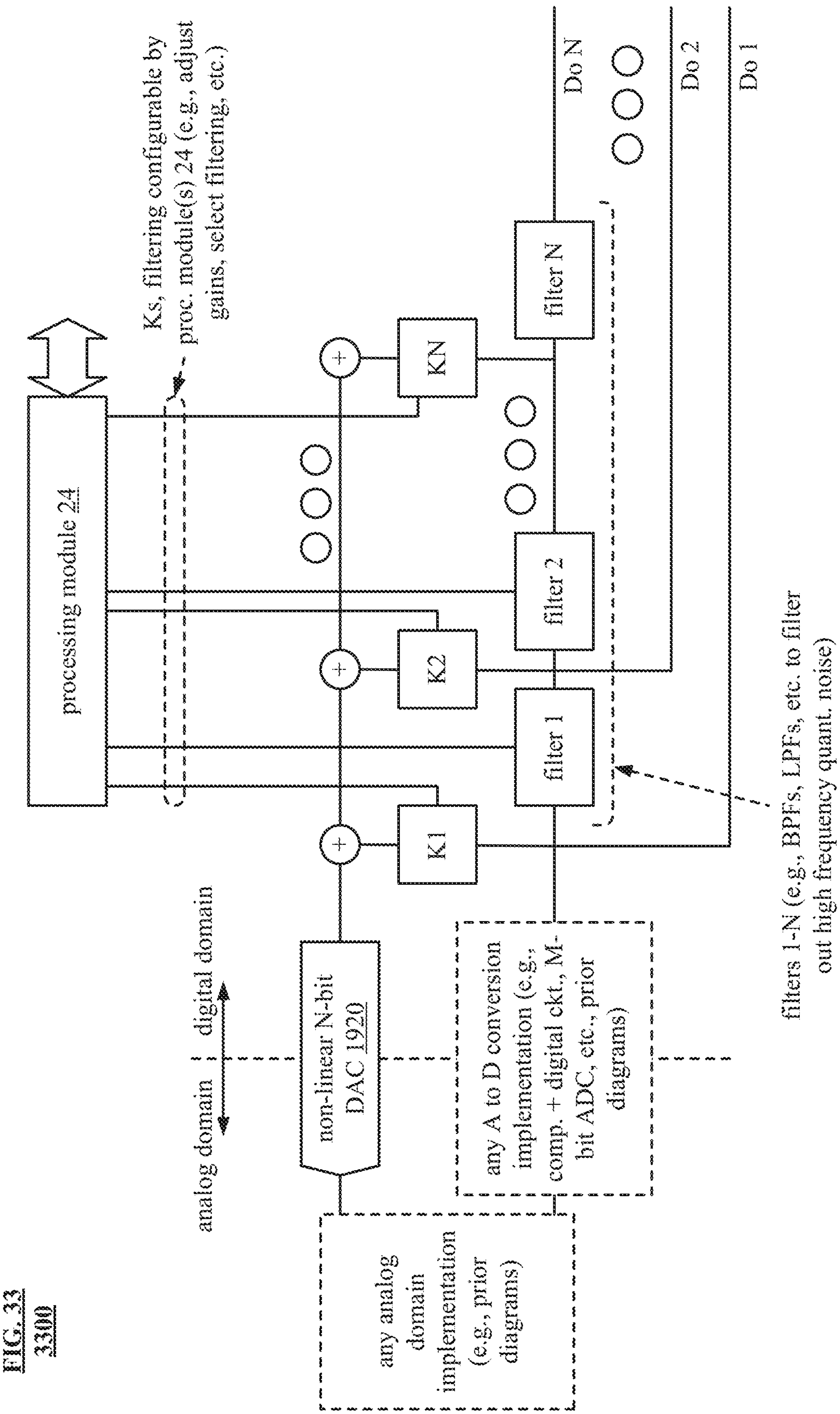
FIG. 33 is a schematic block diagram showing another embodiment of digital domain filtering using configurable/ adjustable cascaded filters within an ADC that includes a non-linear N-bit DAC in accordance with the present invention.

FIG. 33 is a schematic block diagram showing another embodiment 3300 of digital domain filtering using configurable/adjustable cascaded filters within an ADC that includes a non-linear N-bit DAC in accordance with the present invention. This diagram is similar to FIG. 17 with a difference being that a non-linear N-bit DAC 1920 is implemented in place of the N-bit DAC 420.

FIG. 34 is a schematic block diagram showing an embodiment 3400 of one or more processing modules implemented to perform digital domain filtering within an ADC that includes a non-linear N-bit DAC in accordance with the present invention. This diagram is similar to FIG. 18 with a difference being that a non-linear N-bit DAC 1920 is implemented in place of the N-bit DAC 420.

FIGS. 35A, 35B, and 35C are schematic block diagrams showing various embodiments 3501, 3502, and 3503, respectively, of analog to digital converters (ADCs) with improved bandwidth in accordance with the present invention.

Referring to embodiment 3501, this diagram has certain similarities with other diagrams. For example, FIG. 4. An ADC is connected to or coupled to a load 32 via single line such that the ADC is configured to provide a load signal 412 via that single line and simultaneously to detect any effect 414 on that load signal via a single line (including any change thereof). In certain examples, the ADC is configured to perform single line drive and sense of that load signal 412, including any effect 414 thereon via that single line. This embodiment similarly includes a charging capacitor, C, that is coupled to one or the inputs of a comparator as voltage signal, $V_{in}$. The other input of the comparator receives a reference voltage signal, $V_{ref}$. The output of the comparator is provided to a digital circuit 410 (e.g., which is clocked by a clock signal CLK and is configured to generate a digital output signal Do 1 at the particular clock rate of the clock signal CLK). Note that while a comparator coupled to a digital circuit 410 is shown in this diagram note that such a combination of elements may be alternatively implemented using any of the variations found in certain other diagrams herein, such as with respect to FIG. 5A. Note that any of the various implementations 501, 502, 503, 504, may alternatively be implemented in place of the combination of a comparator and a digital circuit 410 within this diagram and any other diagram herein. The output of the digital circuit 410 provides a digital output signal Do 1. As may be desired, the digital output signal Do 1 is provided to one or more processing modules 24 that is configured to communicate and interact with one or more other devices as described herein.

In some examples, the one or more processing modules 24 is configured to process the digital output signal Do 1 to generate another digital output signal Do 2 that is fed back to the N-bit DAC 420 that is configured to generate a feedback current signal $I_{fbk}$. That interacts with the load current $I_{load}$ to generate a quantization noise current, $I_{load}-I_{fbk}$, that charges the capacitor C thereby generating the voltage is provided to the input of the comparator that is coupled to that capacitor C.

In this diagram, a current sensor 3510 is implemented and configured to measure the quantization noise current, $I_{load}-I_{fbk}$, that charges the capacitor C and thereby generates a signal that is representative of the quantization noise current, $I_{load}-I_{fbk}$. Note that the signal that is representative of the quantization noise current, $I_{load}-I_{fbk}$, may be a scaled version of the quantization noise current, $I_{load}-I_{fbk}$ (e.g., scaled by some scaling factor k<1). Note that any of a variety of types of current sensors may be implemented to effectuate the operation of the current sensor 3510. Note that any such scheming information as may be performed by the current sensor 3510 when generating the signal that is representative of the quantization noise current, $I_{load}-I_{fbk}$, that it gets provided to the ADC 3512 will be compensated for as the ADC 3512 generates the output digital signal from the ADC 3512 that undergoes combination with the digital output signal Do 2. For example, any appropriate information regarding scaling of the signal generated by the current sensor 3510 will be included within the digital signal that is generated by the ADC 3512 (e.g., if the signal generated by the current sensor 3510 corresponds to a scaled representation of the quantization noise current, $I_{load}-I_{fbk}$, by a factor of ½ then the ADC 3512 will scale up the digital output signal by a factor of 2; if the signal generated by the current sensor 3510 corresponds to a scaled representation of the quantization noise current, $I_{load}-I_{fbk}$, by a factor of ¼ then the ADC 3512 will scale up the digital output signal by a factor of 4; and so on). Some various options (non-exhaustive) by which current sensing and current sensing circuits may be implemented are shown with respect to FIGS. 35D through 35K.

The current measurement signal that is provided from the current sensor 3510 is a signal that is representative of the sensed quantization noise current, $I_{load}-I_{fbk}$, that charges the capacitor C and thereby generates the voltage signal, $V_{in}$, that is provided to one of the inputs of the comparator. Note that this current measurement signal may be viewed as a signal that is representative of the quantization noise current, $I_{load}-I_{fbk}$. This current measurement signal is provided to an ADC 3512 that is configured to generate additional signal that is provided to a combiner (e.g., a subtract or a summer such that one of the inputs is inverted before combination) to be combined with the other digital output signal Do 2 to subtract the quantization noise from that other digital output signal Do 2. The output of the combiner, after combination of the other digital output signal Do 2 and the digital signal that is generated by the ADC 3512 that corresponds to the quantization noise current (e.g., representative of the quantization noise current, $I_{load}$–I fbk), is yet another/third digital output signal Do 2' that has significantly lower quantization noise than the other digital output signal Do 2. Note that the ADC 3512 may be implemented similar to an ADC as shown in the top portion of the diagram, such as similar to that of FIG. 4 and/or other implementations of an ADC as described herein.

An ADC implemented based on this embodiment 3501 and others presented herein provide much improved bandwidth compared to other ADCs. For example, by sensing and subtracting the quantization noise current, or effectively within the digital domain by subtracting the quantization noise from the other digital output signal Do 2, a signal having a much higher bandwidth may be achieved with relatively little complexity, if any. For example, an ADC as implemented based on this embodiment 3501 and others presented herein provide the benefits of a third or fourth quarter modulator, such as a sigma delta modulator, without any extra added complexity. By subtracting out the quantization noise from the digital output signal Do 2, the other digital output signal Do 2' is generated that has a significantly extended operational bandwidth in comparison to the digital output signal Do 2. In addition, such an ADC as implemented based on this embodiment 3501 and others presented herein may be implemented much more economically than prior art ADCs. Not only can such an ADC as implemented based on this embodiment 3501 and others presented herein be implemented to provide much improved performance including in terms of improved bandwidth, but it may also be implemented without any extra added complexity, and may be implemented more economically than prior art ADCs.

As may be desired in certain implementations, the decimation filter may be implemented to process the other/third digital output signal Do 2' to generate yet another/fourth digital output signal Do 2" having a lower sampling rate and a higher resolution than the other/third digital output signal Do 2'.

In certain examples, note that the other/fourth digital output signal Do 2" is provided to one or more other devices such as one or more processing modules that is configured to process the other/fourth digital output signal Do 2" to interpret information contained therein. Also, many other embodiments, diagrams, etc. show one or more digital output signals being generated by the various components therein. Similarly, in certain examples, note that any such one or more digital output signals is provided to one or more other devices such as one or more processing modules that is configured to process the one or more digital output signals to interpret information contained therein.

Within this diagram as well as any other diagram herein that includes a decimation filter, note that information included within the digital signal being provided to the decimation filter and the digital signal being output from the decimation filter both include comparable information. The decimation filter is operative to modify the sampling rate and resolution between digital signal being provided to the decimation filter and the digital signal being output from the decimation filter.

The quantization noise current, $I_{load}-I_{fbk}$, that is provided to one of the inputs of the comparator that operates in cooperation with the digital circuit 410 is configured to generate a digital signal that is oversampled with a high-frequency clock in the digital circuit 410. Again, the comparator and the digital circuit 410 may be implemented in an alternative implementation, yet the clock signal is such that it generates an oversampled digital output signal Do 1. The N-bit DAC 420 is configured to generate the feedback current signal, $I_{fbk}$, that undergoes combination with the load current signal to generate the quantization noise current, $I_{load}-I_{fbk}$. In an ideal implementation, N of the N-bit DAC 420 is infinite such that the N-bit DAC four and 20 generates a feedback current signal having zero quantization noise. However, in a real application implementation, N of the N-bit DAC 420 is finite such that the feedback current signal, $I_{fbk}$, does include some effect that is caused by the quantization noise.

Such an implementation of an ADC as shown in this diagram significantly expands the bandwidth of operation having a very high signal to noise ratio (SNR). For example, the operational frequency range extends significantly, in some instances up to 200-300 kHz (e.g., with a 20 MHz sampling rate), by sensing and removing the effects of the quantization noise current via the sensing of the quantization noise current, $I_{load}-I_{fbk}$, and combination with the digital output signal Do 2 thereby generating a digital output signal Do 2' having much lower quantization noise. The sensing of and subtracting of the quantization noise from the digital output Do 2 significantly improves the overall functionality of the ADC by extending the bandwidth having a very high SNR.

Also, note that such an ADC is configured to consume a very low-power in operation. For example, in once this example, the entire power consumption of the ADC is approximately 6 milli-Watts (mW) (e.g., consuming less than 6 mW during operation). Note that the implementation of such an ADC includes a mixture of approximately 90% digital circuitry and 10% analog circuitry. One of the larger components in the overall ADC is the and-bit DAC 420.

Given the significant amount of digital circuitry within such an implementation, the power consumption of the ADC is very low. In addition, given the significantly small number of analog components within the ADC, thermal noise is significantly reduced. Generally speaking, reducing the number of analog components will facilitate reduction in thermal noise of the overall circuit. In some implementations, the digital output signal Do 2' (after subtraction of the quantization noise from the digital output signal Do 2) or the other digital output signal Do 2" (output from the decimation filter) is implemented to have 14-16 bits of resolution. In some specific implementations when the bandwidth is extended even more significantly, and the resolution of these digital output signals Do2' or Do 2" may be even greater, such as more than 20 bits of resolution (e.g., 21 bits of resolution in one specific example).

With such an extension of bandwidth to an upper range of approximately 200-300 kHz (e.g., with a 20 MHz sampling rate), such an ADC that is operative to consume very little power and provide very high accuracy while also providing such a broad operational bandwidth, such an ADC may be implemented in a broad range of applications. For example, by providing an operational bandwidth up to approximately 100 kHz, such an ADC may be implemented within audio applications while providing high accuracy and while consuming very low-power. For example, considering audio applications, such as processing of human speech, such an ADC is configured to detect with very high accuracy even very small variations within a person's voice.

Also, with respect to the ADC 3512 implemented near the bottom of the diagram, note that the ADC 3512 may be as simple as that 1-bit ADC. Such an ADC may be approximately ¼ of the size of the N-bit DAC 420 located towards the top of the diagram. In other implementations, the ADC 3512 is replaced with a single comparator.

In addition, note that the one or more processing modules 24 may be viewed as operating as an integrator in certain examples. For example, consider a 6-bit digital output signal Do 2 coming out of the one or more processing modules 24 as being representative of the signal plus noise (e.g., as including quantization noise).

In an example of operation and implementation, the analog to digital converter (ADC) includes a capacitor that is operably coupled to a load and configured to produce a load voltage based on charging by a load current and a digital to analog converter (DAC) output current. Note that the ADC is coupled to the load via a single line. The ADC also includes a current sensor that is operably coupled and configured to sense a quantization noise current that is based on the load current and the DAC output current and to generate a signal that is representative of the quantization noise current. The ADC also includes a comparator operably coupled and configured to receive the load voltage via a first input of the comparator, receive a reference voltage via a second input of the comparator, and compare the load voltage to the reference voltage to generate a comparator output signal. The ADC also includes a digital circuit that is operably coupled to the comparator and configured to process the comparator output signal to generate a first digital output signal that is representative of a difference between the load voltage and the reference voltage.

The ADC also includes one or more processing modules that is operably coupled to the digital circuit and the memory and configured to execute operational instructions (e.g., such as operational instructions stored in memory) to process the first digital output signal to generate a second digital output signal that is representative of the difference between the load voltage and the reference voltage. In certain examples, the second digital output signal includes a higher resolution than the first digital output signal.

The ADC also includes an N-bit digital to analog converter (DAC) that is operably coupled to the one or more processing modules and configured to generate the DAC output current based on the second digital output signal. Note that N is a positive integer. Also, the DAC output current tracks the load current, and the load voltage tracks the reference voltage.

The ADC also includes another ADC that is operably coupled to the current sensor and configured to generate a digital signal that is representative of the quantization noise current based on the signal that is representative of the quantization noise current.

The ADC also includes a combining circuit that is operably coupled to the another ADC and the one or more processing modules and configured to subtract the digital signal that is representative of the quantization noise current from the second digital output signal to generate a third digital output signal.

In certain examples, the one or more processing modules is further configured to process the first digital output signal in accordance with performing band pass filtering or low pass filtering to generate the second digital output signal that is representative of the difference between the load voltage and the reference voltage.

In certain other examples, the comparator includes a sigma-delta comparator, and the digital circuit includes a clocked flip flop. In even other examples, a digital comparator includes both the comparator and the digital circuit. The digital comparator operably coupled and configured to receive the load voltage via a first input of the comparator, receive a reference voltage via a second input of the comparator, and compare the load voltage to the reference voltage to generate the first digital output signal that is representative of the difference between the load voltage and the reference voltage.

In certain alternative examples, the ADC also includes a decimation filter coupled to the combining circuit. When enabled, the decimation filter operably coupled and configured to process the third digital output signal to generate a fourth digital output signal having a lower sampling rate and a higher resolution than the third digital output signal.

Note that the load may be of any of a variety of types including an electrode, a sensor, or a transducer. In certain examples, the ADC includes an operational bandwidth having an upper range of 200 kHz or 300 kHz. Also, in certain specific implementations, the ADC is configured to consume less than 6 mW during operation.

Referring to embodiment 3502, this diagram is similar to the previous diagram with the least one difference being that the ADC 3512 shown at the bottom of the previous diagram is replaced with an N- or M-bit ADC 3520. For example, this ADC at the bottom of the diagram may be implemented as an N-bit ADC 3520 similar to the N-bit DAC 420 at the top of the diagram (e.g., N corresponds to a positive integer less than or equal to 8 bit resolution, $N<8$). In one particular implementation, N corresponds to a positive integer less than or equal to 8 bit resolution ($N<8$), and M corresponds to a positive integer between 1 and 4 bit resolution ($M=1$ to 4), inclusive. In certain implementations as described above, the N- or M-bit ADC 3520 may be implemented using an M-bit ADC 3520, such that $M<N$, given that the signal that is representative of the quantization noise current, $I_{load}-I_{fbk}$, that is generated by the current sensor 3510 will generally be a much smaller signal (e.g., a much smaller current signal in terms of magnitude) than the quantization noise current, $I_{load}-I_{fbk}$, itself.

In this diagram, the N- or M-bit ADC 3520 is implemented instead of the ADC 3512 of the previous diagram. For example, the N- or M-bit ADC 3520 is operably coupled to the current sensor and configured to generate a digital signal that is representative of the quantization noise current based on the signal that is representative of the quantization noise current. Note that M is a positive integer that is less than or equal to N.

Referring to embodiment 3503, this diagram has certain similarities with the previous two diagrams with at least one difference being that the ADC at the bottom of the prior two diagrams is replaced with a comparator operating in conjunction with a digital circuit 410 that is clocked by a clock signal CLK. In this diagram, a charging capacitor C is connected to one of the inputs of the comparator to generate a voltage signal at that input of the comparator. In addition, a reference voltage Vref (QN) is provided to the other input of the comparator to facilitate detection of a voltage signal corresponding to the quantization noise current, $I_{load}-I_{fbk}$. Also note that the combination of the comparator and the digital circuit 410 may alternatively be implemented using any of a number of variations including those described with respect to FIG. 5A. In this diagram, a first and second charging capacitor C, a first and second comparator, and a first and second digital circuit 410 are implemented. The second charging capacitor C, the second comparator, and the second digital circuit 410 are implemented instead of the ADC 3512 or the N- or M-bit ADC 3520 of the previous diagrams.

FIGS. 35D, 35E, 35F, 35G, 35H, 35I, 35J, and 35K are schematic block diagrams showing various embodiments 3504, 3505, 3506, 3507, 3508, 3509, 3521, and 3522, respectively, of current sensor circuitry that may be implemented in accordance with the present invention. These diagrams show some samples of various means by which current may be sensed. Note that these examples are non-not exhaustive and any other equivalent type current sensing capable device may alternatively be used.

Referring to embodiment 3504, a current sensor 3510 generates a current signal $I_2$ that is representative of the current flowing through the line from left to right $I_1$. For example, the current signal $I_2$ may be a scaled up or scale down versions of the current signal $I_1$. Such a current sensor 3510 may be implemented in a variety latest including a ferromagnetic current sensor that encompasses the wire or line that includes the current signal $I_1$ being sensed. Based on the coupling of magnetic field is generated by the current signal $I_1$ within the ferromagnetic current sensor, the current signal $I_2$ is induced within the magnetic core of the ferromagnetic current sensor.

Referring to embodiment 3505, a current sensor 3510-1 generates a voltage signal $V_{out}$ that is representative of the current flowing through the line from left to right $I_1$. For example, the voltage signal $V_{out}$ may is a signal that is representative of the current signal $I_1$. There may be some instances in which a voltage signal $V_{out}$ that is representative of the current signal $I_1$ is more desirable than a current signal $I_2$ that is representative of the current signal $I_1$.

Referring to embodiment 3506, in this diagram, the current signal $I_1$ is provided to a resistor $R_1$. The difference in voltage between the two ends of the resistor $R_1$ (V1 and V2) along with the value of the resistor $R_1$ are used to determine the current signal $I_1$ based on Ohm's Law (Delta $V=\Delta V=V1-V2=I_1\times R_1$, and $I_1=(V1-V2)/R_1$). Note that the symbol Δ is sometimes used in place of the word Delta herein, and vice versa; they both mean the same thing being the difference of, change of, difference between two values, etc. as is understood in the art.

Referring to embodiment 3507, this diagram shows a current mirror circuit. This included two transistor implementation of the current mirror that is based on the relationship that two equal sized transistors at the same temperature with the same characteristics, such as the $V_{BE}$ (voltage drop between the base and emitter of an NPN transistor in this implementation of two NPN BJTs (alternatively, Negative-Positive-Negative Bipolar Junction Transistors)) have the same collector current Ic. The current mirror is a circuit that functions to produce a copy of the current flowing into or out of an input terminal, such as the current signal $I_1$ that is flowing through the resistor $R_1$ and into the collector of the transistor Q1 on the left-hand side of the diagram. The collector and the base of the transistor Q1 are connected together. Also, the collector of the transistor Q1 is connected to the base of the transistor Q2. The voltage at the collector note of the transistor Q1 corresponds to the $V_{BE}$ of that same transistor Q1. This same voltage potential is provided to the base of the transistor Q2. As such, of the current signal $I_2$ that will be induced to flow at the collector note of the transistor Q2 will be the same as the current signal $I_1$.

Referring to embodiment 3508 and 3509, these diagrams correspond to high side current sensing and low side current sensing, respectively based on a load being implemented above or below a resistor $R_1$. A power supply voltage, $V_{pwr\ supp}$, provides a voltage potential that is higher than ground and thereby facilitates the flow of current signal $I_1$ via the load and the resistor $R_1$. One or more operational amplifiers/circuits is implemented to generate an output voltage signal $V_{out}$ that is representative of the current signal $I_1$ that is flowing via the load and the resistor $R_1$.

Referring to embodiment 3508, this diagram depicts high side current sensing such that the current sensing connects to the resistor between the power supply of the load. The sensed voltage signal may be scaled, such as amplified, by one or more operational amplifiers/circuits to generate the output voltage signal $V_{out}$ that is representative of the current signal $I_1$ that is flowing via the load and the resistor $R_1$. Some advantages of performing include eliminating ground disturbance, detecting the high load current caused by accidental electrical shorts, having the load connecting to the system ground directly, etc.

Referring to embodiment 3509, this diagram depicts low side current sensing such that the current sensing connects to the resistor between the load and ground. The sensed voltage signal may be scaled, such as amplified, by one or more operational amplifiers/circuits to generate the output voltage signal $V_{out}$ that is representative of the current signal $I_1$ that is flowing via the load and the resistor $R_1$. Some advantages of performing low side current sensing include providing a low input common mode voltage, a ground referenced input and output, and a relatively simple and low-cost implementations, etc.

Referring to embodiment 3521, this diagram shows a metal-oxide-semiconductor field-effect transistor (MOSFET) current splitter implemented using PMOS transistors. For example, consider a current signal $I_1$ entering the node connected to the sources of the PMOS transistors of the MOSFET current splitter. Also, a voltage bias, Vbias is provided to the gates of the PMOS transistors of the MOSFET current splitter. Considering a MOSFET current splitter that includes two PMOS transistors M1 and M2 of the same size, then the current signal $I_1$ will be evenly split between the two PMOS transistors M1 and M2 as follows: $I_1=I_{1a}+I_{1b}$, and $I_{1a}=I_{1b}$. Alternatively, considering a MOSFET current splitter that includes two PMOS transistors M1 and M2 of not of the same size, and PMOS transistor M1 is less in size than the PMOS transistor M2, then the current signal $I_1$ will be split between the two PMOS transistors M1 and M2 as follows: $I_1=I_{1a}+I_{1b}$, and $I_{1a}<I_{1b}$. In an alternative implementation, considering a MOSFET current splitter that includes two PMOS transistors M1 and M2 of not of the same size, and PMOS transistor M1 is greater in size than the PMOS transistor M2, then the current signal $I_1$ will be split between the two PMOS transistors M1 and M2 as follows: $I_1=I_{1a}+I_{1b}$, and $I_{1a}>I_{1b}$.

Referring to embodiment 3522, this diagram shows a bipolar current splitter implemented using PNP transistors (alternatively, Positive-Negative-Positive Bipolar Junction Transistors (BJT)). For example, consider a current signal $I_1$ entering the node connected to the emitters of the PNP BJT transistors of the bipolar current splitter. Also, a voltage bias, Vbias is provided to the bases of the PNP BJT transistors of the bipolar current splitter. Considering a bipolar current splitter that includes two PNP BJT transistors Q1 and Q2 of the same size, then the current signal $I_1$ will be evenly split between the two PNP BJT transistors Q1 and Q2 as follows: $I_1=I_{1a}+I_{1b}$, and $I_{1a}=I_{1b}$. Alternatively, considering a bipolar current splitter that includes two PNP BJT transistors Q1 and Q2 of not of the same size, and PNP BJT transistor Q1 is less in size than the PNP BJT transistors Q2, then the current signal $I_1$ will be split between the two PNP BJT transistors Q1 and Q2 as follows: $I_1=I_{1a}+I_{1b}$, and $I_{1a}<I_{1b}$. In an alternative implementation, considering a bipolar current splitter that includes two PNP BJT transistors Q1 and Q2 of not of the same size, and PNP BJT transistor Q1 is greater in size than the PNP BJT transistors Q2, then the current signal h will be split between the two PNP BJT transistors Q1 and Q2 as follows: $I_1=I_{1a}+L_{1b}$, and $I_{1a}>I_{1b}$.

Note that any one of these examples of different ways in which to perform current sensing may be limited within an ADC as described herein. Generally speaking, any desired current sensor implementations may be used in various embodiments of the invention.

FIG. 35F shows multiple performance diagrams of ADC output 3581, 3582, 3583, and 3584, respectively, expressed as power spectral density (PSD [dB]) as a function of frequency (kilo-Hertz [kHz]) in accordance with the present invention.

Referring to diagram 3581, this diagram shows the ADC output with no thermal noise in the clock jitter effect. The ADC providing improved bandwidth as described herein by subtracting out the quantization noise from the digital output Do 2 (e.g., shown as improved IADC in the diagram). As can be seen, the operational bandwidth of the ADC is significantly extended in the upper frequency ranges (e.g., into the 100 s of kHz and even the low/10 s of MHz upper limits).

Referring to diagram 3582, this diagram shows the ADC output with thermal noise and also with clock jitter effect. The thermal noise raises the overall noise floor within the ADC providing improved bandwidth, but the ADC providing improved bandwidth still provides improved bandwidth as described herein by subtracting out the quantization noise from the digital output Do 2 (e.g., shown as improved IADC in the diagram). Note that the thermal noise dominates at lower frequencies in the quantization noise dominates at higher frequencies. By subtracting out quantization noise from the digital output Do 2, the operational bandwidth of the ADC is it significantly extended (e.g., into the 100 s of kHz and even the low/10 s of MHz upper limits).

Referring to diagram 3583, this diagram shows the ADC output with thermal noise and also shows that quantization noise is largely negligible at lower frequencies. Although quantization noise can become exacerbated at higher frequencies, the ADC providing improved bandwidth does provide an operational bandwidth extending into the higher frequencies (e.g., into the 100 s of kHz and even the low/10 s of MHz upper limits). As can be seen in this diagram, such an ADC providing improved bandwidth as described herein helps lower the quantization noise at higher frequencies. As can also be seen in this diagram, the ADC providing improved bandwidth provides improved bandwidth as described herein by subtracting out the quantization noise from the digital output Do 2 (e.g., shown as improved IADC in the diagram).

Referring to diagram 3584, this diagram also shows the ADC output with thermal noise and also with clock jitter effect. As can also be seen in this diagram, the ADC providing improved bandwidth provides improved bandwidth as described herein by subtracting out the quantization noise from the digital output Do 2 (e.g., shown as improved IADC in the diagram).

FIG. 36A is a schematic block diagram showing an embodiment 3601 of an ADC implemented with a thermometer decoder in accordance with the present invention. Referring to embodiment 3601, this diagram has certain similarities to others herein including a single line that is coupled from the ADC to a load 32, thereby facilitating single line drive and sense by providing a load signal 412 and detecting an effect 414 on that load signal, a charging capacitor C, a comparator implemented with a digital circuit 410 (which may alternatively be implemented using any of the variations including those in FIG. 5A), etc.

However, this diagram has certain differences from other diagrams herein as well. For example, a N-bit accumulator 3610 (shown as N-bit ACC 3610 and the diagram) is implemented to process the digital output signal from the digital circuit 410 (or alternative one or more components that generates the digital output signal generated by those one or more components). For example, the N-bit accumulator 3610 is configured to convert the digital output signal to a digital signal having a certain number of bits. In some examples, this operation involves converting a digital output signal that includes one bit every clock signal of the clocking signal that is provided to the digital circuit 410 to an N-bit signal that includes N-bits every clock signal. In one specific example, this operation involves conversion of a one-bit digital signal to a 7-bit signal or an 8-bit signal. Generally speaking, the N-bit accumulator 3610 may be configured in various alternative implementations to generate an N-bit signal having any desired number of bits, such that N is a positive integer greater than or equal to 2.

Note also that the decimation filter may be implemented to process the output digital signal from the N-bit accumulator 3610 as well. For example, the decimation filter is configured to process the digital output signal provided from the N-bit accumulator 3610 to generate another digital output signal having a lower sample rate and a higher resolution.

In addition, the digital signal that is generated by the N-bit accumulator 3610 is provided to a thermometer decoder 3612. The thermometer decoder 3612 is configured to generate an output symbol that includes a sequence of 0s followed by a sequence of is in most instances, or alternatively all 0s or all is. For example, with respect to a thermometer code, there cannot be any 0s in between two 1s. Generally speaking, with respect to a thermometer code, an input value representing a particular number (e.g., 3=011 binary) generates an output value such that the lowermost bits are all of value 1, and the other uppermost bits or all of value 0. Generally speaking, for an n-bit binary code, the corresponding thermometer code will have $2^n-1$ symbols. As such, as many bits are needed to represent the thermometer code.

The top portion of the diagram pictorially illustrates an example of a thermometer code with 8 symbols each having 7 bits. Consider 8 binary input symbols composed of 3 bits each: 0=000, 1=001, 2=010, 3=011, 4=100, 5=101, 6=110, and 7=111.

Based on the input value, the thermometer code will generate the following output symbols.

Input 0=000, then output=0000000
Input 1=001, then output=0000001
Input 2=010, then output=0000011
Input 3=011, then output=0000111
Input 4=100, then output=0001111
Input 5=101, then output=0011111
Input 6=110, then output=0111111
Input 7=111, then output=1111111

Note that while this example corresponds to a thermometer code operating on input symbols composed of three bits each and generating output symbols composed of seven bits each, different sized thermometer codes may alternatively be implemented using the thermometer decoder 3612. For example, consider input symbols composed of 7 or 8 bits each, then corresponding output symbols in accordance with the thermometer code may be generated based on these principles.

In an example of operation and implementation, the thermometer decoder 3612 outputs thermometer code symbols based on the inputs provided from the N-bit accumulator 3610. A number of PNP BJTs (alternatively, Positive-Negative-Positive Bipolar Junction Transistors) and NPN BJTs (alternatively, Negative-Positive-Positive BJTs) are implemented to perform digital to analog conversion of the output symbols provided from the thermometer decoder 3612. Generally speaking, any desired total number X of PNP BJTs and NPN BJTs are implemented (e.g., consider Nb PNP BJTs and also Nb NPN BJTs, such that Nb is a positive integer greater than or equal to 2). By using a thermometer decoder 3612 to provide the inputs to and facilitate the operation of the Nb PNP BJTs and also Nb NPN BJTs that are implemented to perform digital to analog conversion thereby generating a source current and/or a sink current, as few as only one current source for current sink is switched on or off at a time during any transition between two successive respective values output by the thermometer decoder 3612. For example, consider the input to the thermometer decoder 3612 transitioning from 2=010 to 3=011, then the output from the thermometer decoder 3612 would transition from 0000011 to 0000111. Note that only one bit of the output from the thermometer decoder 3612 changes during such a transition. By using a thermometer decoder 3612 to facilitate operation of the Nb PNP BJTs and also Nb NPN BJTs that are implemented to perform digital to analog conversion, a significant reduction in noise may be facilitated with respect to the adaptation of a source current and/or a sink current that is set back within the ADC to regulate the input voltage (Vin) to the comparator to the input reference voltage (Vref) to the comparator. This implementation provides a significant improvement over alternative implementations that would switch on or off a large number of current sources and/or current sinks. The thermometer decoder 3612 facilitates adaptation of the feedback source current and/or a sink current in a manner that is very low noise, high precision, etc.

In certain examples, note that the sampling rate within such an ADC implemented with a thermometer decoder is programmable. For example, the sampling rate may be anywhere within the range of 400 kHz to 40 MHz in certain implementations. In addition, the reference currents that may be used within such an ADC implemented with a thermometer decoder may be of extremely low value, such as varying between 1 μA to 100 μA in certain implementations. Also, in certain examples, note that the input reference voltage signal Vref is provided as a programmable sinusoidal signal. Note that such an ADC implemented with a thermometer decoder is operative to operate using very low power, and can sink and or source current to the load 32.

FIGS. 36B and 36C are schematic block diagrams showing embodiments 3602 and 3603, respectively, of one or more PNP BJTs (alternatively, Positive-Negative-Positive Bipolar Junction Transistors) and NPN BJTs (alternatively, Negative-Positive-Positive BJTs) implemented to sink and source current within embodiments of ADCs implemented with a thermometer decoder in accordance with the present invention.

Referring to embodiment 3602, this diagram shows the number of NPN BJTs (e.g., Nb NPN BJTs) that are implemented such that an output symbol from a thermometer decoder is provided to the respective base terminals of the NPN BJTs. For example, each of the respective bits of the output symbol from the thermometer decoder is provided via a respective line to a respective one of the base terminals of the NPN BJTs. Considering an example of an output symbol from the thermometer decoder being 0000011, then the respective bits that are provided via the respective lines to the base terminals of the NPN BJTs are as follows: 0 is provided to 5 of the NPN BJTs, and 1 is provided to 2 of the NPN BJTs (e.g., 0 to NPN BJT 1, 0 to NPN BJT 2, 0 to NPN BJT 3, 0 to NPN BJT 4, 0 to NPN BJT 5, 1 to NPN BJT 6, and 1 to NPN BJT 7). As mentioned above, when the output from the thermometer decoder changes up or down by a particular value, only one of the bits of the output symbol of the thermometer decoder changes, and as such, only one of the respective NPN BJTs is switched on or off. Such an implementation of a number of NPN BJTs is configured to sink current based on the number of NPN BJTs that are switched on in response to the output symbol from the thermometer decoder.

Referring to embodiment 3603, this diagram shows the number of PNP BJTs (e.g., Nb PNP BJTs) that are implemented such that an output symbol from a thermometer decoder is provided to the respective base terminals of the PNP BJTs. This operates similarly to the implementation of the previous diagram with a difference being that the number of PNP BJTs is configured to source current based on the number of PNP BJTs that are switched on in response to the output symbol from the thermometer decoder. As such, the desired sink current and/or source current is provided to the single line that is connected to and/or coupled to the load 32.

Implementing both the embodiments 3602 and 3603, as such, the desired sink current and/or source current is provided to the single line that is connected to and/or coupled to the load 32.

Note that various implementations may include the structure of one or both of the embodiments 3602 and/or 3603 as may be desired in various implementations that may operate by sinking and/or sourcing current.

FIG. 36D is a schematic block diagram showing an alternative embodiment 3604 of an ADC implemented with a thermometer decoder in accordance with the present invention. This diagram is similar to the embodiment 3601 of FIG. 36A with at least one difference being that the PNP BJTs (alternatively, Positive-Negative-Positive Bipolar Junction Transistors) and NPN BJTs (alternatively, Negative-Positive-Positive BJTs) are replaced respectively with PMOS and NMOS metal-oxide-semiconductor field-effect transistors (MOSFETs) (PMOS and NMOS transistors). The PMOS and NMOS transistors operate similarly to source and/or sink current based on the to the single line that is connected to and/or coupled to the load 32. In certain examples, it is preferable to implement PMOS and NMOS transistors instead of PNP and NPN BJTs to source and/or sink current.

FIGS. 36E and 36F are schematic block diagrams showing embodiments of one or more metal-oxide-semiconductor field-effect transistors (MOSFETs) including one or more PMOS transistors and NMOS transistors implemented to sink and source current within embodiments of ADCs implemented with a thermometer decoder in accordance with the present invention.

Referring to embodiments 3605 and 3606, these diagrams are similar to the embodiments 3602 and 3603 of FIG. 36B and FIG. 36C, respectively, with at least one difference being that the PNP BJTs (alternatively, Positive-Negative-Positive Bipolar Junction Transistors) and NPN BJTs (alternatively, Negative-Positive-Positive BJTs) are replaced respectively with PMOS and NMOS metal-oxide-semiconductor field-effect transistors (MOSFETs) (PMOS and NMOS transistors).

Referring to embodiment 3605, this diagram shows the number of NMOS transistors that are implemented such that an output symbol from a thermometer decoder is provided to the respective gate terminals of the NMOS transistors. For example, each of the respective bits of the output symbol from the thermometer decoder is provided via a respective line to a respective one of the gate terminals of the NMOS transistors. Such an implementation of a number of NMOS transistors is configured to sink current based on the number of NMOS transistors that are switched on in response to the output symbol from the thermometer decoder. As such, the desired sink current is provided to the single line that is connected to and/or coupled to the load 32.

Referring to embodiment 3606, this diagram shows the number of PMOS transistors that are implemented such that an output symbol from a thermometer decoder is provided to the respective gate terminals of the PMOS transistors. This operates similarly to the implementation of the previous diagram with a difference being that the number of PMOS transistors is configured to source current based on the number of PMOS transistors that are switched on in response to the output symbol from the thermometer decoder. As such, the desired source current is provided to the single line that is connected to and/or coupled to the load 32.

Implementing both the embodiments 3605 and 3606, as such, the desired sink current and/or source current is provided to the single line that is connected to and/or coupled to the load 32.

Note that various implementations may include the structure of one or both of the embodiments 3605 and/or 3606 as may be desired in various implementations that may operate by sinking and/or sourcing current.

FIG. 36G is a schematic block diagram showing an alternative embodiment 3607 of an ADC implemented with a thermometer decoder in accordance with the present invention. Referring to embodiment 3607, this diagram has similarity to the embodiment 3601 and embodiment 3604 with at least one difference being that the Nb PNP BJTs and also Nb NPN BJTs or replaced by resistor banks that operate to sink and/or source current. For example, consider a number of resistors (e.g., $R_1$ to $R_x$ connected to ground to sink current and/or $R_1$ to $R_x$ connected to ground to a power supply such as VDD to source current) that are implemented within respective resistor banks such that any desired number of those resistors in each of the respective banks may be connected or disconnected as desired to facilitate a particular current sink and/or current source to be fed back to the single line that is connected to and/or coupled to the load 32.

In an example of operation and implementation, a smaller sink current and/or smaller source current is provided from the respective resistor banks based on all of the resistors therein being switched in. For example, number of resistors implemented in parallel provides a lower resistance than any one of the respective resistor is singularly switched in while the others are not connected. Based on the value of the output symbol from the thermometer decoder 3612, the appropriate number of resistors are switched in within the one or more resistor banks thereby facilitating the desired current sink and/or current source to be fed back to the single line that is connected to and/or coupled to the load 32.

Note that alternative implementations, circuits, etc., may be implemented to provide the desired current sink and/or current source to be fed back to the single line that is connected to and/or coupled to the load 32 based on the value of the output symbol from the thermometer decoder 3612. For example, a number of independent and/or dependent current sources may alternatively be implemented and controlled based on the output symbol from the thermometer decoder 3612, a number of current buffers may alternatively be implemented and controlled based on the output symbol from the thermometer decoder 3612, etc.

FIGS. 37A, 37B, and 37C are schematic block diagrams showing various embodiments 3701, 3702, and 3703, respectively, of differential current sensing circuits in accordance with the present invention.

Referring to embodiment 3701, the two respective inputs to a comparator are connected via two respective resistors Rs that connect to the two respective terminals of a resistor R. One of the terminals of the resistor R is connected to load 32. Based on the voltage difference across the resistor R (Delta V=V1−V2, such that V1 is the voltage at one of the terminals of the resistor R and V to is the voltage at the other terminal of the resistor R that is connected to load 32), the current I flowing through the resistor R is measured using the differential current sensing circuit.

The differential current sensing circuit includes the comparator whose inputs are connected via the two respective resistors Rs. The output signal from the comparator is provided to digital circuit 410 that is configured to generate digital output signal Do 1. Similarly, as with respect to other embodiments, diagrams, etc. herein, the comparator and the digital circuit 410 may be alternatively implemented including using those alternative implementations described with respect to FIG. 5A. One or more processing modules 24 is configured to process the digital output signal Do 1 to generate another digital output signal Do 2. In certain examples, a decimation filter is implemented to process the digital output signal Do 2 to generate another digital output signal Do 3. For example, the decimation filter is configured to process the digital output signal Do 2 provided from the one or more processing modules 24 to generate another digital output signal Do 3 having a lower sample rate and a higher resolution.

The digital output signal Do 2 is also provided to a differential N-bit DAC 1120, wherein N is a positive integer. The differential N-bit DAC 1120 is operative to generate a differential output current signal that is provided to the differential load lines that are respectively connected to the inputs of the comparator. Also, a capacitor C is connected between the respective inputs of the comparator. In alternative implementations, two respective single-ended capacitors, C, are respectively connected to the differential signal lines and to ground instead of the capacitor, C, connected to the differential lead lines (e.g., a first single ended capacitor, C, connected to one of the differential signal lines and to ground, and a second single ended capacitor, C, also connected to the other of the differential signal lines and to ground).

Note that the two respective resistors Rs are implemented to convert the voltages V1 and V2 to respective current signals I1 and I2, respectively, to be provided to the respective inputs of the comparator. As such, differential current sensing is performed, which senses (V2−V1)/Rs. by knowing Rs, then the current flowing through the resistor R may be determined. In addition, note that a voltage source is implemented to supply the voltage V1 to facilitate current flow I through the resistor R. The current flowing to the load $I_{load}$ is the difference between the current I and the current I2 (Iload=I−I2). As can be seen, this differential current sensing circuit has similarities to an ADC as described herein that is configured to sense current. By implementing the resistor R, the ADC is configured to sense the differential voltage across the resistor R (after conversion of that differential voltage to current signals via the two respective resistors Rs), and the ADC is then configured to determine the current I flowing through the resistor R based on the voltages V1 and V2 based on the following relationship.

$$\text{Delta } V=V2-V1=I\times R$$

$$I=(V2-V1)/R$$

In certain examples, note also that the majority of components of this differential current sensing circuit may be implemented on-chip (e.g., within an integrated circuit). For example, as can be seen by the dotted line extending from the lower left of the diagram upward into the right, all the components to the right of the dotted line may be implemented on-chip. The other components may be implemented off-chip in certain examples. As such, an integrated circuit having the two respective outputs, pins, leads, etc. to facilitate connection to the two respective resistors Rs is configured to connect with such off-chip components to facilitate differential current sensing of the current flowing through the resistor R that is connected to the load 32. This differential current sensing circuit provides a relatively low complexity circuitry that is operative to sense current. Note that this differential current sensing circuit has some similarities to other implementations described herein of an ADC as described herein that is configured to sense current. By modifying certain connectivity and components of those other implementations of an ADC, a very high accuracy current measurements may be made by generating and using the differential current sensing circuit of this diagram.

Referring to embodiment 3702, this diagram is similar to the previous diagram with at least one difference being that this diagram includes two respective buffers implemented in-line via the lines that connect to the inputs of the comparator. These buffers are implemented to facilitate isolation between the inputs of the comparator and the two respective resistors Rs while still providing signals representative of the current signals flowing through the two respective resistors Rs. In an implementation in which many of the components are implemented on-chip, these buffers also operate to provide isolation between the on-chip components and the off-chip components. Generally speaking, a current buffer is configured to present a signal source from being effective by other electrical effects. For example, a current buffer is configured to transform a current from a first circuit to a second circuit. Often times the first circuit has a relatively lower output impedance then the second circuit, which has a relatively higher output impedance. The current buffer is configured to prevent the two respective circuits from loading one another thereby generating any adverse effects that may interfere with the desired operation of the circuits. In an example of operation and implementation, a current buffer is configured to transfer current signal from the input to the output such that the current is unchanged. In some implementations, the gain of such a current buffer is 1 or unity, such that the output current follows or tracks the input current. In alternative implementations, the output current is a scaled version of the input current (e.g., scaled up or down as may be desired in a particular implementation).

Referring to embodiment 3703, this diagram is similar to the previous two diagrams with at least one difference being that this diagram includes a differential buffer implemented in-line via the lines that connect to the inputs of the comparator. For example, comparing this diagram to the previous diagram, a differential buffer is implemented in place of the two respective buffers that are implemented in-line via the lines that connect to the inputs of the comparator. The differential buffer of this diagram operates similarly to provide isolation between the on-chip components and the off-chip components.

FIGS. 38A and 38B are schematic block diagrams showing various embodiments 3801 and 3802, respectively, of power sensing circuits in accordance with the present invention.

Referring to embodiment 3801, portions of this diagram have similarities to other diagrams in. For example, the components on the left-hand side of the diagram, to the left of the dotted line, the implementation of a voltage source, a resistor R such that one of its terminals is connected to load 32, and two respective resistors Rs that are connected to the two respective terminals of the resistor R, are similar to the previous diagrams (e.g., FIGS. 37A, 37B, and 37C).

However, that in this diagram, each of the two respective resistors Rs is connected to a respective ADC that is configured to measure current. For example, the two respective ADCs are configured to measure the two respective currents I1 and I2 that travel respectively via the two resistors Rs. A first ADC is implemented to measure the current I1, and a second ADC is implemented measure the current I2. For example, each of the respective ADCs that is configured to measure current includes a capacitor C that is connected to one of the inputs of a comparator, and the other input of the comparator is provided with an input voltage reference signal Vref. The output from the comparator is provided to a digital circuit 410 that is configured to generate a digital output signal Do 1. Similarly, as with respect to other embodiments, diagrams, etc. herein, the comparator and the digital circuit 410 may be alternatively implemented including using those alternative implementations described with respect to FIG. 5A. One or more processing modules 24 is configured to process the digital output signal Do 1 to generate another digital output signal Do 2. In certain examples, a decimation filter is implemented to process the digital output signal Do 2 to generate another digital output signal Do 3. For example, the decimation filter is configured to process the digital output signal Do 2 provided from the one or more processing modules 24 to generate another digital output signal Do 3 having a lower sample rate and a higher resolution. Note that the digital output signals Do 1, Do 2, and Do 3 may be understood with reference to the ADC implemented on the bottom right hand portion of the diagram. Similarly, the digital output signals Do 3, Do 4, and Do 6 may be understood with reference to the ADC implemented on the upper right hand portion of the diagram.

The digital output signal Do 2 is also provided to an N-bit DAC 420 that is configured to generate an output current signal that is provided to the line that is connected to one of the input of the comparator, namely, the input is connected to the capacitor C and is also connected to one of the resistors Rs.

In an example of operation and implementation, a first ADC is configured to measure the current I1 flowing through one of the resistors Rs, and a second ADC is configured to measure the current I2 flowing through the other one of the resistors Rs. Once the measurement of these two respective currents I1 and I2 are known, based on the current sensing of the first ADC of the second ADC, then the current I flowing through the resistor R may be calculated. Once the current I flowing to the resistor R and the current I2 are known, then the current being delivered to the load 32 may be calculated based on Iload=I−I2. Note that either one of the instantiations of the one or more processing modules 24 may be implemented to perform such calculations (e.g., in some examples, they are in communication with one another via a communication link), and/or one or more other processing modules (not shown) that may be implemented to process the digital output signals Do 3 and Do 6 to perform such calculations.

The digital output signal Do 6 (and/or the corresponding input to the decimation filter Do 5) is the digital signal that is representative of the current I2, and the digital output signal Do 3 (and/or the corresponding input to the decimation filter Do 2) is the digital signal that is representative of the current I1.

For example, the respective digital output signals Do3 and Do 6 or representative of the two respective currents I1 and I2.

Sense I1: Do 3 corresponds to (V1−Vref)/Rs.

Sense I2: Do 6 corresponds to (V2−Vref)/Rs.

V1 and V2 can be determined based on knowing Vref, Rs, and Do 3 as well as Do 6.

I1=(V1−Vref)/Rs

I2=(V2−Vref)/Rs

The current I flowing through the resistor R may be calculated based on:

$$I=(V1-V2)/R$$

Once these values have been calculated, the power being delivered to the load 32 may be calculated based on:

$$\text{Power}=I\text{load}\times V2=(I-I2)\times V2$$

Referring to embodiment 3802, this diagram is similar to the previous diagram with at least one difference being that buffers are implemented in-line with respect to the lines that connect from one of the inputs of the comparator to the respective resistors Rs. As described above, such buffers are implemented to facilitate isolation between the inputs of the comparators and the two respective resistors Rs while still providing signals representative of the current signals flowing through the two respective resistors Rs. In an implementation in which many of the components are implemented on-chip, these buffers also operate to provide isolation between the on-chip components and the off-chip components.

FIGS. 39A and 39B are schematic block diagrams showing various embodiments 3901 and 3902, respectively, of impedance sensing circuits (including complex impedance sensing capability) in accordance with the present invention.

Referring to embodiment 3901, this diagram also has certain similarities to other embodiments, diagrams, etc. herein including an ADC that is configured to sense current. For example, this diagram includes a capacitor C connected to one of the input terminals of the comparator, the comparator provides a signal to the digital circuit 410, the digital circuit 410 is configured to generate digital signal Do 1, one or more processing modules 24 is configured to process the digital signal Do 1 to generate another digital signal Do 2 that is provided as an input to an N-bit DAC 420, the N-bit DAC 420 is configured to generate a feedback current signal that is provided to the single line that is connected to and/or coupled to the load 32 such that the single line connects to the input terminal of the comparator to which the capacitor C is connected. Also, as may be desired in certain applications, a decimation filter is configured to process the digital output signal Do 2 provided from the one or more processing modules 24 to generate another digital output signal Do 3 having a lower sample rate and a higher resolution. Similarly, as with respect to other embodiments, diagrams, etc. herein, the comparator and the digital circuit 410 may be alternatively implemented including using those alternative implementations described with respect to FIG. 5A.

A signal generator is configured to provide an input voltage reference signal Vref to the other input terminal of the comparator. In addition, the input voltage reference signal Vref is provided to a quadrature generator. The quadrature generator is configured to generate a pair of quadrature sine and cosine signals based on the input voltage reference signal Vref. The pair of quadrature sine and cosine signals are provided to a demodulator that is configured to receive the digital output signal Do 3 from the decimation filter and to extract in-phase and quadrature (I and Q) signal components therefrom. The in-phase component I is generated within the demodulator and corresponds to the sine signal output from the quadrature generator multiplied by the digital output signal Do 3. The quadrature component Q is generated within the demodulator and corresponds to the cosine signal output from the quadrature generator multiplied by the digital output signal Do 3.

In an example of operation and implementation, consider an implementation which the load 32 includes a reactive component, such as based on having characteristics of a capacitor and/or inductor, thereby having an impedance component that includes capacitive reactance and/or inductive reactance.

For example, consider that the impedance of the load 32 is both resistive and reactive such that Z=R+jX, where the reactive impedance component X may correspond to capacitive reactance, inductive reactance, or some combination thereof. For example, consider $Z=R+jX_L$ or $Z=R-jX_C$, such that $X_L=\omega L$ and $X_C=-(1/\omega C)$, etc. where to $\omega=2\pi f$, where f is frequency, and j is the imaginary unit that is the square root of −1. Note that when both inductive reactance and capacitive reactance are both present, they may be combined together to generate the reactive impedance component $X=X_L+X_C=\omega L-(1/\omega C)$. Note that Z is the complex impedance, measured in Ohms. R is the resistance, measured in Ohms and is the real part of the complex impedance Z. X is the reactance, measured in Ohms and is the imaginary part of the complex impedance Z.

By extracting and generating the in-phase and quadrature (I and Q) signal components based on the digital output signal Do 3, both any real and any reactance components of the impedance of the load 32 may be determined. By having both the in-phase and quadrature (I and Q) signal components based on the digital output signal Do 3, the total impedance including the complex impedance of the load 32 may be determined. For example, the sine signal generated by the quadrature generator multiplied by the digital output signal Do 3 provides the in-phase component of the complex impedance of the load 32 corresponding to the real part of the complex impedance Z. The cosine signal generated by the quadrature generator multiplied by the digital output signal Do 3 provides the quadrature component of the complex impedance of the load 32 corresponding to the reactive/imaginary impedance component X of the complex impedance Z. Note that such an impedance sensing circuit (including complex impedance sensing capability) as presented within this diagram is configured to measure the impedance of the load 32 that may have any impedance characteristics including entirely real, entirely imaginary, or any combination thereof. Also note that the in-phase and quadrature (I and Q) signal components based on the digital output signal Do 3 correspond to the complex impedance Z of the load 32.

Generally speaking, such an impedance sensing circuit as described herein is configured to perform impedance sensing while driving in input reference voltage signal Vref and generating a digital signal that includes information corresponding to the measured load current Imeasured. By appropriately interpreting the digital signal, the load impedance is determined based on Vref/Imeasured. In certain examples, note that the input reference voltage signal Vref is sinusoidal. However, generally speaking, the input reference voltage signal Vref may take any desired form (e.g., a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component).

Referring to embodiment 3902, this diagram is similar to the previous diagram with at least one difference being that a buffer is implemented in-line with respect to the line that connects from one of the inputs of the comparator that connect to the load 32 and that has the capacitor C connected thereto. As described above, such a buffer is implemented to facilitate isolation between the input of the comparator and the load 32 while still providing a signal representative of the load current signal Load.

FIGS. 40A and 40B are schematic block diagrams showing various embodiments of resistance sensing circuits in accordance with the present invention.

Referring to embodiment 4001, this diagram also has certain similarities to other embodiments, diagrams, etc. herein including an ADC that is configured to sense current. For example, this diagram includes a capacitor C connected to one of the input terminals of the comparator, the comparator provides a signal to the digital circuit 410, the digital circuit 410 is configured to generate digital signal Do 1, one or more processing modules 24 is configured to process the digital signal Do 1 to generate another digital signal Do 2 that is provided as an input to an N-bit DAC 420, the N-bit DAC 420 is configured to generate a feedback current signal that is provided to the single line that is connected to and/or coupled to the load 32 such that the single line connects to the input terminal of the comparator to which the capacitor C is connected. Also, as may be desired in certain applications, a decimation filter is configured to process the digital output signal Do 2 provided from the one or more processing modules 24 to generate another digital output signal Do 3 having a lower sample rate and a higher resolution. Similarly, as with respect to other embodiments, diagrams, etc. herein, the comparator and the digital circuit 410 may be alternatively implemented including using those alternative implementations described with respect to FIG. 5A. A signal generator is configured to provide an input voltage reference signal Vref to the other input terminal of the comparator.

In an example of operation and implementation, two different input voltage reference signals Vref1 and Vref2 are provided by the signal generator at different respective times. Note that the two different input voltage reference signals Vref1 and Vref2 have different voltage levels, magnitudes, etc. For example, a first input voltage reference signal Vref1 is provided by the signal generator at a first time, and a second input voltage reference signal Vref2 is provided by the signal generator at a second time, such that a difference between the two input voltage reference signals, Vref1 and Vref1, is calculated based on Delta Vref=Vref1−Vref2.

When the first input voltage reference signal Vref1 is set at a first time, a first value of the digital output signal Do 3 is generated, such as Do 3(*t*1). When the second input voltage reference signal Vref2 is set at a second time, a second value of the digital output signal Do 3 is generated, such as Do 3(*t*2). The difference between these two digital output signals, Do 3(*t*1) and Do 3(*t*2), provides a digital output signal difference that corresponds to the resistance of the load 32. For example, Delta Do 3=Do 3(*t*1)=Do 3(*t*2).

By having the difference between the two input voltage reference signals, Delta Vref=Vref1−Vref2, as well as the difference between the two digital output signals, Delta Do 3=Do 3(*t*1)=Do 3(*t*2), which corresponds to the load current, the resistance of the load 32 may be calculated based on Ohm's law such that V=I×R. for example, the difference between the two input voltage reference signals divided by the difference between two digital output signals, which corresponds to the load current, generates a measurement corresponding to the resistance of the load 32.

Generally speaking, such a resistance sensing circuit as described herein is configured to perform impedance sensing while driving in input reference voltage signal Vref and generating a digital signal that includes information corresponding to the measured load current Imeasured. By appropriately interpreting the digital signal, the load resistance is determined based on Delta Vref/Delta Imeasured (the difference or Delta being the difference between the measurements made at two different times). In certain examples, note that the input reference voltage signal Vref is sinusoidal. However, generally speaking, the input reference voltage signal Vref may take any desired form (e.g., a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component). Also, note that a resistance sensing circuit is relatively simpler and cheaper to implement than an impedance sensing circuit (e.g., as described above with respect to other embodiments of sensing circuits).

Referring to embodiment 4002, this diagram is similar to the previous diagram with at least one difference being that a buffer is implemented in-line with respect to the line that connects from one of the inputs of the comparator that connect to the load 32 and that has the capacitor C connected thereto. As described above, such a buffer is implemented to facilitate isolation between the input of the comparator and the load 32 while still providing a signal representative of the load current signal $I_{load}$.

FIG. 41A is a schematic block diagram showing an embodiment 4101 of photodiode equivalent circuit in accordance with the present invention. A photodiode is a circuit that is configured to generate a current that is representative of the level of illumination incident on the photodiode. For example, the photodiode includes a photosensitive region that is configured to receive incident photons, and the photodiode is configured to generate an output current signal that is representative of those incident photons. Photodiodes have a wide variety of applications ranging from precision light meters to high-speed fiber-optic receivers, to ambient light detection, to interior room light detection, to any of a number of various applications. With respect to typical photodiodes, the short-circuit current generated thereby it is typically very linear over a particular range of light intensity. As such, photodiodes are often used to generate a measure of absolute light levels. However, with respect to certain photodiodes, because of them having a large temperature coefficient and being affected by temperature, the diode voltage of a photodiode is often not used as a measure of light intensity.

As can be seen in the diagram, the shunt resistance $R_{SH}(t)$ is typically in the range of approximately 1000 mega-Ohms at room temperature. With respect to some photodiodes, note that the shunt resistance $R_{SH}(t)$ may vary significantly across a much broader range, such as between 100 kilo-Ohms at 100 giga-Ohms. A typical characterization of photodiodes is that the shunt resistance $R_{SH}(t)$ decreases by a factor of two for every 10° C. rise in temperature. In addition, the diode capacitance $C_j$ is a function of the Junction area and the diode bias voltage. A typical value of the diode capacitance $C_j$ is approximately 50 pF at a 0 V bias for typical small area diodes.

The following table provides some typical values that may be seen with respect to the short-circuit current of the photodiode versus light intensity (e.g., when operating within a photovoltaic mode).

| Environment | Illumination (foot-candle/fc) | Short-circuit current |
|---|---|---|
| Direct sunlight | 1000 | 30 μA |
| Overcast day | 100 | 3 μA |
| Twilight | 1 | 0.3 μA |
| Full moonlit night | 0.1 | 3000 pA |
| Clear night/no moon | 0.001 | 30 pA |

FIGS. 41B and 41C are schematic block diagrams showing various embodiments 4102 and 4103, respectively, of photodiode sensor circuits in accordance with the present invention.

Referring to embodiment 4102, note this diagram also has certain similarities to other embodiments, diagrams, etc. herein (e.g., including FIG. 26A, which includes a load 32 instead of photodiode as depicted in this diagram) including an ADC that is configured to sense current. For example, this diagram includes a capacitor C connected to one of the input terminals of the comparator, the comparator provides a signal to the digital circuit 410, the digital circuit 410 is configured to generate digital signal Do 1, one or more processing modules 24 is configured to process the digital signal Do 1 to generate another digital signal Do 2 that is provided as an input to an N-bit DAC 420-1, the N-bit DAC 420-1 is configured to generate a feedback current signal that is provided to the single line that is connected to and/or coupled to the photodiode such that the single line connects to the input terminal of the comparator to which the capacitor C is connected. Also, as may be desired in certain applications, a decimation filter is configured to process the digital output signal Do 2 provided from the one or more processing modules 24 to generate another digital output signal Do 3 having a lower sample rate and a higher resolution. Similarly, as with respect to other embodiments, diagrams, etc. herein, the comparator and the digital circuit 410 may be alternatively implemented including using those alternative implementations described with respect to FIG. 5A. An input voltage reference signal Vref is provides to the other input terminal of the comparator.

Note that such a bipolar PNP BJT transistor provides a logarithmic voltage to current (V2I) conversion within the photodiode sensor circuit of this diagram. In addition, note that the digital output signal Do3 includes information that is representative of the logarithmic photodiode current. That is to say, anyone of the digital output signals Do 1, Do 2, or Do 3 would be representative of the logarithmic photodiode current. The logarithmic relationship is based on the properties and characteristics of the PNP BJT transistor. Note that an alternative implementations that would replace the PNP BJT transistor with a metal-oxide-semiconductor field-effect transistor (MOSFET) would not exhibit logarithmic characteristics, given the non-logarithmic response of a MOSFET.

Referring to embodiment 4103, this diagram is similar to the previous diagram with at least one difference being that a buffer is implemented in-line with respect to the line that connects from one of the inputs of the comparator that connect to the photodiode and that has the capacitor C connected thereto. As described above, such a buffer is implemented to facilitate isolation between the input of the comparator and the photodiode while still providing a signal representative of the photodiode current.

FIGS. 42A and 42B are schematic block diagrams showing various embodiments 4201 and 4202, respectively, of charge and/or capacitive change sensing circuits in accordance with the present invention.

Referring to embodiment 4201, note that the right-hand portion of this diagram is similar to FIG. 39A, that includes an impedance sensing circuit. Also, this diagram includes a capacitor C connected to one of the input terminals of the comparator, the comparator provides a signal to the digital circuit 410, the digital circuit 410 is configured to generate digital signal Do 1, one or more processing modules 24 is configured to process the digital signal Do 1 to generate another digital signal Do 2 that is provided as an input to an N-bit DAC 420, the N-bit DAC 420 is configured to generate a feedback current signal that is provided to the single line that is connected to and/or coupled to the load 32 such that the single line connects to the input terminal of the comparator to which the capacitor C is connected. Also, as may be desired in certain applications, a decimation filter is configured to process the digital output signal Do 2 provided from the one or more processing modules 24 to generate another digital output signal Do 3 having a lower sample rate and a higher resolution. Similarly, as with respect to other embodiments, diagrams, etc. herein, the comparator and the digital circuit 410 may be alternatively implemented including using those alternative implementations described with respect to FIG. 5A.

A signal generator is configured to provide an input voltage reference signal Vref to the other input terminal of the comparator. In addition, the input voltage reference signal Vref is provided to a quadrature generator. The quadrature generator is configured to generate a pair of quadrature sine and cosine signals based on the input voltage reference signal Vref. The pair of quadrature sine and cosine signals are provided to a demodulator that is configured to receive the digital output signal Do 3 from the decimation filter and to extract in-phase and quadrature (I and Q) signal components therefrom. The in-phase component I is generated within the demodulator and corresponds to the sine signal output from the quadrature generator multiplied by the digital output signal Do 3. The quadrature component Q is generated within the demodulator and corresponds to the cosine signal output from the quadrature generator multiplied by the digital output signal Do 3.

This diagram also operates similarly with respect to FIG. 39A such that, by extracting and generating the in-phase and quadrature (I and Q) signal components based on the digital output signal Do 3, both any real and any reactance components of the impedance of the load 32 may be determined. By having both the in-phase and quadrature (I and Q) signal components based on the digital output signal Do 3, the total impedance including the complex impedance of the load 32 may be determined. For example, the sine signal generated by the quadrature generator multiplied by the digital output signal Do 3 provides the in-phase component of the complex impedance of the load 32 corresponding to the real part of the complex impedance Z. The cosine signal generated by the quadrature generator multiplied by the digital output signal Do 3 provides the quadrature component of the complex impedance of the load 32 corresponding to the reactive/imaginary impedance component X of the complex impedance Z. Note that such charge and/or capacitive change (including complex impedance sensing capability so as to detect charge and/or change of capacitance) as presented within this diagram is configured to measure the impedance of the load 32 that may have any impedance characteristics including entirely real, entirely imaginary, or any combination thereof. Also note that the in-phase and quadrature (I and Q) signal components based on the digital output signal Do 3 correspond to the complex impedance Z of the load 32.

Generally speaking, such an charge and/or capacitive change sensing circuit as described herein is configured to perform impedance sensing while driving in input reference voltage signal Vref and generating a digital signal that includes information corresponding to the measured load current Imeasured. By appropriately interpreting the digital signal, the load impedance (e.g., charge and/or change of capacitance) is determined based on Vref/Imeasured. In certain examples, note that the input reference voltage signal Vref is sinusoidal. However, generally speaking, the input reference voltage signal Vref may take any desired form (e.g., a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component).

In addition, considering some differences between this diagram and that of FIG. 39A, on the left-hand side of the diagram, note that a charge amplifier for a capacitive sensor is shown. The equivalent circuit includes a voltage bias Vc in connected to parallel implemented capacitors C1 and Delta C, which is the change to C1. Note that the change in charge Delta Q is a function of the change in capacitance Delta C multiplied by the difference between the input voltage reference signal Vref and that the voltage bias Vc.

$$\text{Delta } Q = \text{Delta } C \times (V\text{ref} - Vc)$$

note that there are wide variety of devices this may operate based on high impedance charge output sensors. For example, high impedance transistors such as PAs electric sensors, hydrophones, and some accelerometers operate based on detecting a transfer of charge. Typical implementations of such charge transducers operate by detecting charge and/or capacitive change. The charge and/or capacitive change sensing circuit operates with much greater precision than any prior art such sensors given the fine resolution and broad range that may be achieved using such an architecture as described herein. The current measurement capabilities of such a charge and/or capacitive change sensing circuit operates far better than prior art sensors that seek to measure such parameters. With respect to the left-hand side of the diagram, note that the change in capacitance Delta C produces a change in charge Delta Q that is a function of the input voltage reference signal Vref and that the voltage bias Vc, as described by the equation above. The charge and/or capacitive change sensing circuit of this diagram is configured to measure the change of capacitance Delta C. Given that the voltage bias Vc and the input voltage reference signal Vref are known, then the change in charge Delta Q can be calculated as described above.

Note that measurements taken at two different times (e.g., t1 and t2) are performed to determine change of capacitance Delta C. For example, the first capacitance measurement C1 is made at a first time t1, and a second capacitance measurement C2 is made at a second time t2. The change of capacitance Delta C is the difference between these two capacitance measurements.

$$\text{Delta } C = C1 - C2$$

then, once the change of capacitance Delta C is known, and given that the voltage bias Vc and the input voltage reference signal Vref are known, then the change in charge Delta Q can be calculated as described above.

Referring to embodiment 4202, this diagram is similar to the previous diagram with at least one difference being that a buffer is implemented in-line with respect to the line that connects from one of the inputs of the comparator that connect to the circuitry on the left-hand side of the diagram (that includes C1 and Delta C) and that has the capacitor C connected thereto. As described above, such a buffer is implemented to facilitate isolation between the input of the comparator and the photodiode while still providing a signal representative of the current associated with the circuitry on the left-hand side of the diagram (that includes C1 and Delta C).

FIG. 43A is a schematic block diagram showing an embodiment 4301 of response of a thermistor that may be implemented within a temperature sensing circuit in accordance with the present invention. Referring to embodiment 4301, a thermistor is a temperature sensitive device such that the resistance varies as a function of temperature. Such resistance temperature devices can operate and provide great accuracy when detecting temperature. However, the efficacy of sensing temperature using a thermistor depends greatly upon the accuracy by which the impedance of the resistance temperature device can be measured. For example, using an ADC as described here in that is implemented to detect change in impedance, resistance, and/or any other electrical characteristic of a component, very high accuracy measurement of the resistance of the resistance temperature device may be made thereby providing a highly accurate temperature measurement.

Generally speaking, thermistors or low-cost temperature sensitive resistors and are constructed of solid conductor materials that exhibit a positive or negative temperature coefficient, such that the resistance of the device changes as a function of the temperature to which the thermistor is exposed. Generally, thermistors are most commonly implemented having a negative temperature coefficient such that the resistance of the device decreases as a function of increasing temperature. Also, a thermistor is generally a highly nonlinear device such that the resistance of the device does not change when nearly as a function of change in temperature.

The right-hand side of the diagram shows the resistance characteristics of a 10 kilo-Ohm negative temperature coefficient thermistor. The diagram shows the thermistor resistance and kilo-Ohms along the vertical axis as a function of temperature in degrees Celsius. Note that different thermistors may have different resistance characteristics as a function of change in temperature, and this is one example of one type of thermistor. The thermistor has a nominal value of approximately 10 kilo-Ohms at 25° C. By having an accurate mapping of the resistance characteristics of the thermistor, then by measuring the resistance of the device, the temperature to which the thermistors expose may be determined (e.g., such as using the graph on the right hand side of the diagram that describes the resistance characteristics of the thermistor).

FIGS. 43B, 43C, 43D, and 43E are schematic block diagrams showing various embodiments 4302, 4303, 4304, and 4305, respectively, of temperature sensing circuits operative with a thermistor in accordance with the present invention.

Referring to embodiment 4302, note this diagram also has certain similarities to other embodiments, diagrams, etc. herein including an ADC that is configured to sense current. For example, this diagram includes a capacitor C connected to one of the input terminals of the comparator, the comparator provides a signal to the digital circuit 410, the digital circuit 410 is configured to generate digital signal Do 1, one or more processing modules 24 is configured to process the digital signal Do 1 to generate another digital signal Do 2 that is provided as an input to an N-bit DAC 420, the N-bit DAC 420 is configured to generate a feedback current signal that is provided to the single line that is connected to and/or coupled to the thermistor such that the single line connects to the input terminal of the comparator to which the capacitor C is connected. Also, as may be desired in certain applications, a decimation filter is configured to process the digital output signal Do 2 provided from the one or more processing modules 24 to generate another digital output signal Do 3 having a lower sample rate and a higher resolution. Similarly, as with respect to other embodiments, diagrams, etc. herein, the comparator and the digital circuit 410 may be alternatively implemented including using those alternative implementations described with respect to FIG. 5A. An input voltage reference signal Vref is provides to the other input terminal of the comparator. By having a highly accurate measurement of the current flowing in the thermistor, the impedance of the thermistor may be determined. For example, by detecting the current flowing in the thermistor and by knowing the input voltage reference signal Vref, and by detecting the other voltage going into the other input of the comparator Vin, the resistance of the thermistor may be determined. In addition, any of the other implementations described herein that are operative to In this diagram, compared to certain other embodiments included herein, the load 32 is replaced with a thermistor. In this diagram, a nonlinear mapping module is configured to process the digital output signal Do 3 to deal with the non-linear mapping of the resistance characteristics of the thermistor, such as with respect to a graph of a thermistor as shown on the right-hand side of the previous diagram such that the resistance characteristics of the thermistor very non-linearly as a function of temperature. In certain examples, the resistance characteristics of the thermistor as a function of temperature may be stored in a lookup table (LUT), and once the resistance of the thermistor is determined, the corresponding temperature may be looked up within the LUT and determined.

Note that such a nonlinear mapping module may be implemented using one or more processing modules, such as the one or more processing modules 24 as may be desired in certain embodiments. Alternatively, the nonlinear mapping module may be implemented using another one or more processing modules. The nonlinear mapping module is configured to interpret the digital output signal Do 3 to extract the temperature related information regarding the thermistor and to generate the digital output signal Do 4. The nonlinear mopping module is configured to perform the nonlinear conversion, which is similar to a logarithmic converter operation as described herein, to make the temperature reading of the thermistor linear, such that the digital output signal Do 4 corresponds to a linearized response of resistance of the thermistor as a function of temperature.

Referring to embodiment 4303, this diagram is similar to the previous diagram with at least one difference being that a buffer is implemented in-line with respect to the line that connects from one of the inputs of the comparator that connect to the thermistor and that has the capacitor C connected thereto. As described above, such a buffer is implemented to facilitate isolation between the input of the comparator and the thermistor while still providing a signal representative of the current associated with the thermistor.

Figure 43B:
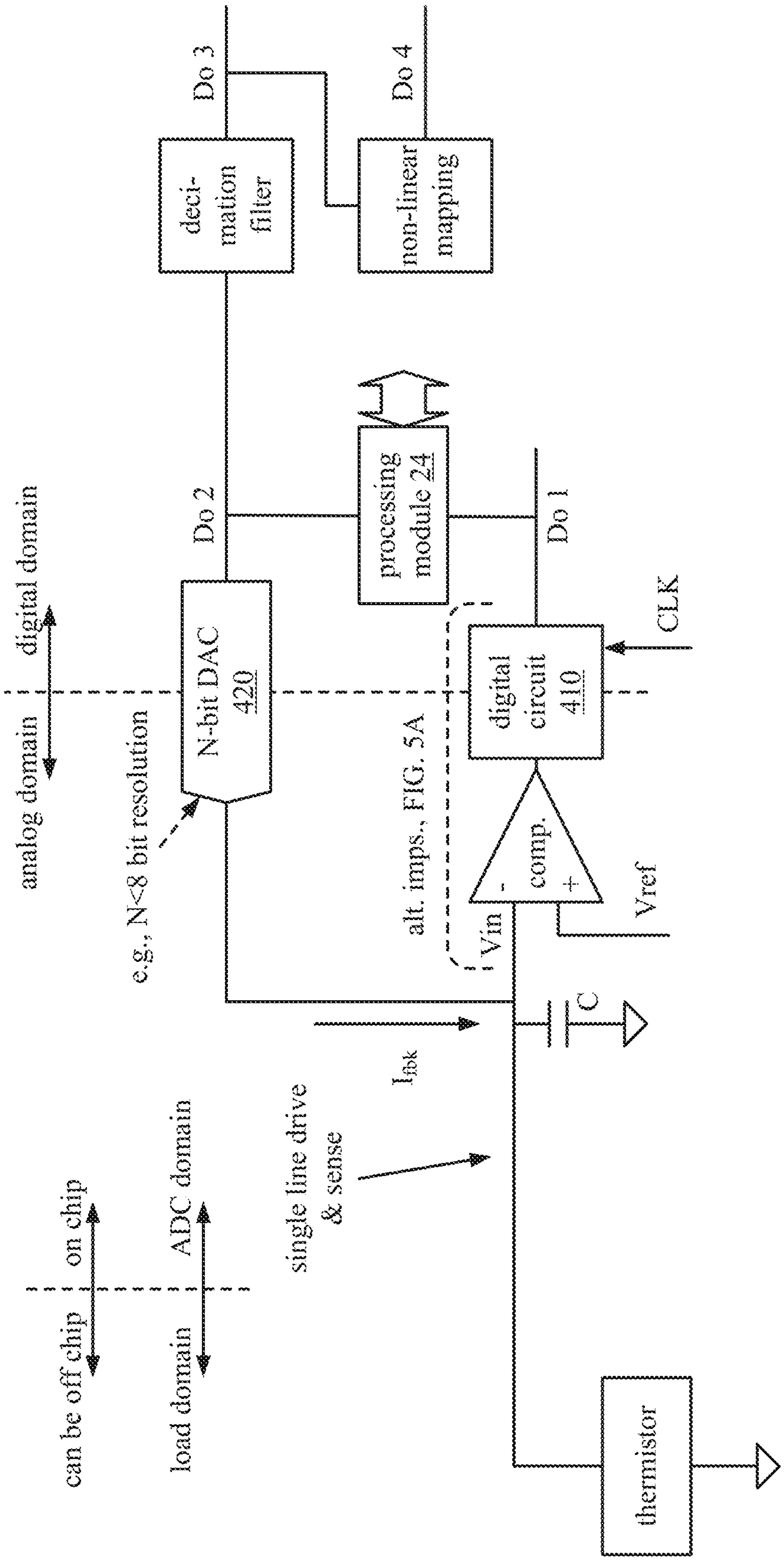
Figure 43C:
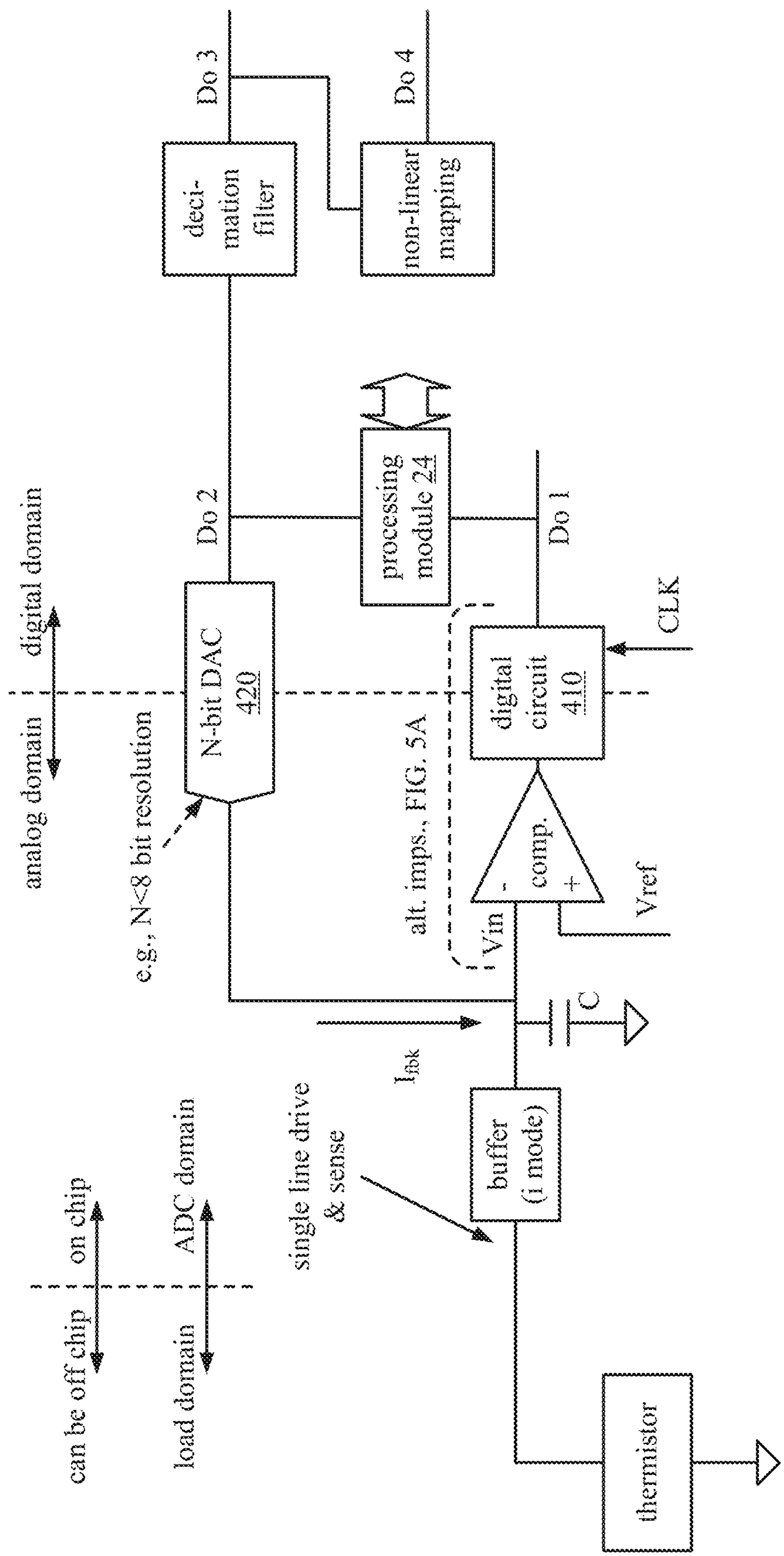
Figure 43D:
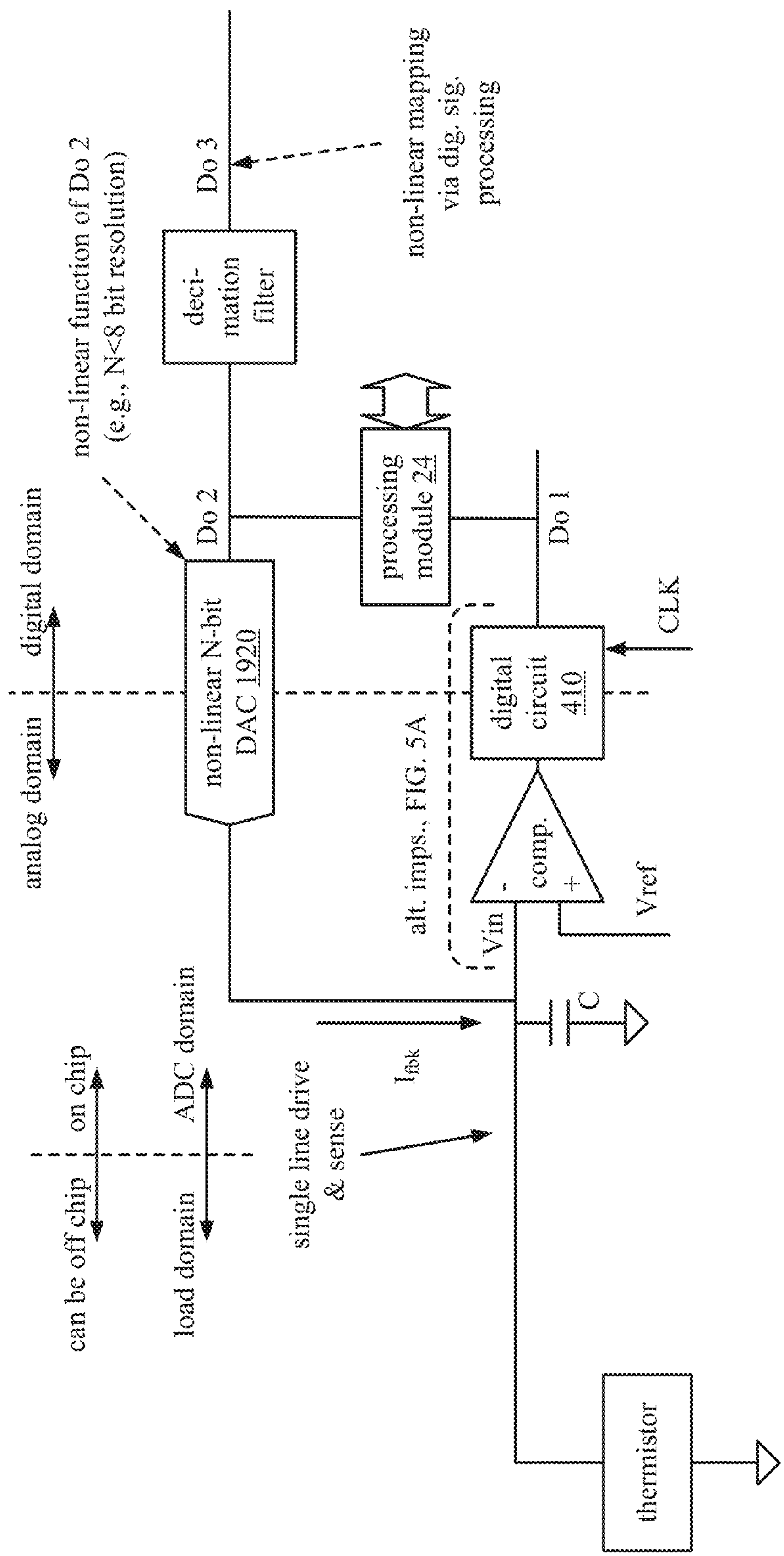
Figure 43E:
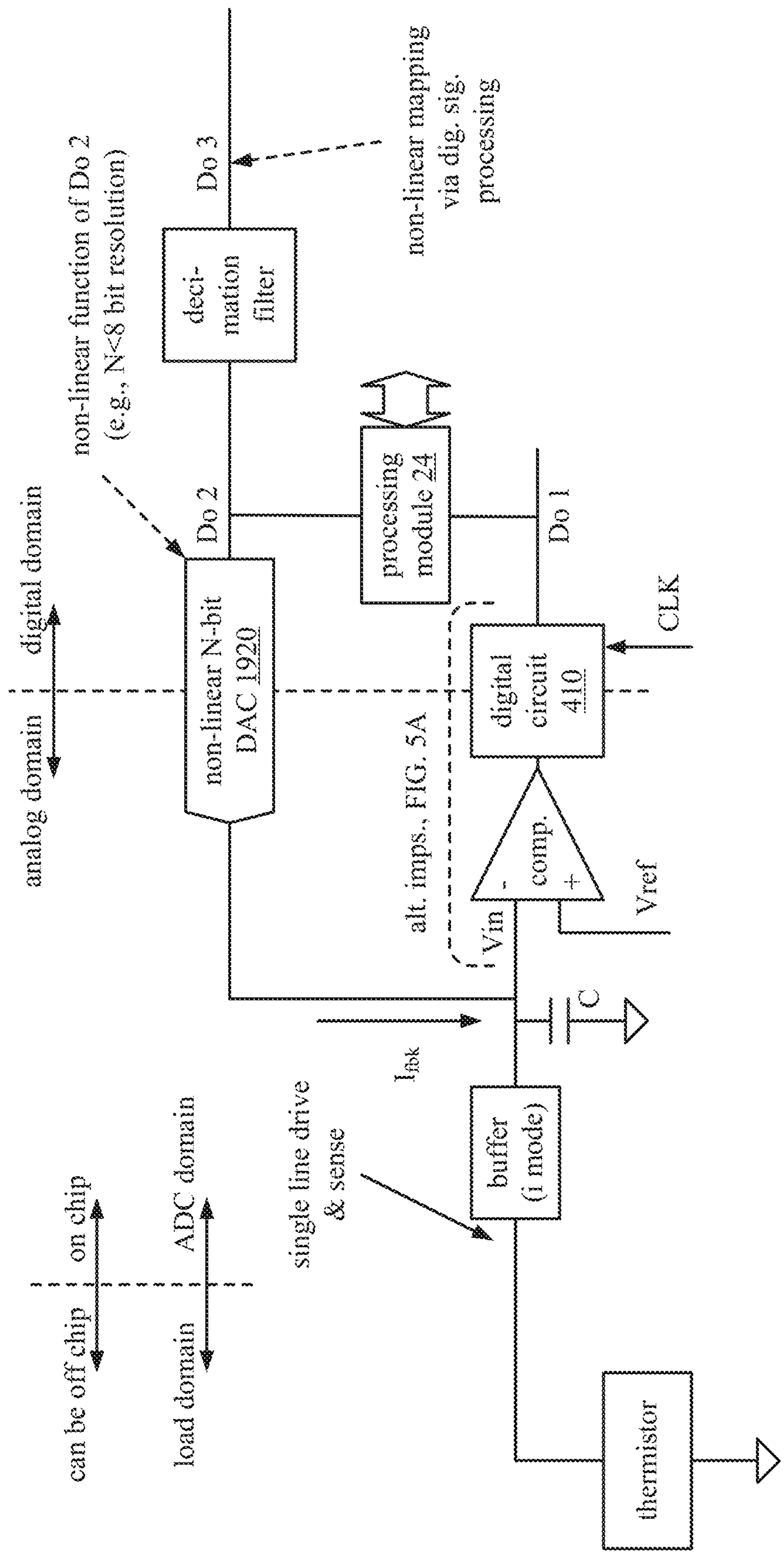

Referring to embodiment 4304, this diagram is similar to FIG. 43B with at least one difference being that the N-bit DAC 420 is replaced with a non-linear N-bit DAC 1920 that is implemented to generate the current that is output to a thermistor that matches or tracks the current of the thermistor. Generally speaking, with respect to such non-linear N-bit DACs, such as the non-linear N-bit DAC 1920, the output current provided there from is a non-linear function of the Do 2. Therefore, the Do 2 itself is also an inverse function of the load current, given that the output current from the non-linear N-bit DAC 1920 is operative to match or track the current of the load (e.g., being equal and opposite of the current of the load thereby minimizing the error signal that is based on the difference between Vref and Vin).

In certain examples, using such a non-linear N-bit DAC 1920 instead of the N-bit DAC 420, the nonlinear mapping that is needed to compensate for the nonlinear response of the thermistor is performed by the non-linear N-bit DAC 1920 itself. As may be needed in certain implementations in which the non-linear N-bit DAC 1920 does not fully address the nonlinear mapping of the thermistor, subsequent digital signal processing may be performed on the digital signal Do 3 to generate a linearized response of resistance of the thermistor as a function of temperature. Alternatively, consider an alternative embodiment in which the N-bit DAC 420 is still implemented instead of the non-linear N-bit DAC 1920, such subsequent digital signal processing may perform all needed processing on the digital signal Do 3 to generate a linearized response of resistance of the thermistor as a function of temperature.

Referring to embodiment 4305, this diagram is similar to the previous diagram with at least one difference being that a buffer is implemented in-line with respect to the line that connects from one of the inputs of the comparator that connect to the thermistor and that has the capacitor C connected thereto. As described above, such a buffer is implemented to facilitate isolation between the input of the comparator and the thermistor while still providing a signal representative of the current associated with the thermistor.

FIGS. 44A, 44B, and 44C are schematic block diagrams showing various embodiments 4401, 4402, and 4403, respectively, of high accuracy resistance sensing circuits in accordance with the present invention.

Note that alternative prior art means to measure resistance with a high degree of accuracy may be implemented in certain ways such as using a Wheatstone bridge. The Wheatstone bridge has been around for nearly 200 years and is still used as one of the most accurate resistance measurement techniques known in the prior art based on ratio metric measurement that is independent of temperature and voltage tolerance.

Referring to embodiment 4401, the left-hand side of the diagram shows a typical for resistor Wheatstone bridge, such that four resistors R1 R2 R3 and R4 are connected as shown, and when a voltage VB is applied to the junction between resistors R3 and R4, and resistors R1 and R2 are connected at a junction that is grounded, then the voltage VO between a first junction between resistors R1 and R4 and a second junction between resistors R3 and R2 is measured.

If the values of the four resistors R1 R2 R3 and R4 are such that the ratios of the resistances of the resistors R1 and R4 is the same as the ratios of the resistances of the resistors R3 and R4, then the voltage VO is zero.

$$VO=0 \text{ if } R1/R4=R2/R3$$

However, if the ratios of the resistances of the resistors R1 and R4 are not the same as the ratios of the resistances of the resistors R3 and R4, then the voltage VO is as follows:

$$VO=[(R1)/(R1+R4)]\times VB-[(R2)/(R2+R3)]\times VB$$

$$VO=[(R2/R4)-(R2/R3)]/[(1+(R1/R4))\times(1+(R2/R3))]\times VB$$

Referring also to embodiment 4401, the right-hand side of the diagram shows an alternative circuit that is operative to perform high accuracy resistance sensing using only two resistors as opposed to four that are required in a Wheatstone bridge.

Note this diagram also has certain similarities to other embodiments, diagrams, etc. herein including an ADC that is configured to sense current. In this diagram, two resistors R1 and R2 are respectively coupled to the two respective input terminals of the comparator. In addition, capacitor C is connected between the two respective input terminals of the comparator. In alternative implementations, two respective single-ended capacitors, C, are respectively connected to the differential signal lines and to ground instead of the capacitor, C, connected to the differential lead lines (e.g., a first single ended capacitor, C, connected to one of the differential signal lines and to ground, and a second single ended capacitor, C, also connected to the other of the differential signal lines and to ground).

The comparator provides a signal to the digital circuit 410, the digital circuit 410 is configured to generate digital signal Do 1. An N-bit accumulator 3610 (shown as N-bit ACC 3610 and the diagram) is implemented to process the digital output signal from the digital circuit 410 (or alternative one or more components that generates the digital output signal generated by those one or more components) to generate another digital signal Do 1. Similarly, as with respect to other embodiments, diagrams, etc. herein, the comparator and the digital circuit 410 may be alternatively implemented including using those alternative implementations described with respect to FIG. 5A.

For example, the N-bit accumulator 3610 is configured to convert the digital output signal output from the N-bit accumulator 3610 to a digital output signal Do 1 having a certain number of bits. In some examples, this operation involves converting a digital output signal that includes one bit every clock signal of the clocking signal that is provided to the digital circuit 410 to an N-bit signal that includes N-bits every clock signal. In one specific example, this operation involves conversion of a one-bit digital signal to a 7-bit signal or an 8-bit signal. Generally speaking, the N-bit accumulator 3610 may be configured in various alternative implementations to generate an N-bit signal having any desired number of bits, such that N is a positive integer greater than or equal to 2.

Note also that a decimation filter may be implemented to process the digital output digital Do 1 from the N-bit accumulator 3610 as well. For example, the decimation filter is configured to process the digital output digital Do 1 provided from the N-bit accumulator 3610 to generate another digital output signal Do 2 having a lower sample rate and a higher resolution.

In addition, the digital output digital Do 1 that is generated by the N-bit accumulator 3610 is provided to a thermometer decoder 3612. The thermometer decoder 3612 is configured to generate an output symbol that includes a sequence of 0s followed by a sequence of Is in most instances, or alternatively all 0s or all Is. For example, with respect to a thermometer code, there cannot be any 0s in between two 1s. Generally speaking, with respect to a thermometer code, an input value representing a particular number (e.g., 3=011 binary) generates an output value such that the lowermost bits are all of value 1, and the other uppermost bits are all of value 0. Generally speaking, for an n-bit binary code, the corresponding thermometer code will have output symbols of $2^n-1$ bits each. As such, as many bits are then needed to represent the thermometer code (n=3, 8 output symbols of 7 bits each of the thermometer code).

A differential N-bit DAC 1120, wherein N is a positive integer is configured to process the output signal from the thermometer decoder 3612 to generate two current signals I1 and I2 that are provided via lines that connect respectively to the resistors R1 and R2 to keep the two input voltages V at the two terminals of the comparator the same. That is to say, the differential N-bit DAC 1120 is configured to regulate I1 and I2 to keep the two input voltages V at the two terminals of the comparator the same. The N-bit DAC 420 is operative to generate a differential output current signal that is provided based on the output signal from the thermometer decoder 3612.

The use of a current node ADC as described herein for high accuracy resistance measurement is much improved over that which exists in the prior art. For example, such a high accuracy resistance sensing circuit operates with very low ADC power consumption. Also, high accuracy resistance measurement may be achieved using only two resistor elements as opposed to four resistor elements as implemented within a Wheatstone bridge. This can result in significant reduction in cost and also a reduction in mismatched errors between the respective resistive elements. Having a smaller number of elements is operative to enhance the accuracy of Delta R/R measurements. The mathematical their patient to show ratio metric measurements is provided below.

$$I_1 + I_2 = I_{REF}$$

$$\frac{V}{R1} + \frac{V}{R2} = I_{REF} \Rightarrow V = \frac{R1 \cdot R2}{R1 + R2} I_{REF}$$

$$I_1 = \frac{R2}{R1 + R2} I_{REF}$$

$$I_2 = \frac{R1}{R1 + R2} I_{REF}$$

$$\Delta I = I_2 - I_1 = I_{REF} \frac{R1 - R2}{R1 + R2} = I_{REF} \frac{\Delta R}{R1 + R2} \Rightarrow \frac{\Delta I}{I_{REF}} = \frac{\Delta R}{R1 + R2}$$

Compare this novel high accuracy resistance sensing circuit to various implementations of a first implementation of Wheatstone bridge in which:

$$R1=R3=R$$

$$R4=R2=R+\Delta R$$

Then, within this high accuracy resistance sensing circuit, such a measurement is alternatively made as follows:

For R1=R & R2=R+ΔR, then $$\frac{\Delta I}{I_{REF}} = \frac{1}{2} \frac{\Delta R}{R + \frac{\Delta R}{2}}$$

As can be seen, such a high accuracy resistance measurement circuit may be implemented using only two resistors as opposed to four that required a Wheatstone bridge.

Alternatively, compare this novel high accuracy resistance sensing circuit to various implementations of a second implementation of Wheatstone bridge in which:

$$R4=R1=R$$

$$R3=R-\Delta R \;\&\; R2=R+\Delta R$$

Then, within this high accuracy resistance sensing circuit, such a measurement is alternatively made as follows:

For $R1=R-\Delta R$ & $R2=R+\Delta R$, then $$\frac{\Delta I}{I_{REF}} = \frac{1}{2} \frac{\Delta R}{R}$$

Note that the digital output signal Do 2 includes information that may be interpreted to determine the change in current ΔI such that the change in resistance ΔR may subsequently be determined.

Referring to embodiment 4402, this diagram is similar to the previous two diagrams with at least one difference being that this diagram includes two respective buffers implemented in-line via the lines that connect from the output of the differential N-bit DAC 1120 to the two respective inputs of the comparator. For example, comparing this diagram to the previous diagram, the two respective buffers are implemented to provide isolation between the two respective inputs of the comparator and the differential N-bit DAC 1120.

Referring to embodiment 4403, this diagram is similar to the previous two diagrams showing a conceptual representation of a current node ADC. Consider a current source that provides the current signal:

$$I_1+I_2=I_{REF}$$

This current signal is split to provide the two current signals I1 and I2 that are operative to keep the two input voltages V1 and V2 at the input terminals of comparator the same. Note that the two respective buffers may also be implemented as desired in certain examples.

FIG. 45A is a schematic block diagram showing an embodiment 4501 of a photo-diode that is operative with an ADC in accordance with the present invention. On the left-hand side of the diagram, a photo-diode is shown as operating to generate a photo-diode current based on incident photons coming into contact with the active portion of the photo-diode. Generally speaking, the photo-diode is a semiconductor device with a P-N junction that is operative to convert incident photons into an electrical current, namely, a photo-diode current. Similar to other types of semiconductor devices, the P layer includes holes, and the N layer includes electrons. Generally speaking, the P layer corresponds to the positive portion of the substrate, and the N layer corresponds to the negative portion of the substrate. Note that photo-diodes may be built based on a number of different types of materials including silicon, gallium arsenide, indium gallium arsenide, germanium, and other materials. Depending on the material used, the particular characteristics of the active region of the photo-diode, its dimensions, etc., the photo-diode will respond to incident photons in a particular way. For example, some photo-diodes are designed to respond to a broad spectrum of visible light, others are more finely tuned to particular wavelengths of the visible spectrum, etc.

Generally speaking, diffusion of holes and electrons occurs in response to an based on the incident electrons within the depletion region of the photo-diode, which corresponds to the region between N layer and the P layer within the photo-diode. For example, based on a photon coming into contact with the depletion region, and electrons-hole pair is created. Photons absorbed in the depletion region, or sufficiently close to it, create electron-hole pairs that move to the opposite ends due to the electric field existent within the photo-diode between the anode and cathode.

From certain perspectives, the depletion region may be viewed as creating a capacitance within the photo-diode, and the different layers of the substrate of the photo-diode, the P type substrate, and the N type substrate, may be viewed as operating as the parallel plates of a capacitor within the photo-diode. Note that photo-diodes may be implemented in a variety of ways, and sometimes a reverse bias voltage is applied to the photo-diode so as to affect the capacitance of the depletion region. Also, note that a photo-diode may sometimes generate a dark current within the photo-diode even when there is no incident light. For example, a photo-diode current generated within the photo-diode even in the absence of light is referred to as dark current. This dark current can be a source of noise within a photo-diode system. However, note that photo-diodes may be operated without any voltage bias as well. For example, without any added voltage across the depletion region, any dark current within photo-diode will typically be very small or even close to zero thereby reducing the overall noise within the photo-diode system. Note also with respect to the pictorial illustration of a photo-diode, the photo-diode current actually moves in the opposite direction of the diode illustrated within the photo-diode. That is to say, based on incident photons coming in contact with the active portion of the photo-diode, current will flow towards the photo-diode, which is opposite to the direction of the diode illustrated within the photo-diode.

Generally speaking, note that photo-diode current may be positive or negative, depending on what particularly is happening with the photo-diode. As a photo-diode is receiving incident photons, it will draw current, but as a photo-diode is not receiving incident photons, and a dark current may be generated within the photo-diode, it will source current. Also, generally speaking, considering incident photons coming into contact with the photo-diode that are time-varying intensity, the overall photo-diode current may have a DC offset and an AC component as well, such that the magnitude of the photo-diode current is varying as a function of time. Considering such an implementation, consider that the photo-diode current undergoes some low pass filtering so as to remove the DC component, the remaining AC component will then include both positive and negative components such that the remaining AC component will have no DC offset and be positive but sometimes a negative at others based on a time-varying light intensity.

FIG. 45B is a schematic block diagram showing an embodiment 4502 of a pixel array of a photo-diode image sensor that is operative with an ADC in accordance with the present invention. In this diagram, a pixel array is composed of a number of photo-diodes. In one implementation, consider that each respective square of the pixel array corresponds to one photo-diode. In another implementation, consider that each respective square of the pixel array includes three photo-diodes (e.g., RGB such as one for red, one for green, and one for blue), so that each respective square of the pixel array is operative to detect red, green, or blue light therein.

Regardless of the particular implementation of the pixel array, whether each particular square includes one photo-diode, or multiple photo-diodes, consider an example in which one particular square of the pixel array including a photo-diode, an analog signal provided from the photo-diode, a photo-diode current, is generated based on incident photons on that photo-diode and that analog signal is detected by and analog to digital converter (ADC) that is operative to generate a digital signal that is output to one or more desired recipients, such as a circuit board, a digital signal processor (DSP), another device that is operative to process the digital signal, etc. Note also that the digital control may be provided as input to the pixel array. Based on which particular squares within the pixel array detect incident photons, and consider that respective ADCs are in communication with those respective photo-diodes, at a particular time, the photons that are incident on the respective photo-diodes within the pixel array will correspond to an image detected by the pixel red at that time. Note that such image sensors that include pixel arrays composed of photo-diodes may be implemented in a variety of different ways, and this diagram illustrates the interaction between one particular photo-diode and an ADC that is operative to generate a digital signal based on the photo-diode current, the analog signal, associated with that particular photo-diode.

FIGS. 44D, 44E, 44F, 44G, 44H, 44I, and 44J are schematic block diagrams showing various other embodiments 4404, 4405, 4406, 4407, 4408, 4409, and 4410, respectively, of high accuracy resistance sensing circuits in accordance with the present invention.

The following three diagrams are similar to the previous three diagrams with at least one difference being that the two resistors R1 and R2 that are coupled to the respective inputs of the comparator or operational amplifier are removed, and a Wheatstone bridge is implemented instead such that the notes corresponding to the output voltage of the Wheatstone bridge are instead coupled to the respective inputs of the comparator or operational amplifier.

Referring to embodiment 4404 of FIG. 44D, this diagram is similar to embodiment 4401 of FIG. 44A yet includes two nodes of a Wheatstone bridge coupled to the respective inputs of the comparator operational amplifier instead of the two resistors are one or two that are shown in FIG. 44A. Again, such a Wheatstone bridge may be implemented in a variety of ways. In one example, shown on the upper left-hand side of the diagram, three of the resistors within such a Wheatstone bridge may all have the same resistance value, R, and the fourth resistor includes a value R+Delta R (or R+ΔR). Such an implementation is sometimes referred to as a single-element varying Wheatstone bridge. In this implementation, the output voltage of the Wheatstone bridge, VO, is a function of the input voltage of the Wheatstone bridge, VB, as follows:

$$VO=(VB/4)\times[\Delta R/(R+\Delta R/2)]$$

In an alternative example, shown on the lower left-hand side of the diagram, the resistors of an all-element varying Wheatstone bridge are such that that two of the resistors include a value of R+Delta R (or R+ΔR), and the other two resistors include a value of R−Delta R (or R−ΔR). In this implementation, the output voltage of the Wheatstone bridge, VO, is a function of the input voltage of the Wheatstone bridge, VB, as follows:

$$VO=VB\times[\Delta R/(R+\Delta R/2]$$

In another alternative example, the resistors of an all-element varying Wheatstone bridge located opposite one another include the same values, such that two of the resistors include a value of R, and the other two resistors include a value of R+Delta R (or R+ΔR). This implementations is sometimes referred to as a two-element varying Wheatstone bridge. In this implementation, the output voltage of the Wheatstone bridge, VO, is a function of the input voltage of the Wheatstone bridge, VB, as follows:

$$VO=(VB/2)\times[\Delta R/(R+\Delta R/2)]$$

Note that yet another an alternative implementation of an all-element varying Wheatstone bridge may similarly be implemented, such as that the two resistors on the left-hand side that connect at one of the output nodes of the output voltage, VO, are of the same value, R, yet the two resistors on the right-hand side that connect at the other one of the output nodes of the output voltage, VO, or of different values (e.g., consider the top right-hand resistor of the Wheatstone bridge having a value of R−ΔR, and the lower right-hand resistor of the Wheatstone bridge having a value of R+ΔR). In this implementation, the output voltage of the Wheatstone bridge, VO, is a function of the input voltage of the Wheatstone bridge, VB, as follows:

$$VO=(VB/2)\times[\Delta R/R]$$

Generally speaking, note that a Wheatstone bridge may be implemented in a variety of different ways (e.g., including an alternative implementation in which all four of the resistors of the Wheatstone bridge include different values R1 R2 R3 and R4), and any such implementations may be used in conjunction with such a high accuracy resistance measuring circuit as described herein.

Figure 44E:
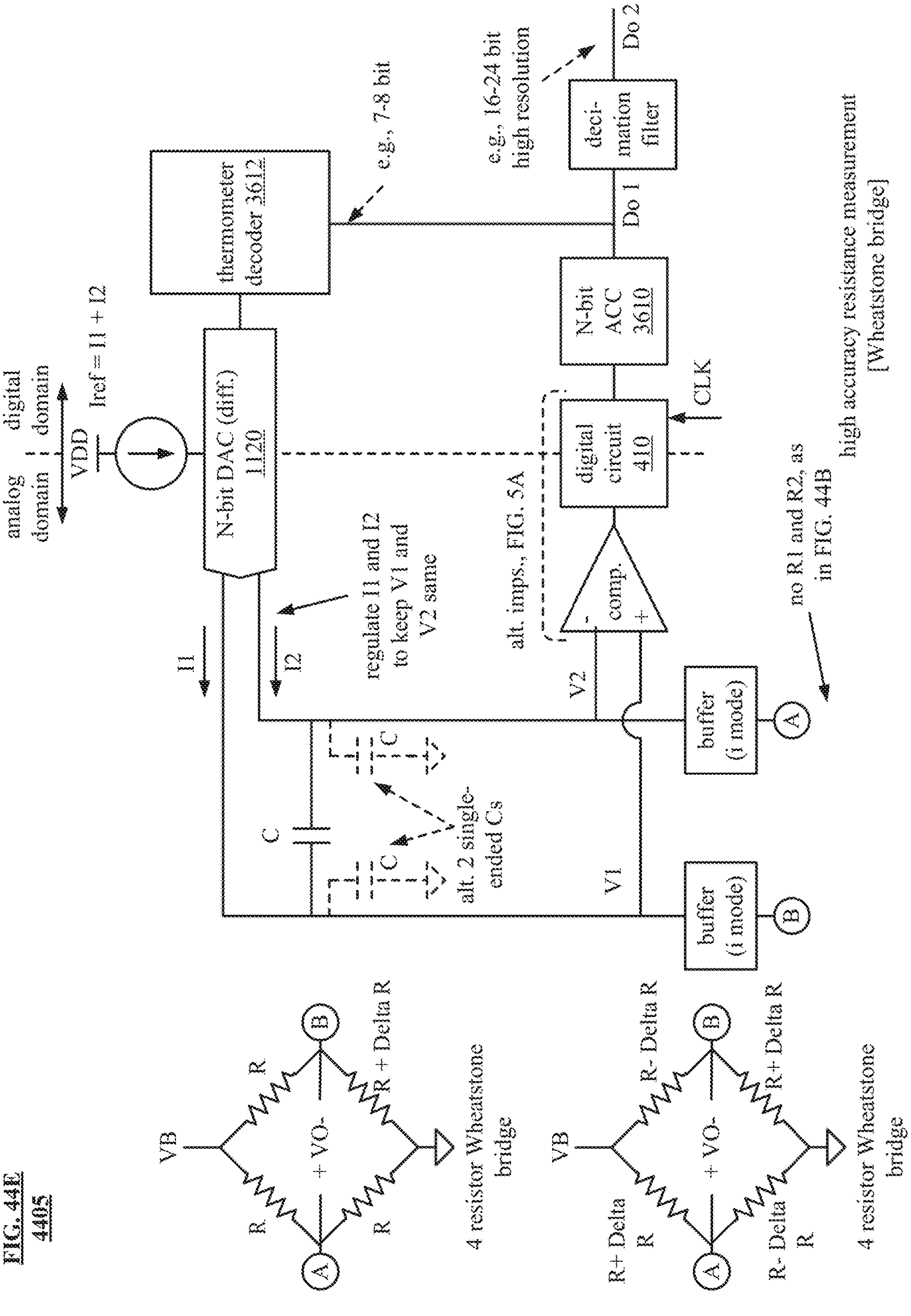

Referring to embodiment 4405 of FIG. 44E, this diagram is similar to embodiment 4402 of FIG. 44B yet includes two nodes of a Wheatstone bridge coupled to the respective inputs of the comparator or operational amplifier (e.g., as shown by the letters A and B, respectively) instead of the two resistors R1 and R1 that are shown in FIG. 44B.

Figure 44F:
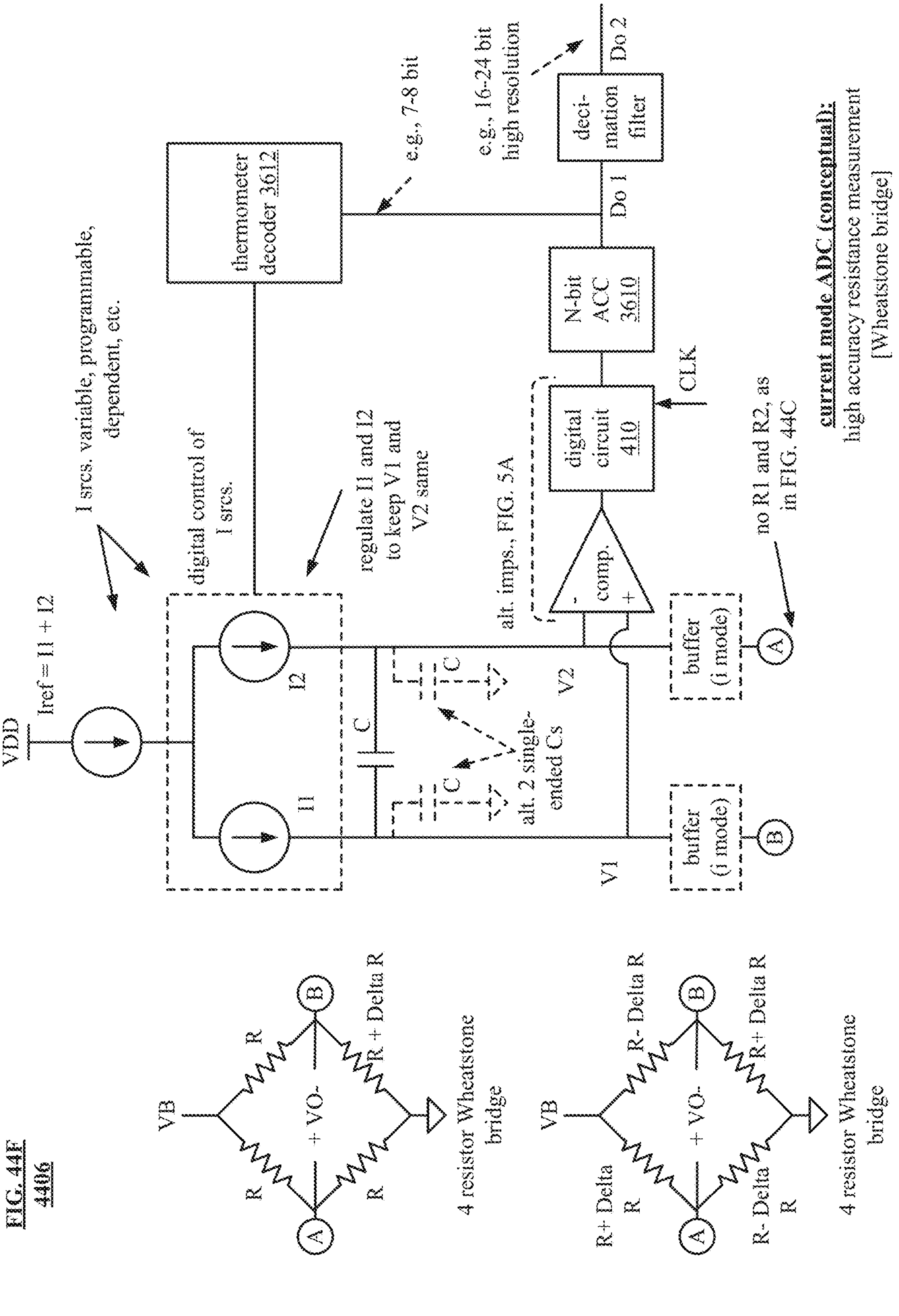

Referring to embodiment 4406 of FIG. 44F, this diagram is similar to embodiment 4403 of FIG. 44C yet includes two nodes of a Wheatstone bridge coupled to the respective inputs of the comparator or operational amplifier (e.g., as shown by the letters A and B, respectively) instead of the two resistors R1 and R1 that are shown in FIG. 44C.

Figure 44G:
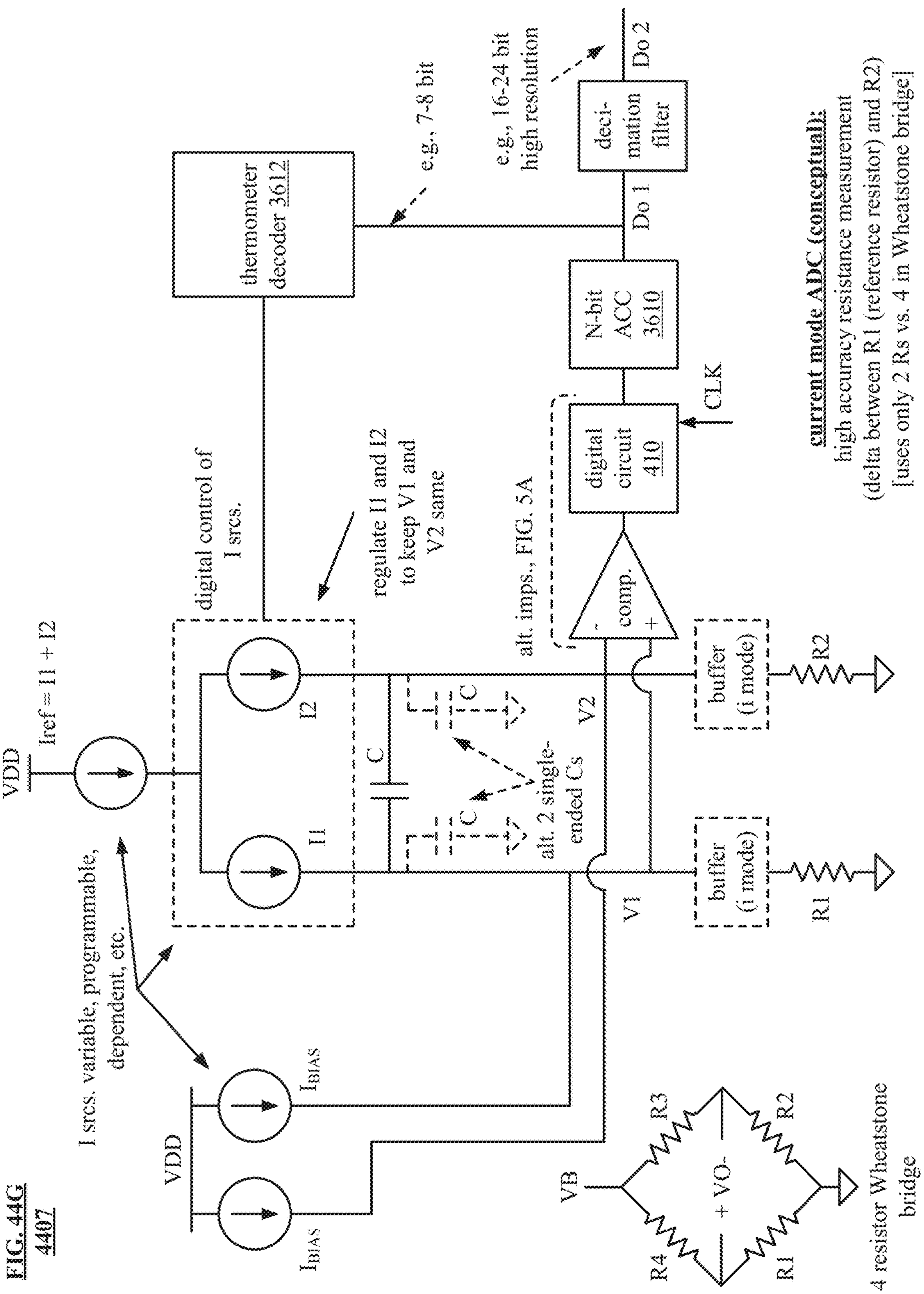

Referring to embodiment 4407 of FIG. 44G, this diagram is similar to embodiment 4403 of FIG. 44C yet it also includes two bias current sources that are coupled to the respective inputs of the comparator or operational amplifier (e.g., the nodes that are respectively coupled to the upper terminals of the resistors R1 and R2 that are shunted to ground. With respect to such a high accuracy resistance sensing circuit, note that the noise floor is currently at its lowest in large part because of the contribution of two transistors and a digital circuit or analog to digital converter (ADC) that is configured to form digital sampling of the comparator or operational amplifier output signal. Note also that the signal sensitivity of such a high accuracy resistance sensing circuit is increased by increasing the signal amplitude by leaving the noise floor the same. For example, consider this two resistor implementation, by applying two substantially equal or identical current bias current signals from the two respective bias current sources, such that each outputs a bias current signal having a value of Isms, then the signal amplitude is increased while leaving the noise for the same.

In such a situation, the signal output from the comparator or operational amplifier (as well as all of the digital signals that are generated directly or based on the output signal from the comparator operational level for, such as the digital signal output from the digital circuit 410, the digital signal Do 1 output from the N-bit ACC 3610, or the digital signal Do 2 output from the decimation filter) will correspond to a ratio metric current measurement that is based on a Delta current (or Delta I, or ΔI) measurement and the reference current, Iref, provided by the current source at the top of the diagram. Consider that the Delta current (or Delta I, or ΔI) measurement corresponds to the difference between the respective current signals I1 and I2 output from the first and second current sources.

For example, considering such a two resistor implementation as shown in this diagram, consider that the resistor values are as follows:

$$R1=R$$

$$R2=R+\Delta R$$

In such a case, the ratio metric current measurement is as follows:

$$\Delta I/\mathrm{Iref}=\tfrac{1}{2}\times[1+I_{BIAS}/I_{ref}]\times[\Delta R/(R+\Delta R/2)]$$

As can be seen, a gain factor of $[1+I_{BIAS}/I_{ref}]$ is applied to the ratio metric resistance measurement of $[\Delta R/(R+\Delta R/2)]$. This improves performance by increasing the sensitivity of the ratio metric resistance measurement. For example, the signal is increased with minimal increase in noise. This significantly improves the signal to noise ratio (SNR) of the high accuracy resistance sensing circuit. For example, consider that this gain factor of $[1+I_{BIAS}/I_{ref}]$ is some value greater than one, and it is multiplied by the ratio metric resistance measurement. In operation, the two bias current sources operate cooperatively to source current such that any noise introduced by them is largely canceled out, and this allows the signal magnitude to gain by this gain factor. Generally speaking, the signal magnitude is increased with minimal increase in the noise thereby significantly improving the SNR of the high accuracy resistance sensing circuit.

In another example, considering such a two resistor implementation as shown in this diagram, consider that the resistor values are as follows:

$$R1=R-\Delta R$$

$$R2=R+\Delta R$$

In such a case, the ratio metric current measurement is as follows:

$$\Delta I/\mathrm{Iref}=[1+I_{BIAS}/I_{ref}]\times[\Delta R/R]$$

As can be seen, a gain factor of $[1+I_{BIAS}/I_{ref}]$ is applied to the ratio metric resistance measurement of [ΔR/R]. Again, by using two identical or substantially identical bias current sources to provide bias current signals of Isms, the sensitivity of the measurement is increased. The signal magnitude is increased with minimal increase in the noise. This significantly improves the SNR of the high accuracy resistance sensing circuit.

Note also that any current source will inherently add some noise, and the bias current sources will introduce some noise, but the amount by which they increase the signal magnitude is much larger than the noise that they do introduce. Even though some noise is added by these bias current sources, that amount of noise is relatively small in comparison to the signal gain that they provide to facilitate even improved sensitivity including improved SNR within the high accuracy resistance sensing circuit.

Figure 44H:
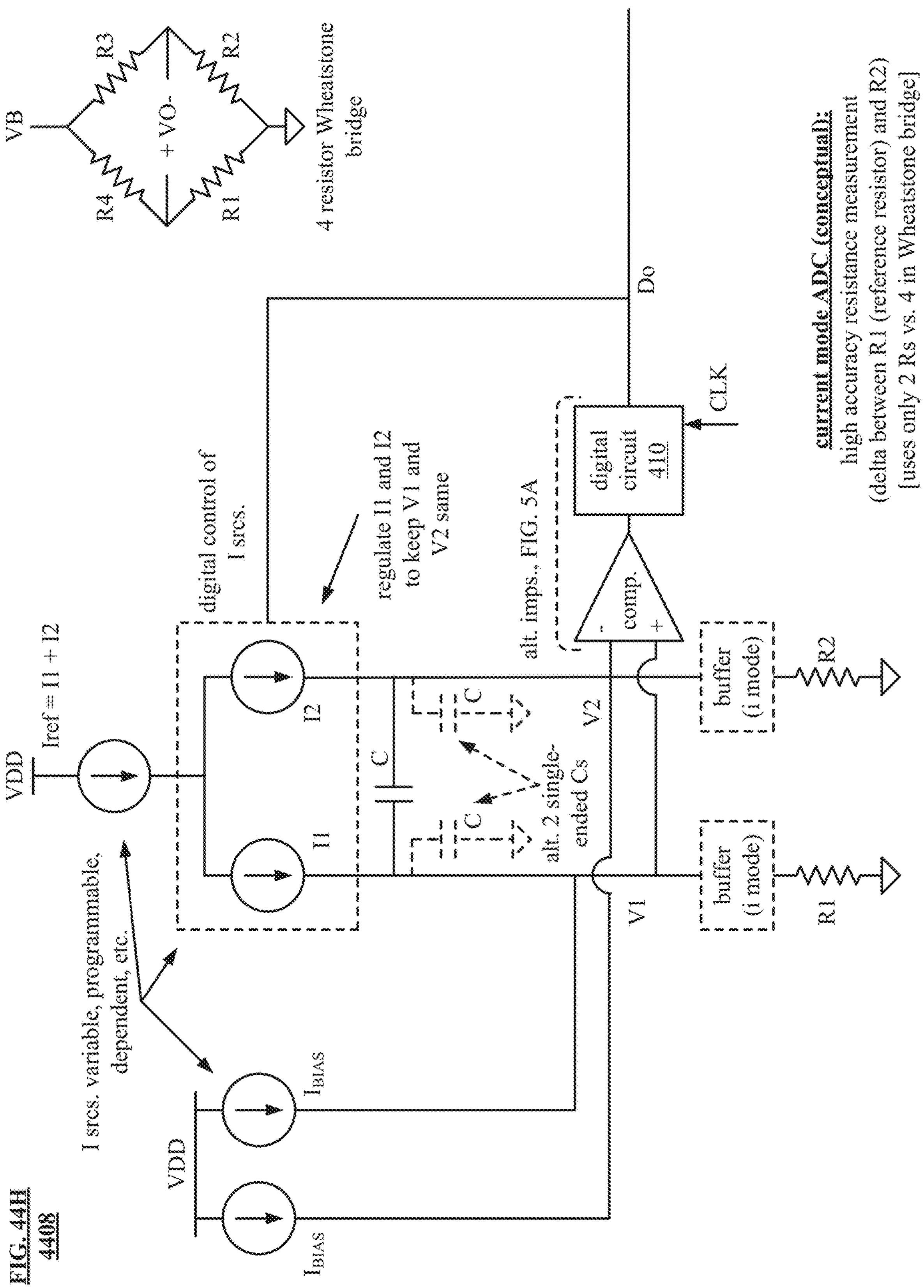

Referring to embodiment 4408 of FIG. 44H, this diagram is similar to the previous diagram with at least one difference being that the and-bit ACC 3610, the thermometer decoder 3612, and the decimation filter or removed. In this diagram, a digital signal Do is output from the digital circuit 410 and is configured to operate as the feedback control signal to regulate the operation of the current sources I1 and I2. In the previous diagram, the digital signal output from me thermometer decoder 3612 is configured to the feedback control signal to regulate the operation of the current sources I1 and I2. Similarly to the previous diagram, this implementation of a high accuracy resistance sensing circuit provides a gain factor to facilitate improved sensitivity including improved SNR.

In an example of operation and implementation, an impedance sensing circuit includes a first current source, second current source, a first bias current source, and a second bias current source. The first current source is operably coupled and configured, based a digital signal, to output a first current signal to a first node that is operably coupled to a first terminal of a first resistor. The second current source is operably coupled and configured, based the digital signal, to output a second current signal to a second node that is operably coupled to first terminal of a second resistor. The first bias current source is operably coupled and configured to output a first bias current signal to the first node that is operably coupled to the first terminal of the first resistor. The second bias current source is operably coupled and configured to output a second bias current signal to the second node that is operably coupled to the first terminal of the second resistor.

A comparator or an operational amplifier may be implemented. Considering and an example in which a comparator isn't limited, the impedance sensing circuit also includes a comparator that is operably coupled to the first current source and the second current source. When enabled, the comparator is configured to receive a first voltage based on the first terminal of the first resistor via a first input of the comparator, receive a second voltage based on the first terminal of the second resistor via a second input of the comparator, and compare the first voltage to the second voltage to generate a comparator output signal.

In addition, the digital circuit 410 is operably coupled to the comparator. When enabled, the digital circuit 410 is operably coupled and configured to process the comparator output signal to generate the digital signal. Note that the digital signal is representative of a difference between the first voltage and the second voltage that is based on an impedance difference between the first resistor and the second resistor. In addition, note that the difference between the first voltage and a second voltage, as well as the difference between the current signals I1 and I2 output from the first and second current sources facilitate determination of the difference between the resisters R1 and R2. In operation, the first current signal and the second current signal I1 and 12 are regulated based on the digital signal to ensure that the first voltage V1 is same as the second voltage V2.

In certain examples, the impedance sensing circuit also includes memory that stores operational instructions and one or more processing modules operably coupled to the digital circuit 410 and the memory. When enabled, the one or more processing modules is configured to execute the operational instructions to process the digital signal to determine the impedance difference between the first resistor and the second resistor.

Note also that a reference current source may be implemented to provide a current signal to the first and second current sources that provide the current source signals I1 and I2. For example, consider the reference current source is configured to provide a reference current signal, Iref, that is equal to the sum of both the current source signals I1 and I2 that are provided from the first and second current sources (e.g., Iref=I1+I2). For example, consider a reference current source that is operably coupled to another node that couples to inputs of the first current source and the second current source and configured to output a reference current signal, Iref. Note also that the sensitivity of the digital signal is based on a ratio of the first bias current signal or first second current signal to the reference current signal. In certain examples, this increase in sensitivity is based on the gain factor of $[1+I_{BIAS}/I_{ref}]$.

Note also that the resisters R1 and R2 that are operably coupled risks to the inputs of the comparator or operational amplifier, respectively, are grounded at their other terminals.

Also, note that certain implementations may include a capacitor that is operably coupled between the first input of the comparator and the second input of the comparator or operational amplifier. Even other implementations may include a first capacitor that is operably coupled to the first input of the comparator or operational amplifier and a second capacitor that is operably coupled to the second input of the comparator.

Again, note that the first bias current signal is same as or approximately same as second bias current signal. For example, they may have values that are within 0.01% of one another, 0.1% of one another, 1% of one another, or some other measure of precision.

Note also that buffers may be operably coupled between first and second inputs of the comparator or operational amplifier. For example, a first buffer is operably coupled between the first node and the first terminal of the first resistor, and a second buffer is operably coupled between the second node and the first terminal of the second resistor.

Figure 44I:
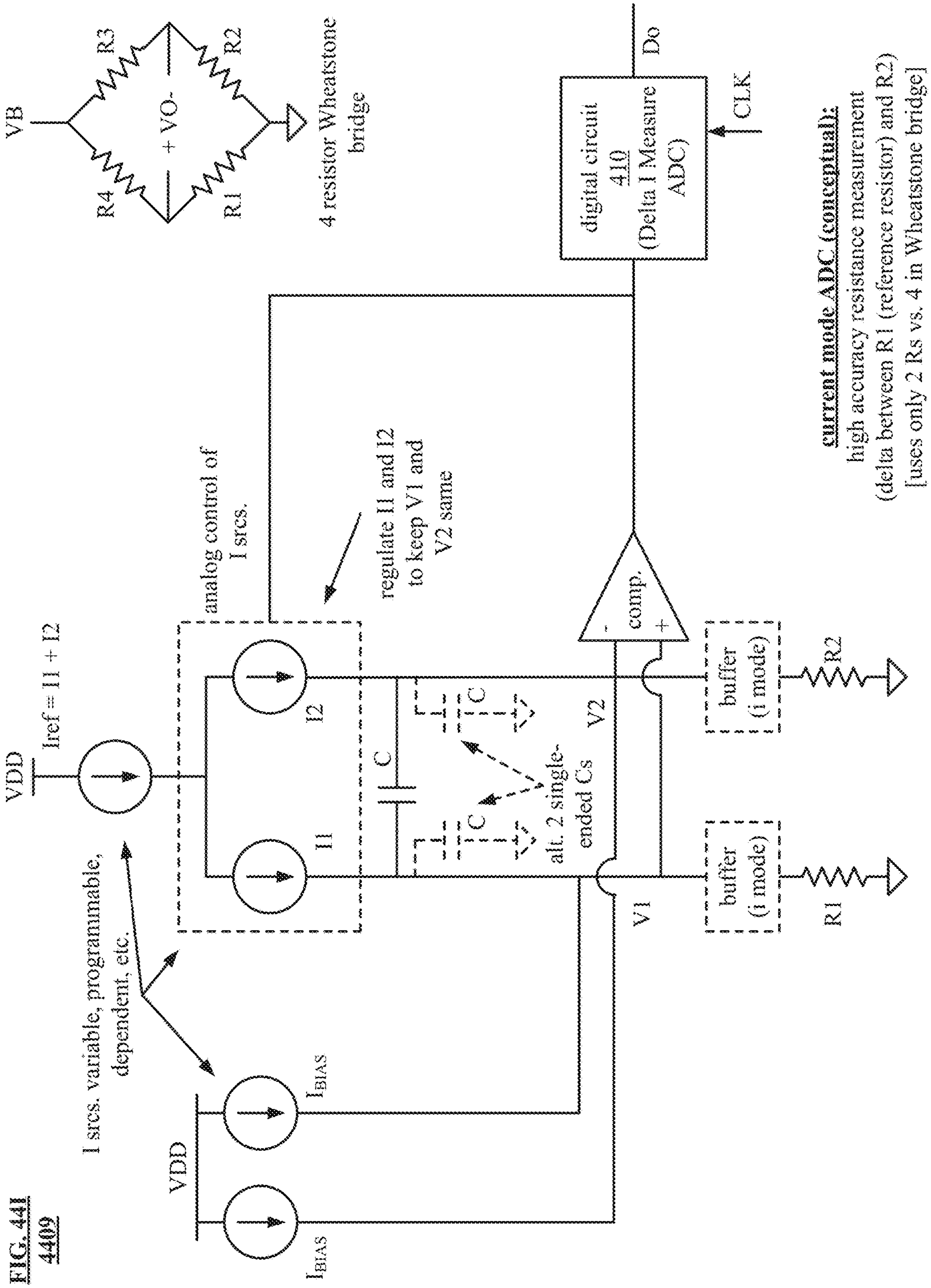

Referring to embodiment 4409 of FIG. 44I, this diagram is similar to the previous diagram except the digital circuit 410, which is configured to generate the digital signal Do corresponding to the Delta current (or Delta I, or ΔI) measurement as well as any voltage difference between the input terminals of the comparator or operational amplifier V1 and V2 does not provide the digital control signal that operates as the feedback control signal to regulate the operation of the current sources I1 and I2. Instead, in this diagram, the output of the comparator or operational amplifier is used as the feedback control signal to regulate the operation of the current sources I1 and I2. This implementation includes analog control of the current sources I1 and I2.

The following three diagrams are similar to the previous three diagrams with at least one difference being that the two resistors R1 and R2 that are coupled to the respective inputs of the comparator or operational amplifier are removed, and a Wheatstone bridge is implemented instead such that the notes corresponding to the output voltage of the Wheatstone bridge are instead coupled to the respective inputs of the comparator or operational amplifier. In addition, note that a bias current source providing a bias current signal of $2\times I_{BIAS}$ is connected to the top terminal of the Wheatstone bridge.

Figure 44J:
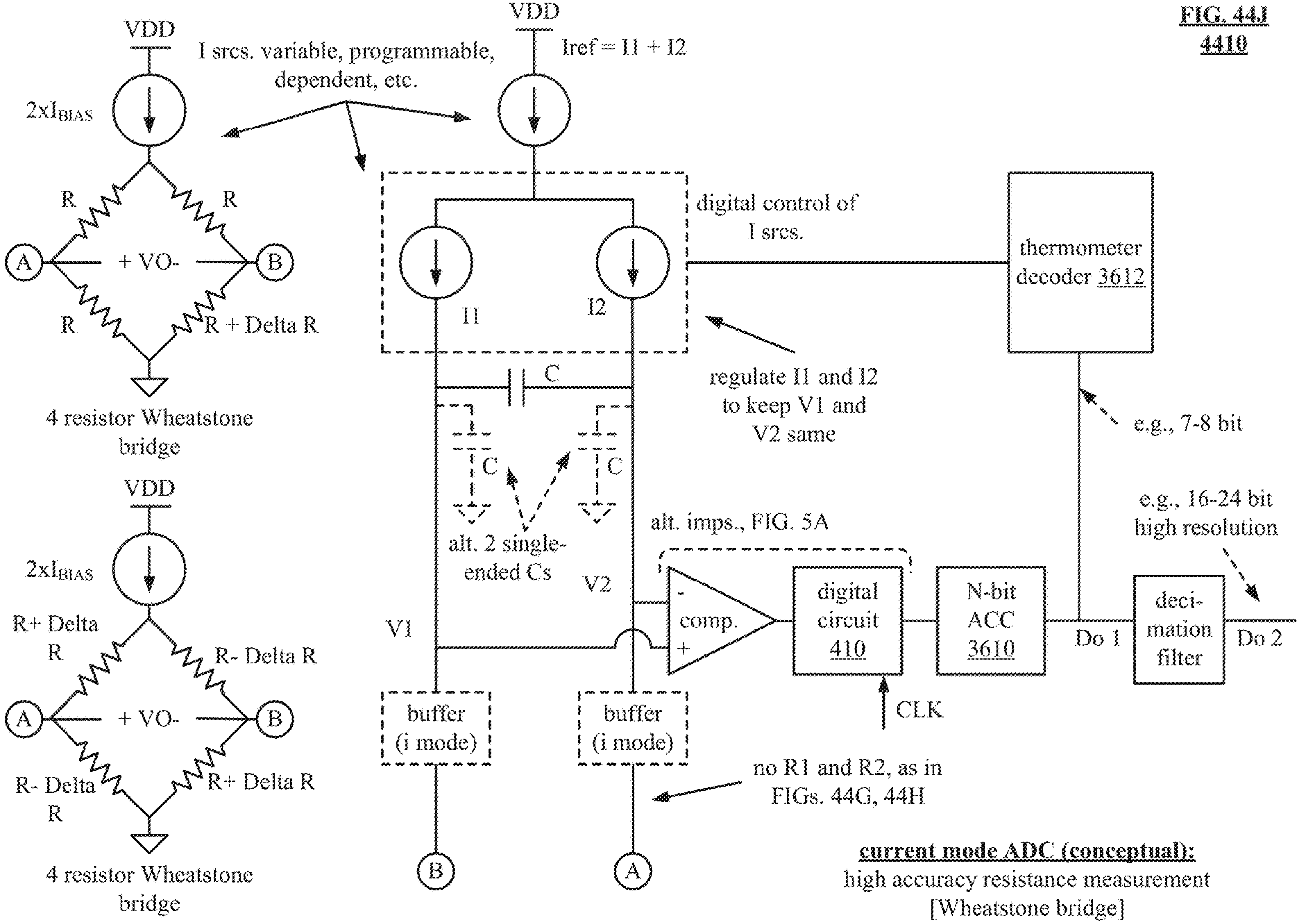

Referring to embodiment 4410 of FIG. 44J, this diagram is similar to embodiment 4407 of FIG. 44G yet includes two nodes of a Wheatstone bridge coupled to the respective inputs of the comparator or operational amplifier (e.g., as shown by the letters A and B, respectively) instead of the two resistors R1 and R1 that are shown in FIG. 44B.

Again, such a Wheatstone bridge may be implemented in a variety of ways. In one example, shown on the upper left-hand side of the diagram, three of the resistors within such a Wheatstone bridge may all have the same resistance value, R, and the fourth resistor includes a value R+Delta R (or R+ΔR). Such an implementation is sometimes referred to as a single-element varying Wheatstone bridge. In this implementation, the output voltage of the Wheatstone bridge, VO, is a function of the input voltage of the Wheatstone bridge, VB, as follows:

$$VO=(VB/4)\times[\Delta R/(R+\Delta R/2)]$$

In such a case, the ratio metric current measurement is as follows:

$$\Delta I/I\text{ref}=\tfrac{1}{2}\times[1+I_{BIAS}/I_{ref}]\times[\Delta R/(R+\Delta R/2)]$$

As can be seen, a gain factor of $[1+I_{BIAS}/I_{ref}]$ is applied to the ratio metric resistance measurement of [ΔR/(R+ΔR/2)]. This improves performance by increasing the sensitivity of the ratio metric resistance measurement. For example, the signal is increased with minimal increase in noise. This significantly improves the signal to noise ratio (SNR) of the high accuracy resistance sensing circuit. For example, consider that this gain factor of $[1+I_{BIAS}/I_{ref}]$ is some value greater than one, and it is multiplied by the ratio metric resistance measurement. In operation, the bias current source provides a bias current signal of $2\times I_{BIAS}$. Generally speaking, the signal magnitude is increased with minimal increase in the noise thereby significantly improving the SNR of the high accuracy resistance sensing circuit.

In an alternative example, shown on the lower left-hand side of the diagram, the resistors of an all-element varying Wheatstone bridge are such that that two of the resistors include a value of R+Delta R (or R+ΔR), and the other two resistors include a value of R−Delta R (or R−ΔR). In this implementation, the output voltage of the Wheatstone bridge, VO, is a function of the input voltage of the Wheatstone bridge, VB, as follows:

$$VO=VB\times[\Delta R/R]$$

In such a case, the ratio metric current measurement is as follows:

$$\Delta I/\mathrm{Iref}=[1+I_{BIAS}/I_{ref}]\times[2\Delta R/R]$$

As can be seen, a gain factor of $[1+I_{BIAS}/I_{ref}]$ is applied to the ratio metric resistance measurement of [2ΔR/R]. This improves performance by increasing the sensitivity of the ratio metric resistance measurement. For example, the signal is increased with minimal increase in noise. This significantly improves the signal to noise ratio (SNR) of the high accuracy resistance sensing circuit. For example, consider that this gain factor of $[1+I_{BIAS}/I_{ref}]$ is some value greater than one, and it is multiplied by the ratio metric resistance measurement. In operation, the bias current source provides a bias current signal of $2\times I_{BIAS}$. Generally speaking, the signal magnitude is increased with minimal increase in the noise thereby significantly improving the SNR of the high accuracy resistance sensing circuit. As with respect to previous examples, note that while the introduction of a bias current source that provides a bias current signal of $2\times I_{BIAS}$ can introduce some noise, the increase in signal gained that it provides for outweighs any potentially adverse effect caused by such additional noise. Generally speaking, the increase in signal gained significantly out paces any introduction in noise caused by the introduction of a bias current source that provides a bias current signal of $2\times I_{BIAS}$.

In such an implementation as this that includes a Wheatstone bridge architecture, the mathematical duration also shows gain scaling and improvement in SNR. The supply current provided from the bias current source that provides the bias current signal of $2\times I_{BIAS}$ increases the sensitivity of the ΔR/R measurement by the gain factor of $[1+I_{BIAS}/I_{ref}]$. Note that this is caused at least in part by the noise from the bias current source [bias current signal of $2\times I_{BIAS}$] is split in half into the top two resistors of the Wheatstone bridge and the noise introduced by them is canceled out from one another from the differential current reading that is performed by the high accuracy resistance sensing circuit.

Note that the ratio metric current measurements described above respect to embodiment 4410 of FIG. 44J are performed similarly with respect to the following two diagrams.

Figure 44K:
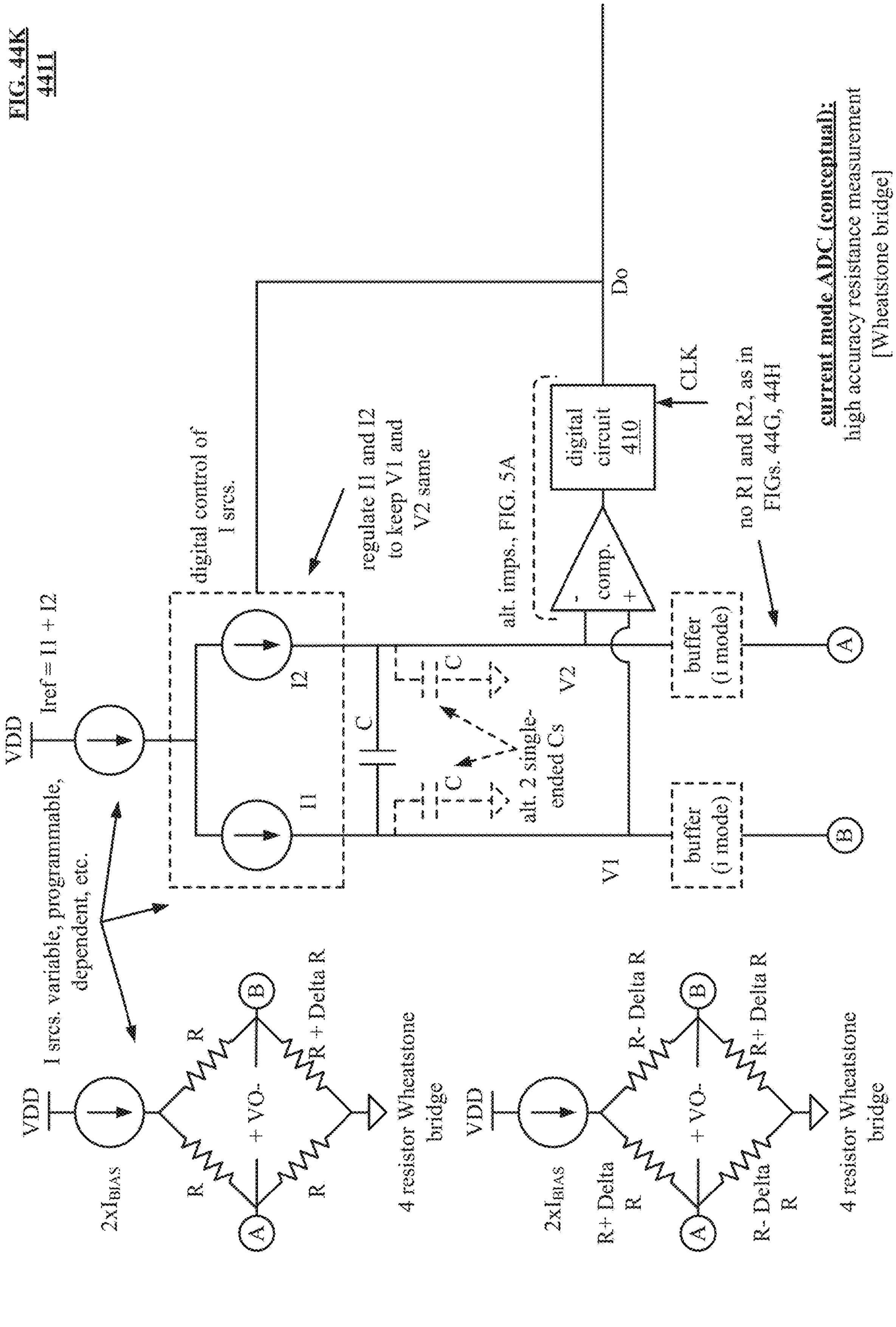

Referring to embodiment 4411 of FIG. 44K, this diagram is similar to embodiment 4408 of FIG. 44H yet includes two nodes of a Wheatstone bridge coupled to the respective inputs of the comparator or operational amplifier (e.g., as shown by the letters A and B, respectively) instead of the two resistors $R_1$ and $R_1$ that are shown in FIG. 44B.

Figure 44L:
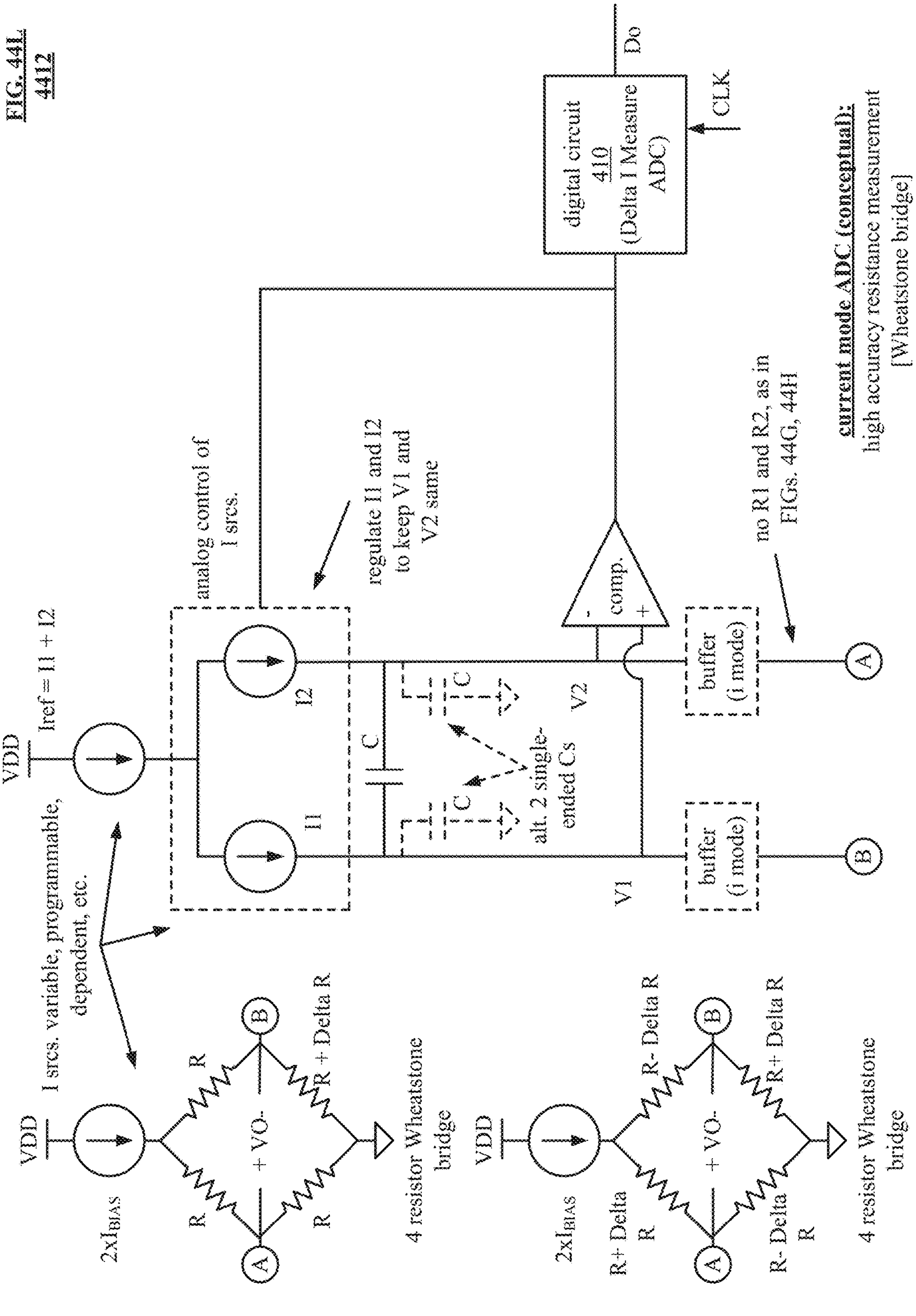

Referring to embodiment 4412 of FIG. 44L, this diagram is similar to embodiment 4409 of FIG. 44I yet includes two nodes of a Wheatstone bridge coupled to the respective inputs of the comparator or operational amplifier (e.g., as shown by the letters A and B, respectively) instead of the two resistors $R_1$ and $R_1$ that are shown in FIG. 44B.

FIG. 45C is a schematic block diagram showing an embodiment 4503 of passive pixel topology that is operative with a pixel array of a photo-diode image sensor. This diagram shows one possible implementation by which multiple respective photo-diodes are serviced within a passive pixel topology. For example, consider the photo-diodes (PDs) as corresponding to different respective rows within a pixel array, row 1, row 2, and so on up to row n. Consider the photo-diode the top of the diagram, an N-type metal-oxide-semiconductor field-effect transistor (MOSFET) (NMOS) transistor is coupled to the photo-diodes is that the source connects to the photo-diode and the drain is connected to one of the inputs of an operational amplifier. This is similar for the other respective rows that are serviced by this operational amplifier. Another NMOS transistor and integration capacitor in the feedback loop are connected from the input to the output of the operational amplifier. At the other one of the inputs of the operational amplifier, a common mode voltage signal, Wm, is provided. At the gate of the NMOS transistor in the feedback loop of the operational amplifier, a reset signal is provided, phi(row<RST>). Note that the operation of this NMOS transistor serving as a reset switch and the integration capacitor in the feedback loop, $C_F$, introduce noise into the system.

As the overall pixel array is read starting with the top photo-diode and continuing down the respective rows of the pixel array to the other photo-diodes of the other rows, the signal provided to the gates of the NMOS transistors, phi, transitions down the respective rows phi(row<1>), to phi (row<2>), and so on to phi(row<n>) until all of the rows are read. Within such an implementation in which one particular operational amplifier is operative to generate an output voltage, $V_O$, that is representative of the occurrence of photons incident on one or more of the photo-diodes, note that such an implementation can inherently include deleterious effects such as crosstalk between the pixels of the pixel array thereby degrading the image producing quality of the pixel array itself. In addition, such as architecture of a passive pixel topology can produce a large green eyes due to the large capacitive loading among all of the photo-diodes serviced by the operational amplifier.

FIG. 45D is a schematic block diagram showing an embodiment 4504 of vertical and horizontal scanners operative with a pixel array of a photo-diode image sensor. This diagram also corresponds to the passive pixel topology shown in the previous diagram such that a vertical scanner and horizontal scanner are implemented respectively to scan the rows and columns of the pixel array. For example, a number of NMOS transistors are implemented so that each respective photo-diode the pixel array may be switched into communication with the vertical scanner or the horizontal scanner, depending on what particular scanner is operational at a particular time. In an example of operation and implementation, consider that vertical scanning is performed before horizontal scanning such that the rows of the pixel array are detected followed by the columns of the pixel array. Based on detection in both the vertical and horizontal directions, one or more processing models in communication with the vertical scanner and the horizontal scanner is configured to generate an image corresponding to the incident photons on the photo-diodes of the pixel array.

FIG. 45E is a schematic block diagram showing an embodiment 4505 of a three transistor pixel structure (3T) that is operative with a pixel of a pixel array of a photo-diode image sensor. This implementation includes three respective NMOS transistors such that a first NMOS transistor includes its source being coupled to the photo-diode and operates as a reset transistor based on the signal, phi(RST), that is provided to the gate of that reset transistor. The reset power supply voltage is provided to the drain of the reset transistor. In addition, the gate of a source-follower transistor is also connected to the photo-diode, and the drain of this source-follower transistor is connected to a power supply (e.g., $V_{DD}$). The gate of a row select NMOS transistor is connected to a row select signal, phi(row), the drain of the row select NMOS transistor is connected to the source of the source-follower transistor, and the source of the row select NMOS transistor provides a voltage corresponding to the pixel associated with the photo-diode. The source of the row select NMOS transistor is also connected to a current supply providing a bias current, $I_{BIAS}$.

As can be seen with respect to this diagram in comparison to the passive pixel topology of FIG. 45C, this diagram of the 3T pixel structure includes three transistors as opposed to two transistors. This implementation has a larger fill factor, and this implementation can unfortunately generate noise caused by the reset transistor.

FIG. 45F is a schematic block diagram showing an embodiment 4506 of a four transistor pixel structure (4T) that is operative with a pixel of a pixel array of a photo-diode image sensor. This implementation may be viewed as an extension of the implementation of the previous diagram. As can be seen, within such a 4T pixel structure, an additional transfer transistor is implemented between the photo-diode and the reset transistor that is connected to the photo-diode. This additional transfer transistor is operative to prevent any dark current from flowing to the gates of the source-follower transistor. The inclusion of the additional transfer transistor affects the performance of the 4T pixel structure to operate more as a pinned photo-diode including a drastic reduction in dark current compared to the 3T pixel structure.

In addition, a small integration capacitor is implemented on the floating diffusion (FD) node, shown as $C_{FD}$ in the diagram. This small integration capacitor operates to increase the value of the conversion gain of the 4T pixel structure. This implementation within this diagram does have improved performance over the prior diagram, with better noise performance, larger conversion gain, and smaller dark current. However, as can be seen, this implementation does include four transistors as opposed to three transistors of the previous diagram (or two transistors of a further previous diagram, FIG. 45C).

FIG. 45G is a schematic block diagram showing an embodiment 4507 of a capacitive transimpedance amplifier including an inverter structure that is operative with a pixel of pixel array of a photo-diode image sensor.

FIG. 45H is a schematic block diagram showing an embodiment 4508 of a capacitive transimpedance amplifier including a differential amplifier structure that is operative with a pixel of pixel array of a photo-diode image sensor.

The two diagrams show two alternative implementations of a capacitive trans-impedance amplifier pixel and are similar to the passive pixel technology described above, such as with respect to FIG. 45C. Within each of these diagrams, note that a capacitor is shown as being representative of parasitic capacitance of the photo-diode, $C_{PD}$.

Referring to embodiment 4507 of FIG. 49G, this diagram is similar to the implementation shall in within FIG. 45C, with the addition of the capacitor, $C_{PD}$, and the operational amplifier being replaced with an inverter, and the overall structure servicing a single photo-diodes in this diagram. The output of the inverter is an output voltage, $V_{PIX}$, that is representative of the occurrence of photons incident on the photo-diode.

Referring to embodiment 4508 of FIG. 49H, this diagram is similar to the implementation shall in within FIG. 45C, with the addition of the capacitor, $C_{PD}$, and the overall structure servicing a single photo-diodes in this diagram.

FIG. 45I is a schematic block diagram showing an embodiment 4509 of a digital pixel structure that is operative with a pixel of pixel array of a photo-diode image sensor. In this diagram, an ADC and memory, shown as static random access memory, SRAM, replaced the source-follower transistor, the row select transistor, and current source of the 4T pixel structure of FIG. 45F. This implementation is operative to provide much faster speed within an image sensor such that an ADC is employed inside the pixel, however, while this does provide an improvement over other implementations including the 4T pixel structure of FIG. 45F, there are still multiple components that may be sources of noise, crosstalk, interference, and may adversely affect the overall performance of the device.

FIG. 45J is a schematic block diagram showing an embodiment 4510 of a chain block diagram of a photo-diode image sensor. This diagram provides a pictorial illustration of the respective stages within a chain block diagram of a photo-diode image sensor. For example, many of the respective stages are shown within the various implementations of the previous diagrams. A photo detection stage includes the photo-diode, a charge to voltage (Q to V) conversion stage follows the photo detection stage, a source-follower stage follows the charge to voltage conversion stage, an amplifier stage follows the source-follower stage, and an ADC stage follows the amplifier stage. As can be seen, such a pixel structure that is operative to service a photo-diode within an image sensing device, such as a pixel array, can include a number of stages, and each respective stage made unfortunately be a source of noise, interference, crosstalk, etc. thereby adversely affecting the overall performance of the device. For example, consider these respective stages is corresponding to and implementation of the 4T pixel structure of the FIG. 45F, then each respective stage and the components associated therewith may each unfortunately be a contributor to a reduction in the overall performance of the device. In an ideal and perfect situation, the transfer function between the photons incident on the photo-diode in the final output of the ADC stage would be linear. Unfortunately, these respective stages that are implemented in between the photo detection stage and the ADC stage introduce nonlinearity into the overall transfer function and also introduce noise and other deleterious effects.

FIG. 45K is a schematic block diagram showing an embodiment 4511 of a chain block diagram of a photo-diode image sensor in accordance with the present invention. This diagram shows an ADC stage directly connected to our coupling to the photo detection stage. By taking the ADC stage all the way back to the photo detection stage within the device, there is a significant reduction if not the elimination of all of the noise and nonlinearity generated by the respective stages of the chain between the photo detection stage and the ADC stage of the previous diagram. As described herein with respect to various aspects, embodiments, and/or examples of the invention (and/or their equivalents), an ADC may be constructed that operates based on very low power, introduces very little noise, provides linearity in response, and can operate based on converting a detected current and generating a corresponding digital signal therefrom. For example, consider the current signal generated by a photo-diode, the photo-diode current, that is the current that is detected by an ADC that is operative to detect a current signal and to generate a corresponding digital signal therefrom.

FIG. 46A is a schematic block diagram showing an embodiment 4601 of an ADC implemented based on a single-ended direct interface dual DAC feedback photo-diode sensor in accordance with the present invention. This diagram has certain similarities to other ADCs described. Certain differences include the ADC use particularly connected to or coupled to a photo-diode. A charging capacitor, C, is connected to the single line that connects the ADC to the photo-diode, and the single line that connects the ADC to the photo-diode is coupled to a self-referenced latched comparator. The self-referenced latched comparator is operatively coupled and configured simultaneously to provide the load signal 412 and to detect any effect 414 on the load signal corresponding to the photo-diode current signal that is operative to charge the charging capacitor, C, thereby generating a photo-diode voltage. The photo-diode voltage is received at an input of the self-referenced latched comparator. The self-referenced latched comparator is operative to generate a digital output signal, Do 0, based the photo-diode voltage. This digital output signal, Do 0, is provided to a first one or more processing modules 24 and also to a second one more processing modules 24. Note that these respective one or more processing modules 24 are configured to perform any desired digital signal processing. Examples of such digital signal processing may include functions corresponding to low pass filtering (LPF), accumulating (ACC) such as the operation described with respect to an N-bit accumulator and other diagrams herein, all pass filtering (APF), etc. The first one or more processing modules 24 is configured to provide another digital input signal to an N-bit DAC 420-2 that is implemented to operate as a current source to the single line connecting the ADC to the photo-diode, and the second one or more processing modules 24 is configured to provide yet another digital input signal to an M-bit DAC 420-3 that is implemented to operate as a current sink to the single line connecting the ADC to the photo-diode. Note that N and M are both positive integers greater than or equal to 1.

In some implementations, note that M is equal to N. In other implementations, N is greater than M. In certain examples, the amount of current that is sourced by the N-bit DAC 420-2 is more than the amount of current that is sunk by the M-bit DAC 420-3. In other examples, the amount of current that is sourced by the N-bit DAC 420-2 is less than the amount of current that is sunk by the M-bit DAC 420-3. Consider an example where the amount of current that is sourced by the N-bit DAC 420-2 is more than the amount of current that is sunk by the M-bit DAC 420-3, then N being greater than M operates to provide more source current than sink current. In In certain examples, note that the N-bit DAC 420-2 will be a higher power consuming component then the M-bit DAC 420-3. In an example of operation and implementation, the M-bit DAC 420-3 is implemented to provide a sync current to ensure that the voltage at the input of the self-referenced latched comparator is the same as the threshold voltage associated with the self-referenced latched comparator. Generally speaking, note that the combination of both the N-bit DAC 420-2 and the M-bit DAC 420-3 allow for sourcing and/or sinking current to track the photo-diode current.

In this diagram, note that the self-referenced latched comparator does not receive a separate reference signal has certain comparators and/or operational amplifiers and other diagrams do. This is a further reduction in complexity compared to other architectures. By using a self-referenced match comparator, the comparison of the photo-diode voltage is too a threshold voltage associated with the self-referenced latched comparator in accordance with generating the digital output signal, Do 0. For example, the self-referencing of the self-referenced latched comparator is based on a threshold voltage associated with the self-referenced latched comparator. Note that the threshold voltage of the self-referenced latch comparator may be of a variety of types, including 0.3 V, 0.5 V, 0.7 V, 1 V, greater than 1 V, or some other value. In an example of operation and implementation, based on the photo-diode voltage that is received by the self-referenced latched comparator comparing favorably to the threshold voltage of the self-referenced latched comparator, the self-referenced latched comparator outputs a first digital value. Based on the photo-diode voltage that is received by the self-referenced latched comparator comparing unfavorably to the threshold voltage of the self-referenced latched comparator, the self-referenced latched comparator outputs a second digital value. For example, consider that the photo-diode voltage is greater than the threshold voltage of the self-referenced latched comparator, then the self-referenced latched comparator outputs the first digital value (e.g., digital value of 1). Alternatively, consider that the photo-diode voltage is less than or equal than the threshold voltage of the self-referenced latched comparator, then the self-referenced latched comparator outputs the second digital value (e.g., digital value of 0). As the photo-diode voltage varies as a function of time, digital output signal, Do 0, output from the self-referenced latched comparator will include a stream of digital values composed of the first digital value in the second digital value, based on comparison of the photo-diode voltage to the threshold voltage of the self-referenced latched comparator.

Also, note that the first one or more processing modules 24 and the second one or more processing modules 24 is also operative to provide the digital signals that are provided respectively to the N-bit DAC 420-2 and the M-bit DAC 420-3 also to a first decimation filter and the second decimation filter that are operative to generate digital output signals, Do 1 and Do 2, respectively. That is to say, the very same digital signals that are generated by the first one or more processing modules 24 and the second one or more processing modules 24 based on processing of the digital output signal, Do 0, are provided respectively to the first decimation filter and the second decimation filter. In certain examples, a decimation filter is configured to process a first digital signal to generate a second digital signal having a lower sample rate and a higher resolution than the first digital signal.

In another example, the first one or more processing modules 24 that is configured to process the digital output signal, Do 0, to generate the digital signal is provided to the N-bit DAC 420-2 is also configured to process the digital output signal, Do 0, to generate another the digital output signal, Do 0', to be provided to the first decimation filter. The second one or more processing modules 24 that is configured to process the digital output signal, Do 0, to generate the digital signal is provided to the N-bit DAC 420-2 is also configured to process the digital output signal, Do 0, to generate another the digital output signal, Do 0", to be provided to the second decimation filter. For example, note that the first and second one or more processing modules are configured to provide the very same digital signals that they respectively provide to the N-bit DAC 420-2 and the M-bit DAC 420-3 to the first and second decimation filters, or alternatively, respectively provide different digital signals to the first and second decimation filters.

In a particular implementation of the self-referenced latched comparator, the self-referenced latched comparator includes a first inverter, a second inverter, and a digital circuit. The first inverter is operably coupled to the photo-diode and the charging capacitor, C, and is configured to compare the photo-diode voltage to the threshold voltage associated with the self-referenced latched comparator. In certain examples, this threshold voltage associated with the self-referenced latched comparator corresponds to a threshold voltage of this first inverter. A second inverter is operably coupled to the first inverter, and the digital circuit 410-1 is operably coupled to the second converter and is configured to output the digital output signal, Do 0. The digital circuit 410-1 may be viewed as that component that is operative to perform the data latch thereby generating the appropriate first or second digital value (e.g., 1 or 0) of the signal is output from the second inverter thereby generating the digital output signal, Do 0, at some desired clock frequency. Note that the complexity of any inverter is much less than that of a comparator or an operational amplifier. In addition, note that the use of inverters within a cell-referenced latched comparator provides for a very small size with very low power consumption.

Note that such an ADC as described with respect to this diagram is operative to consume very low power. For example, consider a particular implementation in which the photo-diode is detecting very strong light, and the photo-diode is generating a photo-diode current in the range of 10 s of microamps, and consider a power supply of the ADC to be in the range of 2 V. Within such an implementation, the overall power consumption of the ADC will be in the range of a couple microwatts. In some implementations, note that the majority of power consumption will be within the N-bit DAC 420-2, such as where a larger source current is provided in comparison to the sink current to ensure tracking of the photo-diode current that is operative to charge the charging capacitor, C, and to generate the photo-diode voltage that is received at the input of the self-referenced latched comparator.

Given such an extremely low level of power consumption of such an ADC that is operative to service a photo-diode, an extremely large number of photo-diodes can be serviced while still providing very small size, low power consumption, low noise, etc. Such an ADC provides a significant improvement over existing technologies that are directed towards servicing one or more photo-diodes. Note that some alternative implementations may include one ADC as described herein that is operative to service more than one photo-diode, such as with respect to an appropriate switching, multiplexing, or other time-division implementation such that the ADC services different perspective photo-diodes at different perspective times. In other implementations, note that one respective ADC is implemented to service each respective photo-diode.

FIG. 46B is a schematic block diagram showing an embodiment 4602 of a self-referenced latched comparator that is operative with an ADC in accordance with the present invention. This diagram shows one particular implementation of a self-referenced latched comparator. In this implementation, the first two inverters of the self-referenced latched comparator are similarly implemented, but a third inverter including an input that is operatively coupled to an output of the second inverter and an output operably coupled to a node coupling an output of the first inverter to an input of the second inverter via switch facilitates operation of the self-referenced latched comparator in accordance with the sampling mode and a latched mode. For example, consider that a power supply, VDD, is connected to the first inverter via a switch, and the first inverter is also connected to ground via switch. Depending on the configuration of these switches, the operational mode of the self-referenced latched comparator may be performed in accordance with the sampling mode or the latched mode. For example, during a first configuration, corresponding to the switches phi_1, associated with the first inverter being closed, then the first inverter turns on, and the switch, phi_2, is open thereby turning off the third inverter so that the self-referenced latched comparator operates in accordance with a sampling mode. Alternatively, during a second configuration, corresponding to the switches phi_1, associated with the first inverter being open, then the first inverter turns off, and the switch, phi_2, is closed thereby turning on the third inverter so that the self-referenced latched comparator operates in accordance with a latched mode. Note that this is one particular implementation by which the self-referenced latched comparator may be done to facilitate operation of the ADC of FIG. 46A.

Generally speaking, any implementation of a self-referenced latched comparator that is operative to compare the photo-diode voltage to a threshold voltage associated with the self-referenced latched comparator so as to generate a digital signal that is based on a difference between the photo-diode voltage and the threshold voltage associated with the self-referenced latched comparator is operative to facilitate operation of the ADC without the requirement of any reference signal to be provided to assist in the generation of the digital output signal, Do 0. Such an architecture provides a reduction in complexity while providing high precision, low noise, high performance, and high accuracy with respect to detection of the photo-diode current that is associated with the photo-diode. In addition, note that such an ADC, being directly connected or coupled to the photo-diode also provides a significant reduction if not the elimination of all of the noise and nonlinearity generated by any intermediate respective stages between the photo detection stage and the ADC stage of previous diagrams as described herein. By completely obviating the requirement for any such intermediate respective stages, a significant improvement in performance is achieved in comparison to other designs. Such a ADC design that is operative to service a photo-diode provides very low noise. When implemented in an image sensor based application, this reduction in noise will provide for a much improved image quality. In addition, the overall device consumes much less power than prior technologies as the analog circuitry included within such an ADC design that is operative to service a photo-diode is minimized Consider adding image sensing application, such an ADC design that is operative to service a photo-diode may be implemented to provide for a very high-speed image sensor with as many as one ADC per pixel within a pixel array of the image sensor. Again, the very small size, low noise, and low power consumption of such an ADC design that is operative to service a photo-diode makes it well tailored for image sensing applications.

In an example of operation and implementation, an ADC includes a capacitor, a self-referenced latched comparator, one or more processing modules, an N-bit DAC, and an M-bit DAC. In some examples, the ADC includes memory that stores operational instructions such that the one or more processing modules is configured to execute the operational instructions. The capacitor is operably coupled to a photo-diode and configured to produce a photo-diode voltage based on charging by a photo-diode current associated with the photo-diode and a digital to analog converter (DAC) source current and/or a DAC sink current. The ADC is coupled to the photo-diode via a single line. The self-referenced latched comparator is operably coupled to the photo-diode and the capacitor and configured to generate a first digital signal that is based on a difference between the photo-diode voltage and a threshold voltage associated with the self-referenced latched comparator. The one or more processing modules is operably coupled to the self-referenced latched comparator and configured to execute the operational instructions to process the first digital signal to generate a second digital signal and/or a third digital signal. The N-bit DAC is operably coupled to the one or more processing modules and configured to generate the DAC source current based on the second digital signal (e.g., N is a first positive integer. The M-bit DAC is operably coupled to the one or more processing modules and configured to generate the DAC sink current based on the third digital signal (e.g., M is a second positive integer). Note that the DAC source current and/or the DAC sink current tracks the photo-diode current.

In some examples, a first one or more processing modules of the one or more processing modules is operably coupled to the self-referenced latched comparator and the N-bit DAC and is configured to execute first operational instructions to process the first digital signal to generate the second digital signal and to provide the second digital signal to the N-bit DAC, and a second one or more processing modules of the one or more processing modules is operably coupled to the self-referenced latched comparator and the M-bit DAC and is configured to execute second operational instructions to process the first digital signal to generate the third digital signal and to provide the second digital signal to the M-bit DAC.

In another of operation and implementation, a first one or more processing modules of the one or more processing modules is operably coupled to the self-referenced latched comparator and the N-bit DAC and is configured to execute first operational instructions to process the first digital signal to generate a fourth digital signal, and a second one or more processing modules of the one or more processing modules is operably coupled to the self-referenced latched comparator and the M-bit DAC and is configured to execute second operational instructions to process the first digital signal to generate a fifth digital signal. In yet another specific example, a first decimation filter is operably coupled to the first one or more processing modules and configured to process the fourth digital signal to generate a first digital output signal having a lower sampling rate and a higher resolution than the fourth digital signal. A second decimation filter is operably coupled to the second one or more processing modules and configured to process the fifth digital signal to generate a second digital output signal having a lower sampling rate and a higher resolution than the fifth digital signal.

In another example, a first one or more processing modules of the one or more processing modules is operably coupled to the self-referenced latched comparator and the N-bit DAC and is configured to execute first operational instructions to process the first digital signal to generate the second digital signal and to provide the second digital signal to the N-bit DAC and to a first decimation filter. A second one or more processing modules of the one or more processing modules is operably coupled to the self-referenced latched comparator and the M-bit DAC and s configured to execute second operational instructions to process the first digital signal to generate the third digital signal and to provide the second digital signal to the M-bit DAC and to a second decimation filter. Note that the first decimation filter is operably coupled to the first one or more processing modules and is configured to process the first digital signal to generate a first digital output signal having a lower sampling rate and a higher resolution than the first digital signal, and the second decimation filter is operably coupled to the second one or more processing modules and is configured to process the second digital signal to generate a second digital output signal having a lower sampling rate and a higher resolution than the second digital signal.

In some examples, the self-referenced latched comparator is implemented to include a first inverter operably coupled to the photo-diode and the capacitor and configured to compare the photo-diode voltage to the threshold voltage associated with the self-referenced latched comparator that corresponds to a threshold voltage of the first inverter, a second inverter operably coupled to the first inverter, and a digital circuit operably coupled to the second inverter and configured to output the first digital signal.

In some other examples, the self-referenced latched comparator is implemented to include a first inverter operably coupled to the photo-diode and the capacitor and configured to compare the photo-diode voltage to the threshold voltage associated with the self-referenced latched comparator that corresponds to a threshold voltage of the first inverter, a second inverter operably coupled to the first inverter, a third inverter including an input operably coupled to an output of the second inverter and an output operably coupled to a node coupling an output of the first inverter to an input of the second inverter via a switch to facilitate operation of the self-referenced latched comparator in accordance with a sampling mode and a latched mode, and a digital circuit operably coupled to the second inverter and configured to output the first digital signal.

In certain implementations, the N-bit DAC is a higher power consuming component than the M-bit DAC (e.g., N is greater than M), and the DAC source current is larger than the DAC sink current. In other implementations, N is equal to M. Alternatively, N is than less than or equal M.

In an example of operation and implementation, the N-bit DAC is further configured to generate and provide the DAC source current based on the photo-diode voltage comparing favorably to the threshold voltage associated with the self-referenced latched comparator (e.g., N is a first positive integer), and an M-bit DAC is further configured to generate and provide the DAC sink current based on the photo-diode voltage comparing unfavorably to the threshold voltage associated with the self-referenced latched comparator, wherein the DAC source current and/or the DAC sink current tracks the photo-diode current. For example, the photo-diode voltage compares favorably to the threshold voltage associated with the self-referenced latched comparator based on the photo-diode voltage being greater than the threshold voltage associated with the self-referenced latched comparator, and the photo-diode voltage compares unfavorably to the threshold voltage associated with the self-referenced latched comparator based on the photo-diode voltage being less than the threshold voltage associated with the self-referenced latched comparator.

In even other examples, the ADC also includes a decimation filter operably coupled to the one or more processing modules and configured to process the first digital signal to generate a digital output signal having a lower sampling rate and a higher resolution than the first digital signal. In yet other examples, the ADC also includes a decimation filter operably coupled to the one or more processing modules and configured to process the second digital signal to generate a digital output signal having a lower sampling rate and a higher resolution than the second digital signal.

In another example of operation and implementation, an ADC includes an ADC includes a capacitor, a self-referenced latched comparator, one or more processing modules, an N-bit DAC, an M-bit DAC, and a decimation filter. In some examples, the ADC includes memory that stores operational instructions such that the one or more processing modules is configured to execute the operational instructions. The capacitor is operably coupled to a photo-diode and configured to produce a photo-diode voltage based on charging by a photo-diode current associated with the photo-diode and a digital to analog converter (DAC) source current and/or a DAC sink current. The ADC is coupled to the photo-diode via a single line. The self-referenced latched comparator is operably coupled to the photo-diode and the capacitor and configured to generate a first digital signal that is based on a difference between the photo-diode voltage and a threshold voltage associated with the self-referenced latched comparator. The one or more processing modules is configured to execute the operational instructions to process the first digital signal to generate a second digital signal and/or a third digital signal. The N-bit DAC is operably coupled to the one or more processing modules and is configured to generate and provide the DAC source current based on the second digital signal and also based on the photo-diode voltage comparing favorably to the threshold voltage associated with the self-referenced latched comparator (e.g., N is a first positive integer). The M-bit DAC is operably coupled to the one or more processing modules and is configured to generate and provide the DAC sink current based on the third digital signal based on the second digital signal and also based on the photo-diode voltage comparing unfavorably to the threshold voltage associated with the self-referenced latched comparator. The DAC source current and/or the DAC sink current tracks the photo-diode current (e.g., M is a second positive integer). Also, the decimation filter operably coupled to the one or more processing modules and configured to process the second digital signal to generate a first digital output signal having a lower sampling rate and a higher resolution than the second digital signal or to process the third digital signal to generate a second digital output signal having a lower sampling rate and a higher resolution than the third digital signal.

In some examples, the photo-diode voltage compares favorably to the threshold voltage associated with the self-referenced latched comparator based on the photo-diode voltage being greater than the threshold voltage associated with the self-referenced latched comparator, and the photo-diode voltage compares unfavorably to the threshold voltage associated with the self-referenced latched comparator based on the photo-diode voltage being less than the threshold voltage associated with the self-referenced latched comparator.

Also, in certain examples, a first one or more processing modules of the one or more processing modules is operably coupled to the self-referenced latched comparator, and the N-bit DAC and is configured to execute first operational instructions to process the first digital signal to generate the second digital signal and to provide the second digital signal to the N-bit DAC. A second one or more processing modules of the one or more processing modules is operably coupled to the self-referenced latched comparator, and the M-bit DAC and is configured to execute second operational instructions to process the first digital signal to generate the third digital signal and to provide the second digital signal to the M-bit DAC.

In some implementations, a first one or more processing modules of the one or more processing modules is operably coupled to the self-referenced latched comparator, and the N-bit DAC and configured to execute first operational instructions to process the first digital signal to generate a fourth digital signal. A second one or more processing modules of the one or more processing modules is operably coupled to the self-referenced latched comparator and the M-bit DAC and is configured to execute second operational instructions to process the first digital signal to generate a fifth digital signal.

In some examples, a first decimation filter is operably coupled to the first one or more processing modules and is configured to process the fourth digital signal to generate a first digital output signal having a lower sampling rate and a higher resolution than the fourth digital signal, and a second decimation filter is operably coupled to the second one or more processing modules and is configured to process the fifth digital signal to generate a second digital output signal having a lower sampling rate and a higher resolution than the fifth digital signal.

Also, in some specific implementations, the self-referenced latched comparator is implemented to include a first inverter operably coupled to the photo-diode and the capacitor and configured to compare the photo-diode voltage to the threshold voltage associated with the self-referenced latched comparator that corresponds to a threshold voltage of the first inverter, a second inverter operably coupled to the first inverter, and a digital circuit operably coupled to the second inverter and configured to output the first digital signal.

Also, in certain implementations, the N-bit DAC is a higher power consuming component than the M-bit DAC (e.g., N is greater than M), and the DAC source current is larger than the DAC sink current. In other implementations, N is equal to M. Alternatively, N is than less than or equal M.

FIG. 47 is a schematic block diagram showing an embodiment 4700 of an ADC implemented based on a single-ended direct interface DAC feedback and current sink photo-diode sensor in accordance with the present invention. This diagram has some similarities to the previous diagram with at least a few differences being that the M-bit DAC 420-3 is replaced by a current sink device, $I_2$, towards the bottom of the diagram that is controlled by the digital output signal, Do 0, and an N-bit accumulator (ACC) 3610 is implemented to process the digital output signal, Do 0, to generate the digital signal is provided to the N-bit DAC 420-2. In this diagram, the current sink provides a path to sink current when there is no photo-diode current. In this diagram, the self-referenced latched comparator outputs the digital signal, Do 0, that is provided to the N-bit ACC 3610 and also to the switch that is connected between the current sink and the input of the self-referenced latched comparator. In certain examples, the N-bit ACC 3610 is configured to provide the same digital signal to a decimation filter that it provides to the N-bit DAC 420-2, and the decimation filter is configured to output digital output signal, Do 1. In other examples, the ACC 3610 is configured to process the digital output signal, Do 0, that is output from the self-referenced latched comparator to generate another digital output signal, Do 0', that is provided to the decimation filter, and the decimation filter is configured to process this another digital output signal, Do 0', to generate digital output signal, Do 1.

This diagram shows even a further simplification of the ADC of the previous diagrams, FIGS. 46A and 46B. By using the N-bit ACC 3610, a very small sink current may be used at the bottom of the diagram, and the sink current is operative to sink some current even when there is no photo-diode current, so as to maintain the voltage at the input of the self-referenced latched comparator to be same as a threshold voltage associated with the self-referenced latched comparator. Note that the self-referenced latched comparator of this diagram may be similarly modified in accordance with FIG. 46B as described above. In addition, this diagram includes further simplification by replacing the one or more processing modules 24 with the N-bit ACC 3610.

FIG. 48 is a schematic block diagram showing an embodiment 4800 of an ADC implemented based on a single-ended direct interface DAC feedback and current sink with improved settling time photo-diode sensor in accordance with the present invention. This diagram includes similarity to the previous diagram with at least one difference being that the current sink at the bottom of the diagram includes a modified configuration that is operative to compensate for the switching time of the previous diagram when this switch connected between the current sink and the input to the self-referenced latched comparator is closed so that the current sink is turned on. For example, within an actual physical system, it does take some finite amount of time for the current to change from zero to some DC current value (e.g., not instantaneous). The current sink to the bottom of the diagram still is operative to provide a path to sink current when there is no photo-diode current. However, by providing an alternative path, such that the current sink is connected to a power supply (e.g., VDD) when the switch between the current sink in the input to the self-reference latched comparator is open, and improved settling time is achieved when the current sink actually does get switched in to the input of the self-referenced latched comparator when that switch is closed.

By including two switches connected to the current sink at the bottom of the diagram, one switch connected between the current sink and the input to the self-referenced latched comparator, and another switch connected to a power supply (e.g., VDD), such that the two switches are oppositely controlled such that when one is open, the others closed, and vice versa. To compensate for the settling time of the turn on or turn off of the current sink, this implementation includes and means by which current can be pulled immediately such that the current never goes to zero. For example, depending on the connectivity of the switches, the current can be steered to the power supply (e.g., VDD) or alternatively to the input of the self-referenced latched comparator.

FIGS. 49A and 49B are schematic block diagrams showing various embodiments (embodiment 4901 of FIG. 49A and embodiment 4902 of FIG. 49B) of an ADC implemented based on a single-ended direct interface dual DAC feedback differential signaling photo-diode sensor in accordance with the present invention.

Referring to embodiment 4901 of FIG. 49A, this diagram has some similarities to the ADC of FIG. 46A with certain differences being that this ADC provides for a differential implementation. In this diagram, the self-referenced latched comparator is replaced with a comparator that is connected or coupled to a digital circuit 410 that is operated based on an oversampling clock and the N-bit DAC 420-2 and the M-bit DAC 420-3 are replaced by differential N-bit DAC 1120 and differential M-bit DAC 4910, respectively. Also, an additional/second charging capacitor, C, is connected to one of the differential inputs of the differential N-bit DAC 1120. Note that only one of the differential leads of the ADC, corresponding to the two respective inputs to the comparator, is connected to the photo-diode. In this implementations, the comparator compares two inputs. One of the inputs to the comparator corresponds to a photo-diode voltage that is generated via first ones of the differential leads of the differential N-bit DAC 1120 and differential M-bit DAC 4910 (e.g., a first differential lead of the differential leads of the differential N-bit DAC 1120 and a first differential lead of the differential M-bit DAC 4910) that is connected to the first charging capacitor, C, that is also connected to the photo-diode. The other input to the comparator corresponds to the second ones of the differential leads of the differential N-bit DAC 1120 and differential M-bit DAC 4910 (e.g., a second differential lead of the differential leads of the differential N-bit DAC 1120 and a second differential lead of the differential M-bit DAC 4910) that is connected to the second charging capacitor, C).

Referring to embodiment 4901 of FIG. 49B, this diagram as similar to the previous diagram with at least one difference being that the comparator and the digital circuit 410 is replaced with a digital comparator that is operated based on an oversampling clock.

FIGS. 50A and 50B are schematic block diagrams showing various embodiments (embodiment 5001 of FIG. 50A and embodiment 5002 of FIG. 50B) of an ADC implemented based on a single-ended direct interface DAC feedback and current sink differential signaling photo-diode sensor in accordance with the present invention.

Referring to embodiment 5001 of FIG. 50A, this diagram is similar to the diagram of FIG. 49A with the replacement of the one or more processing modules with an N-bit ACC 3610 that is operative to generate the digital signal that is provided to the differential N-bit DAC 1120. In addition, the differential M-bit DAC 4910 is replaced with a current sink that is connected via two respective leads via two respective switches to the two respective inputs of the comparator. Again, note that one of the respective inputs of the comparator is connected to the charging capacitor, C, and the photo-diode and is configured to receive the photo-diode voltage. Note that the digital output signal, Do 0, that is generated by the digital circuit 410 is operative to control the two respective switches that are connected between the current sink and the two respective inputs of the comparator. In an example of operation and implementation, when one of the switches is closed, the other is open, and vice versa.

In certain examples, the same digital signal that is provided from the N-bit ACC 3610 to the differential N-bit DAC 1120 is provided to a decimation filter. Alternatively, a first digital signal is provided from the N-bit ACC 3610 to the differential N-bit DAC 1120, and a second digital signals is provided from the N-bit ACC 3610 to the decimation filter. This diagram provides a simplification of the diagram of FIG. 49A with the replacement of the one or more processing modules with the N-bit ACC 3610.

Referring to embodiment 5002 of FIG. 50B, this diagram as similar to the previous diagram with at least one difference being that the comparator and the digital circuit 410 is replaced with a digital comparator that is operated based on an oversampling clock.

FIGS. 51A, 51B, 51C, and 51D are schematic block diagrams showing various embodiments (embodiment 5101 of FIG. 51A, embodiment 5102 of FIG. 51B, embodiment 5103 of FIG. 51C, embodiment 5104 of FIG. 51D) of an ADC implemented based on a single-ended direct interface DAC feedback and current sink with chopper differential signaling photo-diode sensor in accordance with the present invention.

Figure 51A:
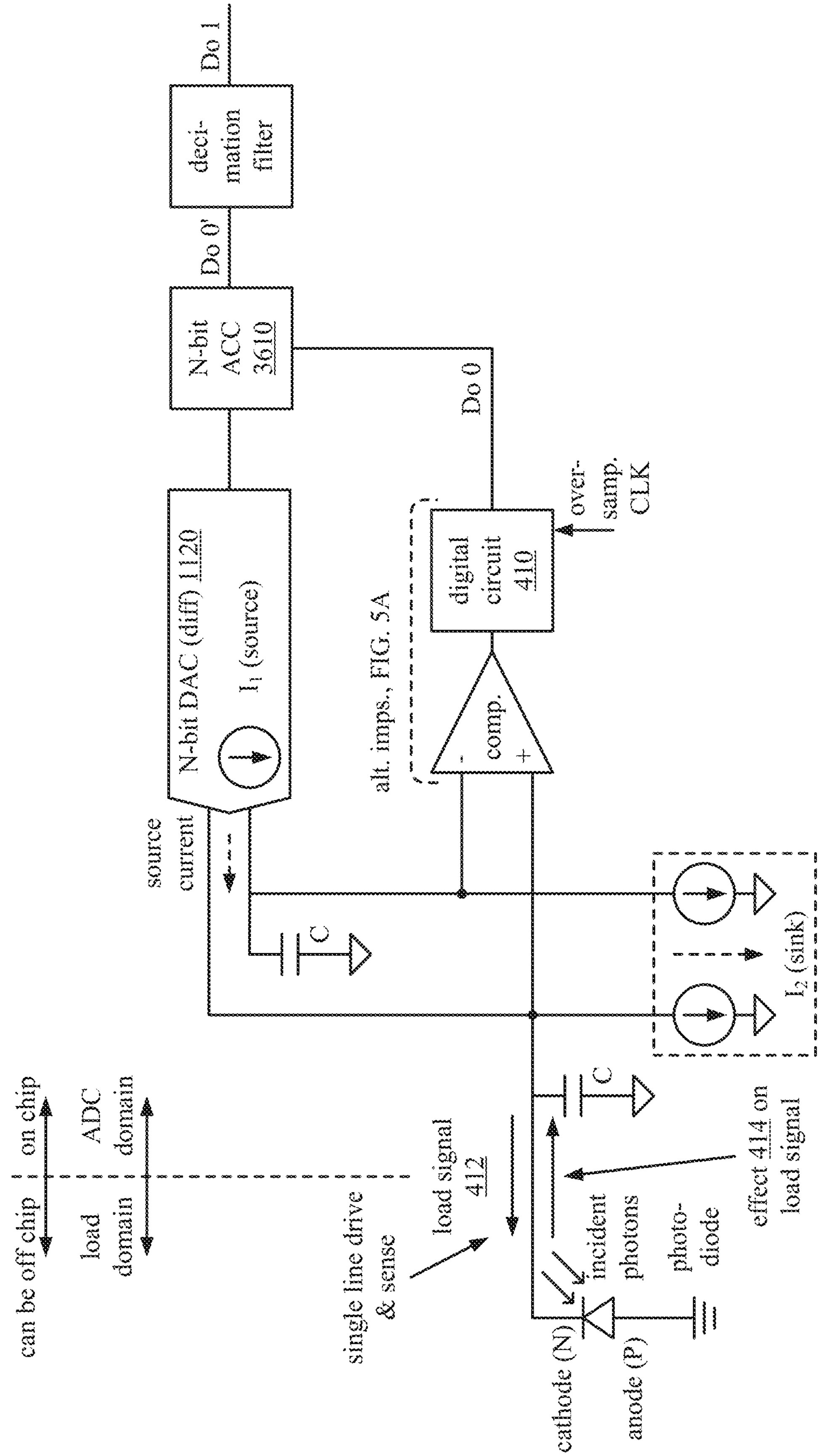

Referring to embodiment 5101 of FIG. 51A, this diagram is similar to the diagram of FIG. 50A with the replacement of the current sink at the bottom of the diagram with two respective current sinks, $I_2$, that provide for differential current sinking corresponding to the two respective differential lines that are input to the comparator, such that one of the differential lines is connected to the charging capacitor, C, and photo-diode. However, using such an implementation may present problems when there are mismatches between the two current sinks. For example, variation or mismatch between current sinks may be as much as 1-2%. FIG. 51C provides an alternative implementation to mitigate or reduce entirely any adverse effects of such mismatches.

Figure 51B:
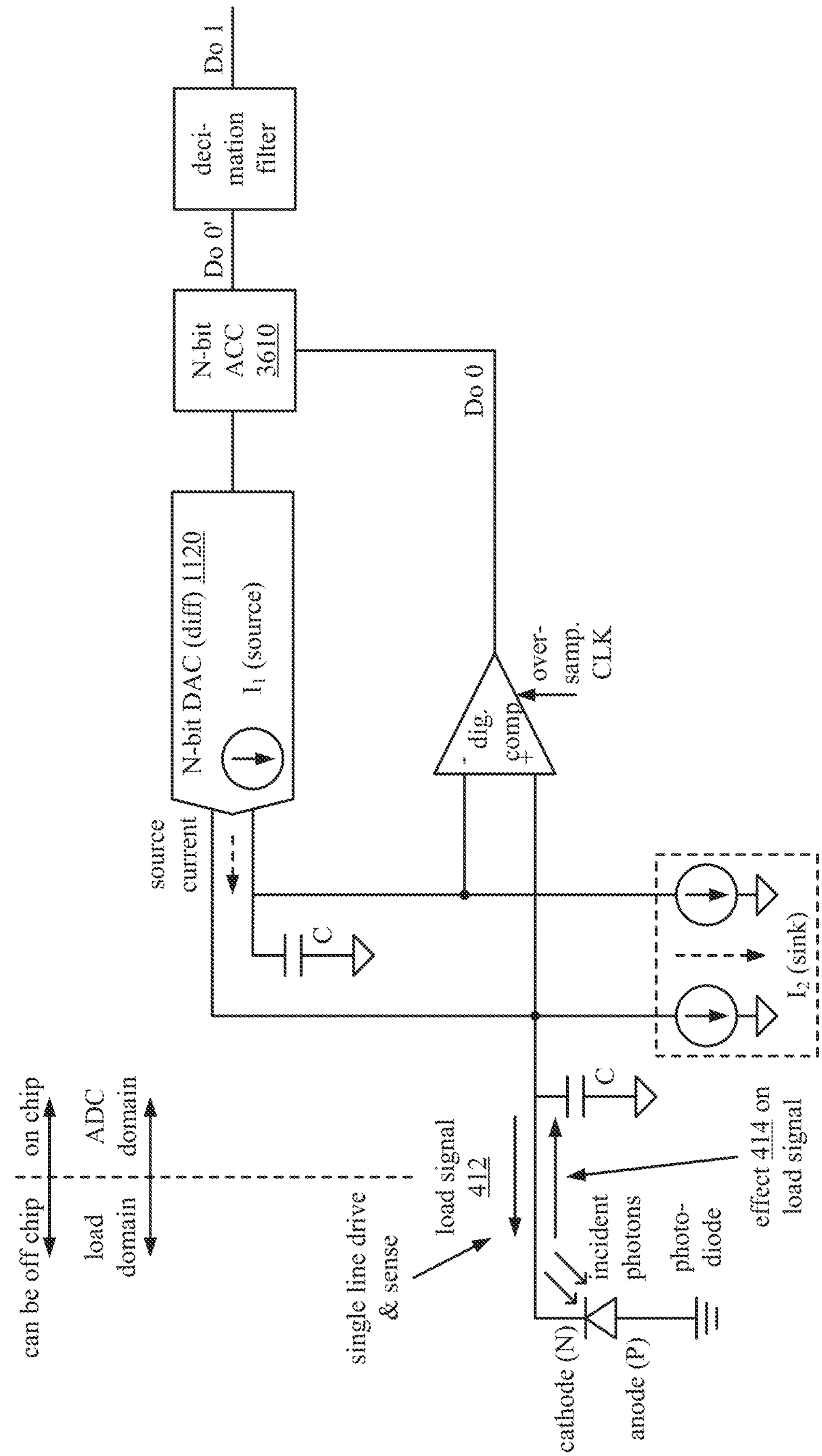
Figure 51C:
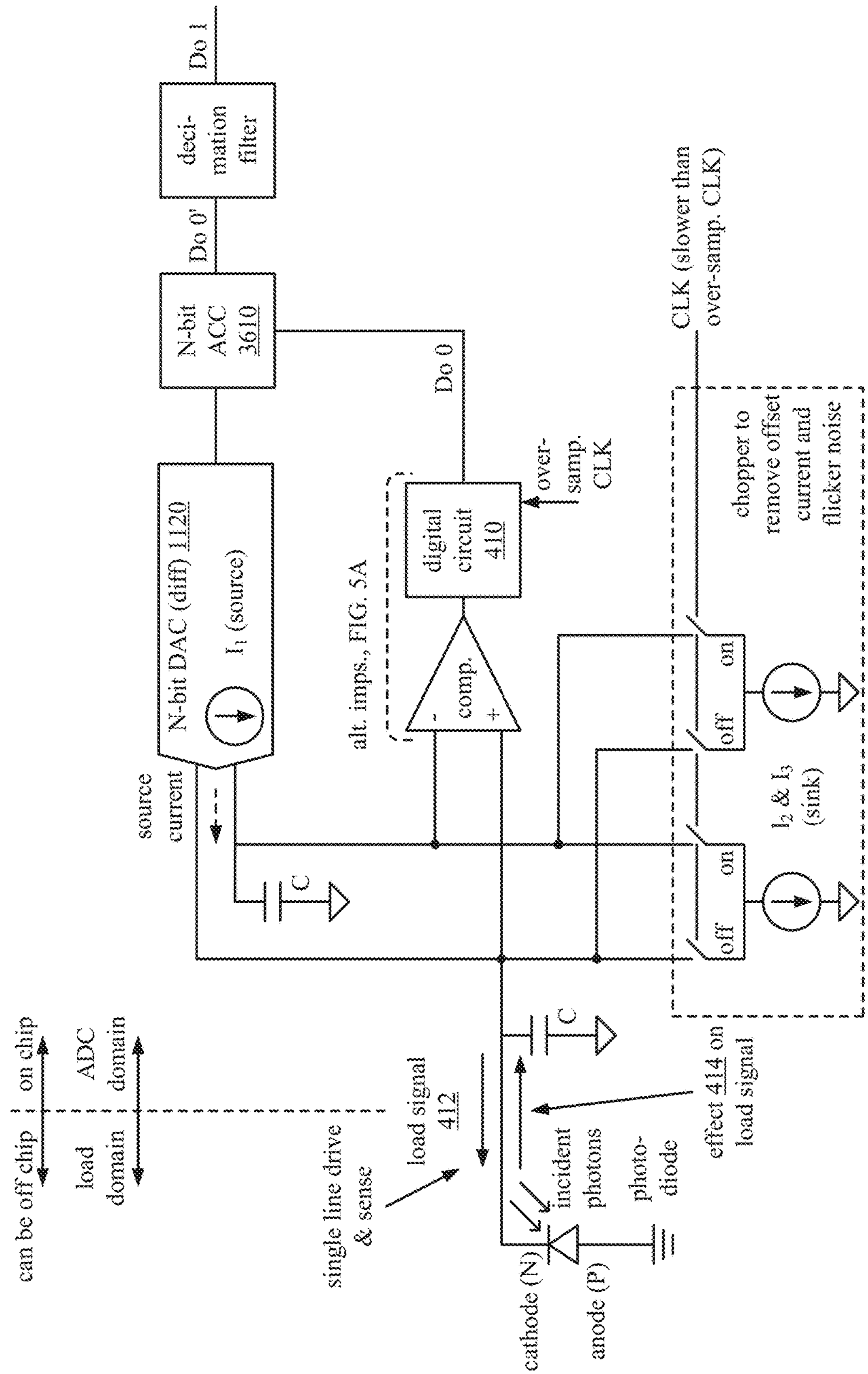

Referring to embodiment 5102 of FIG. 51B, this diagram as similar to the previous diagram with at least one difference being that the comparator and the digital circuit 410 is replaced with a digital comparator that is operated based on an oversampling clock.

Referring to embodiment 5103 of FIG. 51C, as mentioned above, this diagram is similar to the diagram of FIG. 51A with at least one difference being that the two current sinks, $I_2$, that provide for differential current sinking corresponding to the two respective lines that are input to the comparator, such that one of the differential lines is connected to the charging capacitor, C, and photo-diode, are replaced instead with two respective current sinks, $I_2$ and $I_3$, that each are connected using a pair of switches to the two respective differential leads of the respective inputs of the comparator such that one of the differential leads is connected to the charging capacitor, C, and the photo-diode and is configured to receive the photo-diode voltage. Specifically, one of the current sinks, $I_2$, is connected via two switches to the two respective inputs of the comparator, and the other of the one of the current sinks, $I_3$, is also connected via two switches to the two respective inputs of the comparator. For each of these respective switches that are connected to the two respective current sinks, $I_2$ and $I_3$, when one of the switches is closed, the other is open, and vice versa. Considering the current sink, $I_2$, when the switch on the left that is connected to the charging capacitor, C, and the photo-diode and is configured to receive the photo-diode voltage is closes, then the other switch is open, and vice versa. Similarly, considering the current sink, $I_3$, when the switch on the left that is connected to the charging capacitor, C, and the photo-diode and is configured to receive the photo-diode voltage is closed, then the other switch is open, and vice versa.

In an example of operation and implementation, the operation of these with two respective current sinks, $I_2$ and $I_3$, and their connectivity to the two respective lines that are input to the comparator, such that one of the differential lines is connected to the charging capacitor, C, and photo-diode, operates as a chopper to remove any offset current and flicker noise that may be existent within the photo-diode current. Note that the switches may be operated a clock that is slower than the oversampling clock that is used for the digital circuit 410. Together, these two respective current sinks, $I_2$ and $I_3$, and their switches operate to get rid of any offset between the two respective current sinks, $I_2$ and $I_3$. In an example of operation and implementation, by operating the switches, such as using a clock that is even slower than the oversampling clock that is used for the digital circuit 410, any DC offset current between the two respective current sinks, $I_2$ and $I_3$, is converted to an AC current. Then after performing very simple low pass filtering (LPF), then the only remaining component is a DC component. Generally speaking, this may be viewed as averaging out a low frequency offset by introducing a high-frequency AC offset that is a function of the clock frequency. Then, this DC offset is converted to an AC offset, and very simple low pass filtering (LPF) may be used to filter out the AC offset completely. In some examples, that such low pass filtering (LPF) may be performed in accordance with the conversion of the analog signal to the digital output signal, Do 0, within the digital circuit 410, within the N-bit ACC 3610, within the decimation filter, and/or within one or more other processing modules that are implemented to perform such low pass filtering (LPF). Such low pass filtering (LPF) may be performed in the analog domain and/or the digital domain In other examples, one or more analog LPFs for implemented between the two respective current sinks, $I_2$ and $I_3$, and the two respective inputs to the comparator.

Figure 51D:
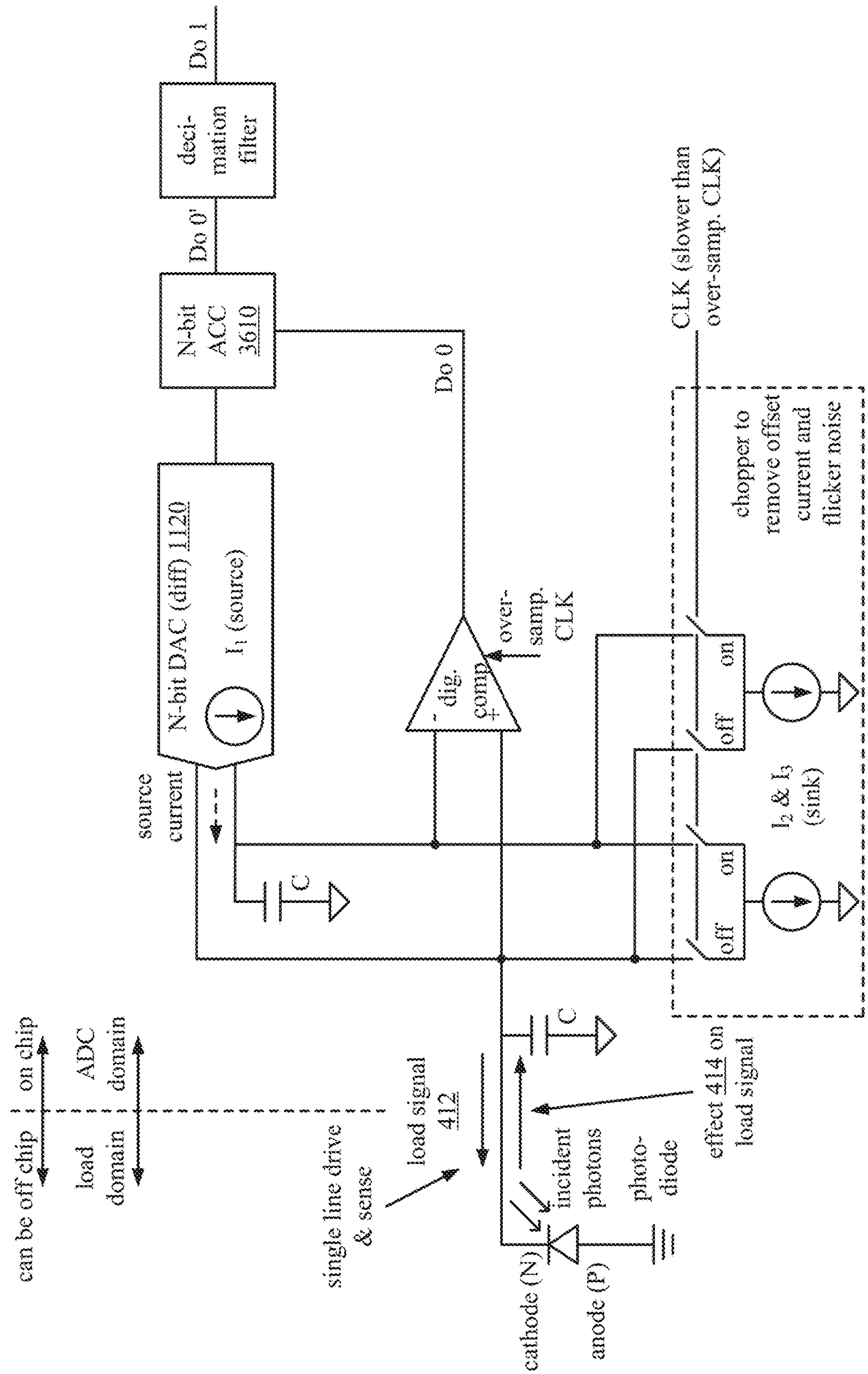

Referring to embodiment 5104 of FIG. 51D, this diagram as similar to the previous diagram with at least one difference being that the comparator and the digital circuit 410 is replaced with a digital comparator that is operated based on an oversampling clock.

With respect to various aspects, embodiments, and/or examples of the invention (and/or their equivalents) corresponding to pixel arrays, image sensors, photo detection devices, devices including one or more photo-diodes, etc., including many of the embodiments and/or examples described below, note that any embodiment of an ADC may be implemented to service one or more photo-diodes included within any such device. For example, while many embodiments and/or examples described herein particularly include a photo-diode therein, note that any embodiment of an ADC as described herein (and/or their equivalents) may be implemented to service a photo-diode. Several examples are described below corresponding to image sensors that include multiple pixels. As described above, a particular pixel is pictorially illustrated as a square in certain diagrams, and a given pixel may include one or more photo-diodes therein. In some examples, each respective pixel includes one single photo-diode. In other examples, each respective pixel includes more than one photo-diode (e.g., such as three respective photo-diodes, each particularly tailored for a particular portion of the visible spectrum, such as red, green, and blue (RGB)).

FIG. 52A is a schematic block diagram showing an embodiment 5201 of a photo-diode image sensor in accordance with the present invention. In this diagram a pixel array is shown as including multiple pixels. In one example, consider each square within the array includes one photo-diode. Also, one ADC is implemented to service each respective photo-diode of the array such that the number of ADCs corresponds to the number of pixels in the array. Note that while this particular pixel array is shown as being square in shape, including a common number of rows and columns within the pixel array, note that a pixel array may generally be implemented within any desired shape. Examples of such shapes might include square, rectangular, circular, oval, and/or any other desired shape of an image sensor that includes photo-diodes therein. In various embodiments described below, different implementations of ADCs servicing one or more photo-diodes are described.

FIG. 52B is a schematic block diagram showing various embodiments 5202 of groupings of pixels within a photo-diode image sensor in accordance with the present invention. This diagram is similar to the previous diagram showing a pixel array, but in this diagram, one or more groups of pixels are grouped together within subgroups. For example, on the upper left-hand corner of the pixel array, a 3×3 pixel subgroup is shown. In the upper right-hand corner of the pixel array, a 2×2 pixel subgroup is shown. In other portions the pixel array, a 2×3 pixel subgroup is shown, and a 4×4 pixel subgroup is shown. Note that different respective pixel subgroups may be implemented in other examples. Generally speaking, any group of two or more pixels may be grouped together to form a pixel subgroup. Note also that a pixel may be included in more than one subgroup in certain particular examples. In other examples, each respective subgroup is included with only one subgroup.

Also, note that while different respective pixel subgroups are shown in this diagram of being different size including different numbers of pixels, another example includes pixel subgroups each having the same number of pixels there in and being of the same size. For example, consider a pixel array that is subdivided such that it is composed of a number of pixel subgroups of size N×N or N×M, such that N and M are each positive integers greater than or equal to 1. In a specific example, consider that a pixel array is subdivided into uniformly sized 2×2 pixel subgroups, 3×3 pixel subgroups, 4×4 pixel subgroups, or some other size. In another specific example, consider the pixel array is subdivided into the uniformly sized 2×4 pixel subgroups, 3×5 pixel subgroups, or some other size. When a pixel array is subdivided into a number of pixel subgroups, note that each respective pixel subgroup may be serviced by one ADC. For example, consider a pixel array that includes X pixels in total that are divided into Y pixel subgroups each of size Z×Z, such that X, Y, and Z are positive integers, and X is greater than Y, then one respective ADC may be implemented for each of the Y pixel subgroups.

For example, a ADC that services the Z respective pixels within a given one of the Y pixel subgroups such that that particular ADC services a first pixel of the Z pixels within the pixel subgroup at a first time, a second pixel of the Z pixels within the pixel subgroup at a second time, a third pixel of the Z pixels was in the pixel subgroup the third time, and so on. After the ADC has serviced each of the Z respective pixels within that particular one of the Y pixel subgroups, the ADC would return back to the first pixel of the Z pixels within the pixel subgroup. Over time, that one ADC would continue to progress through the respective Z respective pixels within that particular one of the Y pixel subgroups.

Also, note that any desired pattern of scanning of the Z respective pixels within that particular one of the Y pixel subgroups may be performed. That is to say, the scanning need not necessarily go in one particular order during each scan. In some examples, a scan through the Z respective pixels starts at the top left of the pixel subgroup and proceed along the top row of that pixel subgroup until that particular row of that pixel subgroup is completed, then proceeds to the second two top row of that pixel subgroup, and proceeded along the second row from left to right, and so on through the entire pixel subgroup. Alternatively, different respective stands may sample different respective pixels of the pixel subgroup at different times. For example, consider the Z respective pixels within that particular one of the Y pixel subgroups, during a first scan, perhaps a first subgroup of those Z respective pixels are serviced by the ADC. And during a second scan, a second subgroup of those Z respective pixels are serviced by the ADC, such that different respective subgroups of those Z respective pixels are serviced during different respective scans. Generally speaking, the scanning of the pixels within the pixel subgroup may be performed in accordance with any desired pattern, periodicity, etc.

FIG. 52C is a schematic block diagram showing an embodiment 5203 a device stack-up within a photo-diode image sensor in accordance with the present invention. This diagram shows a view of a portion of the stack-up of a device that includes an image sensor. In this example, the bottom shows a printed circuit board (PCB), above that is an ADC chip, it and above that is a sensor chip. Note that the sensor chip may include one or more photo-diodes, and the ADC chip may include one or more ADCs. For example, consider an implementation in which the sensor chip corresponds to one pixel of the pixel array and includes one photo-diode, then the ADC chip may include one ADC that services that particular sensor chip. In another example, consider an inclination in which the sensor chip corresponds to a pixel subgroup that includes multiple pixels, then the ADC chip may include one ADC that services all of the pixels of that particular subgroup within the sensor chip.

As described herein, in ADC implemented in accordance with various aspects, embodiments, and/or examples of the invention (and/or their equivalents), including ADC that is implemented to service one or more photo-diodes, may be implemented having much smaller size than those employed within previous technologies. For example, consider a pixel array as described herein including X×Y pixels. Each respective pixel of the pixel array is very small (e.g., 12 microns×12 microns, where 1 micron=1 la-meter). In ADC that is implemented as described here is smaller than the size of a pixel within a pixel array, and can be implemented directly underneath a pixel within a pixel array. This is a significant improvement over prior technologies such that, by implementing ADCs as described herein, a respective ADC may be implemented underneath each respective pixel within a pixel array. In certain alternative embodiments, such as using an ADC to service more than one pixel of the pixel array, there is even more space available underneath the pixel array. For example, using some form of multiplexing, time-division servicing, etc. of an ADC servicing more than one pixel of the pixel array, such as when the pixels of the pixel array are subdivided into pixel subgroups, there is even more space available underneath the pixel array.

One of the many advantages of using ADC as described herein to service one or more photo-diodes is that the very small size and low power consumption of such an ADC allows for it to be implemented directly beneath a pixel. In one particular implementation, there is one photo-diode implemented for each respective pixel of the pixel array (e.g., each respective ADC implemented directly underneath its corresponding pixel of the pixel array so as to service the photo-diode of that particular pixel). In another implementation, there is one photo-diode implemented underneath a pixel subgroup of the pixel array (e.g., each respective ADC implemented directly underneath its corresponding pixel subgroup so as to service the photo-diodes of those particular pixels of that pixel subgroup).

FIG. 52D is a schematic block diagram showing an embodiment 5204 of multiple ADCs respectively servicing photo-diodes within a photo-diode image sensor in accordance with the present invention. This diagram shows multiple ADCs implemented to service photo-diodes such that each respective ADC is connected or coupled to a corresponding photo-diode. In an example, each respective photo-diode corresponds to one pixel of a pixel array of an image sensor. In another example, more than one photo-diode corresponds to one pixel of a pixel array of an image sensor, such that more than one photo-diodes service a pixel of the pixel array (e.g., RGB including three photo-diodes the service a particular pixel of the pixel array). Each of the ADCs is also coupled to the memory, such that as the ADCs service the respective photo-diodes, that information generated thereby is provided in digital format for storage in the memory. In addition, the pixel scanner is coupled to the memory. In an example of operation and implementation, the pixel scanner accesses the memory according to a desired pattern, periodicity, etc. so that the device processes information corresponding to each of the respective pixels of the pixel array.

FIG. 53A is a schematic block diagram showing an embodiment 5301 of a single ADC respectively servicing multiple photo-diodes within a photo-diode image sensor in accordance with the present invention. This diagram has some similarities to the previous diagram including a pixel scanner and a memory. In an example, each respective photo-diode corresponds to one pixel of a pixel array of an image sensor. In another example, more than one photo-diode corresponds to one pixel of a pixel array of an image sensor, such that more than one photo-diodes service a pixel of the pixel array (e.g., RGB including three photo-diodes the service a particular pixel of the pixel array).

This diagram shows a single ADC implemented to service photo-diodes such that the ADC is connected or coupled to the photo-diodes via some multiplexing, switching, etc. means. For example, a multiplexer may be implemented such that the pixel scanner selects which particular photo-diode is connected to or coupled to the ADC at a particular time. Alternatively, the ADC is connected to or coupled to the respective photo-diodes via a switching mechanism such that the pixel scanner can select which one of the photo-diodes is connected to or coupled to the ADC at a particular time. In an example, the pixel scanner selects a first photo-diode to be serviced by the ADC at a first time, a second photo-diode be serviced by the ADC is a second time, a third photo-diode the service by the ADC is a third time, and so on. As the ADC services the respective photo-diodes to which it is connected or coupled via the multiplexing, switching, etc. means, the digital information generated by the ADC provided in digital format for storage in the memory.

FIG. 53B is a schematic block diagram showing an embodiment 5302 of a multiple instantiations of single ADCs each respectively servicing multiple photo-diodes within a photo-diode image sensor in accordance with the present invention. This diagram has some similarities to the previous diagram including a pixel scanner and a memory. This diagram is similar to the previous diagram but includes multiple instantiations of ADCs that respectively service more than one photo diode. The first ADC is implemented to service a first group of photo-diodes via a first multiplexing, switching, etc. means, and a second ADC is implemented to service the second group of photo-diodes via a second multiplexing, switching, etc. means. Generally seeking, any number of instantiations of ADCs that respectively service more than one photo-diode may be implemented within a device.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. An impedance sensing circuit comprising:

a first current source operably coupled and configured, based on a digital signal, to output a first current signal to a first node that is operably coupled to a first terminal of a Wheatstone bridge;

a second current source operably coupled and configured, based on the digital signal, to output a second current signal to a second node that is operably coupled to second terminal of the Wheatstone bridge;

a comparator operably coupled to the first current source and the second current source, wherein, when enabled, the comparator configured to:

receive a first voltage based on the first terminal of the Wheatstone bridge via a first input of the comparator;

receive a second voltage based on the second terminal of the Wheatstone bridge via a second input of the comparator; and compare the first voltage to the second voltage to generate a comparator output signal; and a digital circuit operably coupled to the comparator, wherein, when enabled, the digital circuit operably coupled and configured to process the comparator output signal to generate the digital signal, wherein the digital signal is representative of a difference between the first voltage and the second voltage that is based on an impedance difference associated with the Wheatstone bridge.

2. The impedance sensing circuit of claim 1 further comprising:

memory that stores operational instructions; and one or more processing modules operably coupled to the digital circuit and the memory, wherein, when enabled, the one or more processing modules is configured to execute the operational instructions to process the digital signal to determine the impedance difference associated with the Wheatstone bridge.

3. The impedance sensing circuit of claim 2, wherein the Wheatstone bridge further comprising:

a first resistor;

a second resistor connected to the first resistor;

a third resistor connected between the first resistor and ground;

a fourth resistor connected between the second resistor and ground;

the second terminal of the Wheatstone bridge based on connection between the first resistor and the third resistor; and the second terminal of the Wheatstone bridge based on connection between the second resistor and the fourth resistor.

4. The impedance sensing circuit of claim 3, wherein:

the first resistor, the second resistor, and the third resistor have a first resistance value;

the fourth resistor has a second resistance value that is different from the first resistance value; and the impedance difference associated with the Wheatstone bridge is based on a difference between the first resistance value and the second resistance value.

5. The impedance sensing circuit of claim 3, wherein:

the first resistor and the third resistor have a first resistance value; and the second resistor and the fourth resistor have a second resistance value that is different from the first resistance value; and the impedance difference associated with the Wheatstone bridge is based on a difference between the first resistance value and the second resistance value.

6. The impedance sensing circuit of claim 3 further comprising:

a bias current source that is operably coupled to connection between the first resistor and the second resistor and configured to output a bias current signal.

7. The impedance sensing circuit of claim 6 further comprising:

a reference current source that is operably coupled to another node that couples to inputs of the first current source and the second current source and configured to output a reference current signal, wherein sensitivity of the digital signal is based on a ratio of the bias current signal to the reference current signal.

8. The impedance sensing circuit of claim 1 further comprising:

a capacitor that is operably coupled between the first input of the comparator and the second input of the comparator.

9. The impedance sensing circuit of claim 1 further comprising:

a first capacitor that is operably coupled to the first input of the comparator; and a second capacitor that is operably coupled to the second input of the comparator.

10. The impedance sensing circuit of claim 1, wherein:

the first current signal and the second current signal are regulated based on the digital signal to ensure that the first voltage is same as the second voltage.

11. The impedance sensing circuit of claim 1 further comprising:

a first buffer operably coupled between the first node and the first terminal of the Wheatstone bridge; and a second buffer operably coupled between the second node and the second terminal of the Wheatstone bridge.

12. An impedance sensing circuit comprising:

a first current source operably coupled and configured, based on a comparator output signal, to output a first current signal to a first node that is operably coupled to a first terminal of a Wheatstone bridge;

a second current source operably coupled and configured, based on the comparator output signal, to output a second current signal to a second node that is operably coupled to second terminal of the Wheatstone bridge;

a comparator operably coupled to the first current source and the second current source, wherein, when enabled, the comparator configured to:

receive a first voltage based on the first terminal of the Wheatstone bridge via a first input of the comparator;

receive a second voltage based on the second terminal of the Wheatstone bridge via a second input of the comparator; and compare the first voltage to the second voltage to generate a comparator output signal; and a digital circuit operably coupled to the comparator, wherein, when enabled, the digital circuit operably coupled and configured to process the comparator output signal to generate a digital signal, wherein the digital signal is representative of a difference between the first voltage and the second voltage that is based on an impedance difference associated with the Wheatstone bridge.

13. The impedance sensing circuit of claim 12 further comprising:

memory that stores operational instructions; and one or more processing modules operably coupled to the digital circuit and the memory, wherein, when enabled, the one or more processing modules is configured to execute the operational instructions to process the digital signal to determine the impedance difference associated with the Wheatstone bridge.

14. The impedance sensing circuit of claim 13, wherein the Wheatstone bridge further comprising:

a first resistor;

a second resistor connected to the first resistor;

a third resistor connected between the first resistor and ground;

a fourth resistor connected between the second resistor and ground;

the second terminal of the Wheatstone bridge based on connection between the first resistor and the third resistor; and the second terminal of the Wheatstone bridge based on connection between the second resistor and the fourth resistor.

15. The impedance sensing circuit of claim 14, wherein:

the first resistor, the second resistor, and the third resistor have a first resistance value;

the fourth resistor has a second resistance value that is different from the first resistance value; and the impedance difference associated with the Wheatstone bridge is based on a difference between the first resistance value and the second resistance value.

16. The impedance sensing circuit of claim 14, wherein:

the first resistor and the third resistor have a first resistance value; and the second resistor and the fourth resistor have a second resistance value that is different from the first resistance value; and the impedance difference associated with the Wheatstone bridge is based on a difference between the first resistance value and the second resistance value.

17. The impedance sensing circuit of claim 14 further comprising:

a bias current source that is operably coupled to connection between the first resistor and the second resistor and configured to output a bias current signal.

18. The impedance sensing circuit of claim 17 further comprising:

a reference current source that is operably coupled to another node that couples to inputs of the first current source and the second current source and configured to output a reference current signal, wherein sensitivity of the digital signal is based on a ratio of the bias current signal to the reference current signal.

19. The impedance sensing circuit of claim 12 further comprising:

a capacitor that is operably coupled between the first input of the comparator and the second input of the comparator.

20. The impedance sensing circuit of claim 12, wherein:

the first current signal and the second current signal are regulated based on the comparator output signal to ensure that the first voltage is same as the second voltage.

* * * * *